US012520457B2

(12) United States Patent
Takahashi et al.

(10) Patent No.: US 12,520,457 B2

(45) Date of Patent: Jan. 6, 2026

(54) VAPOR CHAMBER HAVING CONDENSATE FLOW PATHS AND VAPOR FLOW PATHS WITH VARYING CROSS-SECTIONAL AREAS IN LINEAR PARTS AND A CURVED PART, ELECTRONIC DEVICE, AND SHEET FOR SUCH VAPOR CHAMBER

(71) Applicant: DAI NIPPON PRINTING CO., LTD., Tokyo (JP)

(72) Inventors: Shinichiro Takahashi, Tokyo (JP); Takayuki Ota, Tokyo (JP); Kazunori Oda, Tokyo (JP); Toshihiko Takeda, Tokyo (JP); Kiyotaka Takematsu, Tokyo (JP); Terutoshi Momose, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 82 days.

(21) Appl. No.: 17/638,057

(22) PCT Filed: Sep. 4, 2020

(86) PCT No.: PCT/JP2020/033661

§ 371 (c)(1),
(2) Date: Feb. 24, 2022

(87) PCT Pub. No.: WO2021/045211

PCT Pub. Date: Mar. 11, 2021

(65) Prior Publication Data

US 2022/0279678 A1 Sep. 1, 2022

(30) Foreign Application Priority Data

Sep. 6, 2019 (JP) ................................ 2019-163204
Sep. 6, 2019 (JP) ................................ 2019-163217
Sep. 11, 2019 (JP) ................................ 2019-165245

(51) Int. Cl.

*H05K 7/20* (2006.01)
*F28D 15/02* (2006.01)
*H01L 23/427* (2006.01)

(52) U.S. Cl.

CPC ....... *H05K 7/20336* (2013.01); *H01L 23/427* (2013.01); *F28D 15/0233* (2013.01)

(58) Field of Classification Search

CPC .............. H01L 23/427; H05K 7/20336; F28D 15/0233

See application file for complete search history.

(56) References Cited

U.S. PATENT DOCUMENTS 1,562,525 A * 11/1925 Thunholm .............. B01D 1/00 159/37
5,687,768 A * 11/1997 Mull, Jr. .............. F24F 13/081 137/561 A (Continued)

FOREIGN PATENT DOCUMENTS

JP H06-350277 A 12/1994
JP H10-321774 A 12/1998

(Continued)

OTHER PUBLICATIONS

Nov. 24, 2020 International Search Report issued in International Patent Application No. PCT/JP2020/033661.

*Primary Examiner* — Robert J Hoffberg
(74) *Attorney, Agent, or Firm* — Oliff PLC

(57) ABSTRACT

Included are a plurality of first flow paths, and second flow paths arranged between adjacent ones of the first flow paths; and a layer including grooves constituting the first flow paths and the second flow paths, and a layer laminated on the insides of the grooves, and constituting inner surfaces of the first flow paths and the second flow paths.

8 Claims, 87 Drawing Sheets

(56) References Cited

U.S. PATENT DOCUMENTS

| | | | | |
|---|---|---|---|---|
| 6,644,355 | B1 * | 11/2003 | Gleason | F15D 1/04 137/561 A |
| 6,742,571 | B2 * | 6/2004 | Yamasaki | B22D 11/055 164/443 |
| 9,551,538 | B2 * | 1/2017 | Honmura | G06F 1/203 |
| 9,657,997 | B2 * | 5/2017 | Fujita | H05K 7/20436 |
| 11,324,143 | B2 * | 5/2022 | Stefanoski | H05K 7/20509 |
| 11,324,144 | B2 * | 5/2022 | Stefanoski | G05D 1/021 |
| 11,578,927 | B2 * | 2/2023 | Takahashi | F28D 15/0266 |
| 11,737,244 | B2 * | 8/2023 | Stefanoski | H05K 7/20872 361/704 |
| 11,747,090 | B2 * | 9/2023 | Takahashi | F28D 15/0233 165/104.21 |
| 11,859,913 | B2 * | 1/2024 | Oda | F28D 15/046 |
| 11,903,167 | B2 * | 2/2024 | Takahashi | G06F 1/203 |
| 2004/0069459 | A1 | 4/2004 | Tonosaki et al. | |
| 2006/0065385 | A1 | 3/2006 | Tonosaki et al. | |
| 2015/0077929 | A1 | 3/2015 | Honmura et al. | |
| 2016/0091258 | A1 | 3/2016 | Ahamed et al. | |
| 2016/0209122 | A1 * | 7/2016 | Wang | F28D 15/0233 |
| 2017/0234627 | A1 * | 8/2017 | Kobayashi | F28F 13/08 165/183 |
| 2017/0248378 | A1 | 8/2017 | Aoki et al. | |
| 2019/0221501 | A1 | 7/2019 | Tamura et al. | |
| 2020/0025458 | A1 | 1/2020 | Takahashi et al. | |
| 2020/0404802 | A1 * | 12/2020 | Takahashi | F28D 15/0233 |
| 2021/0168969 | A1 * | 6/2021 | Takahashi | H05K 7/20318 |
| 2021/0392781 | A1 * | 12/2021 | Oda | F28D 15/046 |
| 2022/0120509 | A1 * | 4/2022 | Takeda | F28D 15/0233 |
| 2024/0172395 | A1 * | 5/2024 | Oda | F28D 15/02 |
| 2025/0185214 | A1 * | 6/2025 | Takahashi | F28D 15/0233 |

FOREIGN PATENT DOCUMENTS

| | | | | | |
|---|---|---|---|---|---|
| JP | 2002-168578 | A | | 6/2002 | |
| JP | 2003-291241 | A | | 10/2003 | |
| JP | 2004-088048 | A | | 3/2004 | |
| JP | 2004-190985 | A | | 7/2004 | |
| JP | 2004-356135 | A | | 12/2004 | |
| JP | 2007-024369 | A | | 2/2007 | |
| JP | 2007-183021 | A | | 7/2007 | |
| JP | 2015-059693 | A | | 3/2015 | |
| JP | 5788069 | B1 | | 9/2015 | |
| JP | 2016-070593 | A | | 5/2016 | |
| JP | 2016-205693 | A | | 12/2016 | |
| JP | 6057952 | B2 | | 1/2017 | |
| JP | 2019105416 | A | * | 6/2019 | |
| JP | 2019-128143 | A | | 8/2019 | |
| JP | 2020008202 | A | * | 1/2020 | |
| JP | 2020008275 | A | * | 1/2020 | |
| JP | 2020038051 | A | * | 3/2020 | |
| WO | 2018/066311 | A1 | | 4/2018 | |
| WO | 2018/155641 | A1 | | 8/2018 | |
| WO | 2019/088301 | A1 | | 5/2019 | |
| WO | WO-2023054692 | A1 | * | 4/2023 | F28D 15/04 |

* cited by examiner

VAPOR CHAMBER HAVING CONDENSATE FLOW PATHS AND VAPOR FLOW PATHS WITH VARYING CROSS-SECTIONAL AREAS IN LINEAR PARTS AND A CURVED PART, ELECTRONIC DEVICE, AND SHEET FOR SUCH VAPOR CHAMBER

TECHNICAL FIELD

The present disclosure relates to a vapor chamber for transporting heat by refluxing a working fluid enclosed in a sealed space with a phase of the working fluid being changed.

BACKGROUND ART

The heats generated from electronic components such as CPUs (central processing units) which are installed in personal computers, and in portable terminals such as portable telephones and tablet terminals tend to increase due to an increase in information processing capacities. Thus, cooling technology is important. Heat pipes are well known as devices for such cooling. A heat pipe is to transport heat from a heat source to other portions by means of a working fluid enclosed therein, thereby diffusing the heat, and to cool the heat source.

In particular, portable terminals and the like have been remarkably slimmed in recent years, which has required a more slimmed cooling device than the conventional heat pipe. For this, for example, vapor chambers as described in Patent Literatures 1 to 3 have been proposed.

A vapor chamber is a device formed of a member in the form of a flat plate to which the concept of heat transport using a heat pipe is applied. That is, a working fluid is enclosed in between facing flat plates in the vapor chamber. This working fluid refluxes with a phase thereof being changed, thereby transporting heat, so that heat from a heat source is transported and diffused and the heat source is cooled.

More specifically, a flow path where the working fluid flows is provided between the facing flat plates of the vapor chamber, and the working fluid is enclosed therein. When the vapor chamber is disposed at a heat source, the working fluid receives heat from the heat source near the heat source, vaporizes, and moves in the flow path in a gas (vapor) phase. According to this, the heat from the heat source is smoothly transported to a place apart from the heat source, which causes the heat source to be cooled. The working fluid in a gas phase, which has transported the heat from the heat source, moves to a place apart from the heat source, and the heat thereof is absorbed by its surroundings, so that the working fluid is cooled and condenses and the phase thereof changes to a liquid phase. The working fluid with the phase thereof changed to a liquid phase passes through another flow path, returns to a place at the heat source, and again receives the heat from the heat source and vaporizes, and the phase thereof changes to a gas phase.

By the circulation as described above, the heat generated from the heat source is transported to a place apart from the heat source, and the heat source is cooled.

CITATION LIST

Patent Literature

Patent Literature 1: JP 5788069 B1
Patent Literature 2: JP 2016-205693 A
Patent Literature 3: JP 6057952 B2

SUMMARY OF INVENTION

Technical Problem

The first object of the present disclosure is to provide a vapor chamber that offers necessary strength even if being slimmed.

The second object of the present disclosure is to provide a vapor chamber having a heat transport capability that can be improved even when the vapor chamber has a flow path with its direction being changed.

The third object of the present disclosure is to provide an intermediate where an oxide film is difficult to form on the inner surface of a flow path where a working fluid flows.

Solution to Problem

The first aspect of the present disclosure is a vapor chamber having thereinside a sealed space where a working fluid is enclosed, the vapor chamber comprising: a layer including grooves constituting a plurality of first flow paths and a plurality of second flow paths; and a layer laminated on insides of the grooves, and constituting inner surfaces of the first flow paths and the second flow paths, wherein the sealed space has the first flow paths, and the second flow paths arranged between adjacent ones of the first flow paths, and when an average flow path cross-sectional area of any two adjacent ones of the first flow paths is defined as $A_g$, and an average flow path cross-sectional area of groups of the second flow paths which are each arranged between the adjacent ones of the first flow paths is defined as $A_1$, $A_1$ is at most 0.5 times as large as $A_g$ in at least part of the vapor chamber.

The second aspect of the present disclosure is a vapor chamber having a sealed space in which a working fluid is enclosed, the vapor chamber comprising: linear parts where a plurality of condensate flow paths and a plurality of vapor flow paths linearly extend; and a curved part continuous to the linear parts, at the curved part extending directions of the condensate flow paths and the vapor flow paths change, wherein the sealed space includes the condensate flow paths, which are flow paths where the working fluid in a condensate state moves, and the vapor flow paths, each of which has a flow path cross-sectional area larger than that of each of the condensate flow paths, and where the working fluid in a vapor or condensate state moves, and a flow path cross-sectional area of any of the vapor flow paths which is disposed on an inner side is larger than that of any of the vapor flow paths which is disposed on an outer side, at the curved part.

The third aspect of the present disclosure is a sheet on which multiple intermediates for a vapor chamber are imposed, the sheet comprising: a hollow part to be a flow path for a working fluid thereinside, the hollow part being shut off from an outside.

Effects of Invention

The first aspect makes it possible to improve the strength of a vapor chamber.

The second aspect makes it possible to improve the heat transport capability of a vapor chamber even when the vapor chamber has a flow path with its direction being changed.

The third aspect makes it possible to obtain an intermediate where an oxide film is difficult to form on an inner surface of a flow path where a working fluid flows.

DESCRIPTION OF EMBODIMENTS

Figure 1:
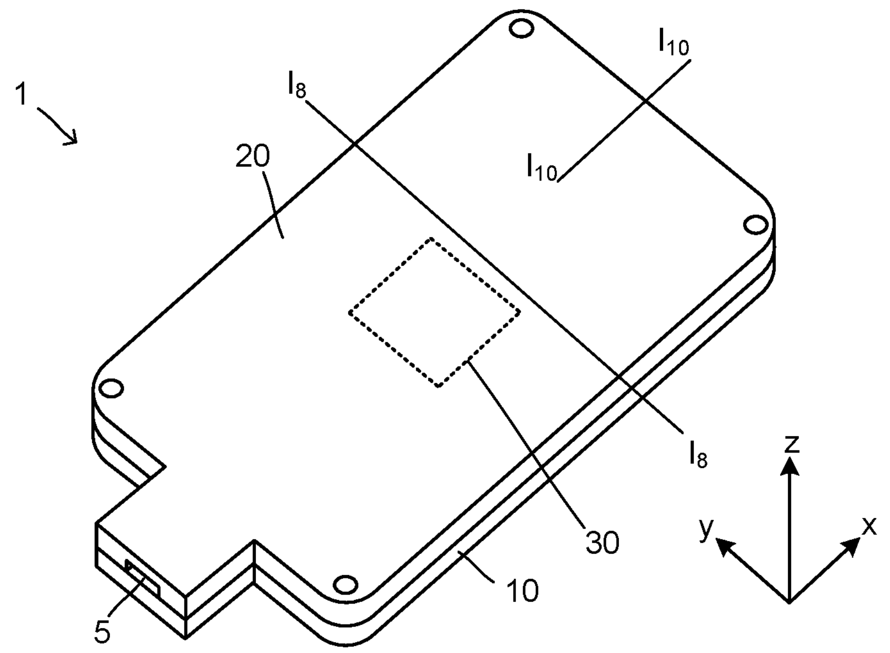
FIG. 1 is a perspective view of a vapor chamber 1.

Hereinafter the present disclosure will be described based on the embodiments shown in the drawings. The drawings shown in the following may show changed or exaggerated sizes and ratios of the members for clarity. Illustrations of portions unnecessary for the description, and repeatedly appearing signs may be omitted for visibility.

First Embodiment

Figure 2:
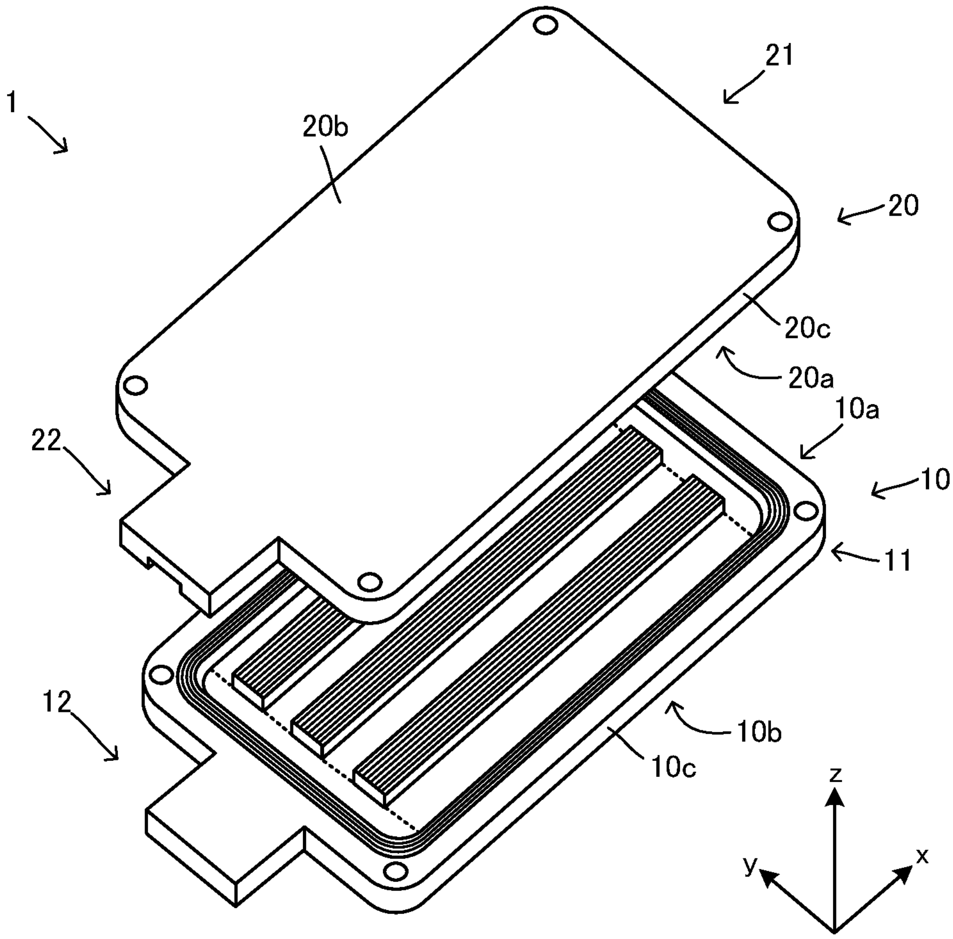
FIG. 2 is an exploded perspective view of the vapor chamber 1.

FIG. 1 is an external perspective view of a vapor chamber 1 according to the first embodiment. FIG. 2 is an exploded perspective view of the vapor chamber 1. For convenience, these and the following drawings also show the arrows (x, y, z) indicating directions if necessary. The xy in-plane direction is a plate plane direction of the vapor chamber 1 in the form of a flat plate, and the z-direction is a thickness direction thereof.

The vapor chamber 1 has, as can be seen from FIGS. 1 and 2, a first sheet 10 and a second sheet 20. As described later, these first sheet 10 and second sheet 20 are superposed and bonded (diffusion bonding, brazing, or the like), so that a hollow part is formed between the first sheet 10 and the second sheet 20. This hollow part is a sealed space 2 (for example, see FIG. 19) when a working fluid is enclosed therein.

Figure 3:
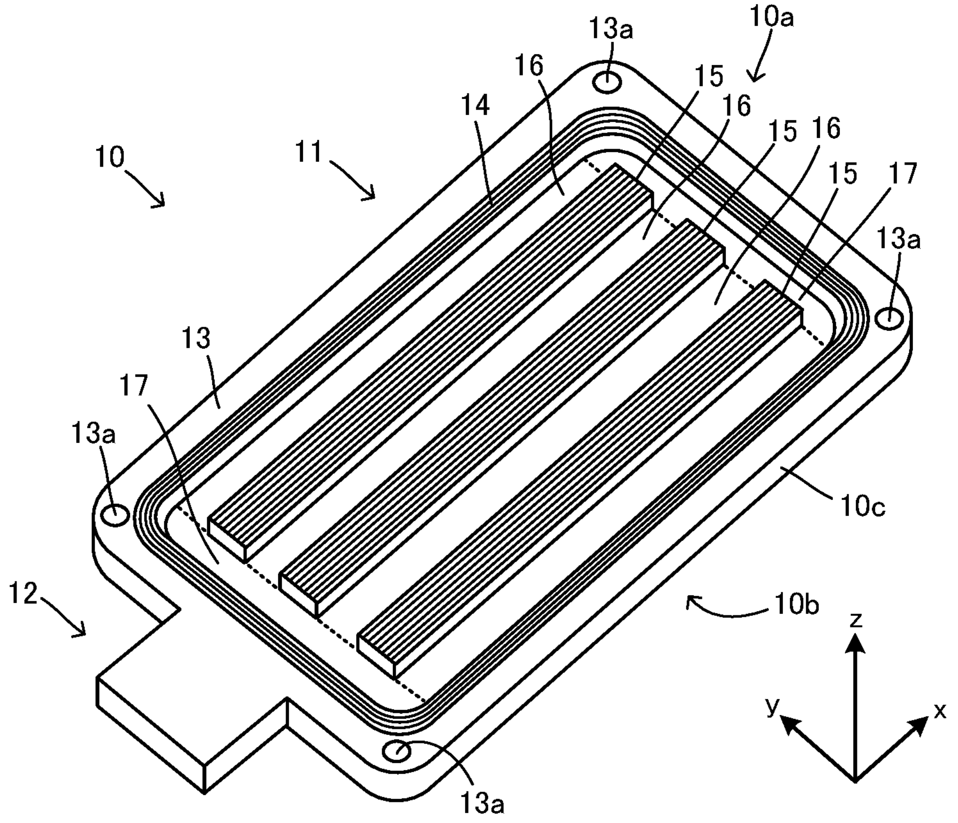
FIG. 3 is a perspective view of a first sheet 10.
Figure 4:
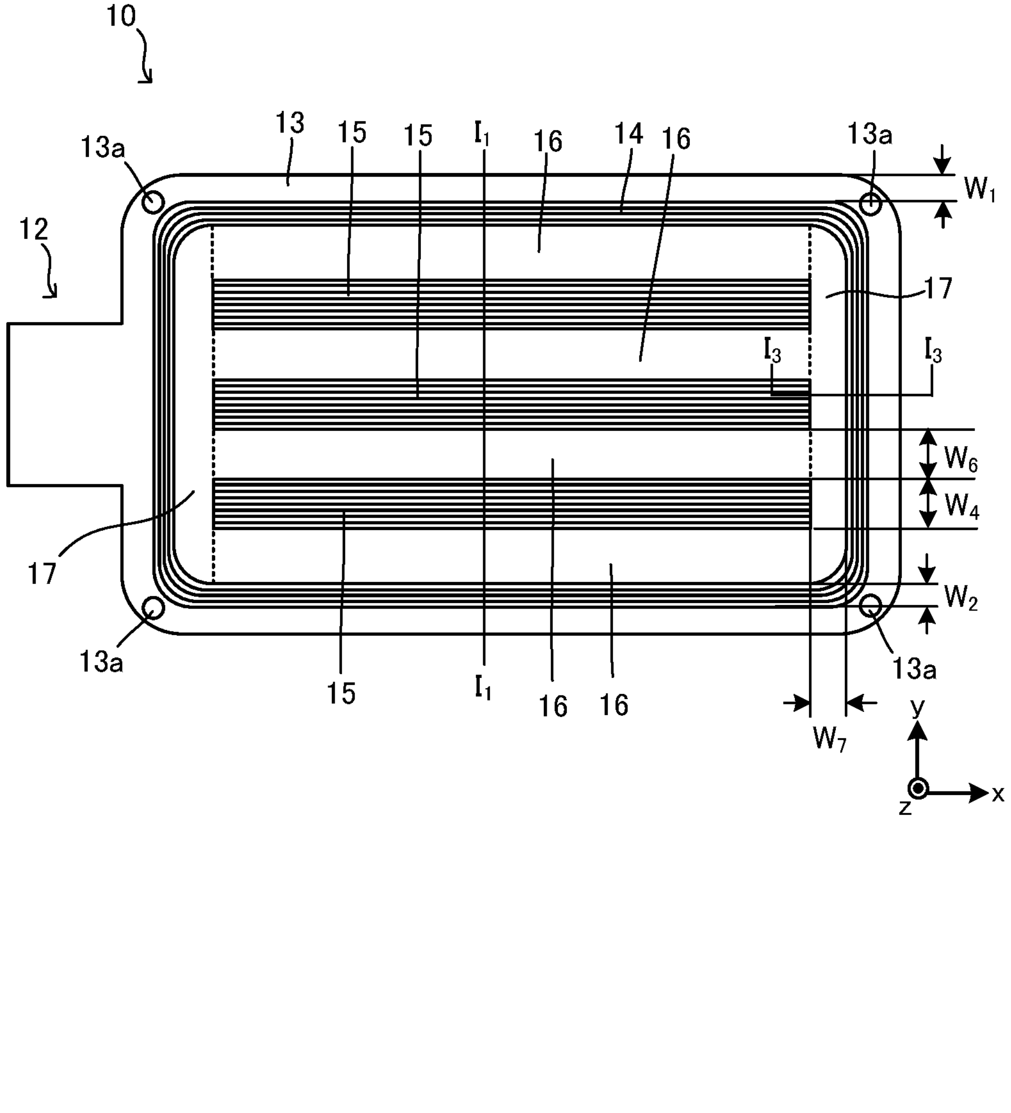
FIG. 4 is a plan view of the first sheet 10.
Figure 5:
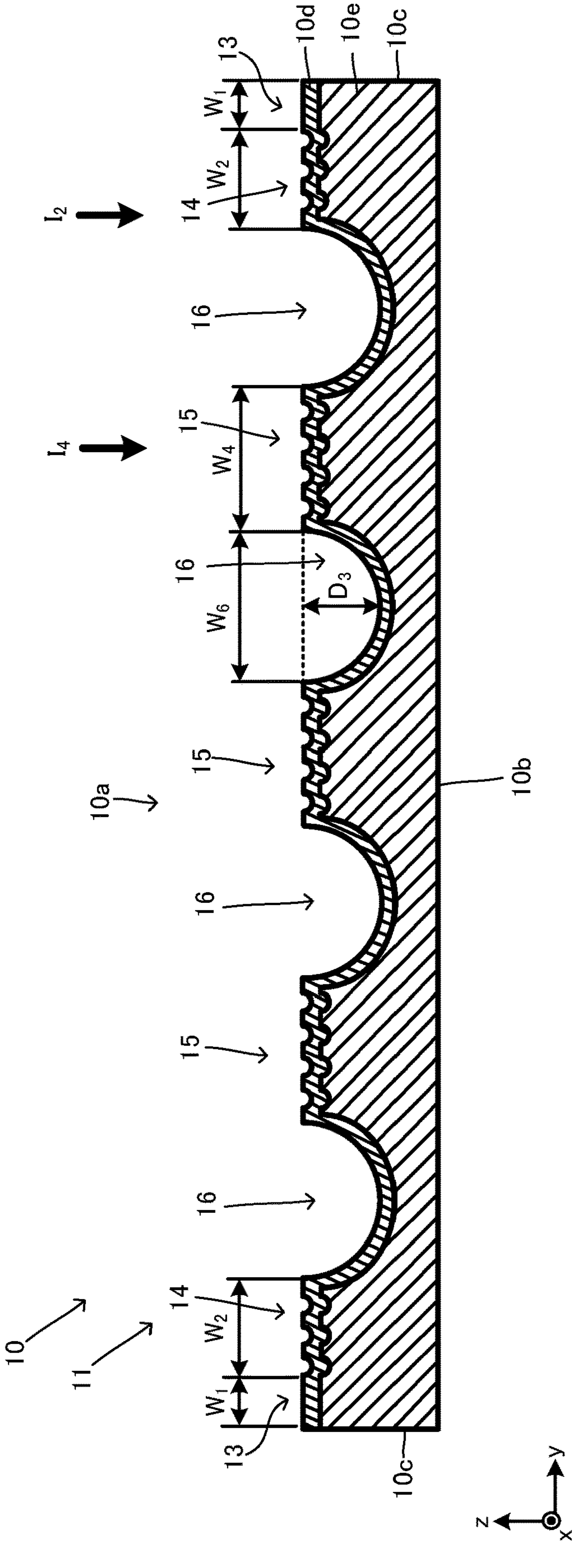
FIG. 5 shows a cross section of the first sheet 10.

In the present embodiment, the first sheet 10 is a sheet-like member as a whole. FIG. 3 is a perspective view of the first sheet 10 on an inner face 10*a* side. FIG. 4 is a plan view of the first sheet 10 on the inner face 10*a* side. FIG. 5 shows a cross section of the first sheet 10 taken along the line of FIG. 4.

The first sheet 10 includes the inner face 10*a*, an outer face 10*b* on the opposite side of the inner face 10*a*, and a side face 10*c* that couples the inner face 10*a* and the outer face 10*b* to form thickness. A pattern for flow paths where a working fluid refluxes is formed on the inner face 10*a* side. As described later, the inner face 10*a* of this first sheet 10 and an inner face 20*a* of the second sheet 20 are superposed so as to face each other, so that the hollow part is formed. This hollow part is the sealed space 2 when a working fluid is enclosed therein.

As can be seen from FIG. 5, in the present embodiment, the first sheet 10 has an inner layer 10*d* that is a layer made from a material constituting the inner face 10*a*, and an outer layer 10*e* that is a layer made from a material constituting the outer face 10*b*. That is, the first sheet 10 comprises a plurality of laminated layers: one of the layers forms the inner face 10*a*; and another one of the layers forms the outer face 10*b*.

In the present embodiment, the side face 10*c* is formed of the end face of the inner layer 10*d* and the end face of the outer layer 10*e*.

Here, as described above, a pattern for a working fluid to move is provided on the first sheet 10 on the inner face 10*a* side. The inner layer 10*d* forms a face of this pattern which a working fluid is in direct contact with. Therefore, the inner layer 10*d* is preferably made from a material that is chemically stable in a working fluid and that has high thermal conductivity. More specifically, for example, copper or a copper alloy may be used. In particular, the use of copper or a copper alloy leads to suppression of the reaction with a working fluid (particularly water) and also the achievement of an improvement in the heat transport capability, and further, easy production of the vapor chamber as described later.

On the outer layer 10*e*, the inner layer 10*d* is laminated on the inner face 10*a* side. The outer layer 10*e* also forms the outer face 10*b*.

The pattern formed on the first sheet 10 on the inner face 10*a* side is provided on the outer layer 10*e* on the side in contact with the inner layer 10*d*. As described above, the portion of the outer layer 10*e* corresponding to this pattern forms flow paths, but is covered with the inner layer 10*d* so as not to be in direct contact with a working fluid. That is, grooves to be flow paths for a working fluid (condensate flow paths and vapor flow paths) are formed in the outer layer 10*e*, and the inner layer 10*d* is laminated inside the grooves.

In the present embodiment, a face of the outer layer 10*e* which is to be the outer face 10*b* is a flat face, a little uneven face, or the like in view of contact with a component to be disposed on the vapor chamber 1.

Therefore, in the present embodiment, the outer layer 10*e* is configured so that the distance (i.e., thickness) between the face on the inner face 10*a* side and in contact with the inner layer 10*d*, and the outer face 10*b* is different between positions in the x-direction and between positions in the y-direction.

This makes it possible to maintain the strength as a vapor chamber even when a vapor chamber with flow paths is slimmed.

Therefore, the outer layer 10*e* is preferably made from a material having higher strength than the inner layer 10*d*. Specifically, the 0.2% proof stress or upper yield point of the outer layer 10*e* is preferably greater than that of the inner layer 10*d*. The material of the outer layer 10*e* is not particularly limited as long as satisfying the above. For higher strength, the 0.2% proof stress or upper yield point of the outer layer 10*e* is preferably at least 100 MPa, and more preferably at least 200 MPa.

This makes it possible to suppress deformation of and damage to a vapor chamber by force of, for example, an external shock, expansion of a working fluid due to its solidification by low temperature freezing, or the vapor pressure in operation even when the vapor chamber with desired flow paths is slimmed.

In addition, because the strength of the vapor chamber can be improved with the outer layer 10*e* in this way, the limit on the strength of the pattern of flow paths where a working fluid moves, which is formed on the inner face 10*a* side, can be reduced, so that a design focusing on an improvement in thermal performance can be created on this pattern. Thus, it can be said that this is also advantageous in view of thermal performance.

The material constituting the outer layer 10*e* is not particularly limited, but preferably has high thermal conductivity in view of dispersion of heat. This thermal conductivity is preferably at least 10 W/m·K. In view of this, examples of the material constituting the outer layer 10*e* include ferrous materials such as stainless steel, invariant steel and Kovars, titanium alloys, and nickel alloys. A composite material containing: any of the above metals; and a fine particle of diamond, alumina, silicon carbide, or the like may be also used.

The thickness of the inner layer 10*d* is in view of the specifications, and is not particularly limited. This thickness is preferably 5 μm to 20 μm. The inner layer 10*d* having a thickness less than 5 μm leads to a more likely possibility that the material of the outer layer 10*e* and a working fluid affect each other. The inner layer 10*d* having a thickness more than 20 μm leads to more likely possibilities that difficulties arise in manufacture, that it becomes difficult to satisfy the requirements of the thickness including in-plane nonuniformity, and that the surface becomes rough.

The thickness of the outer layer 10*e* is not particularly limited because dependent on the specifications. This thickness is preferably 0.02 mm to 0.5 mm in any portion. The outer layer 10*e* including a portion having a thickness less than 0.02 mm may lead to a minor effect of suppressing the deformation. The outer layer 10*e* including a portion having a thickness more than 0.5 mm prevents heat from transferring from the vapor chamber to the outside, and makes it difficult to satisfy the specifications of the thickness.

The thickness of such a first sheet 10 is the total of that of the inner layer 10*d* and that of the outer layer 10*e*. A specific thickness of the first sheet 10 is not particularly limited. This thickness is preferably at most 1.0 mm, and may be at most 0.75 mm, and may be at most 0.5 mm. This thickness is preferably at least 0.02 mm, and may be at least 0.05 mm, and may be at least 0.1 mm. The range of this thickness may be defined by a combination of any one of the foregoing plural candidate values for the upper limit and any one of the foregoing plural candidate values for the lower limit. The range of this thickness may be also defined by a combination of any two of the plural candidate values for the upper limit or a combination of any two of the plural candidate values for the lower limit.

This makes it possible to apply a slim vapor chamber to more situations. This also makes it possible to suppress deformation of and damage to a vapor chamber by force of, for example, an external shock, expansion of a working fluid due to its solidification by low temperature freezing, or the vapor pressure in operation even when the vapor chamber with desired flow paths is slimmed.

Such a first sheet 10 includes a main body 11 and an inlet part 12. The main body 11 is in the form of a sheet and forms a portion where a working fluid refluxes. In the present embodiment, the main body 11 is a rectangle having the corners in the form of circular arcs (what is called R) from a plan view. As described above, the inner face 10*a* of the main body 11 and of the inlet part 12 is formed of the inner layer 10*d*, and the outer face 10*b* thereof is formed of the outer layer 10*e*.

The inlet part 12 is a portion via which a working fluid is poured into the hollow part formed by the first sheet 10 and the second sheet 20. In the present embodiment, the inlet part 12 is in the form of a sheet of a quadrangle from a plan view which sticks out of one side of the main body 11, which is a rectangle from a plan view. In the present embodiment, the inlet part 12 of the first sheet 10 is formed to have flat faces on both the inner face 10*a* side and the outer face 10*b* side.

A structure for refluxing a working fluid is formed in the main body 11 on the inner face 10*a* side. Other than a quadrangle like the present embodiment, the main body 11 may have: a shape of a circle, an ellipse, a triangle, and any other polygon; a shape having any bend such as an L-shape, a T-shape, and a crank-shape; or a shape of a combination of at least two of them.

The main body 11 is configured to include a peripheral bonding part 13, a peripheral fluid flow path part 14, inner side fluid flow path parts 15, vapor flow path grooves 16 and vapor flow path communicating grooves 17 on the inner face 10*a* side.

The peripheral bonding part 13 is a face formed on the main body 11 on the inner face 10*a* side along the periphery of the main body 11. This peripheral bonding part 13 is superposed on, and bonded (diffusion bonding, brazing, or the like) to a peripheral bonding part 23 of the second sheet 20, so that the hollow part is formed between the first sheet 10 and the second sheet 20. This hollow part is the sealed space 2 when a working fluid is enclosed therein.

The peripheral bonding part 13 has a width (a size in a direction orthogonal to the extending direction thereof, or a width on the bonding face to the second sheet 20) indicated by $W_1$ in FIGS. 4 and 5 which may be suitably set as necessary. This width $W_1$ is preferably at most 3.0 mm, and may be at most 2.5 mm, and may be at most 2.0 mm. The width $W_1$ larger than 3 mm leads to a smaller internal volume of the sealed space, which may make it impossible to sufficiently secure vapor flow paths and condensate flow paths. The width $W_1$ is preferably at least 0.2 mm, and may be at least 0.6 mm, and may be at least 0.8 mm. The width $W_1$ smaller than 0.2 mm may lead to lack of the bonding area when there is a positional deviation in the bonding of the first sheet and the second sheet. The range of the width $W_1$ may be defined by a combination of any one of the foregoing plural candidate values for the upper limit, and any one of the foregoing plural candidate values for the lower limit. The range of the width $W_1$ may be also defined by a combination of any two of the plural candidate values for the upper limit, or a combination of any two of the plural candidate values for the lower limit.

Holes 13*a* penetrating in the thickness direction (z-direction) are made in the peripheral bonding part 13 at the four corners of the main body 11. These holes 13*a* function for positioning when the first sheet 10 is superposed on the second sheet 20.

Figure 6:
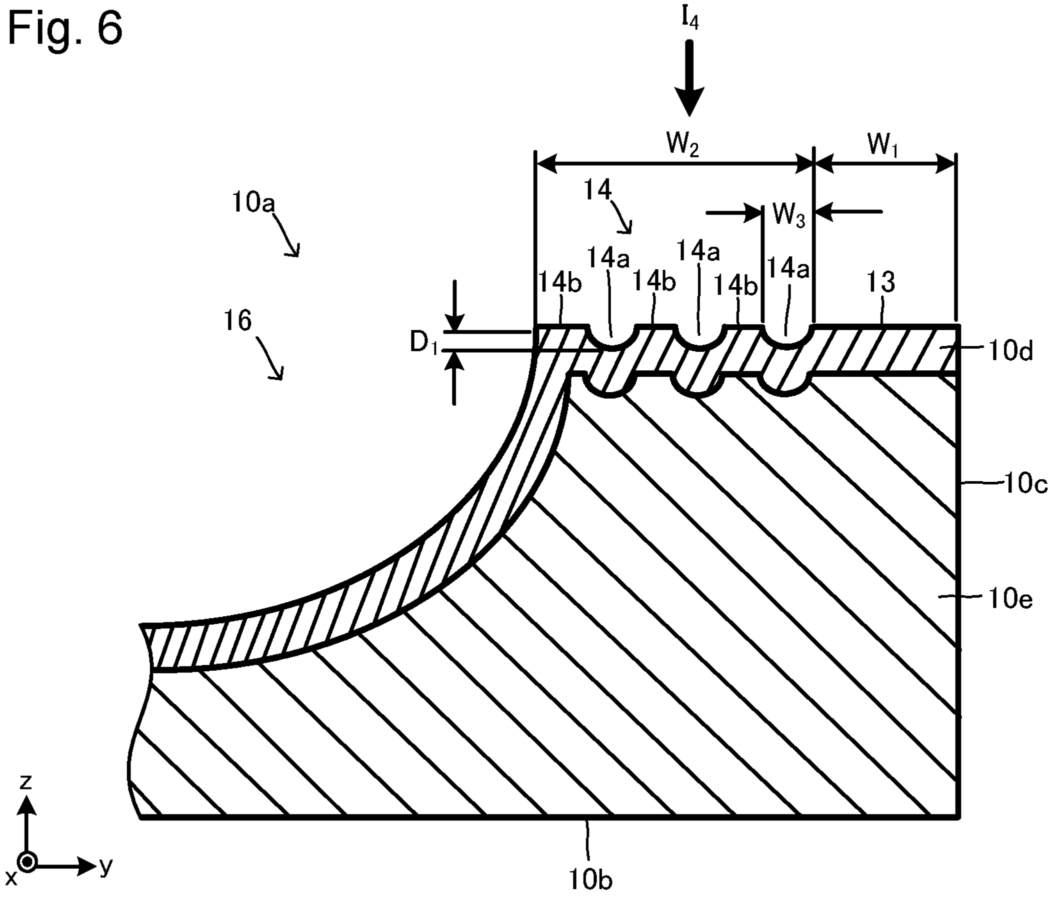
FIG. 6 shows another cross section of the first sheet 10.
Figure 7:
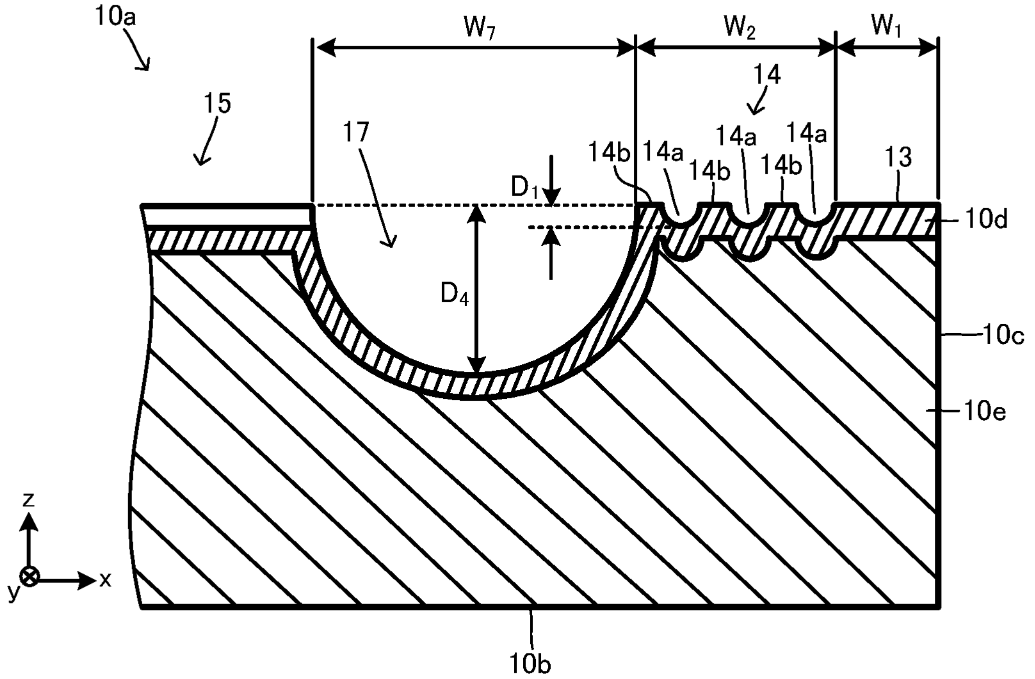
FIG. 7 shows another cross section of the first sheet 10.
Figure 8:
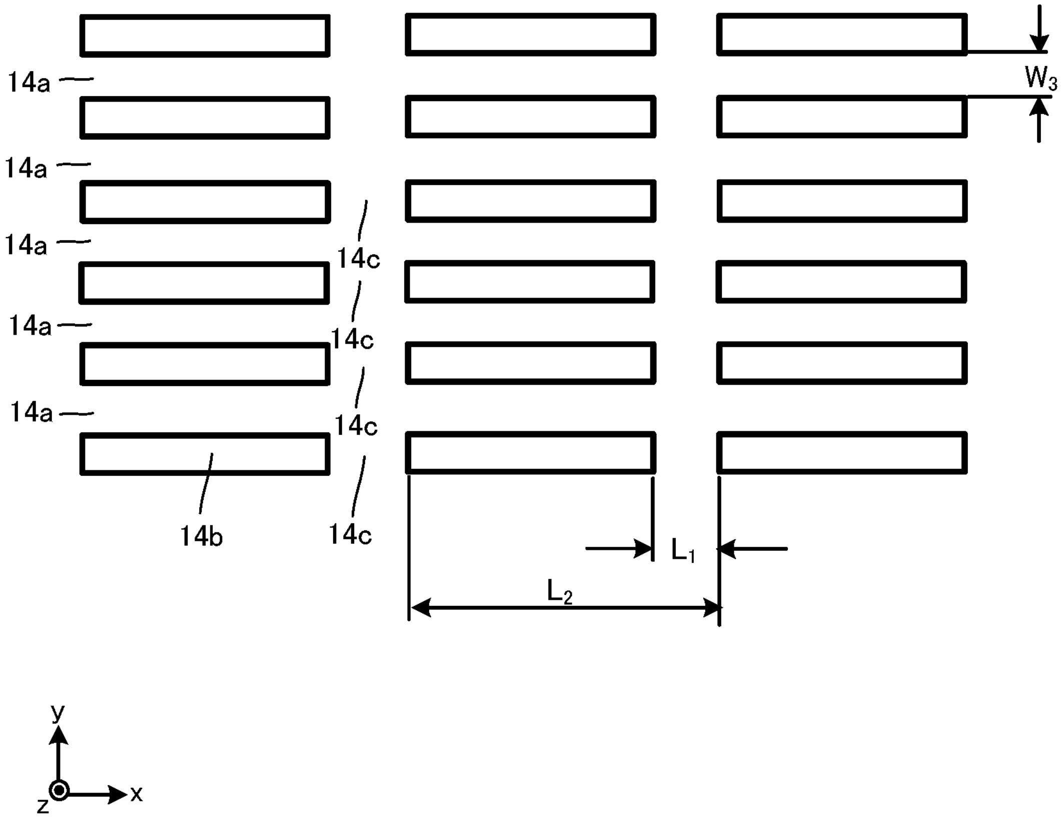
FIG. 8 is a partially enlarged plan view of a peripheral fluid flow path part 14.

The peripheral fluid flow path part 14 functions as a fluid flow path part, and is a portion that forms a part of condensate flow paths 3 that are the second flow paths where a condensed and liquified working fluid passes. FIG. 6 shows a cross section of a portion indicated by the arrow $I_2$ in FIG. 5. FIG. 7 shows a cross section of a portion taken along the line $I_3$-$I_3$ in FIG. 4. Both the drawings show cross-sectional shapes of the peripheral fluid flow path part 14. FIG. 8 is an enlarged plan view of the peripheral fluid flow path part 14 in the direction indicated by the arrow $I_4$ in FIG. 6.

As can be seen in these drawings, the peripheral fluid flow path part 14 is formed on the inner face 10*a* of the main body 11 along the inside of the peripheral bonding part 13, and is provided along the periphery of the sealed space 2. Fluid flow path grooves 14*a* that are a plurality of grooves extending parallel to the direction of the periphery of the main body 11 are formed in the peripheral fluid flow path part 14. A plurality of the fluid flow path grooves 14*a* are arranged at given intervals in a direction different from the extending direction thereof. Thus, as can be seen in FIGS. 6 and 7, the fluid flow path grooves 14*a*, which are depressions, and protrusions 14*b* among the fluid flow path grooves 14*a* are formed on the peripheral fluid flow path part 14 as the depressions and the protrusions are repeated in a cross section of the peripheral fluid flow path part 14 on the inner face 10*a* side.

These fluid flow path grooves 14*a* are grooves formed by laminating the inner layer 10*d* on the insides of the grooves formed in the outer layer 10*e*.

By including a plurality of the fluid flow path grooves 14*a* in this way, each of the fluid flow path grooves 14*a* can have smaller depth and width, and each of the condensate flow paths 3, which are the second flow paths (see FIG. 20 etc.), can have a smaller flow path cross-sectional area, so that a greater capillary force can be used. A plurality of the fluid flow path grooves 14*a* make it possible to secure a suitable magnitude of the total flow path cross-sectional area of the condensate flow paths 3 as a whole, which allows a condensate of a necessary flow rate to flow.

Here, since being grooves, the fluid flow path grooves 14*a* each have a bottom portion provided on the outer face 10*b* side, and an opening provided on the inner face 10*a* side, which is the opposite side of the bottom portion, facing the bottom portion, in a cross-sectional shape thereof.

In the present embodiment, the fluid flow path grooves 14*a* each have a semi-elliptical cross-sectional shape. This cross-sectional shape is not limited to a semi-elliptical shape, and may be a circle, a quadrangle such as a rectangle, a square and a trapezoid, any other polygon, or a shape of a combination of any of them.

Figure 9:
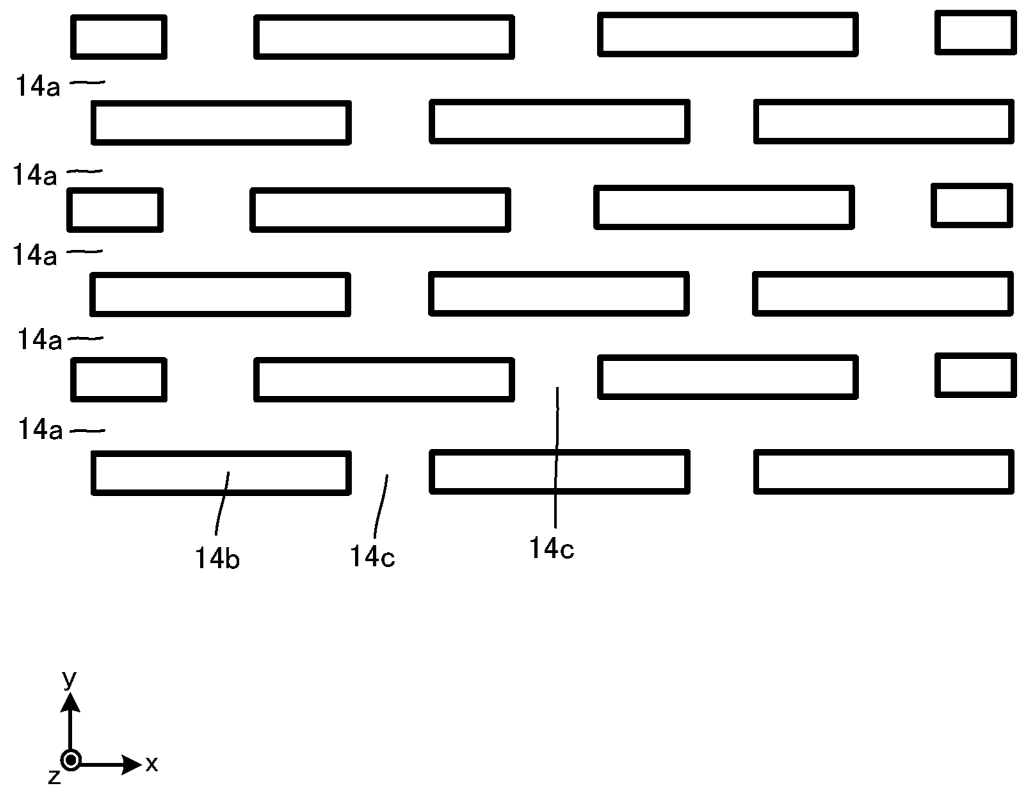
FIG. 9 is a partially enlarged plan view of the peripheral fluid flow path part 14 according to another example.

Further, in the present embodiment, in the peripheral fluid flow path part 14, as can be seen in FIG. 8, any adjacent ones of the fluid flow path grooves 14*a* communicate with each other via communicating opening parts 14*c* at given intervals. This promotes the equality of the amount of a condensate among a plurality of the fluid flow path grooves 14*a*, allows the condensate to efficiently flow, and allows a working fluid to smoothly reflux. In the present embodiment, as shown in FIG. 8, the communicating opening parts 14*c* are arranged so as to face each other across the respective fluid flow path grooves 14*a* at the same position in the extending direction of the fluid flow path grooves 14*a*. The communicating opening parts 14*c* are not limited to this, but for example, as shown in FIG. 9, may be arranged at different positions across each of the fluid flow path grooves 14*a* in the extending direction of the fluid flow path grooves 14*a*. That is, the protrusions 14*b* and the communicating opening parts 14*c* may be alternately arranged in a direction orthogonal to the extending direction of the fluid flow path grooves.

Figure 10:
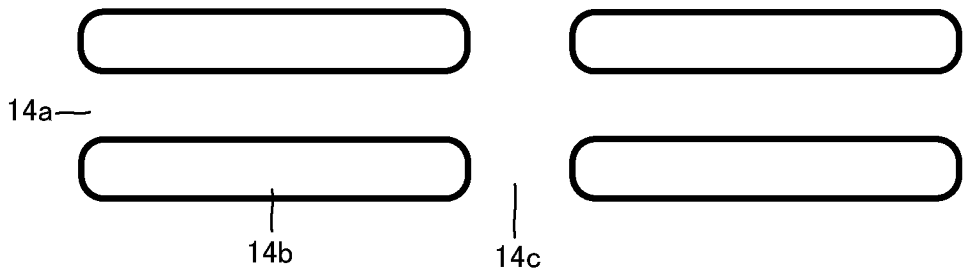
FIG. 10 is a partially enlarged plan view of the peripheral fluid flow path part 14 according to another example.
Figure 11:
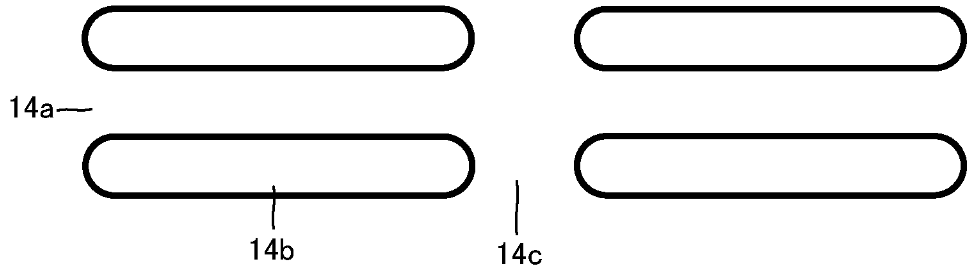
FIG. 11 is a partially enlarged plan view of the peripheral fluid flow path part 14 according to another example.
Figure 12:
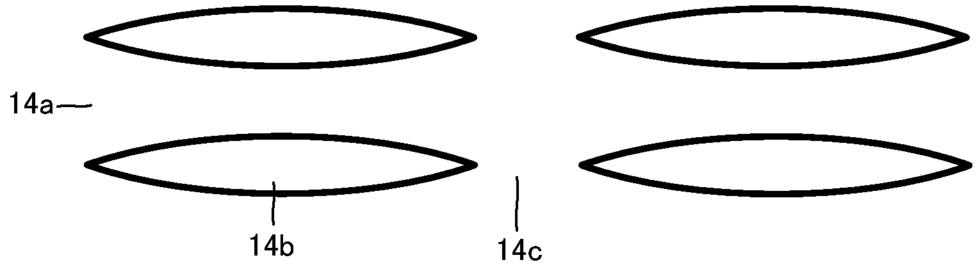
FIG. 12 is a partially enlarged plan view of the peripheral fluid flow path part 14 according to another example.

Other than the foregoing, for example, the communicating opening parts 14*c* may be as shown in FIGS. 10 to 12. FIGS. 10 to 12 each show one of the fluid flow path grooves 14*a*, two of the protrusions 14*b* with this flow path 14*a* therebetween, and one of the communicating opening parts 14*c* that is provided in each of the protrusions 14*b*, from the same viewpoint as FIG. 8. The shapes of the protrusions 14*b* and the communicating opening parts 14*c* in the examples shown in these drawings are different from those in the example in FIG. 8, from this viewpoint (plan view).

That is, the width of each of the protrusions 14*b* shown in FIG. 8 is the same at the ends thereof where the communicating opening parts 14*c* are formed and in any other portions thereof, and is constant. In contrast, the protrusions 14*b* having the shapes shown in any of FIGS. 10 to 12 are formed so as to each have a smaller width at the ends thereof, where the communicating opening parts 14*c* are formed, than the respective maximum width thereof. More specifically, in the example of FIG. 10, the corners at the ends of the protrusions 14*b* are in the form of circular arcs to form R, which results in smaller widths at the ends; in the example of FIG. 11, the ends are formed to be in the form of semicircles, which results in smaller widths at the ends; and in the example of FIG. 12, the ends taper so as to be pointed.

As shown in FIGS. 10 to 12, the ends of the protrusions 14*b*, where the communicating opening parts 14*c* are formed, are formed so as to each have a smaller width than the respective maximum width of the protrusions 14*b*, which makes it easy for a working fluid to move through the communicating opening parts 14*c*, and makes it easy for the working fluid to move between adjacent ones of the condensate flow paths 3.

Preferably, the peripheral fluid flow path part 14 having the foregoing structure further has the following structure.

The peripheral fluid flow path part 14 has a width (a size in the aligning direction of the fluid flow path grooves 14*a*, or a width on the bonding face to the second sheet 20) indicated by $W_2$ in FIGS. 4 to 7 which may be suitably set according to, for example, the size of the whole of the vapor chamber. The width $W_2$ is preferably at most 3.0 mm, and may be at most 1.5 mm, and may be at most 1.0 mm. The width $W_2$ more than 3.0 mm may make it impossible to sufficiently secure a space for inside fluid flow paths and vapor flow paths. The width $W_2$ is preferably at least 0.1 mm, and may be at least 0.2 mm, and may be at least 0.4 mm. The width $W_2$ less than 0.1 mm may make it impossible to obtain a sufficient amount of a fluid refluxing through the periphery. The range of the width $W_2$ may be defined by a combination of any one of the foregoing plural candidate values for the upper limit and any one of the foregoing plural candidate values for the lower limit. The range of the width $W_2$ may be also defined by a combination of any two of the plural candidate values for the upper limit or a combination of any two of the plural candidate values for the lower limit.

Figure 17:
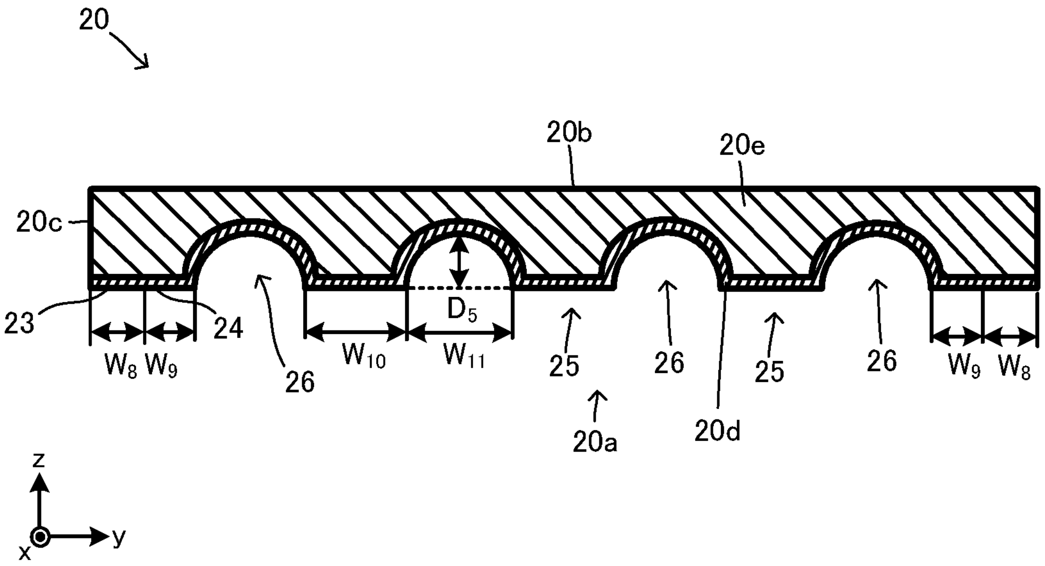
FIG. 17 shows a cross section of the second sheet 20.

The width $W_2$ may be the same as, or larger or smaller than a width $W_9$ of a peripheral fluid flow path part 24 of the second sheet 20 (see FIG. 17). In this embodiment, the width $W_2$ is the same as the width $W_9$.

The groove width of each of the fluid flow path grooves 14*a* (the size in the aligning direction of the fluid flow path grooves 14*a*, or the width on the opening face of each of the grooves) which is indicated by $W_3$ in FIGS. 6 and 8 is preferably at most 1000 μm, and may be at most 500 μm, and may be at most 200 μm. The width $W_3$ is preferably at least 20 μm, and may be at least 45 μm, and may be at least 60 μm. The range of the width $W_3$ may be defined by a combination of any one of the foregoing plural candidate values for the upper limit and any one of the foregoing plural candidate values for the lower limit. The range of the width $W_3$ may be also defined by a combination of any two of the plural candidate values for the upper limit or a combination of any two of the plural candidate values for the lower limit.

The depth of the grooves which is indicated by $D_1$ in FIGS. 6 and 7 is preferably at most 200 μm, and may be at most 150 μm, and may be at most 100 μm. The depth $D_1$ is preferably at least 5 μm, and may be at least 10 μm, and may be at least 20 μm. The range of the depth $D_1$ may be defined by a combination of any one of the foregoing plural candidate values for the upper limit and any one of the foregoing plural candidate values for the lower limit. The range of the depth $D_1$ may be also defined by a combination of any two of the plural candidate values for the upper limit or a combination of any two of the plural candidate values for the lower limit.

The structure as described above makes it possible to more strongly exert the capillary force of the condensate flow paths, which is necessary for reflux.

In view of more strongly exerting the capillary force of the condensate flow paths, the aspect ratio on a flow path cross section which is represented by the value obtained by dividing the width $W_3$ by the depth $D_1$ is preferably higher than 1.0. This ratio may be at least 1.5, and may be at least 2.0. This aspect ratio may be lower than 1.0. This ratio may be at most 0.75, and may be at most 0.5.

Among them, in view of manufacture, $W_3$ is preferably more than $D_1$, and in such a view, the aspect ratio is preferably higher than 1.3.

The pitch for adjacent ones of the fluid flow path grooves 14*a* is preferably at most 1100 μm, and may be at most 550 μm, and may be at most 220 μm. This pitch is preferably at least 30 μm, and may be at least 55 μm, and may be at least 70 μm. The range of this pitch may be defined by a combination of any one of the foregoing plural candidate values for the upper limit and any one of the foregoing plural candidate values for the lower limit. The range of the pitch may be also defined by a combination of any two of the plural candidate values for the upper limit or a combination of any two of the plural candidate values for the lower limit.

This makes it possible to increase the density of the condensate flow paths, and also to suppress deformation and crushing of the condensate flow paths in bonding or assembling. The size of the opening part of each of the communicating opening parts 14*c* in the extending direction of the fluid flow path grooves 14*a* which is indicated by $L_1$ in FIG. 8 is preferably at most 1100 μm, and may be at most 550 μm, and may be at most 220 μm. The size $L_1$ is preferably at least 30 μm, and may be at least 55 μm, and may be at least 70 μm.

The range of the size $L_1$ may be defined by a combination of any one of the foregoing plural candidate values for the upper limit and any one of the foregoing plural candidate values for the lower limit. The range of the size $L_1$ may be also defined by a combination of any two of the plural candidate values for the upper limit or a combination of any two of the plural candidate values for the lower limit.

The pitch for adjacent ones of the communicating opening parts 14*c* in the extending direction of the fluid flow path grooves 14*a* which is indicated by $L_2$ in FIG. 8 is preferably at most 2700 μm, and may be at most 1800 μm, and may be at most 900 μm. This pitch $L_2$ is preferably at least 60 μm, and may be at least 110 μm, and may be at least 140 μm. The range of this pitch $L_2$ may be defined by a combination of any one of the foregoing plural candidate values for the upper limit and any one of the foregoing plural candidate values for the lower limit. The range of the pitch $L_2$ may be also defined by a combination of any two of the plural candidate values for the upper limit or a combination of any two of the plural candidate values for the lower limit.

Figure 13:
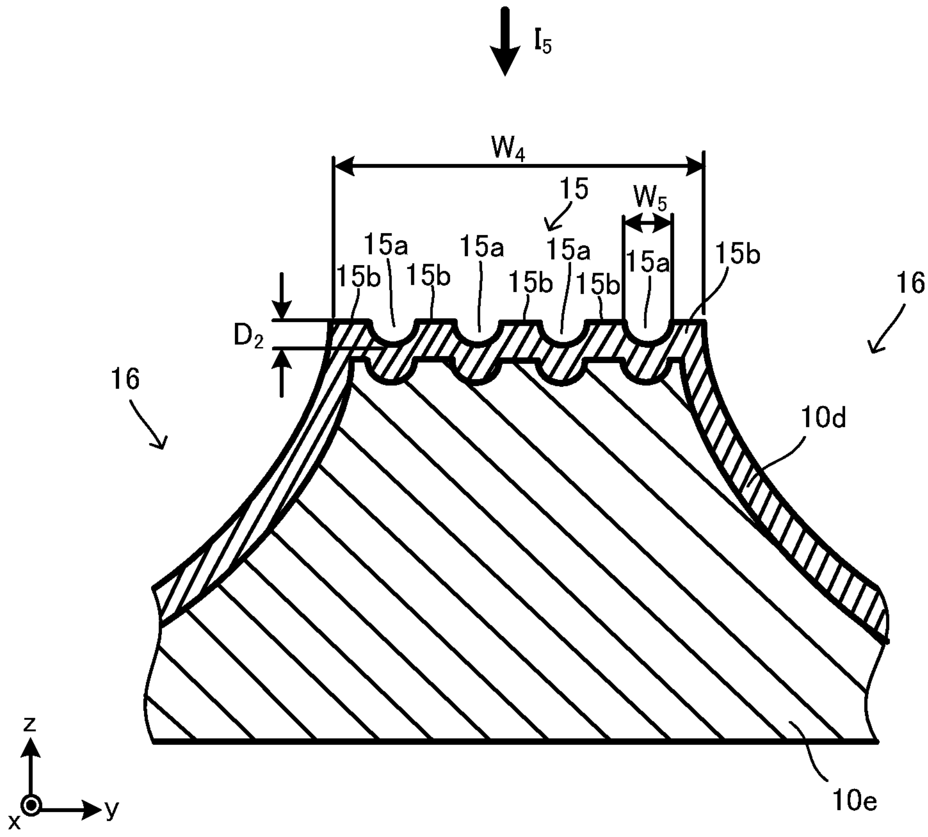
FIG. 13 shows a cross section focusing on an inner side fluid flow path part 15.
Figure 14:
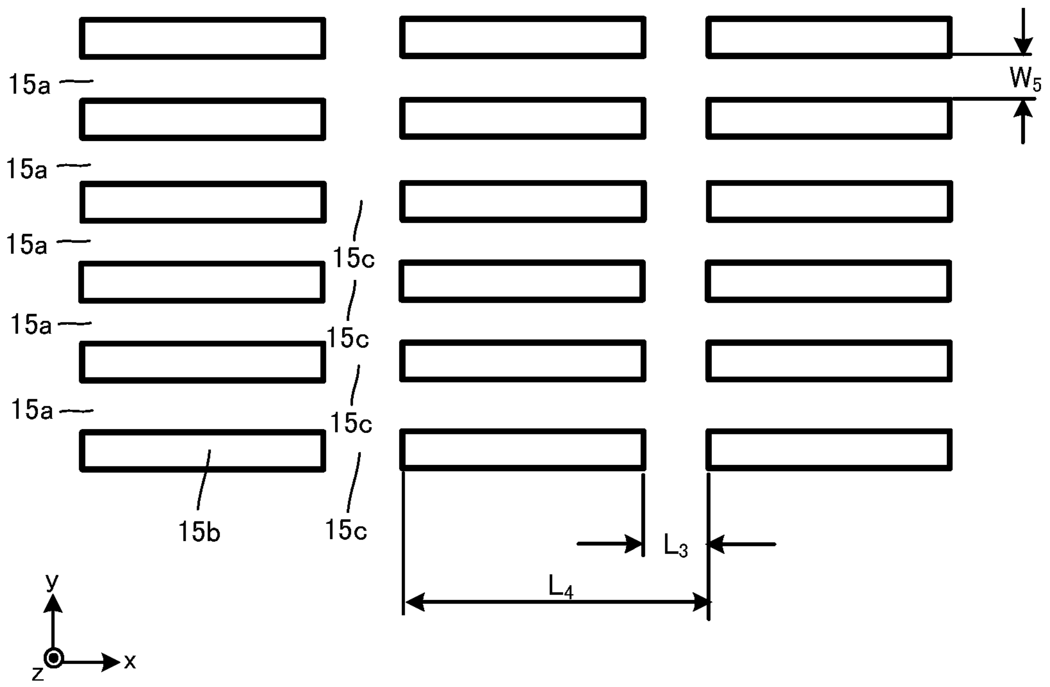
FIG. 14 is a partially enlarged plan view of the inner side fluid flow path part 15.

Returning to FIGS. 1 to 5, the inner side fluid flow path parts 15 will be described. The inner side fluid flow path parts 15 also function as fluid flow path parts, and are portions that form a part of the condensate flow paths 3, which are the second flow paths where a condensed and liquified working fluid passes. FIG. 13 shows a portion indicated by $I_4$ in FIG. 5. This drawing also shows a cross-sectional shape of the inner side fluid flow path parts 15. FIG. 14 shows an enlarged plan view of the inner side fluid flow path parts 15 in the direction indicated by the arrow $I_5$ in FIG. 13.

As can be seen from these drawings, the inner side fluid flow path parts 15 are walls formed inside the annular ring of the peripheral fluid flow path part 14 on the inner face 10*a* of the main body 11. The inner side fluid flow path parts 15 according to the present embodiment are, as can be seen in FIGS. 3 and 4, walls extending in a direction parallel to the long sides of the rectangle of the main body 11 from a plan view (x-direction). The plural (three in the present embodiment) inner side fluid flow path parts 15 are aligned at given intervals in a direction parallel to the short sides of the rectangle of the main body 11 from a plan view (y-direction).

Fluid flow path grooves 15*a* that are grooves parallel to the extending direction of the inner side fluid flow path parts 15 are formed in each of the inner side fluid flow path parts 15. A plurality of the fluid flow path grooves 15*a* are arranged at given intervals in a direction different from the extending direction thereof. Thus, as can be seen in FIGS. 5 and 13, the fluid flow path grooves 15*a*, which are depressions, and protrusions 15*b* among the fluid flow path grooves 15*a* are formed on each of the inner side fluid flow path parts 15 as the depressions and the protrusions are repeated in a cross section of the inner side fluid flow path parts 15 on the inner face 10*a* side. These fluid flow path grooves 15*a* are grooves formed by laminating the inner layer 10*d* on the insides of the grooves formed in the outer layer 10*e*.

By including a plurality of the fluid flow path grooves 15*a* in this way, each of the fluid flow path grooves 15*a* can have smaller depth and width, and each of the condensate flow paths 3 as the second flow paths (see FIG. 20 etc.) can have a smaller flow path cross-sectional area, so that a greater capillary force can be used. A plurality of the fluid flow path grooves 15*a* make it possible to secure a suitable magnitude of the total flow path cross-sectional area of the condensate flow paths 3 as a whole, which allows a condensate of a necessary flow rate to flow.

Here, since being grooves, the fluid flow path grooves 15*a* each have a bottom portion provided on the outer face 10*b* side, and an opening that is a portion facing the bottom portion on the opposite side of the bottom portion, and is provided on the inner face 10*a* side, in a cross-sectional shape thereof.

In the present embodiment, the fluid flow path grooves 15*a* each have a semi-elliptical cross-sectional shape. This cross-sectional shape is not limited to a semi-elliptical shape, and may be a circle, a quadrangle such as a rectangle, a square and a trapezoid, any other polygon, or a shape of a combination of any of them.

Further, as can be seen in FIG. 14, any adjacent ones of the fluid flow path grooves 15*a* communicate with each other via communicating opening parts 15*c* at given intervals. This promotes the equality of the amount of a condensate among a plurality of the fluid flow path grooves 15*a*, allows the condensate to efficiently flow, and allows a working fluid to smoothly reflux.

The protrusions 15*b* and the communicating opening parts 15*c* may be also alternately arranged in a direction orthogonal to the extending direction of the fluid flow path grooves 15*a* according to the example shown in FIG. 9 like the communicating opening parts 14*c*. The communicating opening parts 15*c* and the protrusions 15*b* may have the shapes according to any of the examples of FIGS. 10 to 12.

Preferably, the inner side fluid flow path parts 15 having the foregoing structure further include the following structure.

The width of each of the inner side fluid flow path parts 15 (the size in the aligning direction of the inner side fluid flow path parts 15 and the vapor flow path grooves 16, or the width on the bonding face to the second sheet 20) which is indicated by $W_4$ in FIGS. 4, 5 and 13 is preferably at most 3000 μm, and may be at most 1500 μm, and may be at most 1000 μm. This width $W_4$ is preferably at least 100 μm, and may be at least 200 μm, and may be at least 400 μm. The range of this width $W_4$ may be defined by a combination of any one of the foregoing plural candidate values for the upper limit, and any one of the foregoing plural candidate values for the lower limit. The range of the width G may be also defined by a combination of any two of the plural candidate values for the upper limit, or a combination of any two of the plural candidate values for the lower limit.

The width $W_4$ may be the same as, or larger or smaller than a width $W_{10}$ of each of inner side fluid flow path parts 25 of the second sheet (see FIG. 17). In this embodiment, the width $W_4$ is the same as the width $W_{10}$.

The pitch for a plurality of the inner side fluid flow path parts 15 is preferably at most 4000 μm, and may be at most 3000 μm, and may be at most 2000 μm. This pitch is preferably at least 200 μm, and may be at least 400 μm, and may be at least 800 μm. The range of this pitch may be defined by a combination of any one of the foregoing plural candidate values for the upper limit, and any one of the foregoing plural candidate values for the lower limit. The range of the pitch may be also defined by a combination of any two of the plural candidate values for the upper limit, or a combination of any two of the plural candidate values for the lower limit.

This results in lowered flow path resistance of the vapor flow paths, which makes it possible to move a vapor and to reflux a condensate in a well-balanced manner.

The width of each of the fluid flow path grooves 15*a* (the size in the aligning direction of the fluid flow path grooves 15*a*, or the width on the opening face of each of the grooves) which is indicated by $W_5$ in FIGS. 13 and 14 is preferably at most 1000 μm, and may be at most 500 μm, and may be at most 200 μm. This width $W_5$ is preferably at least 20 μm, and may be at least 45 μm, and may be at least 60 μm. The range of this width $W_5$ may be defined by a combination of any one of the foregoing plural candidate values for the upper limit, and any one of the foregoing plural candidate values for the lower limit. The range of the width $W_5$ may be also defined by a combination of any two of the plural candidate values for the upper limit, or a combination of any two of the plural candidate values for the lower limit.

The depth of the grooves which is indicated by $D_2$ in FIG. 13 is preferably at most 200 μm, and may be at most 150 μm, and may be at most 100 μm. This depth $D_2$ is preferably at least 5 μm, and may be at least 10 μm, and may be at least 20 μm. The range of this depth $D_2$ may be defined by a combination of any one of the foregoing plural candidate values for the upper limit, and any one of the foregoing plural candidate values for the lower limit. The range of the depth $D_2$ may be also defined by a combination of any two of the plural candidate values for the upper limit, or a combination of any two of the plural candidate values for the lower limit.

This makes it possible to strongly exert the capillary force of the condensate flow paths, which is necessary for reflux.

In view of more strongly exerting the capillary force of the flow paths, the aspect ratio on a flow path cross section which is represented by the value obtained by dividing the width $W_5$ by the depth $D_2$ is preferably higher than 1.0. This ratio may be at least 1.5, and may be at least 2.0. Or, the aspect ratio may be lower than 1.0, may be at most 0.75, and may be at most 0.5.

Among them, in view of manufacture, the width $W_5$ is preferably larger than the depth $D_2$, and in such a view, the aspect ratio is preferably higher than 1.3.

The pitch for adjacent ones of a plurality of the fluid flow path grooves 15*a* is preferably at most 1100 and may be at most 550 and may be at most 220. This pitch is preferably at least 30 and may be at least 55 and may be at least 70 The range of this pitch may be defined by a combination of any one of the foregoing plural candidate values for the upper limit and any one of the foregoing plural candidate values for the lower limit. The range of the pitch may be also defined by a combination of any two of the plural candidate values for the upper limit or a combination of any two of the plural candidate values for the lower limit.

This makes it possible to increase the density of the condensate flow paths, and also to suppress deformation and crushing of the flow paths in bonding or assembling.

Further, the size of the opening part of each of the communicating opening parts 15*c* in the extending direction of the fluid flow path grooves 15*a* which is indicated by $L_3$ in FIG. 14 is preferably at most 1100 and may be at most 550 and may be at most 220 This size $L_3$ is preferably at least 30 and may be at least 55 and may be at least 70 μm. The range of this size $L_3$ may be defined by a combination of any one of the foregoing plural candidate values for the upper limit and any one of the foregoing plural candidate values for the lower limit. The range of the size $L_3$ may be also defined by a combination of any two of the plural candidate values for the upper limit or a combination of any two of the plural candidate values for the lower limit.

The pitch for adjacent ones of the communicating opening parts 15*c* in the extending direction of the fluid flow path grooves 15*a* which is indicated by $L_4$ in FIG. 14 is preferably at most 2700 μm, and may be at most 1800 μm, and may be at most 900 μm. This pitch $L_4$ is preferably at least 60 μm, and may be at least 110 μm, and may be at least 140 μm. The range of this pitch $L_4$ may be defined by a combination of any one of the foregoing plural candidate values for the upper limit and any one of the foregoing plural candidate values for the lower limit. The range of the pitch $L_4$ may be also defined by a combination of any two of the plural candidate values for the upper limit or a combination of any two of the plural candidate values for the lower limit.

The fluid flow path grooves 14*a* according to the present embodiment are separated at regular intervals from and arranged in parallel to each other, and the fluid flow path grooves 15*a* according to the present embodiment are separated at regular intervals from and arranged in parallel to each other. The fluid flow path grooves 14*a* and 15*a* are not limited to this. As long as the capillary action can be brought about, the pitches for the grooves may be irregular, and the grooves do not have to be in parallel to each other.

Next, the vapor flow path grooves 16 will be described. The vapor flow path grooves 16 are portions where a vapor that is a vaporized and gasified working fluid passes, and form a part of vapor flow paths 4 which are the first flow paths (see, for example, FIG. 19). FIG. 4 is a plan view showing the shape of the vapor flow path grooves 16. FIG. 5 shows a cross-sectional shape of each of the vapor flow path grooves 16.

As can be seen in these drawings, the vapor flow path grooves 16 are formed of grooves that are formed inside the annular ring of the peripheral fluid flow path part 14 on the inner face 10*a* of the main body 11. Specifically, the vapor flow path grooves 16 according to the present embodiment are grooves formed between adjacent ones of the inner side fluid flow path parts 15 and between the peripheral fluid flow path part 14 and the inner side fluid flow path parts 15, and extending in a direction parallel to the long sides of the rectangle of the main body 11 from a plan view (x-direction). The plural (four in the present embodiment) vapor flow path grooves 16 are aligned in a direction parallel to the short sides of the rectangle of the main body 11 from a plan view (y-direction). Thus, as can be seen in FIG. 5, the first sheet 10 has a shape of repeated depressions and protrusions in the y-direction: the protrusions are walls that are the peripheral fluid flow path part 14 and the inner side fluid flow path parts 15; and the depressions are the vapor flow path grooves 16.

Here, since being grooves, the vapor flow path grooves 16 each have a bottom portion on the outer face 10*b* side, and an opening on the opposite side of the bottom portion, facing the bottom portion, and on the inner face 10*a* side, in a cross-sectional shape thereof.

These vapor flow path grooves 16 are grooves formed by laminating the inner layer 10*d* inside the grooves formed in the outer layer 10*e*.

Preferably, the vapor flow path grooves 16 having such a structure further include the following structure.

The width of each of the vapor flow path grooves 16 (the size in the aligning direction of the inner side fluid flow path parts 15 and the vapor flow path grooves 16, or the width on the opening face of each of the grooves) which is indicated by $W_6$ in FIGS. 4 and 5 is formed to be at least larger than the width $W_3$ of each of the fluid flow path grooves 14*a* and than the width $W_5$ of each of the fluid flow path grooves 15*a*, and is preferably at most 2000 μm, and may be at most 1500 μm, and may be at most 1000 μm. This width $W_6$ is preferably at least 100 μm, and may be at least 200 μm, and may be at least 400 μm. The range of this width $W_6$ may be defined by a combination of any one of the foregoing plural candidate values for the upper limit, and any one of the foregoing plural candidate values for the lower limit. The range of the width $W_6$ may be also defined by a combination of any two of the plural candidate values for the upper limit, or a combination of any two of the plural candidate values for the lower limit.

The pitch for the vapor flow path grooves 16 is usually fixed according to the pitch for the inner side fluid flow path parts 15.

The depth of the vapor flow path grooves 16 which is indicated by $D_3$ in FIG. 5 is formed to be at least larger than the depth $D_1$ of the fluid flow path grooves 14*a* and than the depth $D_2$ of the fluid flow path grooves 15*a*, and is preferably at most 300 μm, and may be at most 200 μm, and may be at most 100 μm. This depth $D_3$ is preferably at least 10 μm, and may be at least 25 μm, and may be at least 50 μm. The range of this depth $D_3$ may be defined by a combination of any one of the foregoing plural candidate values for the upper limit, and any one of the foregoing plural candidate values for the lower limit. The range of the depth $D_3$ may be also defined by a combination of any two of the plural candidate values for the upper limit, or a combination of any two of the plural candidate values for the lower limit.

A vapor flow path groove having a larger flow path cross-sectional area than a fluid flow path groove as described above makes it possible to smoothly reflux a vapor having a larger volume than a condensate due to the properties of a working fluid.

In the present embodiment, each of the vapor flow path grooves 16 has a semi-elliptical cross-sectional shape. This cross-sectional shape is not limited to this, but may be a quadrangle such as a rectangle, a square and a trapezoid, a triangle, a semicircle, a semicircle at the bottom, a semi-ellipse at the bottom, or any combination of some of them. Because a lowered flow resistance of a vapor makes it possible to smoothly reflux a working fluid in a vapor flow path, the flow path cross-sectional shape may be also determined in such a view.

The present embodiment has described the example of the vapor flow path grooves 16 formed between adjacent ones of the inner side fluid flow path parts 15. The vapor flow path grooves 16 are not limited to this. At least two vapor flow path grooves may be aligned between adjacent inner side fluid flow path parts.

No vapor flow path groove may be formed in part or all of the first sheet 10 as long as the vapor flow path grooves are formed in the second sheet 20.

The vapor flow path communicating grooves 17 are grooves allowing a plurality of the vapor flow path grooves 16 to communicate. This makes it possible to achieve the equality of a vapor in a plurality of the vapor flow path grooves 16, and to convey the vapor into a wider area and efficiently use much part of the condensate flow paths 3, which make it possible to more smoothly reflux a working fluid.

As can be seen from FIGS. 3 and 4, the vapor flow path communicating grooves 17 according to the present embodiment are formed between the peripheral fluid flow path part 14 and both ends of the inner side fluid flow path parts 15 and the vapor flow path grooves 16 in their extending direction. FIG. 7 shows a cross section orthogonal to the communicating direction of the vapor flow path communicating grooves 17 which is the cross section taken along the line $I_3$-$I_3$ in FIG. 4.

For clarity, FIGS. 2 to 4 show portions to be the borders between the vapor flow path grooves 16 and the vapor flow path communicating grooves 17 in the dotted line. This line is not a line always appearing according to the shape, but an imaginary line given for clarity.

The shape of the vapor flow path communicating grooves 17 is not particularly limited as long as the vapor flow path communicating grooves 17 are formed to allow adjacent ones of the vapor flow path grooves 16 to communicate. For example, the vapor flow path communicating grooves 17 can have the following structure.

The width of each of the vapor flow path communicating grooves 17 (the size in a direction orthogonal to the communicating direction, or the width on the opening face of each of the grooves) which is indicated by $W_7$ in FIGS. 4 and 7 is preferably at most 1000 μm, and may be at most 750 μm, and may be at most 500 μm. This width $W_7$ is preferably at least 100 μm, and may be at least 150 μm, and may be at least 200 μm. The range of this width $W_7$ may be defined by a combination of any one of the foregoing plural candidate values for the upper limit, and any one of the foregoing plural candidate values for the lower limit. The range of the width $W_7$ may be also defined by a combination of any two of the plural candidate values for the upper limit, or a combination of any two of the plural candidate values for the lower limit.

The depth of the vapor flow path communicating grooves 17 which is indicated by $D_4$ in FIG. 7 is preferably at most 300 μm, and may be at most 225 μm, and may be at most 150 μm. This depth $D_4$ is preferably at least 10 μm, and may be at least 25 μm, and may be at least 50 μm. The range of this depth $D_4$ may be defined by a combination of any one of the foregoing plural candidate values for the upper limit, and any one of the foregoing plural candidate values for the lower limit. The range of the depth $D_4$ may be also defined by a combination of any two of the plural candidate values for the upper limit, or a combination of any two of the plural candidate values for the lower limit.

In the present embodiment, each of the vapor flow path communicating grooves 17 has a semi-elliptical cross-sectional shape. This shape is not limited to this, but may be a quadrangle such as a rectangle, a square and a trapezoid, a triangle, a semicircle, a circle at the bottom, a semi-ellipse at the bottom, or any combination of a plurality of them.

Because a vapor flow path communicating groove leads to a lowered flow resistance of a vapor, which makes it possible to smoothly reflux a working fluid, the flow path cross-sectional shape may be also determined in such a view.

These vapor flow path communicating grooves 17 are also grooves formed of grooves provided in the outer layer 10*e*, and the inner layer 10*d* laminated inside these provided grooves.

In the present embodiment, the outer face 10*b* of the main body 11 is configured to be a flat face. This can improve the adhesiveness to a member to be closely adhered to the outer face 10*b* (such as an electronic component to be cooled, and a housing of an electronic device for heat to be transferred). The shape of the outer face 10*b* is not limited to this, but may have unevenness according to the purpose thereof.

Here, the shape of the outer face 10*b* does not correspond to the inner face 10*a*. The outer face 10*b* has a shape that can contribute to, for example, heat transfer which is the purpose thereof. This outer face 10*b* is formed of the outer layer 10*e* as described above. Thus, the thickness of the outer layer 10*e* is different between positions in the x-direction and between positions in the y-direction.

The inner face 10*a*, the outer face 10*b*, and the inner layer 10*d* and the outer layer 10*e* forming them, as the foregoing, make it possible to suppress deformation of and damage to a vapor chamber by force of, for example, an external shock, expansion of a working fluid due to its solidification by low temperature freezing, or the vapor pressure in operation even when the vapor chamber with desired flow paths is slimmed.

Figure 15:
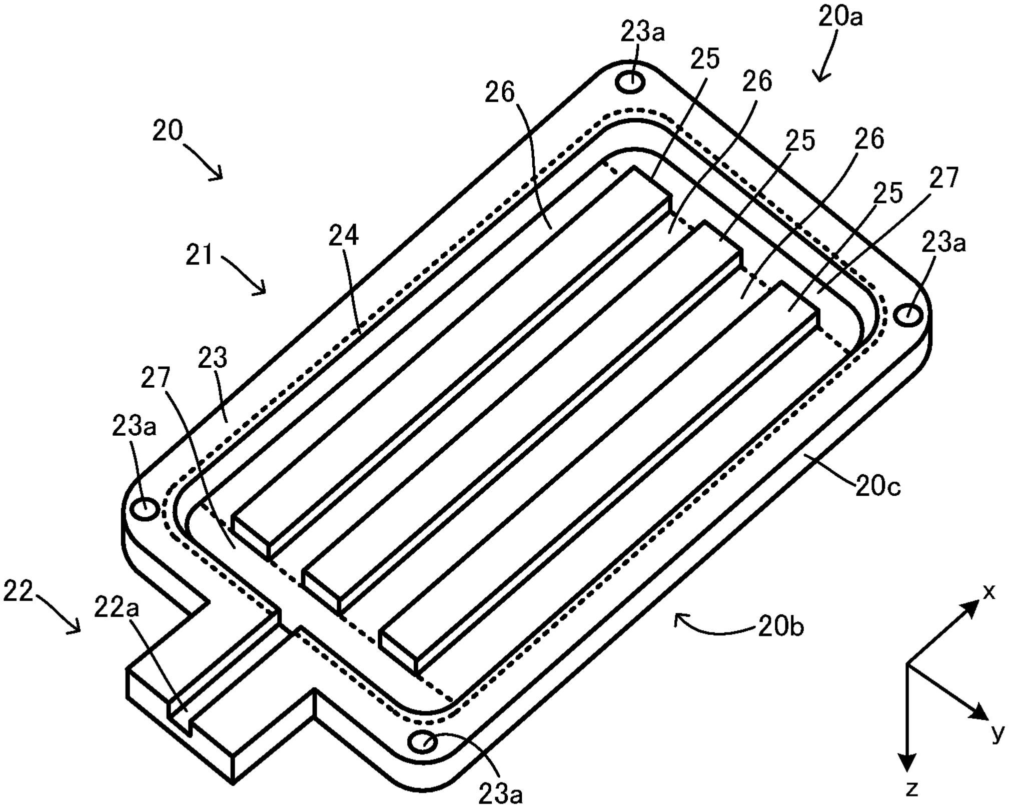
FIG. 15 is a perspective view of a second sheet 20.
Figure 16:
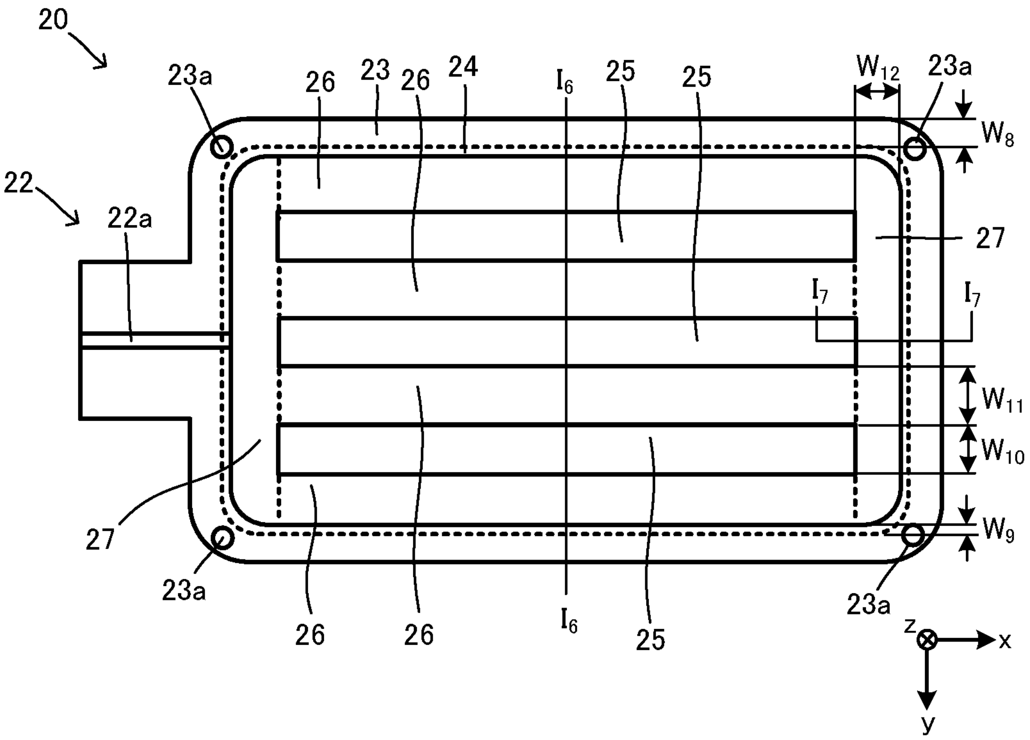
FIG. 16 is a plan view of the second sheet 20.
Figure 18:
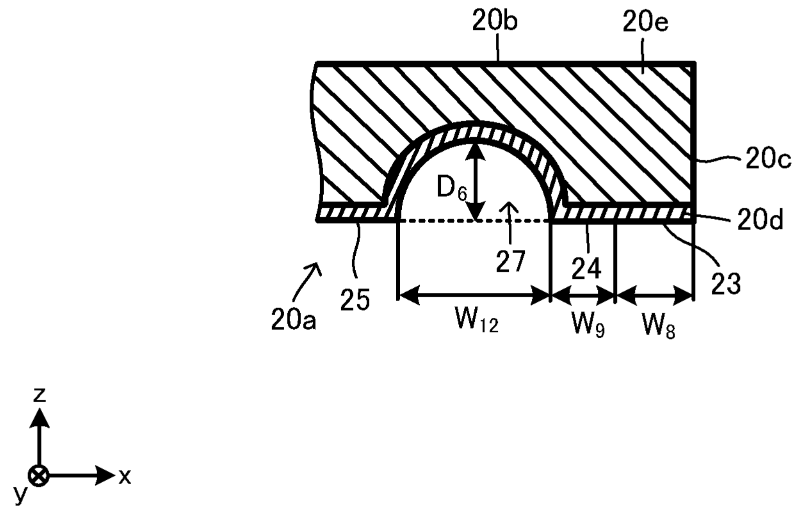
FIG. 18 shows a cross section of the second sheet 20.

Next, the second sheet 20 will be described. In the present embodiment, the second sheet 20 is also a sheet-like member as a whole. FIG. 15 is a perspective view of the second sheet 20 on the inner face 20*a* side. FIG. 16 is a plan view of the second sheet 20 on the inner face 20*a* side. FIG. 17 shows a cross section of the second sheet 20 taken along the line $I_6$-$I_6$ in FIG. 16. FIG. 18 shows a cross section of the second sheet 20 taken along the line 17-17 in FIG. 16.

The second sheet 20 includes the inner face 20*a*, an outer face 20*b* on the opposite side of the inner face 20*a*, and a side face 20*c* that couples the inner face 20*a* and the outer face 20*b* to form thickness. A pattern where a working fluid refluxes is formed on the inner face 20*a* side. As described later, the inner face 20*a* of this second sheet 20 and the inner face 10*a* of the first sheet 10 are superposed so as to face each other, so that the hollow part is formed. This hollow part is the sealed space 2 when a working fluid is enclosed therein.

As can be seen from FIGS. 16 and 17, in the present embodiment, the second sheet 20 has an inner layer 20*d* that is a layer made from a material constituting the inner face 20*a*, and an outer layer 20*e* that is a layer made from a material constituting the outer face 20*b*. That is, the second sheet 20 comprises a plurality of laminated layers: one of the layers forms the inner face 20*a*; and another one of the layers forms the outer face 20*b*.

In the present embodiment, the side face 20*c* is formed of the end face of the inner layer 20*d* and the end face of the outer layer 20*e*.

Here, a pattern for a working fluid to move is provided on the second sheet 20 on the inner face 20*a* side. The inner layer 20*d* forms a face of this pattern which a working fluid is in direct contact with. Therefore, the inner layer 20*d* is preferably made from a material that is chemically stable in a working fluid and that has high thermal conductivity. Thus, for example, copper or a copper alloy may be used. In particular, the use of copper or a copper alloy leads to suppression of the reaction with a working fluid (particularly water) and also the achievement of an improvement in the heat transport capability, and further, easy production of the vapor chamber by etching or by diffusion bonding as described later.

The inner layer 20*d* is laminated on the outer layer 20*e* on the inner face 20*a* side. The outer layer 20*e* forms the outer face 20*b*.

The pattern formed on the second sheet 20 on the inner face 20*a* side is provided on the outer layer 20*e* on the side in contact with the inner layer 20*d*. As described above, the portion of the outer layer 20*e* corresponding to this pattern forms flow paths, but is covered with the inner layer 20*d* so as not to be in direct contact with a working fluid. That is, the outer layer 20*e* has grooves to be flow paths, and the inner layer 20*d* is laminated inside the grooves.

In the present embodiment, a face of the outer layer 20*e* which is to be the outer face 20*b* is a flat face, a little uneven face, or the like in view of contact with a component to be disposed on the vapor chamber 1.

Therefore, in the present embodiment, the outer layer 20*e* is configured so that the distance (i.e., thickness) between the face on the inner face 20*a* side and in contact with the inner layer 20*d*, and the outer face 20*b* is different between positions in the x-direction and between positions in the y-direction.

This makes it possible even for a slimmed vapor chamber with flow paths to have strength necessary as a vapor chamber.

Therefore, the outer layer 20*e* is preferably made from a material having higher strength than the inner layer 20*d*. Specifically, the 0.2% proof stress or upper yield point of the outer layer 20*e* is preferably greater than that of the inner layer 20*d*. The material of the outer layer 20*e* is not particularly limited as long as satisfying the above. For higher strength, the 0.2% proof stress or upper yield point of the outer layer 20*e* is preferably at least 100 MPa, and more preferably at least 200 MPa.

This makes it possible to suppress deformation of and damage to a vapor chamber by force of, for example, an external shock, expansion of a working fluid due to its solidification by low temperature freezing, or the vapor pressure in operation even when the vapor chamber with desired flow paths is slimmed.

Because the strength of the vapor chamber can be improved with the outer layer 20*e* in this way, the limit on the strength of the pattern of flow paths where a working fluid moves, which is formed on the inner face 20*a* side, can be reduced, so that a design focusing on an improvement in thermal performance can be created on this pattern. Thus, it can be said that this is also advantageous in view of thermal performance.

The material constituting the outer layer 20*e* is not particularly limited, but preferably has high thermal conductivity in view of dispersion of heat. This thermal conductivity is preferably at least 10 W/m·K. In view of this, examples of the material constituting the outer layer 20*e* include ferrous materials such as stainless steel, invariant steel and Kovars, titanium alloys, and nickel alloys. A composite material containing: any of the above metals; and a fine particle of diamond, alumina, silicon carbide, or the like may be also used.

The thickness of the inner layer 20*d* is in view of the specifications, and is not particularly limited. This thickness is preferably 5 μm to 20 μm. The inner layer 20*d* having a thickness less than 5 μm leads to a more likely possibility that the material of the outer layer 20*e* and a working fluid affect each other. The inner layer 20*d* having a thickness more than 20 μm leads to more likely possibilities that difficulties arise in manufacture, that it becomes difficult to satisfy the requirements of the thickness including in-plane nonuniformity, and that the surface becomes rough.

The thickness of the outer layer 20*e* is not particularly limited because dependent on the specifications. This thickness is preferably 0.02 mm to 0.5 mm in any portion. The outer layer 20*e* including a portion having a thickness less than 0.02 mm may lead to a minor effect of suppressing the deformation. The outer layer 20*e* including a portion having a thickness more than 0.5 mm prevents heat from transferring from the vapor chamber to the outside, and makes it difficult to satisfy the specifications of the thickness.

The thickness of such a second sheet 20 is the total of that of the inner layer 20*d* and that of the outer layer 20*e*. A specific thickness of the second sheet 20 is not particularly limited. This thickness is preferably at most 1.0 mm, and may be at most 0.75 mm, and may be at most 0.5 mm. This thickness is preferably at least 0.02 mm, and may be at least 0.05 mm, and may be at least 0.1 mm. The range of this thickness may be defined by a combination of any one of the foregoing plural candidate values for the upper limit and any one of the foregoing plural candidate values for the lower limit. The range of the thickness may be also defined by a combination of any two of the plural candidate values for the upper limit or a combination of any two of the plural candidate values for the lower limit.

This makes it possible to apply a slim vapor chamber to more situations. This also makes it possible to suppress deformation of and damage to a vapor chamber by force of, for example, an external shock, expansion of a working fluid due to its solidification by low temperature freezing, or the vapor pressure in operation even when the vapor chamber with desired flow paths is slimmed.

The thicknesses of the first sheet 10 and the thickness of the second sheet 20 may be the same, and may be different.

Such a second sheet 20 includes a main body 21 and an inlet part 22. The main body 21 is a portion in the form of a sheet and forms a portion where a working fluid refluxes. In the present embodiment, the main body 21 is a rectangle having the corners in the form of circular arcs (what is called R) from a plan view.

Other than a quadrangle like the present embodiment, the main body 21 of the second sheet 20 may have a shape of a circle, an ellipse, a triangle, any other polygon, a shape having any bend such as an L-shape, a T-shape, and a crank-shape, or a shape in combination of at least two of them.

Figure 19:
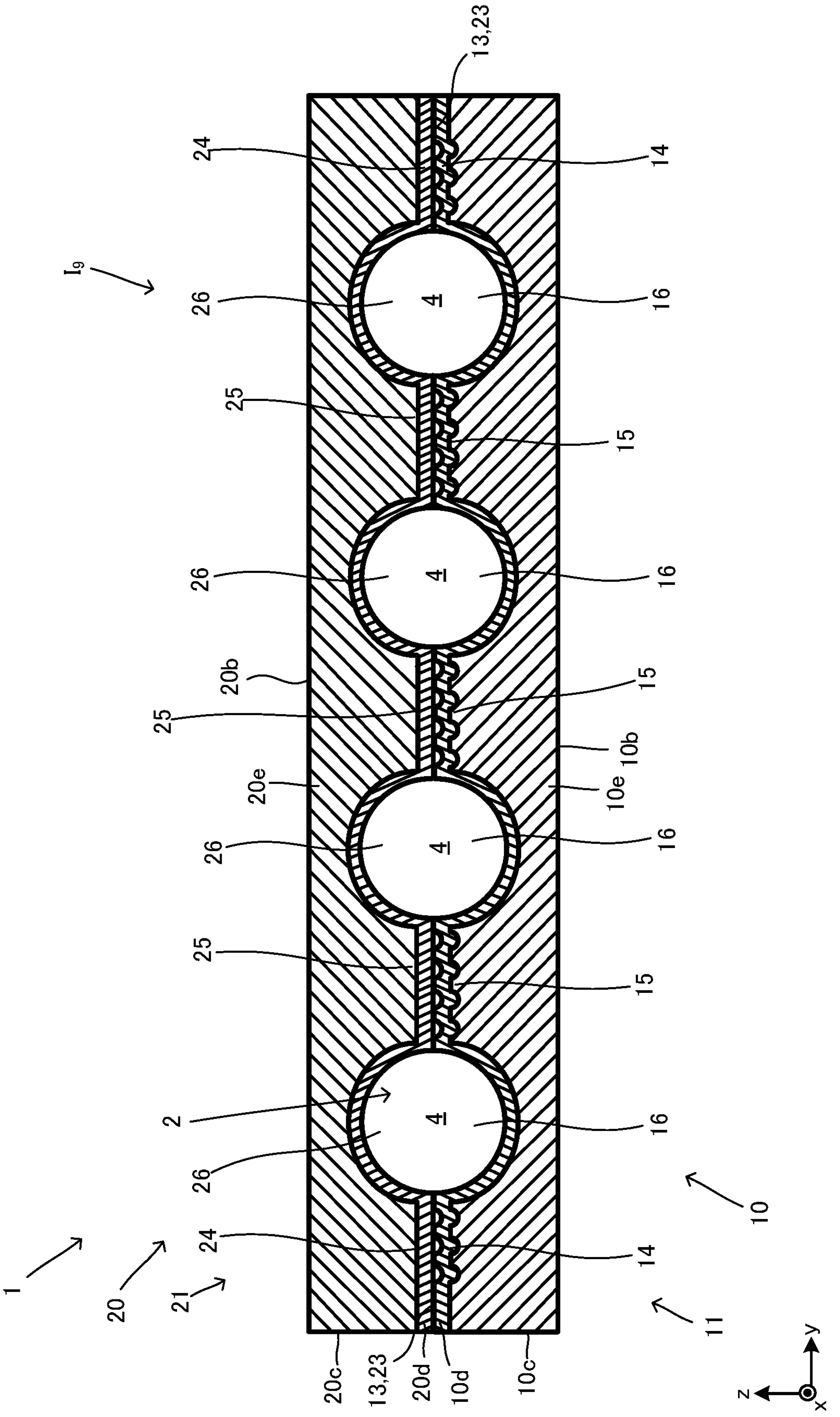
FIG. 19 shows a cross section of the vapor chamber 1.

The inlet part 22 is a portion via which a working fluid is poured into the hollow part formed by the first sheet 10 and the second sheet 20, so that the hollow part forms the sealed space 2 (see FIG. 19). In the present embodiment, the inlet part 22 is in the form of a sheet of a quadrangle from a plan view which sticks out of one side of the main body 21, which is a rectangle from a plan view. In the present embodiment, an inlet groove 22*a* is formed in the inlet part 22 of the second sheet 20 on the inner face 20*a* side, so that the outside and the inside (the hollow part, or the portion to be the sealed space 2) of the main body 21 communicate with each other from the side face 20*c* of the second sheet 20.

A structure for refluxing a working fluid is formed in the main body 21 on the inner face 20*a* side. Specifically, the main body 21 includes the peripheral bonding part 23, a peripheral fluid flow path part 24, inner side fluid flow path parts 25, vapor flow path grooves 26, and vapor flow path communicating grooves 27, on the inner face 20*a* side.

The peripheral bonding part 23 is a face formed on the main body 21 on the inner face 20*a* side along the periphery of the main body 21. This peripheral bonding part 23 is superposed on, and bonded (diffusion bonding, brazing, or the like) to the peripheral bonding part 13 of the first sheet 10, so that the hollow part is formed between the first sheet 10 and the second sheet 20. This hollow part is the sealed space 2 when a working fluid is enclosed therein.

The width of the peripheral bonding part 23 which is indicated by $W_8$ in FIGS. 16 to 18 (the size in a direction orthogonal to the extending direction of the peripheral bonding part 23, or the width on the bonding face to the first sheet 10) is preferably the same as the width $W_1$ of the peripheral bonding part 13 of the main body 11. The width $W_8$ is not limited to this, but may be larger or smaller than the width $W_1$.

Holes 23*a* penetrating in the thickness direction (z-direction) are made in the peripheral bonding part 23 at the four corners of the main body 21. These holes 23*a* function for positioning when the second sheet 20 is superposed on the first sheet 10.

The peripheral fluid flow path part 24 is a fluid flow path part, and is a portion that forms a part of the condensate flow paths 3, which are the second flow paths where a condensed and liquified working fluid passes.

The peripheral fluid flow path part 24 is formed on the inner face 20*a* of the main body 21 along the inside of the peripheral bonding part 23. In the present embodiment, as can be seen in FIGS. 17 and 18, the peripheral fluid flow path part 24 of the second sheet 20 has a flat face and is flush with the peripheral bonding part 23, before the bonding to the first sheet 10. This results in closed openings of a plurality of the fluid flow path grooves 14*a* of the first sheet 10 to form the condensate flow paths 3, which are the second flow paths. A specific mode on combining the first sheet 10 and the second sheet 20 will be described later.

Since the peripheral bonding part 23 and the peripheral fluid flow path part 24 are flush with each other on the second sheet 20 as described above, there is no border to structurally distinguish them. For clarity, FIGS. 15 and 16 each show the border between them in the dotted line.

The peripheral fluid flow path part 24 preferably has the following structure.

The width of the peripheral fluid flow path part 24 which is indicated by $W_9$ in FIGS. 16 to 18 (the size in a direction orthogonal to the extending direction of the peripheral fluid flow path part 24, or the width on the bonding face to the first sheet 10) may be the same as, or larger or smaller than the width $W_2$ of the peripheral fluid flow path part 14 of the first sheet 10.

Next, the inner side fluid flow path parts 25 will be described. The inner side fluid flow path parts 25 are also fluid flow path parts, and each of them is one part that forms the condensate flow paths 3, which are the second flow paths.

As can be seen from FIGS. 15 to 18, the inner side fluid flow path parts 25 are formed inside the annular ring of the peripheral fluid flow path part 24 on the inner face 20*a* of the main body 21. The inner side fluid flow path parts 25 according to the present embodiment are walls extending in a direction parallel to the long sides of the rectangle of the main body 21 from a plan view (x-direction). The plural (three in the present embodiment) inner side fluid flow path parts 25 are aligned at given intervals in a direction parallel to the short sides of the rectangle of the main body 21 from a plan view (y-direction).

In the present embodiment, the surface of each of the inner side fluid flow path parts 25 on the inner face 20*a* side is formed of a flat face before the bonding to the first sheet 10. This results in closed openings of a plurality of the fluid flow path grooves 15*a* of the first sheet 10 to form the condensate flow paths 3.

The width of each of the inner side fluid flow path parts 25 which is indicated by $W_{10}$ in FIGS. 16 and 17 (the size in the aligning direction of the inner side fluid flow path parts 25 and the vapor flow path grooves 26, or the width on the bonding face to the first sheet 10) may be the same as, and may be larger or smaller than the width $W_4$ of each of the inner side fluid flow path parts 15 of the first sheet 10. In this embodiment, the width $W_{10}$ is the same as the width $W_4$.

In the present embodiment, the inner side fluid flow path parts 25 are each formed of a flat face before the bonding. Fluid flow path grooves may be formed as well as the first sheet. In this case, the fluid flow path grooves in the first and second sheets may be at the same position, and may shift each other from a plan view.

Next, the vapor flow path grooves 26 will be described. The vapor flow path grooves 26 are portions where a vapor that is a vaporized and gasified working fluid passes, and form a part of the vapor flow paths 4, which are the first flow paths. FIG. 16 shows a shape of the vapor flow path grooves 26 from a plan view. FIG. 17 shows a cross-sectional shape of each of the vapor flow path grooves 26.

As can be seen in these drawings, the vapor flow path grooves 26 are formed of grooves that are formed on the inner face 20*a* of the main body 21 inside the annular ring of the peripheral fluid flow path part 24. Specifically, the vapor flow path grooves 26 according to the present embodiment are grooves formed between adjacent ones of the inner side fluid flow path parts 25 and between the peripheral fluid flow path part 24 and the inner side fluid flow path parts 25, and extending in a direction parallel to the long sides of the rectangle of the main body 21 from a plan view (x-direction). The plural (four in the present embodiment) vapor flow path grooves 26 are aligned in a direction parallel to the short sides of the rectangle of the main body 21 from a plan view (y-direction). Thus, as can be seen in FIG. 17, the second sheet 20 has a shape of repeated depressions and protrusions in the y-direction: the protrusions are walls that are the peripheral fluid flow path part 24 and the inner side fluid flow path parts 25; and the depressions are grooves that are the vapor flow path grooves 26.

Here, since being grooves, the vapor flow path grooves 26 each have a bottom portion on the outer face 20*b* side, and an opening that is a portion on the opposite side of the bottom portion, facing the bottom portion, and is on the inner face 20*a* side, in a cross-sectional shape thereof.

These vapor flow path grooves 26 are grooves formed by laminating the inner layer 20*d* inside the grooves formed in the outer layer 20*e*.

The vapor flow path grooves 26 are preferably arranged at places superposed on the vapor flow path grooves 16 of the first sheet 10 in the thickness direction when combined with the first sheet 10. This can lead to the formation of the vapor flow paths 4, which are the first flow paths, by the vapor flow path grooves 16 and the vapor flow path grooves 26.

The width of each of the vapor flow path grooves 26 which is indicated by $W_{11}$ in FIGS. 16 and 17 (the size in the aligning direction of the inner side fluid flow path parts 25 and the vapor flow path grooves 26, or the width on the opening face of each of the grooves) may be the same as, and may be larger or smaller than the width $W_6$ of each of the vapor flow path grooves 16 of the first sheet 10.

The depth of the vapor flow path grooves 26 which is indicated by $D_5$ in FIG. 17 is preferably at most 300 μm, and may be at most 225 μm, and may be at most 150 μm. This depth $D_5$ is preferably at least 10 μm, and may be at least 25 μm, and may be at least 50 μm. The range of this depth $D_5$ may be defined by a combination of any one of the foregoing plural candidate values for the upper limit, and any one of the foregoing plural candidate values for the lower limit. The range of the depth $D_5$ may be also defined by a combination of any two of the plural candidate values for the upper limit, or a combination of any two of the plural candidate values for the lower limit.

The depth of the vapor flow path grooves 16 of the first sheet 10 may be the same as, and may be larger or smaller than the depth of the vapor flow path grooves 26 of the second sheet 20.

In the present embodiment, each of the vapor flow path grooves 26 has a semi-elliptical cross-sectional shape. This cross-sectional shape may be a quadrangle such as a rectangle, a square and a trapezoid, a triangle, a semicircle, a semicircle at the bottom, a semi-ellipse at the bottom, or any combination of some of them. Because a lowered flow resistance of a vapor makes it possible to smoothly reflux a working fluid in a vapor flow path, the flow path cross-sectional shape may be also determined in such a view.

The present embodiment has described the example of the vapor flow path grooves 26 formed between adjacent ones of the inner side fluid flow path parts 25. The vapor flow path grooves 26 are not limited to this. At least two vapor flow path grooves may be aligned between adjacent inner side fluid flow path parts.

No vapor flow path grooves may be formed in part or all of the second sheet 20 as long as the vapor flow path grooves are formed in the first sheet 10.

The vapor flow path communicating grooves 27 are grooves allowing a plurality of the vapor flow path grooves 26 to communicate. This makes it possible to achieve the equality of a vapor in a plurality of the vapor flow paths 4, and to convey the vapor into a wider area and efficiently use much part of the condensate flow paths 3, which make it possible to more smoothly reflux a working fluid.

As can be seen from FIGS. 15, 16 and 18, the vapor flow path communicating grooves 27 according to the present embodiment are formed between the peripheral fluid flow path part 24 and both ends of the inner side fluid flow path parts 25 and the vapor flow path grooves 26 in the extending direction thereof. FIG. 18 shows a cross section orthogonal to the communicating direction of the vapor flow path communicating grooves 27.

The width of each of the vapor flow path communicating grooves 27 (the size in a direction orthogonal to the communicating direction, or the width on the opening face of each of the grooves) which is indicated by $W_{12}$ in FIGS. 16 and 18 may be the same as, and may be larger or smaller than the width $W_7$ of each of the vapor flow path communicating grooves 17 of the first sheet 10. The depth of the vapor flow path communicating grooves 27 which is indicated by $D_6$ in FIG. 18 is preferably at most 300 μm, and may be at most 225 μm, and may be at most 150 μm. This depth $D_6$ is preferably at least 10 μm, and may be at least 25 μm, and may be at least 50 μm. The range of this depth $D_6$ may be defined by a combination of any one of the foregoing plural candidate values for the upper limit, and any one of the foregoing plural candidate values for the lower limit. The range of the depth $D_6$ may be also defined by a combination of any two of the plural candidate values for the upper limit, or a combination of any two of the plural candidate values for the lower limit.

The depth of the vapor flow path communicating grooves 17 of the first sheet 10 may be the same as, and may be larger or smaller than the depth of the vapor flow path communicating grooves 27 of the second sheet 20.

In the present embodiment, each of the vapor flow path communicating grooves 27 has a semi-elliptical cross-sectional shape. This shape is not limited to this, but may be a quadrangle such as a rectangle, a square and a trapezoid, a triangle, a semicircle, a circle at the bottom, a semi-ellipse at the bottom, or any combination of some of them. Because a lowered flow resistance of a vapor makes a smooth reflux in a vapor flow path possible, the flow path cross-sectional shape may be also determined in such a view.

The vapor flow path communicating grooves 27 are also grooves formed of grooves provided in the outer layer 20*e*, and the inner layer 20*d* laminated inside these provided grooves.

In the present embodiment, the outer face 20*b* of the main body 21 is configured to be a flat face. This can improve the adhesiveness to a member to be closely adhered to the outer face 20*b* (such as an electronic component to be cooled, and a housing of an electronic device for heat to be transferred). The shape of the outer face 20*b* is not limited to this, but may have unevenness according to the purpose thereof.

Here, the shape of the outer face 20*b* does not correspond to the inner face 20*a*. The outer face 20*b* has a shape that can contribute to, for example, heat transfer, which is the purpose thereof. This outer face 20*b* is formed of the outer layer 20*e* as described above. Thus, the thickness of the outer layer 20*e* is different between positions in the x-direction and between positions in the y-direction.

The inner face 20*a*, the outer face 20*b*, and the inner layer 20*d* and the outer layer 20*e* forming them, as the foregoing, make it possible to suppress deformation of and damage to a vapor chamber by force of, for example, an external shock, expansion of a working fluid due to its solidification by low temperature freezing, or the vapor pressure in operation even when the vapor chamber with desired flow paths is slimmed.

Next, the structure of the vapor chamber 1 formed by combining the first sheet 10 and the second sheet 20 will be described. This description will help further understand the arrangement, the size, the shape, etc. of each component of the first sheet 10 and the second sheet 20.

FIG. 19 shows a cross section of the vapor chamber 1 taken along the y-direction indicated by $I_8$-$I_8$ of FIG. 1 in the thickness direction. This drawing is the combination of the drawing of the first sheet 10 shown in FIG. 5 and the drawing of the second sheet 20 shown in FIG. 17 so as to show a cross section of the vapor chamber 1 at this portion.

Figure 20:
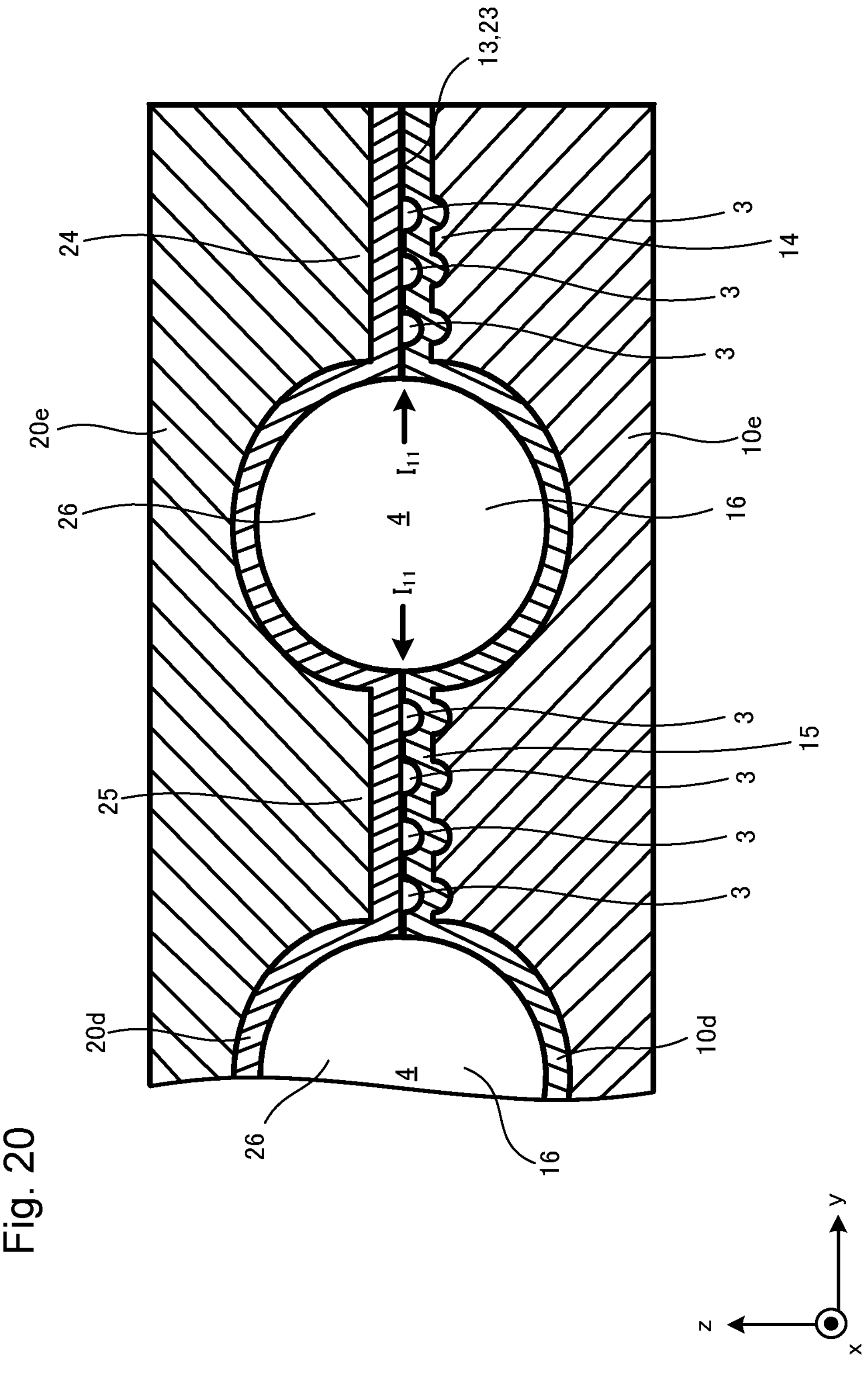
FIG. 20 is a partially enlarged view of FIG. 19.
Figure 21:
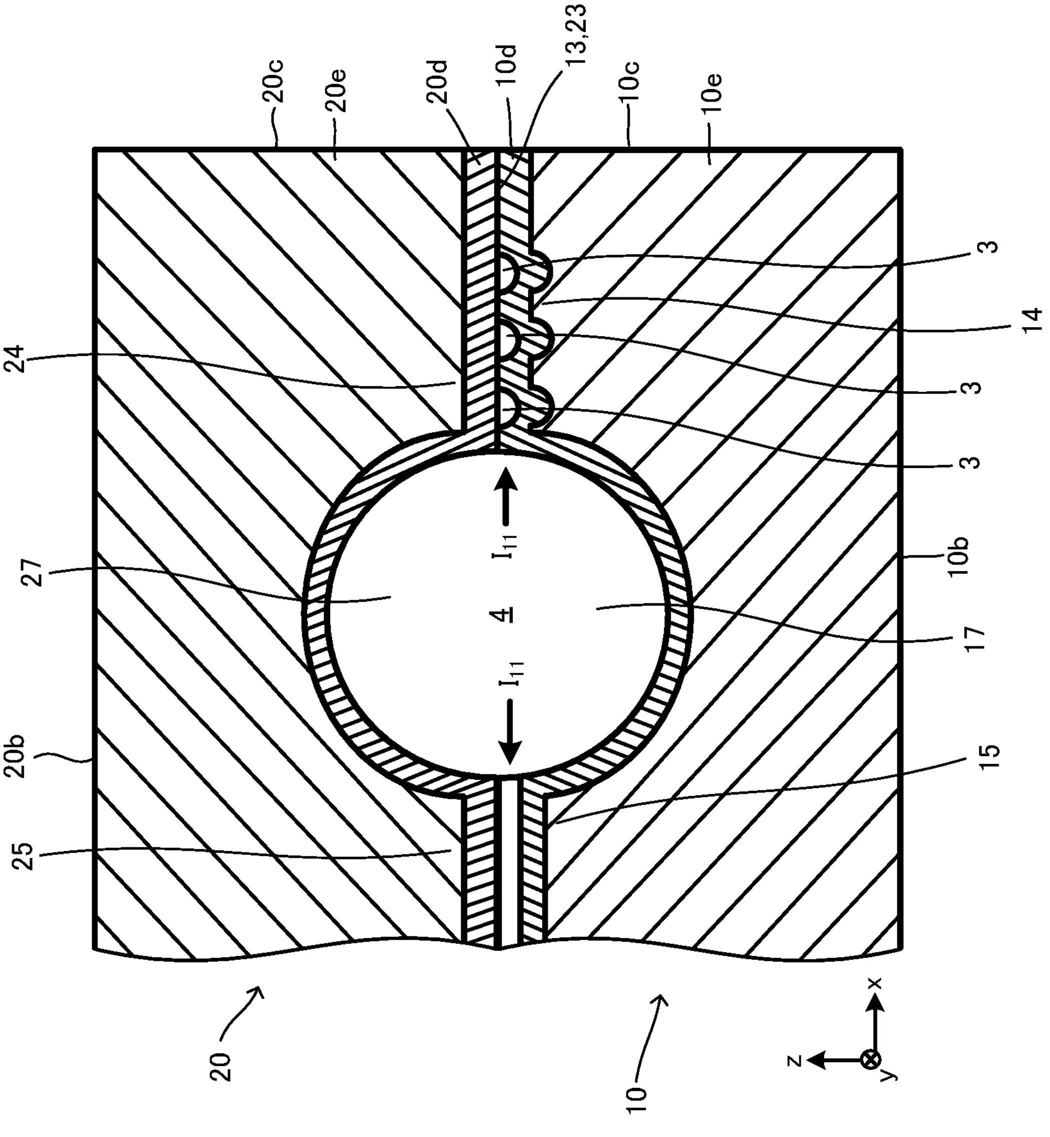
FIG. 21 shows another cross section of the vapor chamber 1.

FIG. 20 is an enlarged view of the portion indicated by $I_9$ in FIG. 19. FIG. 21 shows a cross section of the vapor chamber 1 in the thickness direction which is taken along the x-direction indicated by $I_{10}$-$I_{10}$ of FIG. 1. This drawing is a combination of the drawing of the first sheet 10 shown in FIG. 7 and the drawing of the second sheet 20 shown in FIG. 18 so as to show a cross section of the vapor chamber 1 at this portion.

As can be seen in FIGS. 1, 2 and 19 to 21, the first sheet 10 and the second sheet 20 are arranged so as to be superposed, and are bonded to each other, thereby forming the vapor chamber 1. At this time, the inner face 10*a* of the first sheet 10 and the inner face 20*a* of the second sheet 20 are disposed so as to face each other, so that the main body 11 of the first sheet 10 and the main body 21 of the second sheet 20 are superposed and the inlet part 12 of the first sheet 10 and the inlet part 22 of the second sheet 20 are superposed. That is, the inner layer 10*d* of the first sheet 10, and the outer layer 20*e* of the second sheet 20 are superposed.

In the present embodiment, the first sheet 10 and the second sheet 20 are configured, so that the relative positional relationship therebetween becomes proper by positioning the holes 13*a* of the first sheet 10 and the holes 23*a* of the second sheet 20.

Such a laminate of the first sheet 10 and the second sheet 20 allows each component included in the main body 11 and the main body 21 to be arranged as shown in FIGS. 19 to 21. This is specifically as follows.

The peripheral bonding part 13 of the first sheet 10 and the peripheral bonding part 23 of the second sheet 20 are arranged so as to be superposed, and are bonded to each other by a bonding method such as diffusion bonding and brazing. This leads to the formation of the hollow part between the first sheet 10 and the second sheet 20. This hollow part is the sealed space 2 when a working fluid is enclosed therein.

The peripheral fluid flow path part 14 of the first sheet 10 and the peripheral fluid flow path part 24 of the second sheet 20 are arranged so as to be superposed. This leads to the formation of the condensate flow paths 3, which are the second flow paths where a condensate that is a condensed and liquefied working fluid flows, in the hollow part by the fluid flow path grooves 14*a* of the peripheral fluid flow path part 14, and the peripheral fluid flow path part 24.

Likewise, the inner side fluid flow path parts 15 of the first sheet 10 and the inner side fluid flow path parts 25 of the second sheet 20 are arranged so as to be superposed. This leads to the formation of the condensate flow paths 3, which are the second flow paths where a condensate flows, in the hollow part by the fluid flow path grooves 15*a* of the inner side fluid flow path parts 15, and the inner side fluid flow path parts 25.

The formation of slim flow paths each all surrounded by walls in a cross section as described above makes it possible to move a condensate by a great capillary force, and to lead to a smooth circulation. That is, when a flow path where a condensate is assumed to flow is imagined, a greater capillary force can be obtained through the condensate flow paths 3 compared with a flow path by a so-called groove, such as a flow path having one continuously opening face.

In addition, the condensate flow paths 3 are formed separately from the vapor flow paths 4, which are the first flow paths, which makes it possible for a working fluid to smoothly circulate.

Further, adjacent ones of the condensate flow paths 3 communicate with each other via the communicating opening parts 14*c* and the communicating opening parts 15*c*, which leads to an achievement of the equality of a condensate, and further a smooth circulation of a working fluid.

In view of more strongly exerting the capillary force of the flow paths, the aspect ratio on the flow path cross section of each of the condensate flow paths 3, which is represented by the value obtained by dividing the width of each of the flow paths by the height of the flow paths is preferably higher than 1.0. This ratio may be at least 1.5, and may be at least 2.0. This aspect ratio may be lower than 1.0. This ratio may be at most 0.75, and may be at most 0.5.

Among them, in view of manufacture, the width of each of the flow paths is preferably larger than the height of the flow paths. In such a view, the aspect ratio is preferably higher than 1.3.

As can be seen from FIGS. 19 and 20, the openings of the vapor flow path grooves 16 of the first sheet 10 and the openings of the vapor flow path grooves 26 of the second sheet 20 are superposed so as to face each other, so that the flow paths are formed. These flow paths are the vapor flow paths 4, which are the first flow paths where a vapor flows.

The flow path cross-sectional area of each of the condensate flow paths 3, which are the second flow paths, are formed so as to be smaller than that of each of the vapor flow paths 4, which are the first flow paths. More specifically, when the average flow path cross-sectional area of any two adjacent ones of the vapor flow paths 4 (each formed by one of the vapor flow path grooves 16 and one of the vapor flow path grooves 26 in the present embodiment) is defined as $A_g$, and the average flow path cross-sectional area of groups of the condensate flow paths 3 which are each arranged between two adjacent ones of the vapor flow paths 4 (a plurality of the condensate flow paths 3 formed by one of the inner side fluid flow path parts 15 and one of the inner side fluid flow path parts 25 in the present embodiment) is defined as $A_1$; in the relationship between the condensate flow paths 3 and the vapor flow paths 4, $A_1$ is at most 0.5 times, preferably at most 0.25 times, as large as $A_g$. This results in a working fluid selectively passing through the first flow paths and the second flow paths more easily according to the mode of a phase (gas or liquid phase) thereof.

This relationship may be established in at least part of the entire vapor chamber. It is further preferrable to establish this relationship in the entire vapor chamber.

As can be seen in FIG. 21, the openings of the vapor flow path communicating grooves 17 of the first sheet 10 and the openings of the vapor flow path communicating grooves 27 of the second sheet 20 are superposed so as to face each other, so that the flow paths are formed.

The inlet part 12 and the inlet part 22 are also superposed, so that the inner face 10*a* of the inlet part 12 and the inner face 20*a* of the inlet part 22 face each other, as shown in FIGS. 1 and 2. The opening of the inlet groove 22*a* of the second sheet 20 which is on the opposite side of its bottom is closed by the inner face 10*a* of the inlet part 12 of the first sheet 10, so that an inlet flow path 5 that allows the outside, and the hollow part between the main body 11 and the main body 21 (the condensate flow paths 3 and the vapor flow paths 4) to communicate with each other.

Since the inlet flow path 5 is closed, so that the sealed space 2 is formed after a working fluid is poured via the inlet flow path 5 to the hollow part, the outside and the hollow part do not communicate with each other in the vapor chamber 1 in the final form.

The present embodiment shows the example of the inlet parts 12 and 22 provided at one of a pair of the ends of the vapor chamber 1 in the longitudinal direction. The inlet parts 12 and 22 are not limited to this, but may be arranged at any other end, or at plural ends. When arranged at plural ends, for example, the inlet parts 12 and 22 may be arranged at each of a pair of the ends of the vapor chamber 1 in the longitudinal direction, and may be arranged at one of the other pair of the ends.

A working fluid is enclosed in the sealed space 2 of the vapor chamber 1. The working fluid is not particularly limited. Any working fluid used for a usual vapor chamber, such as pure water, ethanol, methanol, acetone, and any mixtures thereof may be used.

As described above, in the vapor chamber 1, the condensate flow paths 3 and the vapor flow paths 4 are formed of the outer layer 10*e*, the outer layer 20*e*, the inner layer 10*d*, and the inner layer 20*d*. The inner surfaces of the condensate flow paths 3 and the vapor flow paths 4 are formed of the inner layer 10*d* and the inner layer 20*d*.

In the present embodiment, the exterior of the vapor chamber 1 is formed of the outer layer 10*e* and the outer layer 20*e*. This exterior has a shape (in this embodiment, a flat shape) not according to the condensate flow paths 3 and the vapor flow paths 4, which are the interior of the vapor chamber 1.

In such a mode, the outer layer 10*e* and the outer layer 20*e* have higher strength than the inner layer 10*d* and the inner layer 20*d*, respectively, which makes it possible to suppress deformation of and damage to even a slimmed vapor chamber with the condensate flow paths 3 and the vapor flow paths 4. That is, deformation of and damage to the vapor chamber can be suppressed even when force of, for example, an external shock, expansion of the working fluid due to its solidification by low temperature freezing, or the vapor pressure in operation is applied.

The inner layer 10*d* and the inner layer 20*d* can be made from a material that is chemically stable in the working fluid and that has high thermal conductivity, which makes it possible to suppress the thermal resistance at a low level. At this time, the outer layer 10*e* and the outer layer 20*e* make it possible to improve the strength of the vapor chamber, which makes it possible to create a design of the pattern where the working fluid moves, which is formed on the inner face 10*d* and the inner face 20*d*, with the design focusing on thermal performance more than the improvement in strength. Thus, it can be said that this is also advantageous in view of thermal performance.

The effect of the vapor chamber 1 according to the present embodiment is large especially when the vapor chamber 1 is slim. In such a view, the thickness of the vapor chamber 1 is at most 1 mm, more preferably at most 0.4 mm, and further preferably at most 0.2 mm. This thickness of 0.4 mm or less makes it possible to install the vapor chamber 1 inside an electronic device without any processing (such as groove formation) on the electronic device for forming a space where the vapor chamber is arranged in more situations. According to the present embodiment, even such a slim vapor chamber has high strength and is deformation-resistant, offering maintained thermal performance.

A vapor chamber as described above can be made through, for example, the following steps. FIGS. 22A to 22D show illustrations.

Figure 22A:
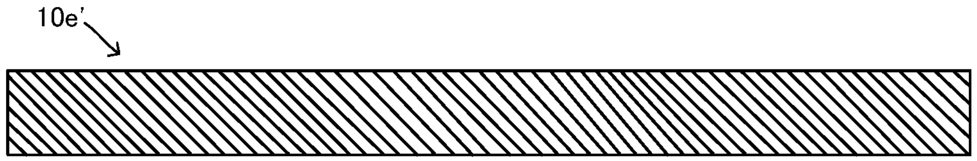
FIG. 22A illustrates the manufacture of the vapor chamber 1.

First, as shown in FIG. 22A, a sheet 10*e*' that is to be the outer layer 10*e* of the first sheet 10 is prepared.

Figure 22B:
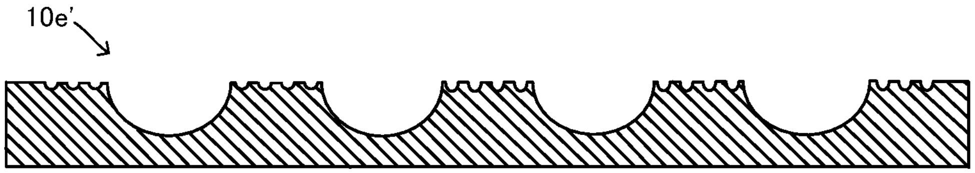
FIG. 22B illustrates the manufacture of the vapor chamber 1.

Next, as shown in FIG. 22B, grooves to be the fluid flow path grooves 14*a*, the fluid flow path grooves 15*a*, the vapor flow path grooves 16 and the vapor flow path communicating grooves 17 are formed in this sheet 10*e*' by half etching. Half etching is to etch in the middle of the thickness without penetrating.

Figure 22C:
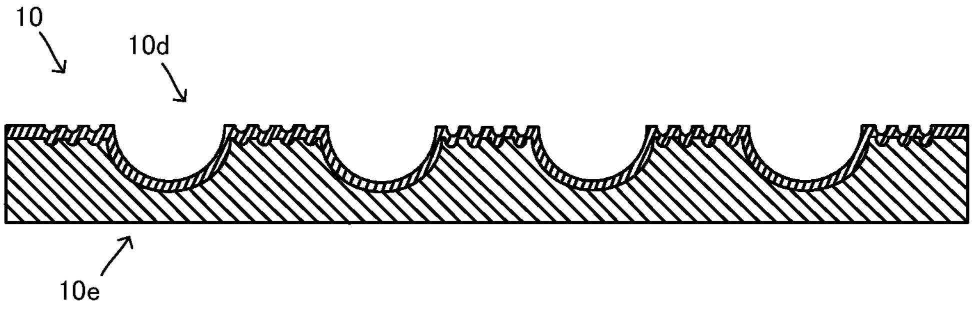
FIG. 22C illustrates the manufacture of the vapor chamber 1.

Next, as shown in FIG. 22C, a face of the sheet 10*e*' which is half-etched as described above is sputtered or plated with the material to be the inner layer 10*d*, so that the inner layer 10*d* is formed. At this time, in view of improving the adhesiveness, an intermediate layer may be formed by sputtering or plating before the sputtering or plating with the material to be the inner layer 10*d*. When formed by sputtering, the intermediate layer may be made from titanium, nickel, or nickel-chromium steel. When formed by plating, the intermediate layer is formed by so-called strike plating.

The first sheet 10 can be made through the foregoing steps. This makes it possible to suppress the amount of the material which is removed by any processing even if the material is a laminating material, and to reduce the material loss.

In addition, it is not necessary to etch a material of laminated different metals, which makes it possible to suppress corrosion by the battery effect during processing, and deterioration in the processing accuracy according to the difference in the etching rate.

A material of a plurality of rolled and laminated metals tends to greatly warp when slimmed. This warp can be lessened by manufacturing as described above. Thus, it is expected to rise the yield in the bonding and conveyance.

Figure 22D:
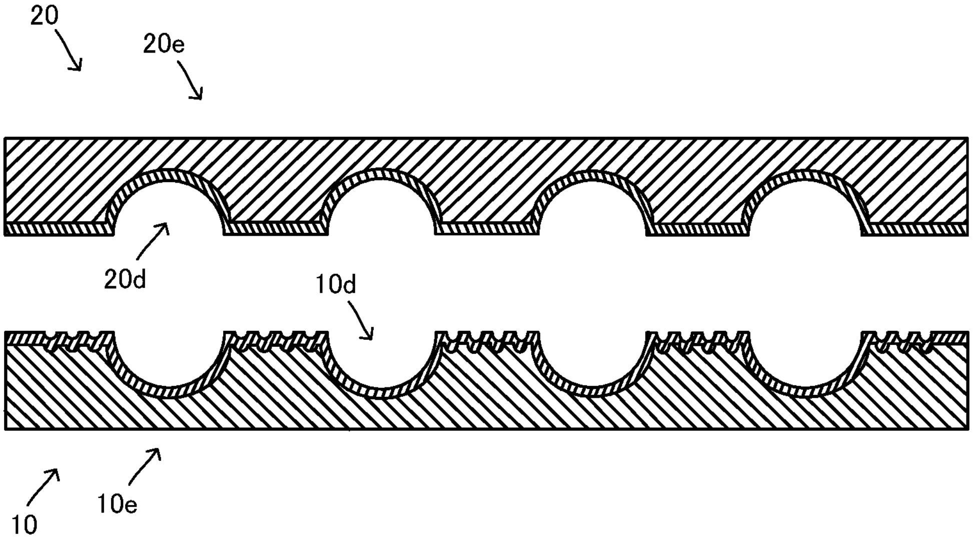
FIG. 22D illustrates the manufacture of the vapor chamber 1.

The second sheet 20 is also made through the foregoing steps. After the first sheet 10 and the second sheet 20 are obtained through this, as shown in FIG. 22D, the inner face 10*a* (inner layer 10*d*) of the first sheet 10 and the inner face 20*a* (inner layer 20*d*) of the second sheet 20 are superposed so as to face each other, positioned using the holes 13*a* and 23*a* for positioning, and tentatively fixed. The way of the tentative fixation is not particularly limited, but examples thereof include resistance welding, ultrasonic welding, and adhesion with an adhesive.

After the tentative fixation, the first sheet 10 and the second sheet 20 are permanently bonded by diffusion bonding. Here, "permanently bonded" means that the inner face 10*a* of the first sheet 10 and the inner face 20*a* of the second sheet 20 are bonded to such an extent that the bonding can be maintained so that the airtightness of the sealed space 2 can be kept when the vapor chamber 1 operates, but is not restricted to a strict meaning thereof.

The above-described example has described the way of forming the inner layer 10*d* and the inner layer 20*d* by sputtering or plating, and thereafter bonding the first sheet 10 and the second sheet 20 by diffusion bonding. The present embodiment is not limited to this. For example, the inner layer 10*d* and the inner layer 20*d* may be formed from a brazing filler metal that is a material for brazing on the assumption that the first sheet 10 and the second sheet 20 are bonded by brazing. This makes it possible to both form and bond the inner layer 10*d* and the inner layer 20*d* at once.

After the first sheet 10 and the second sheet 20 are bonded as described above, the hollow part is evacuated via the inlet flow path 5, which has been formed, and the pressure thereinside is reduced. After that, the working fluid is poured via the inlet flow path 5 (see FIG. 1) to the hollow part, inside which the pressure has been reduced, and is put inside the hollow part. Then, laser fusing is performed on the inlet parts 12 and 22, or the inlet parts 12 and 22 are caulked so as to close the inlet flow path 5, so that the enclosed space is formed. This leads to secure retainment of the working fluid inside the sealed space 2.

In the vapor chamber according to the present embodiment, the inner side fluid flow path parts 15 and the inner side fluid flow path parts 25 are superposed, thereby functioning as pillars, which makes it possible to suppress the sealed space collapsing during the bonding and when the pressure is being reduced. In addition, the strength is improved by the outer layer 10*e* and the outer layer 20*e*, which also makes it possible to suppress such collapse.

The manufacture of the vapor chamber by etching has been described so far. The manufacturing method is not limited to this. The vapor chamber may be manufactured by pressing, cutting, laser processing, or processing with a 3D printer.

For example, when the vapor chamber is manufactured by a 3D printer, it is not necessary to make the vapor chamber by bonding a plurality of sheets, so that the vapor chamber can include no bonding part.

Figure 23:
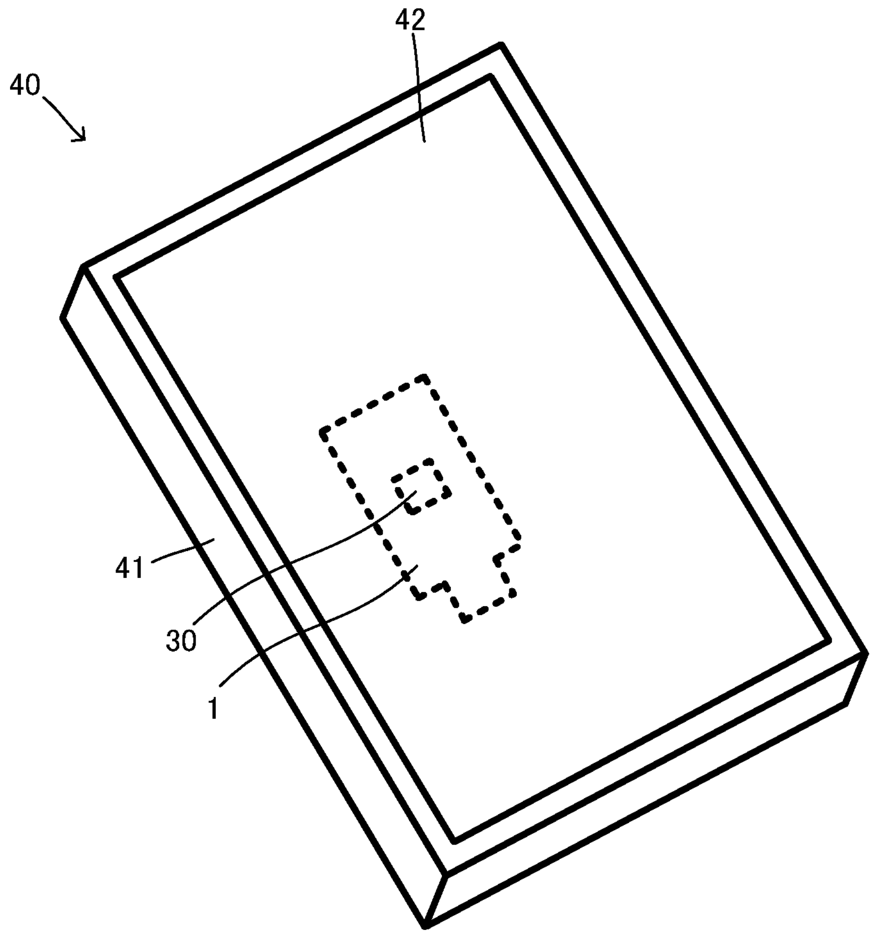
FIG. 23 illustrates an electronic device 40.

Next, the effect of the vapor chamber 1 will be described. FIG. 23 schematically shows a situation where the vapor chamber 1 is installed inside a portable terminal 40 that is one example of an electronic device. Here, the vapor chamber 1 is shown in the dotted line because installed inside a housing 41 of the portable terminal 40. Such a portable terminal 40 is configured to include the housing 41 that contains various electronic components, and a display unit 42 that is exposed so that an image can be seen from the outside through an opening of the housing 41. As one of these electronic components, an electronic component 30 to be cooled by the vapor chamber 1 is disposed inside the housing 41.

The vapor chamber 1 is installed inside, for example, the housing of the portable terminal, and is attached to the electronic component 30 to be cooled, such as a CPU. The electronic component is attached to the outer face 10*b* or the outer face 20*b* of the vapor chamber 1 directly or via a high thermal-conductive adhesive, sheet, tape, or the like. The electronic component is attached to any place at the outer face 10*b* or the outer face 20*b*, and is not particularly limited. This place is suitably set in relation to the arrangement of the other members in, for example, the portable terminal. In the present embodiment, as shown in FIG. 1 in the dotted line, the electronic component 30, which is a heat source to be cooled, is arranged at the center of the main body 11 in the xy-direction on the outer face 10*b* of the first sheet 10. Therefore, the electronic component 30 is invisible in a blind spot in FIG. 1, and thus is shown in the dotted line.

In the vapor chamber 1 according to the present embodiment, the outer face 10*b* and the outer face 20*b* are formed of the outer layer 10*e* and the outer layer 20*e*, respectively, and the shapes thereof are not according to the shapes of the flow paths on the inner face sides. Therefore, the shapes of the outer face 10*b* and the outer face 20*b* may be formed in view of improving the adhesiveness to an electronic component to be in contact, and to a housing, which makes it possible to improve the thermal performance in such a view.

Figure 24:
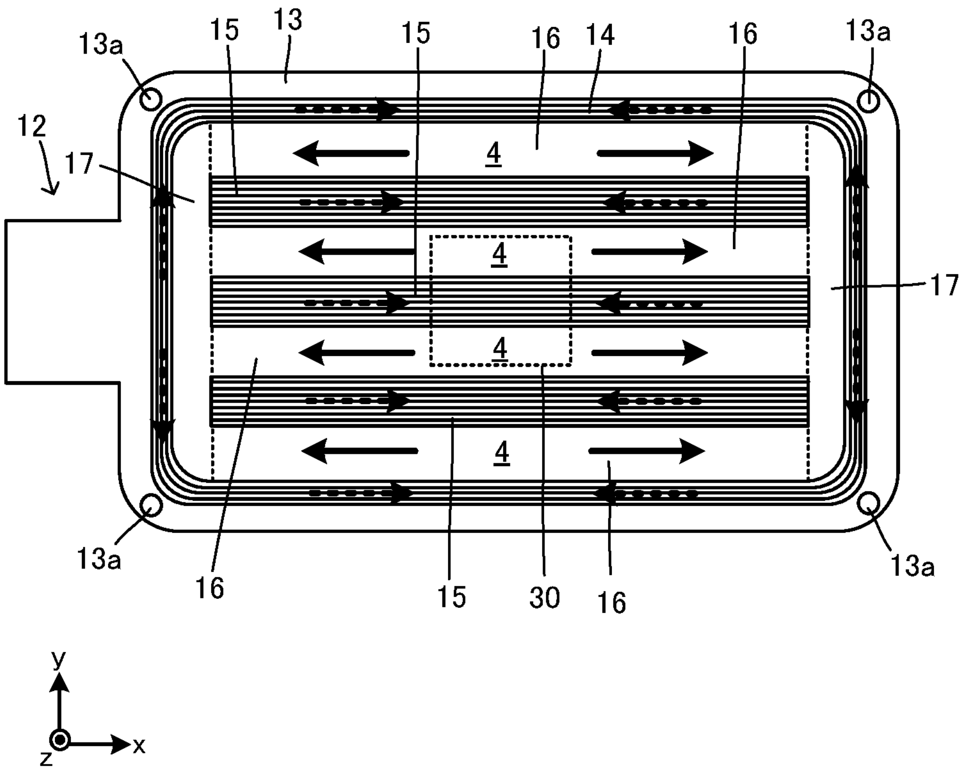
FIG. 24 illustrates flows of a working fluid.

FIG. 24 illustrates flows of the working fluid. For easy description, in this drawing, the second sheet 20 is omitted so that the inner face 10*a* of the first sheet 10 can be seen.

When the electronic component 30 generates heat, the heat is conducted inside the first sheet 10 by heat conduction, and a condensate present near the electronic component 30 and in the sealed space 2 receives the heat. The condensate having received this heat absorbs the heat, and vaporizes and gasifies. This causes the electronic component 30 to be cooled.

A vapor that is the gasified working fluid flows in the vapor flow paths 4 and moves as shown by the solid straight arrows in FIG. 24. These flows are generated in directions separating from the electronic component 30, which allows the vapor to move in the directions separating from the electronic component 30.

The vapor inside the vapor flow paths 4 moves away from the electronic component 30, which is a heat source, to a peripheral portion of the vapor chamber 1 which is at a relatively low temperature. In this movement, the vapor is cooled as the heat thereof is taken by the first sheet 10 and the second sheet 20 successively. The first sheet 10 and the second sheet 20, which have taken the heat from the vapor, transfer the heat to, for example, the housing 41 of the electronic device 40, which is in contact with the outer face 10*b* or the outer face 20*b* thereof. Finally, the heat is released to the outside.

The working fluid, from which the heat has been taken as the working fluid has been moving in the vapor flow paths 4, condenses and liquifies. This condensate is adhered to the wall surfaces of the vapor flow paths 4. Because the vapor continuously flows in the vapor flow paths 4, the condensate moves to the condensate flow paths 3 so as to be pushed by the vapor as shown by the arrows $I_{11}$ in FIGS. 20 and 21. Because the condensate flow paths 3 according to the present embodiment include the communicating opening parts 14*c* and 15*c* as shown in FIGS. 8 and 14, the condensate passes through these communicating opening parts 14*c* and 15*c* and are distributed into a plurality of the condensate flow paths 3.

The condensate having entered the condensate flow paths 3 moves so as to approach the electronic component 30, which is a heat source, as shown by the dotted straight arrows in FIG. 24 by the capillary force by the condensate flow paths, and by pushing by the vapor.

At this time, in a cross section, the respective condensate flow paths 3 are all surrounded by walls since the openings of the fluid flow path grooves 14*a* and the fluid flow path grooves 15*a* of the condensate flow paths 3 are closed by the second sheet 20, which makes it possible to increase the capillary force. This makes it possible to smoothly move the condensate.

The condensate then gasifies again by the heat of the electronic component 30, which is a heat source, and the foregoing is repeated.

The vapor chamber 1 described so far is the example of a vapor chamber formed of two sheets of the first sheet 10 and the second sheet 20. The vapor chamber is not limited to this. The vapor chamber may be formed of three sheets as shown in FIG. 25, and may be formed of four sheets as shown in FIG. 26.

Figure 25:
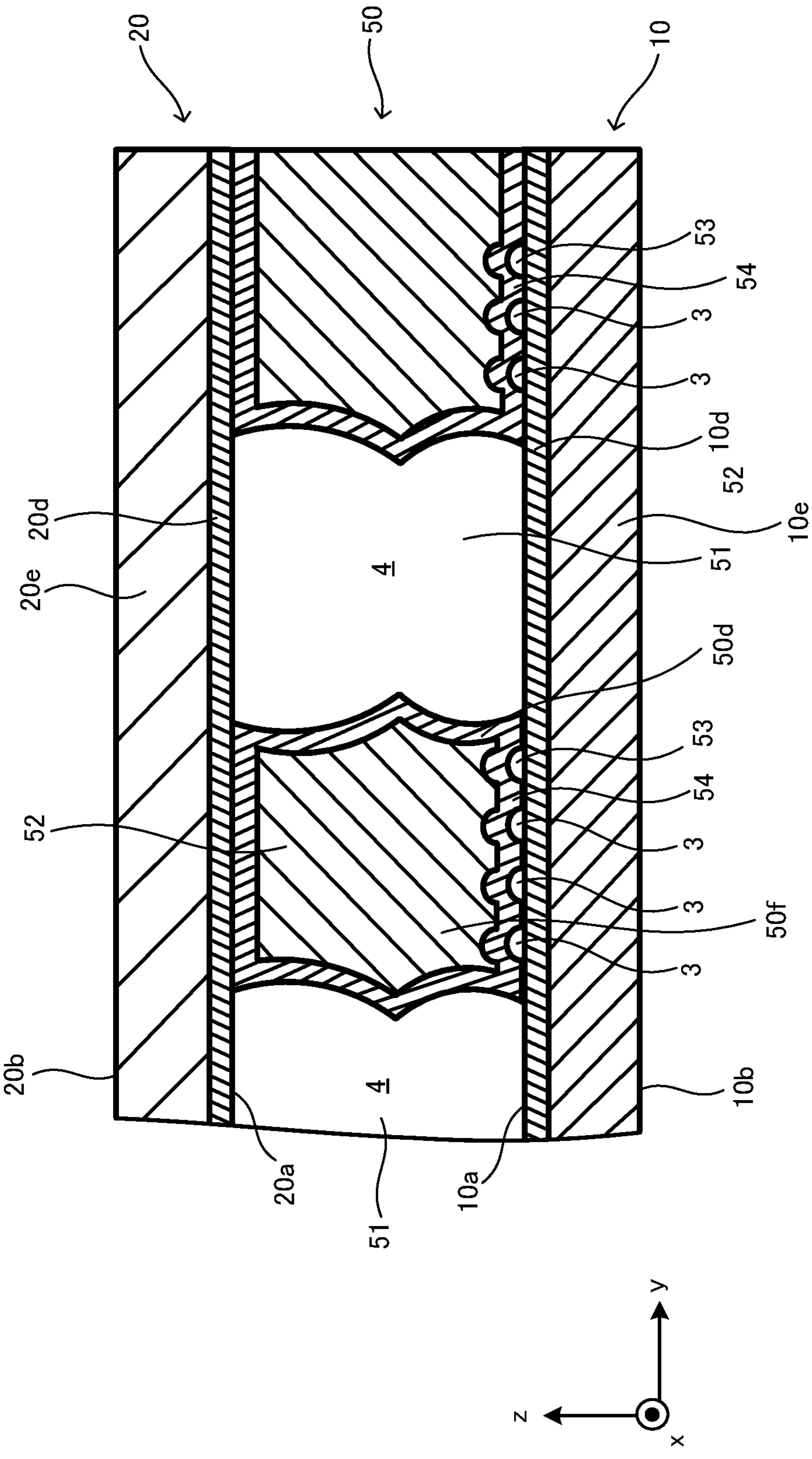
FIG. 25 illustrates a vapor chamber according to a modification.
Figure 26:
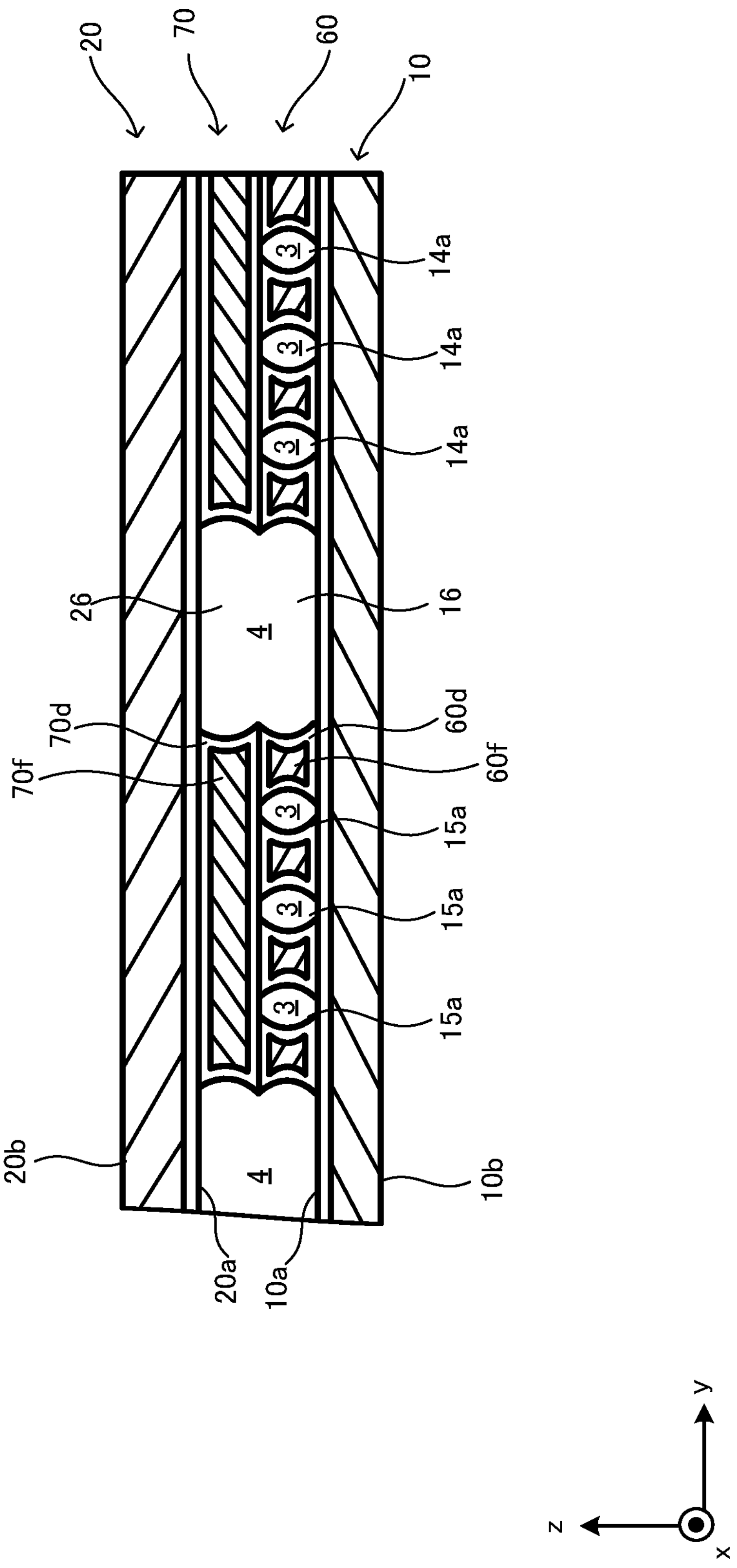
FIG. 26 illustrates a vapor chamber according to a modification.

The vapor chamber shown in FIG. 25 is a laminate of the first sheet 10, the second sheet 20 and a third sheet 50 that is a middle sheet. The third sheet 50 is disposed so as to be sandwiched between the first sheet 10 and the second sheet 20. These sheets are each bonded.

In this example, both the inner face 10*a* and the outer face 10*b* of the first sheet 10 are flat. Likewise, both the inner face 20*a* and the outer face 20*b* of the second sheet 20 are flat. The inner face 10*a* and the inner face 20*a* are formed of the inner layer 10*d* and the inner layer 20*d*, respectively. The outer face 10*b* and the outer face 20*b* are formed of the outer layer 10*e* and the outer layer 20*e*, respectively.

The thicknesses of the first sheet 10 and the second sheet 20 at this time are each preferably at most 1.0 mm, and may be at most 0.5 mm, and may be at most 0.1 mm. These thicknesses are each preferably at least 0.005 mm, and may be at least 0.015 mm, and may be at least 0.030 mm. The ranges of these thicknesses may be each defined by a combination of any one of the foregoing plural candidate values for the upper limit and any one of the foregoing plural candidate values for the lower limit. The ranges of these thicknesses may be each also defined by a combination of any two of the plural candidate values for the upper limit or a combination of any two of the plural candidate values for the lower limit.

The third sheet 50 includes vapor flow path grooves 51, walls 52, fluid flow path grooves 53, and protrusions 54.

The vapor flow path grooves 51 are grooves penetrating through the third sheet 50 in the thickness direction, are the grooves same as the vapor flow paths 4, which are the first flow paths formed by superposing the vapor flow path grooves 16 and the vapor flow path grooves 26, and have a form corresponding to the vapor flow paths 4.

The walls 52 are walls each provided between adjacent ones of the vapor flow path grooves 51, and have a form corresponding to the walls of the superposed peripheral fluid flow path part 14 and 24, and the superposed inner side fluid flow path parts 15 and inner side fluid flow path parts 25.

The fluid flow path grooves 53 are grooves arranged in the faces of the walls 52 which face the first sheet 10, and have a form corresponding to the fluid flow path grooves 14*a* and 15*a*. The fluid flow path grooves 53 form the condensate flow paths 3, which are the second flow paths.

The protrusions 54 are protrusions each arranged between adjacent ones of the fluid flow path grooves 53, and are disposed in a form corresponding to the protrusions 14*b* and 15*b*.

The grooves to be the condensate flow paths 3 and the vapor flow paths 4 are formed in the third sheet 50, and an inner layer 50*d* is laminated inside these grooves. Since no outer face is formed on the third sheet 50, a portion of the third sheet 50 where the inner layer 50*d* is laminated is a base layer 50*f* that is a base layer for laminating the inner layer 50*d*. Thus, each of the walls 52 has a mode of laminating the inner layer 50*d* on the periphery of the base layer 50*f*. The material constituting the base layer 50*f* may be considered the same as the outer layer 10*e*.

The vapor chamber having a structure as described above has the same effect as described above.

The vapor chamber shown in FIG. 26 is a laminate of the first sheet 10 and the second sheet 20, and a third sheet 60 and a fourth sheet 70 that are two middle sheets. The third sheet 60, the fourth sheet 70 and the second sheet 20 are laminated on the first sheet 10 in this order, to be bonded.

In this example, the inner faces 10*a* and 20*a*, and the outer face 10*b* and 20*b* of the first sheet 10 and the second sheet 20 are all flat. The inner face 10*a* and the inner face 20*a* are formed of the inner layer 10*d* and the inner layer 20*d*, respectively. The outer face 10*b* and the outer face 20*b* are formed of the outer layer 10*e* and the outer layer 20*e*, respectively.

The thicknesses of the first sheet 10 and the second sheet 20 at this time are each preferably at most 1.0 mm, and may be at most 0.5 mm, and may be at most 0.1 mm. These thicknesses are each preferably at least 0.005 mm, and may be at least 0.015 mm, and may be at least 0.030 mm. The ranges of these thicknesses may be each defined by a combination of any one of the foregoing plural candidate values for the upper limit and any one of the foregoing plural candidate values for the lower limit. The ranges of these thicknesses may be each also defined by a combination of any two of the plural candidate values for the upper limit or a combination of any two of the plural candidate values for the lower limit.

In this example, hatching of the inner layers is omitted in the drawing for visibility.

The third sheet 60 includes the fluid flow path grooves 14*a*, the fluid flow path grooves 15*a*, and the vapor flow path grooves 16.

The fluid flow path grooves 14*a*, the fluid flow path grooves 15*a*, and the vapor flow path grooves 16 in this example are grooves penetrating through the third sheet 60 in the thickness direction, and other than this, may be the same as the above-described fluid flow path grooves 14*a*, fluid flow path grooves 15*a*, and vapor flow path grooves 16.

The grooves to be the condensate flow paths 3 and the vapor flow paths 4 are formed in the third sheet 60, and an inner layer 60*d* is laminated inside these grooves. Since no outer face is formed on the third sheet 60, a portion of the third sheet 60 where the inner layer 60*d* is laminated is a base layer 60*f* that is a base layer for laminating the inner layer 60*d*. The material constituting the base layer 60*f* may be considered the same as the outer layer 10*e*.

The fourth sheet 70 includes the vapor flow path grooves 26.

The vapor flow path grooves 26 in this example are grooves penetrating through the fourth sheet 70 in the thickness direction, and other than this, may be the same as the above-described vapor flow path grooves 26.

The grooves to be the vapor flow paths 4 are formed in the fourth sheet 70, and an inner layer 70*d* is laminated inside these grooves. Since no outer face is formed on the fourth sheet 70, a portion of the fourth sheet 70 where the inner layer 70*d* is laminated is a base layer 70*f* that is a base layer for laminating the inner layer 60*d*. The material constituting the base layer 70*f* may be considered the same as the outer layer 10*e*.

Such sheets are laminated, so that the condensate flow paths 3, which are the second flow paths surrounded by the first sheet 10, the fluid flow path grooves 14*a* and the fourth sheet 70, and the condensate flow paths 3, which are the second flow paths surrounded by the first sheet 10, the fluid flow path grooves 15*a*, and the fourth sheet 70.

Likewise, the vapor flow path grooves 16 and the vapor flow path grooves 26 are superposed and disposed between the first sheet 10 and the second sheet 20, thereby forming the vapor flow paths 4, which are the first flow paths.

The vapor chamber having a structure as described above has the same effect as described above.

Second Embodiment

Figure 27:
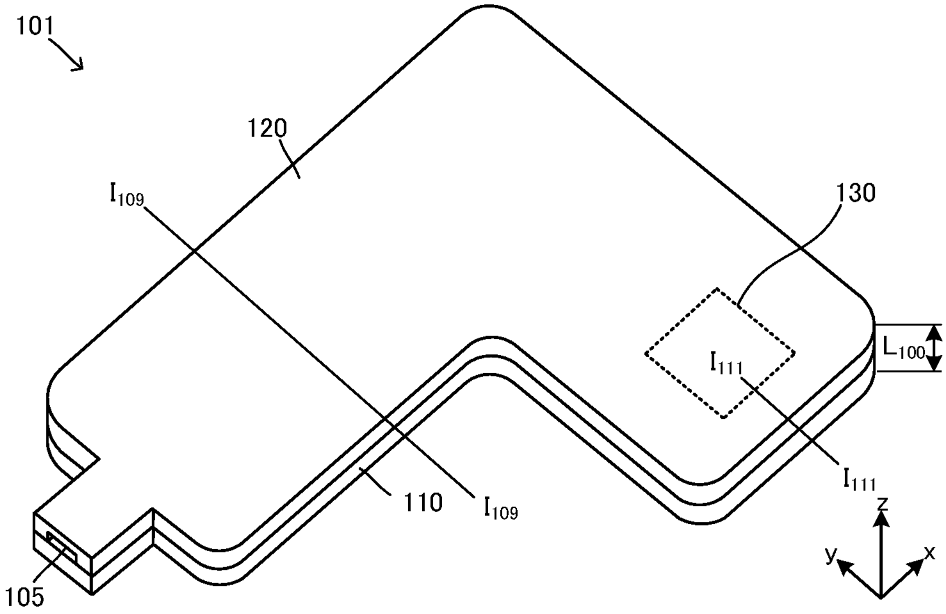
FIG. 27 is a perspective view of a vapor chamber 101.
Figure 28:
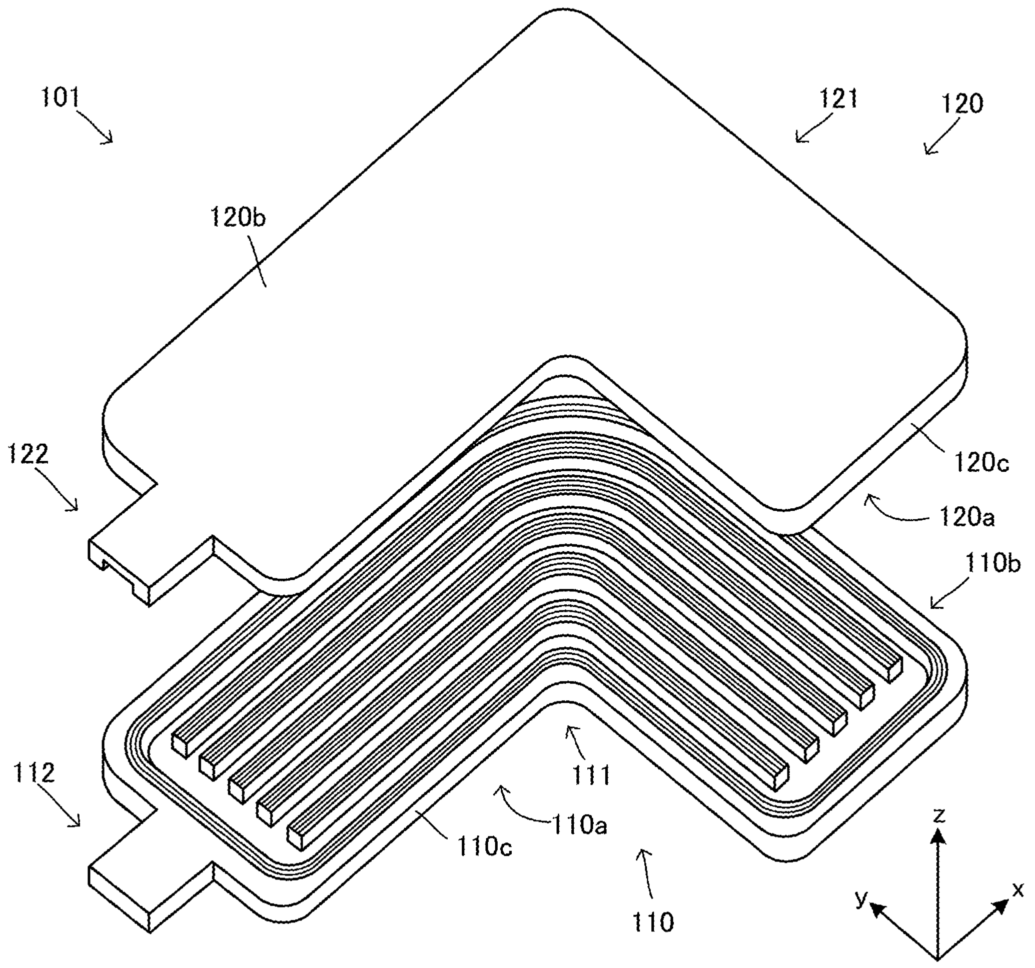
FIG. 28 is an exploded perspective view of the vapor chamber 101.

FIG. 27 is an external perspective view of a vapor chamber 101 according to the second embodiment. FIG. 28 is an exploded perspective view of the vapor chamber 101.

The vapor chamber 101 according to the present embodiment has, as can be seen from FIGS. 27 and 28, a first sheet 110 and a second sheet 120. As described later, these first sheet 110 and second sheet 120 are superposed and bonded (diffusion bonding, brazing, or the like), so that a hollow part is formed between the first sheet 110 and the second sheet 120. This hollow part is a sealed space 102 (for example, see FIG. 45) when a working fluid is enclosed therein.

Figure 29:
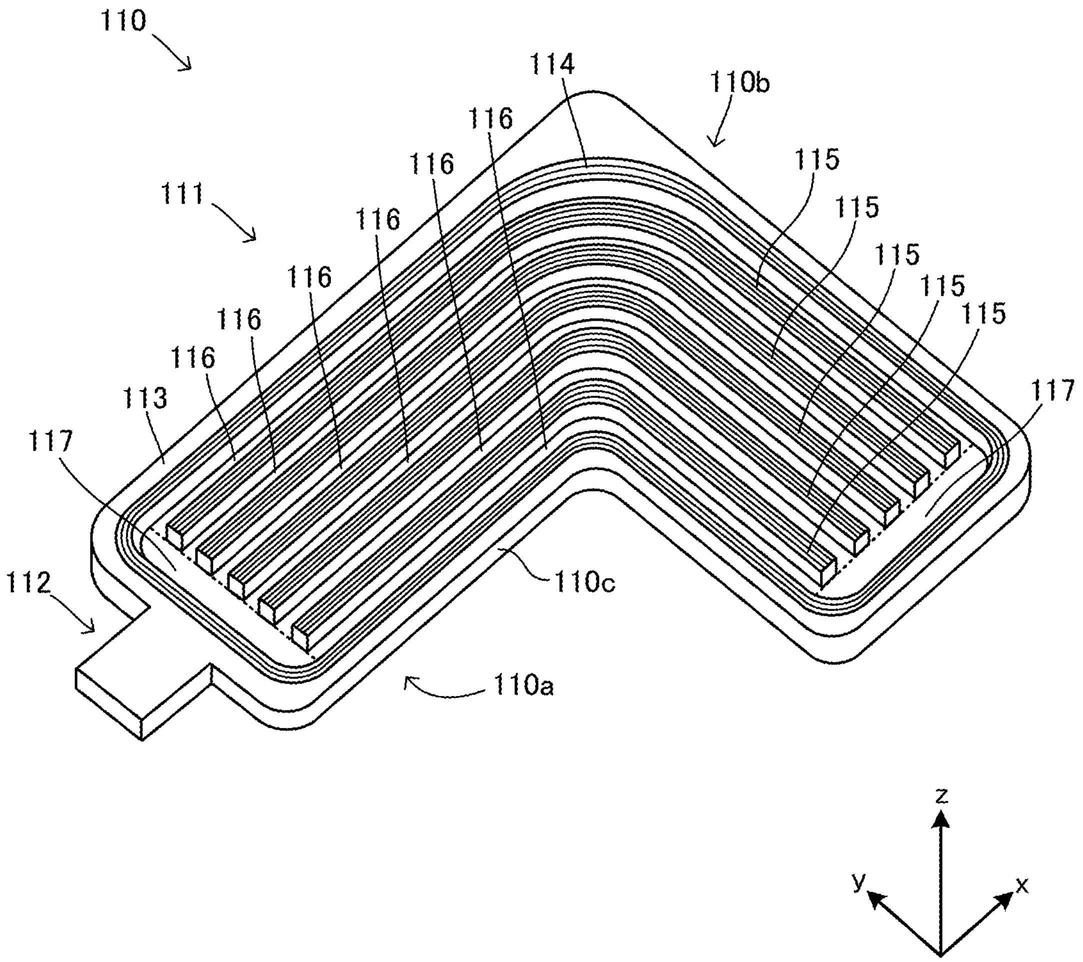
FIG. 29 is a perspective view of a first sheet 110.
Figure 30:
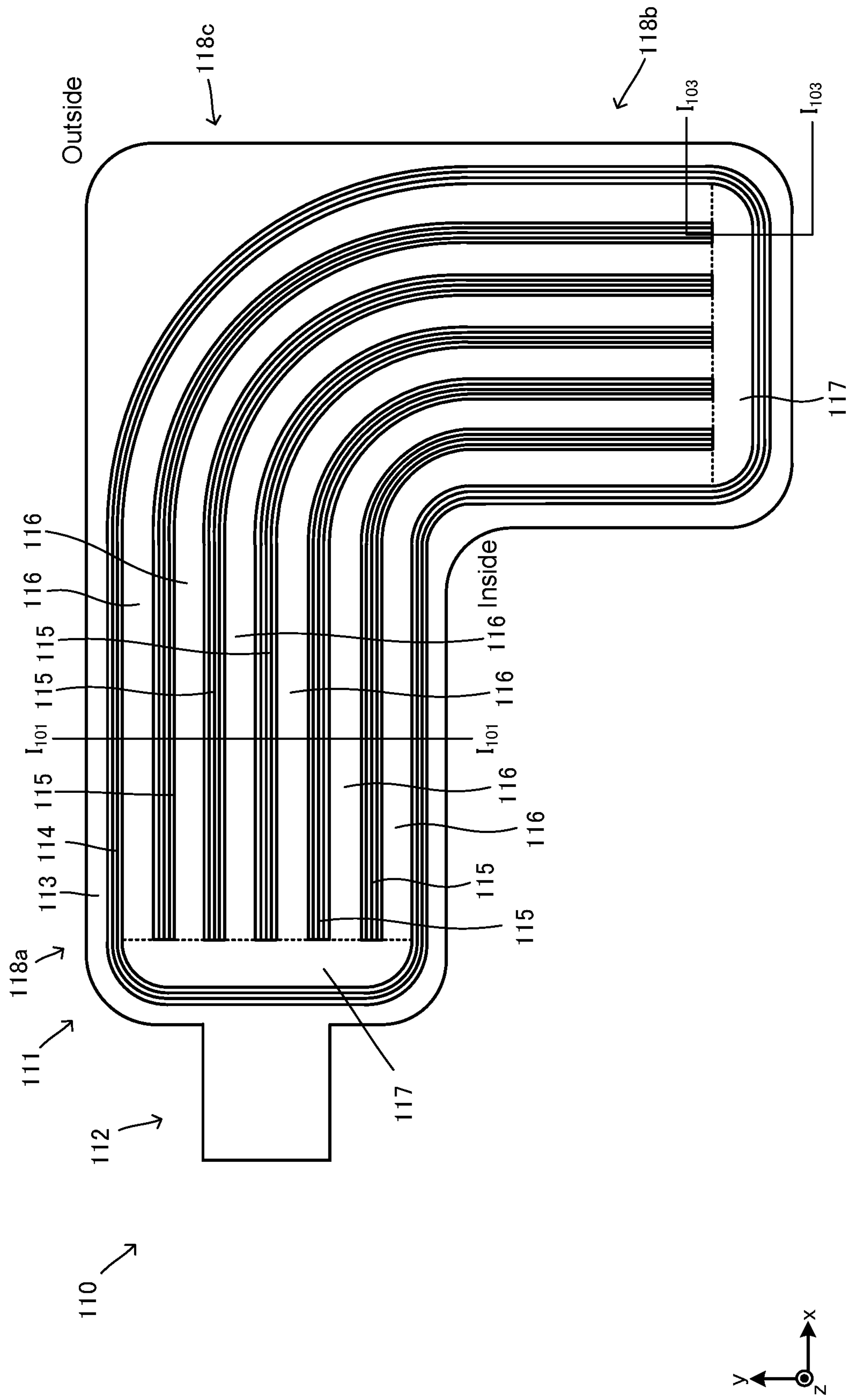
FIG. 30 is a plan view of the first sheet 110.
Figure 31:
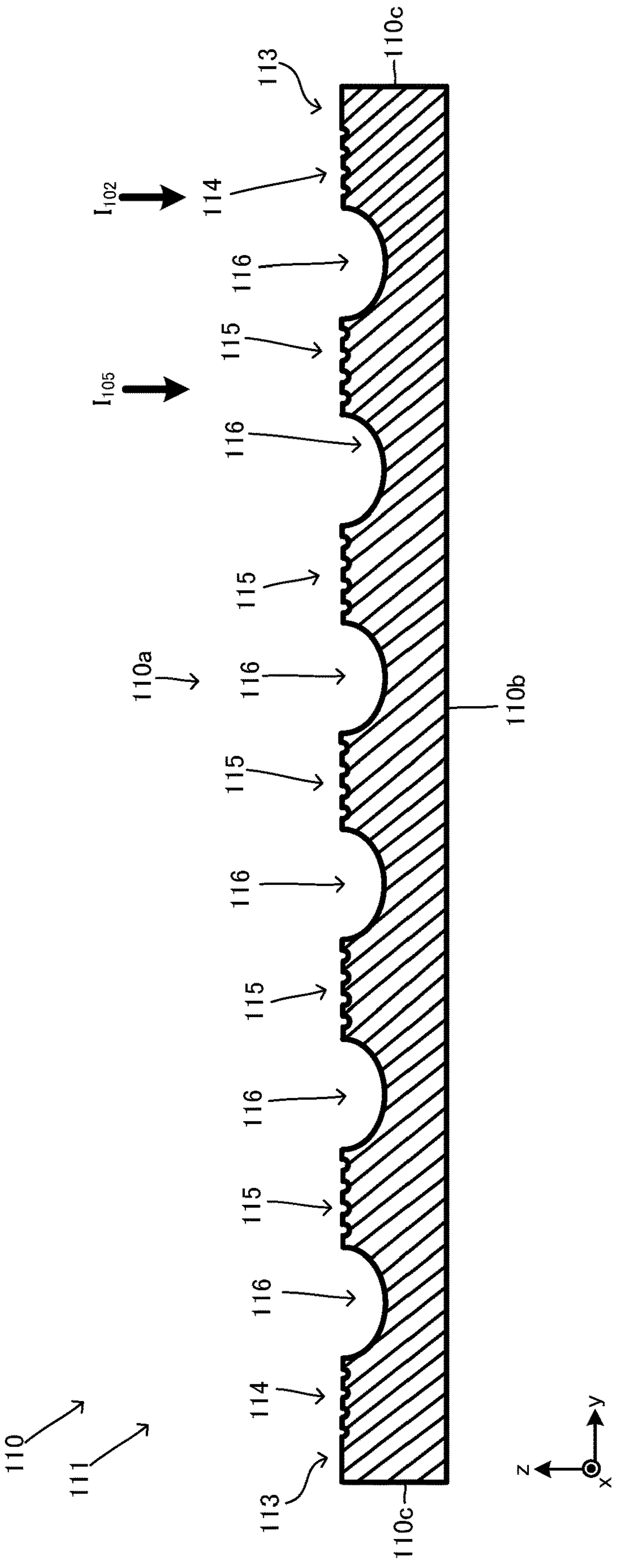
FIG. 31 shows a cross section of the first sheet 110.

In this embodiment, the first sheet 110 is a sheet-like member as a whole, and is in the form of L from a plan view. FIG. 29 is a perspective view of the first sheet 110 from the inner face 110*a* side. FIG. 30 is a plan view of the first sheet 110 from the inner face 110*a* side. FIG. 31 shows a cross section of the first sheet 110 taken along the line $I_{101}$-$I_{101}$ of FIG. 30.

The first sheet 110 includes an inner face 110*a*, an outer face 110*b* on the opposite side of the inner face 110*a*, and a side face 110*c* that stretches between the inner face 110*a* and the outer face 110*b* to form the thickness. A pattern for flow paths where a working fluid moves is formed on the inner face 110*a* side. As described later, the inner face 110*a* of this first sheet 110 and an inner face 120*a* of the second sheet 120 are superposed so as to face each other, so that the hollow part is formed. This hollow part is the sealed space 102 when a working fluid is enclosed therein.

The thickness of the first sheet 110 is not particularly limited, but may be considered the same as the first sheet 10.

The first sheet 110 includes a main body 111 and an inlet part 112. The main body 111 is in the form of a sheet and forms a portion where a working fluid moves, and in the present embodiment, is in the form of L with a curved portion from a plan view.

The inlet part 112 is a portion via which a working fluid is poured into the hollow part formed by the first sheet 110 and the second sheet 120. In the present embodiment, the inlet part 112 is in the form of a sheet of a quadrangle from a plan view which sticks out of the L-shape of the main body 111 from a plan view. In this embodiment, the inlet part 112 of the first sheet 110 is formed to have flat faces on both the inner face 110*a* side and the outer face 110*b* side.

A structure for a working fluid to move is formed in the main body 111 on the inner face 110*a* side. As this structure, specifically, the main body 111 includes a peripheral bonding part 113, a peripheral fluid flow path part 114, inner side fluid flow path parts 115, vapor flow path grooves 116, and vapor flow path communicating grooves 117 on the inner face 110*a* side.

The peripheral bonding part 113 is a face formed on the main body 111 on the inner face 110*a* side along the periphery of the main body 111. This peripheral bonding part 113 is superposed on, and bonded (diffusion bonding, brazing, or the like) to a peripheral bonding part 123 of the second sheet 120, so that the hollow part is formed between the first sheet 110 and the second sheet 120. This hollow part is the sealed space 102 when a working fluid is enclosed therein. The width of the peripheral bonding part 113 may be suitably set as necessary. This width at any of the narrowest portion may be considered the same as the width $W_1$ described concerning the first sheet 10.

Figure 32:
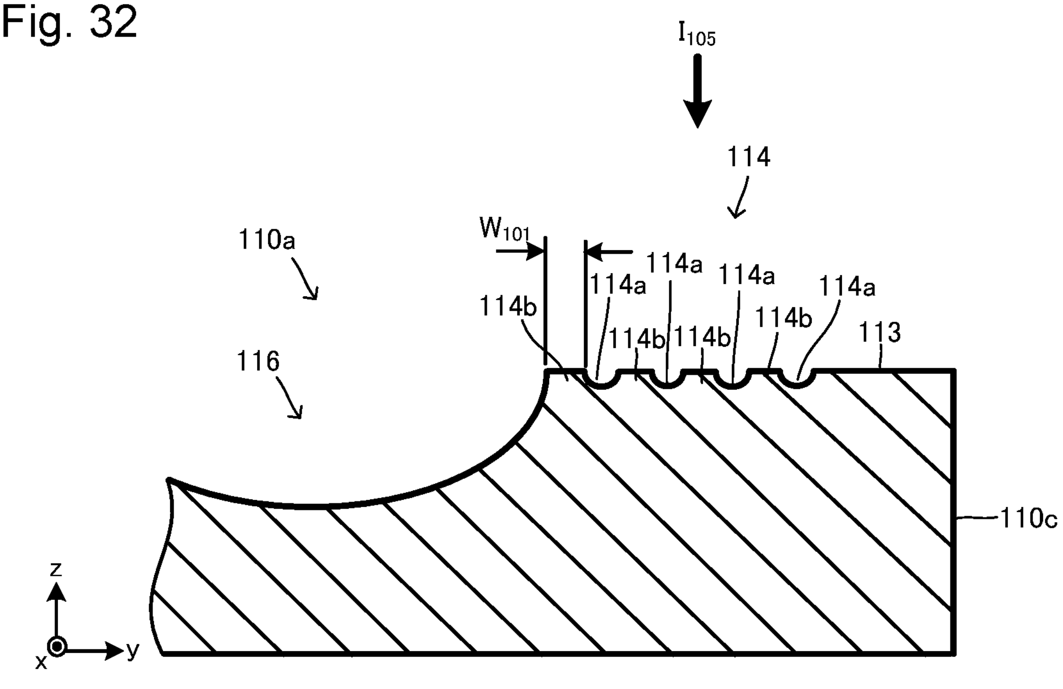
FIG. 32 shows another cross section of the first sheet 110.
Figure 33:
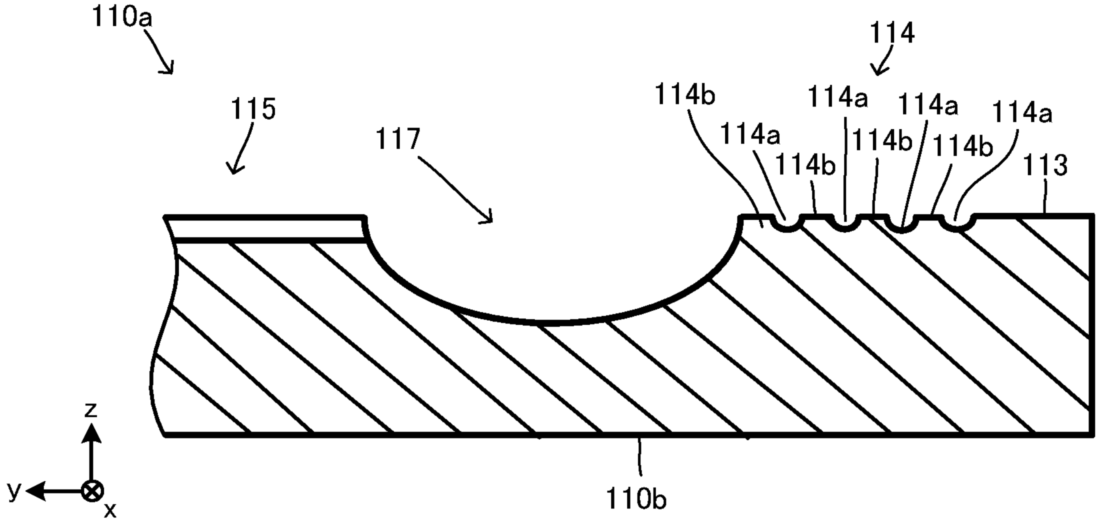
FIG. 33 shows another cross section of the first sheet 110.
Figure 34:
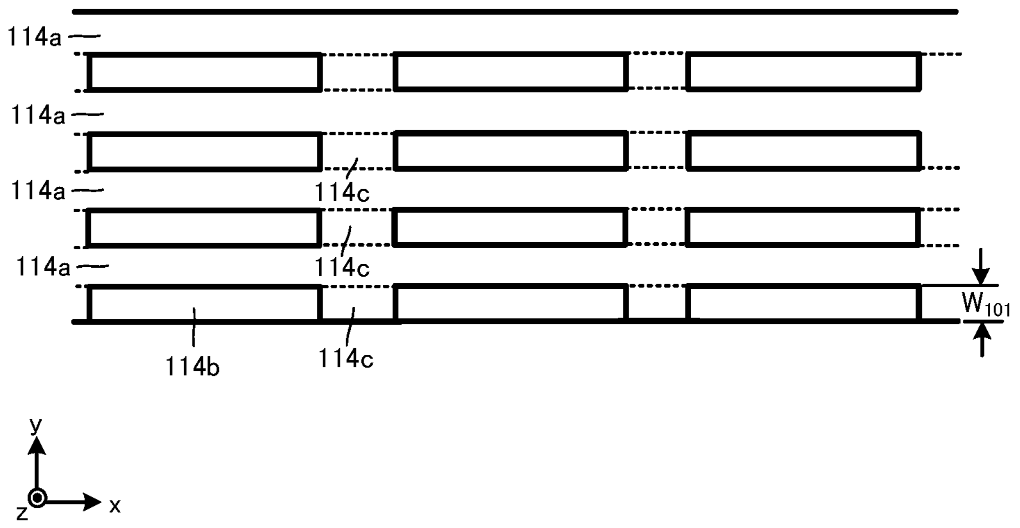
FIG. 34 is a partially enlarged plan view of a peripheral fluid flow path part 114.

The peripheral fluid flow path part 114 functions as a fluid flow path part, and is a portion that forms a part of condensate flow paths 103 (see, for example, FIG. 46) that are flow paths where a condensed and liquified working fluid passes. FIG. 32 shows a cross section of a portion indicated by the arrow $I_{102}$ in FIG. 31. FIG. 33 shows a cross section taken along the line $I_{103}$-$I_{103}$ in FIG. 30. Both the drawings show cross-sectional shapes of the peripheral fluid flow path part 114. FIG. 34 is an enlarged plan view of the peripheral fluid flow path part 114 in the direction indicated by the arrow $I_{105}$ in FIG. 32.

As can be seen in these drawings, the periphery fluid flow path part 114 is formed on the inner face 110*a* of the main body 111 along the inside of the peripheral bonding part 113, and is provided along the periphery of the sealed space 102 so as to be annular. Fluid flow path grooves 114*a* that are a plurality of grooves extending parallel to the extending direction of the periphery fluid flow path part 114 are formed in the peripheral fluid flow path part 114. A plurality of the fluid flow path grooves 114*a* are arranged at intervals in a direction different from the extending direction thereof. Thus, as can be seen in FIGS. 32 and 33, the fluid flow path grooves 114*a*, which are depressions, and walls 114*b* that are protrusions among the fluid flow path grooves 114*a* are formed on the peripheral fluid flow path part 114 as the depressions and the protrusions are repeated in a cross section of the peripheral fluid flow path part 114.

Here, since being grooves, the fluid flow path grooves 114*a* each have a bottom portion, and an opening that is present in a portion on the opposite side of the bottom portion and faces the bottom portion, in a cross-sectional shape thereof.

By including a plurality of the fluid flow path grooves 114*a* in this way, each of the fluid flow path grooves 114*a* can have smaller depth and width, and each of the condensate flow paths 103 (see, for example, FIG. 46) can have a smaller flow path cross-sectional area, so that a greater capillary force can be used. A plurality of the fluid flow path grooves 114*a* make it possible to secure a suitable magnitude of the total internal volume of the condensate flow paths 103 as a whole, which allows a condensate of a necessary flow rate to flow.

Further, in the peripheral fluid flow path part 114, as can be seen in FIG. 23, any adjacent ones of the fluid flow path grooves 114*a* communicate with each other via part of communicating opening parts 114*c* provided in the walls 114*b* at intervals. This promotes the equality of the amount of a condensate among a plurality of the fluid flow path grooves 114*a*, and allows the condensate to efficiently flow. Vapor flow paths 104 and the condensate flow paths 103 communicate with each other via part of the communicating opening parts 114*c* which is provided in part of the walls 114*b* which is adjacent to the vapor flow path grooves 116 forming the vapor flow paths 104. Thus, providing the communicating opening parts 114*c* makes it possible to smoothly move a condensate generated in the vapor flow paths 104 to the condensate flow paths 103, and to smoothly move a vapor generated in the condensate flow paths 103 to the vapor flow paths 104. This can also promote a smooth movement of a working fluid.

In this embodiment, as shown in FIG. 34, the communicating opening parts 114*c* are arranged so as to face each other across the respective fluid flow path grooves 114*a* at the same position in the extending direction of the fluid flow path grooves 114*a*. The communicating opening parts 114*c* are not limited to this, but may be arranged according to the example described with reference to FIG. 9.

The width of the peripheral fluid flow path part 114 may be considered the same as the width $W_2$ described concerning the first sheet 10.

The groove width of each of the fluid flow path grooves 114*a* may be considered the same as the width $W_3$ described concerning the first sheet 10, and the groove depth thereof may be considered the same as the depth $D_1$ described concerning the first sheet 10. The depth of the fluid flow path grooves 114*a* is preferably smaller than the sheet thickness that is the remainder when this groove depth is subtracted from the thickness of the first sheet 110. This makes it possible to more definitely prevent the sheet from breaking when a working fluid freezes.

The width of each of the walls 114*b* which is indicated by $W_{101}$ in FIGS. 32 and 34 is preferably 20 μm to 300 μm. This width smaller than 20 μm leads to easy fracturing due to repeated freezing and melting of a working fluid. This width larger than 300 μm leads to too large a width of each of the communicating opening parts 114*c*, which may prevent a working fluid from smoothly communicating between adjacent ones of the condensate flow paths 103.

The size of each of the communicating opening parts 114*c* along the extending direction of the fluid flow path grooves 114*a* may be considered the same as the size $L_1$ described concerning the first sheet 10. The pitch for adjacent ones of the communicating opening parts 114*c* in the extending direction of the fluid flow path grooves 114*a* may be considered the same as the pitch $L_2$ described concerning the first sheet 10.

In this embodiment, the cross-sectional shape of each of the fluid flow path grooves 114*a* is a semi-ellipse. This cross-sectional shape is not limited to this, but may be a quadrangle such as a square, a rectangle and a trapezoid, a triangle, a semicircle, a semicircle at the bottom, a semi-ellipse at the bottom, or the like.

Preferably, the fluid flow path grooves 114*a* are continuously formed along the edge inside the sealed space. That is, preferably, the fluid flow path grooves 114*a* annularly extend so as to make a circuit without being cut by any other components. This results in reduction of factors that inhibit the movement of a condensate, which can lead to a smooth movement of the condensate.

The peripheral fluid flow path part 114 is provided in this embodiment. The peripheral fluid flow path part 114 is not always necessary to be provided. No peripheral fluid flow path part 114 may be provided in view of the shape of the vapor chamber, the relation to a device to which the vapor chamber is applied, the operating conditions, etc. In this embodiment, heat can be conveyed to a peripheral portion of the vapor chamber by a vapor, using a peripheral portion of the sealed space as a vapor flow path, which may result in the equalization in heat in a higher degree.

Figure 35:
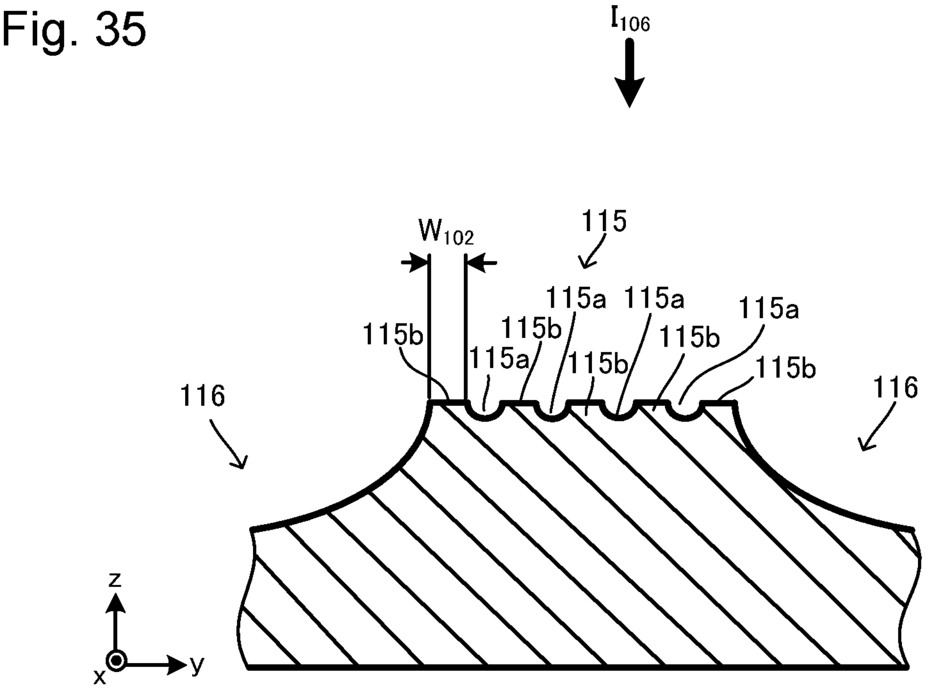
FIG. 35 shows a cross section focusing on an inner side fluid flow path part 115.
Figure 36:
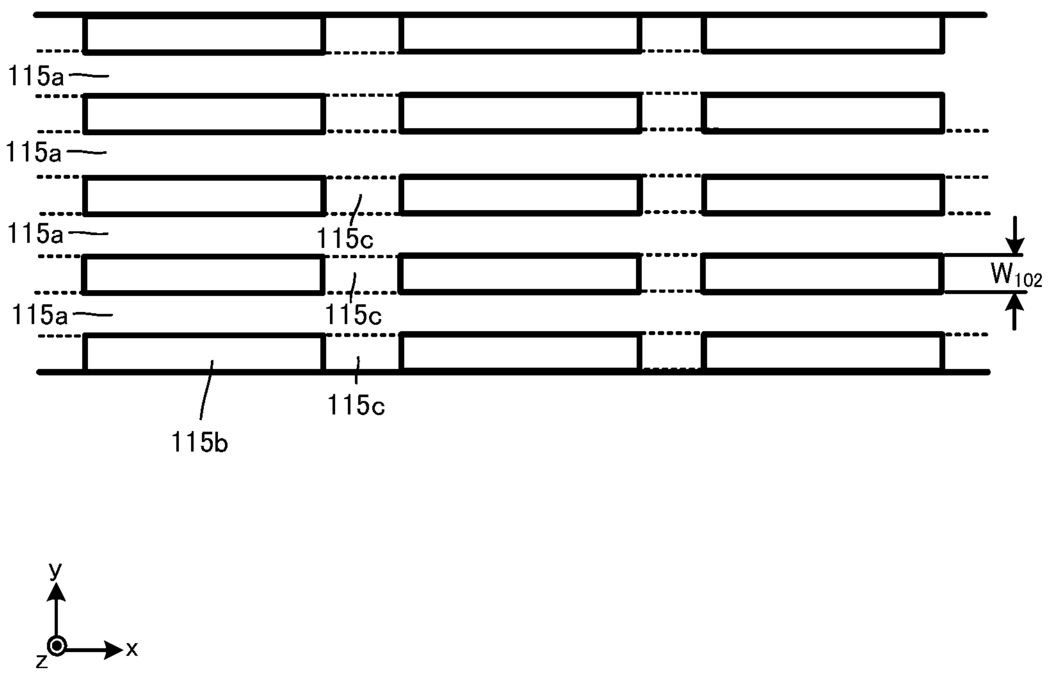
FIG. 36 is a partially enlarged plan view of the inner side fluid flow path part 115.

Returning to FIGS. 29 to 31, the inner side fluid flow path parts 115 will be described. The inner side fluid flow path parts 115 also function as fluid flow path parts, and are portions that form a part of the condensate flow paths 103, where a condensed and liquified working fluid passes. FIG. 35 shows a portion indicated by $I_{105}$ in FIG. 31. This drawing shows a cross-sectional shape of the inner side fluid flow path parts 115. FIG. 36 is an enlarged plan view of the inner side fluid flow path parts 115 in the direction indicated by the arrow $I_{106}$ in FIG. 35.

As can be seen in these drawings, the inner side fluid flow path parts 115 are formed on the inner face 110*a* of the main body 111 inside the ring of the annular peripheral fluid flow path part 114 (or the peripheral bonding part 113). As can be seen in FIGS. 29 and 30, the inner side fluid flow path parts 115 according to the present embodiment are extending protrusions with curved portions. The plural (five in this embodiment) inner side fluid flow path parts 115 are aligned at intervals in a direction different from the extending direction thereof, and are disposed among the vapor flow path grooves 116.

Fluid flow path grooves 115*a* that are grooves parallel to the extending direction of the inner side fluid flow path parts 115 are formed in each of the inner side fluid flow path parts 115. A plurality of the fluid flow path grooves 115*a* are disposed at intervals in a direction different from the extending direction thereof. Thus, as can be seen from FIGS. 31 and 36, the fluid flow path grooves 115*a*, which are depressions, and walls 115*b* that are protrusions among the fluid flow path grooves 115*a* are formed as the depressions and the protrusions are repeated in a cross section of the inner side fluid flow path parts 115.

Here, since being grooves, the fluid flow path grooves 115*a* each have a bottom portion, and an opening that is present in a portion on the opposite side of the bottom portion and faces the bottom portion, in a cross-sectional shape thereof.

By including a plurality of the fluid flow path grooves 115*a* in this way, each of the fluid flow path grooves 115*a* can have smaller depth and width, and each of the condensate flow paths 103 (see, for example, FIG. 46) can have a smaller flow path cross-sectional area, so that a greater capillary force can be used. A plurality of the fluid flow path grooves 115*a* make it possible to secure a suitable magnitude of the total internal volume of the condensate flow paths 103 as a whole, which allows a condensate of a necessary flow rate to flow.

Further, in the inner side fluid flow path parts 115, as can be seen in FIG. 36, any adjacent ones of the fluid flow path grooves 115*a* communicate with each other via communicating opening parts 115*c* provided in the walls 115*b* at intervals, according to the example of the peripheral fluid flow path part 114 as in FIG. 34. This promotes the equality of the amount of a condensate among a plurality of the fluid flow path grooves 115*a*, and allows the condensate to efficiently flow. The vapor flow paths 104 and the condensate flow paths 103 communicate with each other via part of the communicating opening parts 115*c* which is provided in part of the walls 115*b* which is adjacent to the vapor flow path grooves 116 forming the vapor flow paths 104. Thus, as described later, the formation of the communicating opening parts 115*c* can lead to a smooth movement of a condensate generated in the vapor flow paths 104 to the condensate flow paths 103, and can also lead to a smooth movement of a vapor generated in the condensate flow paths to the vapor flow paths 104. This can also promote a smooth movement of a working fluid.

In the inner side fluid flow path parts 115, the communicating opening parts 115*c* may be arranged at different positions across each of the fluid flow path grooves 115*a* in the extending direction of the fluid flow path grooves 115*a* as well according to the example of FIG. 9.

The width of each of the inner side fluid flow path parts 115 having the structure as described above may be considered the same as the width $W_4$ described concerning the first sheet 10.

The groove width of each of the fluid flow path grooves 115*a* may be considered the same as the width $W_5$ described concerning the first sheet 10, and the groove depth thereof may be considered the same as the depth $D_2$ described concerning the first sheet 10. This groove depth is preferably smaller than the sheet thickness that is the remainder when this groove depth is subtracted from the thickness of the first sheet 110. This makes it possible to more definitely prevent the sheet from breaking when a working fluid freezes.

The width of each of the walls 115*b* which is indicated by $W_{102}$ in FIGS. 35 and 36 is preferably 20 μm to 300 μm. This width smaller than 20 μm leads to easy fracturing due to repeated freezing and melting of a working fluid. This width larger than 300 μm leads to too large a width of each of the communicating opening parts 115*c*, which may prevent smooth communication among the condensate flow paths 103.

The size of each of the communicating opening parts 115*c* along the extending direction of the fluid flow path grooves 115*a* may be considered the same as the size $L_3$ described concerning the first sheet 10. The pitch for adjacent ones of the communicating opening parts 115*c* in the extending direction of the fluid flow path grooves 115*a* may be considered the same as $L_4$ described concerning the first sheet 10.

In the present embodiment, the cross-sectional shape of each of the fluid flow path grooves 115*a* is a semi-ellipse. This cross-sectional shape is not limited to this, but may be a quadrangle such as a square, a rectangle and a trapezoid, a triangle, a semicircle, a semicircle at the bottom, a semi-ellipse at the bottom, or the like.

Next, the vapor flow path grooves 116 will be described. The vapor flow path grooves 116 are portions where a working fluid in the form of a vapor or a condensate moves, and form a part of the vapor flow paths 104. FIG. 30 shows a shape of the vapor flow path grooves 116 from a plan view. FIG. 31 shows a cross-sectional shape of the vapor flow path grooves 116.

As can be seen from these drawings, the vapor flow path grooves 116 are formed of grooves that are formed inside the ring of the annular peripheral fluid flow path part 114 on the inner face 110*a* of the main body 111. Specifically, the vapor flow path grooves 116 according to the present embodiment are formed between adjacent ones of the inner side fluid flow path parts 115, and between the peripheral fluid flow path part 114 and the inner side fluid flow path parts 115, and are extending grooves with curved portions. The plural (six in this embodiment) vapor flow path grooves 116 are aligned in a direction different from the extending direction thereof. Thus, as can be seen in FIG. 31, the first sheet 110 has a shape of repeated depressions and protrusions: the protrusions are the inner side fluid flow path parts 15; and the depressions are the vapor flow path grooves 116.

Here, since being grooves, the vapor flow path grooves 116 each have a bottom portion, and an opening that is present in a portion on the opposite side of the bottom portion and faces the bottom portion, in a cross-sectional shape thereof.

The structure of the vapor flow path grooves 116 are not limited as long as a working fluid can move in the vapor flow paths 104 when the vapor flow path grooves 116 are combined with vapor flow path grooves 126 of the second sheet 120 to form the vapor flow paths 104.

The width of each of the vapor flow path grooves 116 is formed to be at least larger than that of each of the fluid flow path grooves 114*a* and that of each of the fluid flow path grooves 115*a*, and may be considered the same as the width $W_6$ described concerning the first sheet 10.

The depth of each of the vapor flow path grooves 116 is formed to be at least larger than that of the fluid flow path grooves 114*a* and that of the fluid flow path grooves 115*a*, and may be considered the same as the depth $D_3$ described concerning the first sheet 10.

The foregoing lead to a stable movement of a working fluid when the vapor flow paths are formed. In addition, the flow path cross-sectional area of the vapor flow path groove larger than that of the fluid flow path groove makes it possible to smoothly move a vapor having a larger volume than a condensate due to properties of a working fluid.

Here, the vapor flow path grooves 116 are preferably configured so that the width of each of the vapor flow paths 104 is larger than the height thereof (size in the thickness direction), that is, each of the vapor flow paths 104 has a flat shape when the vapor flow path grooves 116 are combined with the second sheet 120 to form the vapor flow paths 104 as described later. Therefore, the aspect ratio represented by a value obtained by dividing the height by the width is preferably at least 4.0, and more preferably at least 8.0.

In the present embodiment, the cross-sectional shape of each of the vapor flow path grooves 116 is a semi-ellipse. This cross-sectional shape is not limited to this, but may be a quadrangle such as a square, a rectangle and a trapezoid, a triangle, a semicircle, a semicircle at the bottom, a semi-ellipse at the bottom, or the like.

The vapor flow path communicating grooves 117 are grooves allowing a plurality of the vapor flow path grooves 116 to communicate with each other, and forming flow paths allowing a plurality of the vapor flow paths 104 formed of the vapor flow path grooves 116 to communicate with each other at the ends thereof when combined with vapor flow path communicating grooves 127 of the second sheet 120. This can lead to a smooth movement of a working fluid generated in the vapor flow paths 104 in the extending direction of the inner side fluid flow path parts 115.

The vapor flow path communicating grooves 117 may be considered the same as the vapor flow path communicating grooves 17 described concerning the first sheet 10.

In the present embodiment, the first sheet 110 includes a curved part 118*c* that is a portion at which the extending directions of the fluid flow path grooves 114*a* (peripheral fluid flow path part 114), the fluid flow path grooves 115*a* (inner side fluid flow path parts 115), and the vapor flow path grooves 116 change. That is, the first sheet 110 includes: a linear part 118*a* where the fluid flow path grooves 114*a* (peripheral fluid flow path part 114), the fluid flow path grooves 115*a* (inner side fluid flow path parts 115), and the vapor flow path grooves 116 linearly extend in the x-direction; a linear part 118*b* where the fluid flow path grooves 114*a* (peripheral fluid flow path part 114), the fluid flow path grooves 115*a* (inner side fluid flow path parts 115), and the vapor flow path grooves 116 linearly extend in the y-direction; and the curved part 118*c* where part of the fluid flow path grooves 114*a* (peripheral fluid flow path part 114), the fluid flow path grooves 115*a* (inner side fluid flow path parts 115), and the vapor flow path grooves 116 in the linear part 118*a* and part of those in the linear part 118*b* are linked. Therefore, one end of the curved part 118*c* is connected to the linear part 118*a*, and the other end thereof is connected to the linear part 118*b*. At the curved part 118*c*, the fluid flow path grooves 114*a* (peripheral fluid flow path part 114), the fluid flow path grooves 115*a* (inner side fluid flow path parts 115), and the vapor flow path grooves 116 curve, so that the directions of the flows change from the x-direction to the y-direction and from the y-direction to the x-direction.

Here, the borders between the respective linear parts and the curved part may be where the directions of the flows begin to change in the grooves. Hereinafter the same approach may be adopted.

In this embodiment, at the curved part 118*c*, the widths of a plurality of the vapor flow path grooves 116 are configured, so that any of the vapor flow path grooves 116 on an inner side at which the radius of the curve is narrower has a larger width, and any thereof on an outer side at which the radius of the curve is wider has a smaller width. This makes it possible to improve the balance of the flow resistance at the curved part, which can result in a smoother movement of a working fluid and an increase in the heat transport capability.

Any specific examples for this is not particularly limited, but include the examples shown in FIGS. 37, 38, 39 and 40.

FIGS. 37 to 40 focus on, and illustrate one of the vapor flow path grooves 116. The meanings of the signs shown in these drawings are as follows.

a. At the curved part 118*c*, an inner side wall $w_{in}$ of the curve of the vapor flow path groove 116 is in the form of a circular arc having the radius of curve $r_{in}$ and the center $O_1$.

b. At the curved part 118*c*, an outer side wall $w_{out}$ of the curve of the vapor flow path groove 116 is in the form of a circular arc having the radius of curve $r_{out}$, and the center $O_1$, $O_2$, $O_3$ or $O_4$ according to examples as descried later.

c. While the width of the narrowest vapor flow path groove in a plurality of the vapor flow path grooves 116 is a at the curved part 118*c*, the width of each of the other vapor flow path grooves 116 is widened to β (α<β). That is, in the present embodiment, the width of one of a plurality of the vapor flow path grooves 116 that is disposed on the outermost side is a at the curved part 118*c*.

d. The curved line shown in the dotted line is a virtual line when the width of the vapor flow path groove 116 is α. At this time, the curved line is in the form of a circular arc having the radius of the curve $r_c$ and the center $O_1$.

e. The radius of a circle passing through three points in total may be considered as the radius of the curve: the three points are: two points at the wall (the inner side wall or the outer side wall) at the curved part where the direction of the wall begins to change; and one point in the middle of these two points. Assuming that the curve is part of a circle or an ellipse, as shown in FIGS. 37 to 40, the center side of the circle or ellipse of the curve (i.e., the $O_1$, $O_2$, $O_3$ or $O_4$ side) is defined as an "inner side" of the curved part, and the opposite side of the center side of the circle or ellipse is defined as an "outer side" of the curve. The shape of the curve is not limited to a shape such as part of a complete round, but may be a shape such as part of an ellipse. Some of a plurality of the disposed vapor flow path grooves may have a shape such as a straight line at the curved part. Hereinafter the shapes relating to the curved part may be considered in the same manner.

Figure 37:
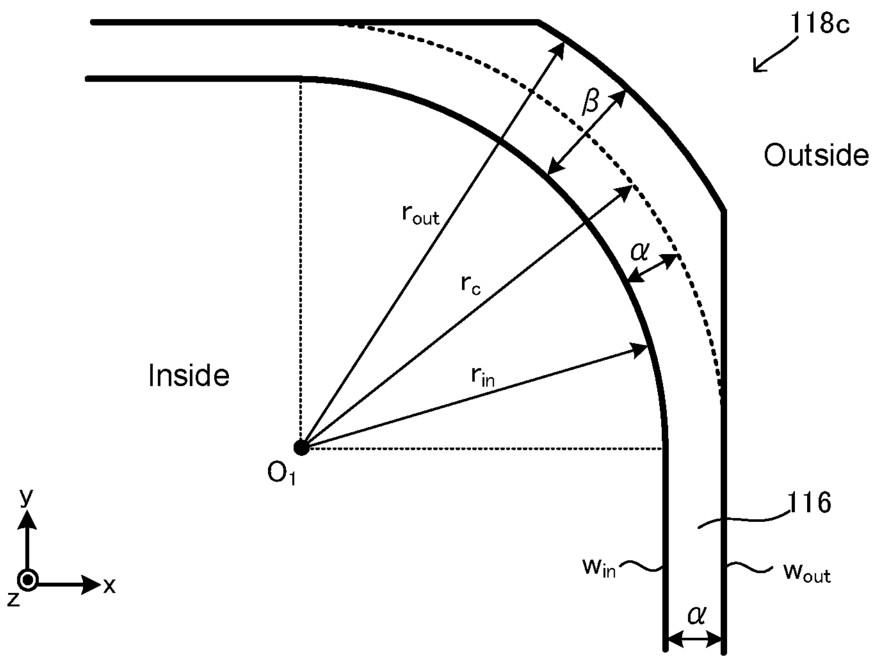
FIG. 37 illustrates an example of a curved part 118*c*.

In the example of FIG. 37, at the curved part 118*c*, the radius of the curve $r_{out}$ of the outer side wall $w_{out}$ of the vapor flow path groove 116 is larger than the radius of the curve $r_c$ ($r_{out}>r_c$), and the center thereof is $O_1$. In this example, it is sufficient that any of the vapor flow path grooves 116 which is disposed on an inner side has larger $r_{out}$ at the curved part 118*c*. According to this, any of the vapor flow path grooves 116 disposed on an inner side has a larger groove width β.

Figure 38:
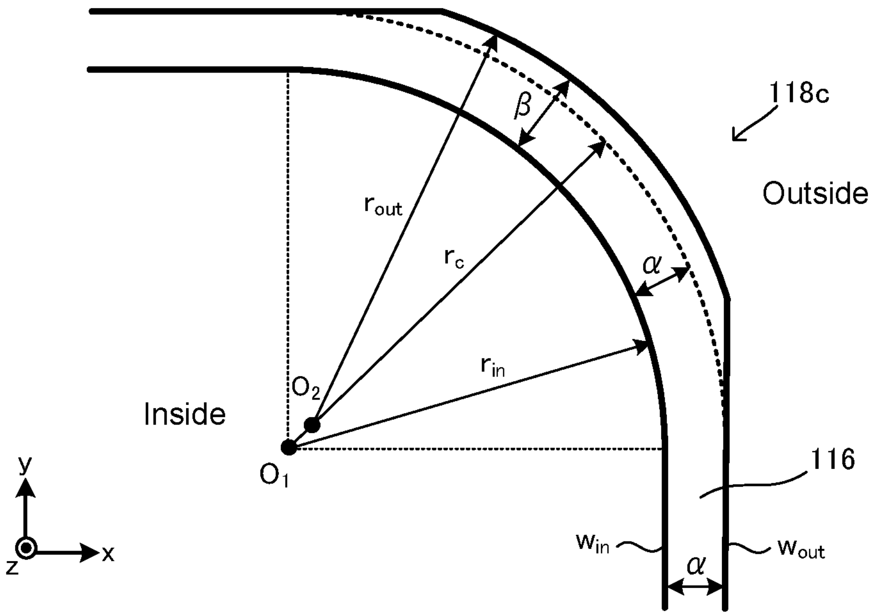
FIG. 38 illustrates an example of the curved part 118*c*.

In the example of FIG. 38, at the curved part 118*c*, the radius of the curve $r_{out}$ of the outer side wall $w_{out}$ of the vapor flow path groove 116 is the same as the radius of the curve $r_c$ ($r_{out}=r_c$), but the center $O_2$ thereof shifts toward the vapor flow path groove 116 side more than $O_1$. In this example, it is sufficient that at the curved part 118*c*, any of the vapor flow path grooves 116 which is disposed on an inner side has the center ($O_2$) for the outer side wall $w_{out}$ thereof, so that the center ($O_2$) is closer to the vapor flow path groove 116. According to this, any of the vapor flow path grooves 116 disposed on an inner side has a larger groove width β.

Figure 39:
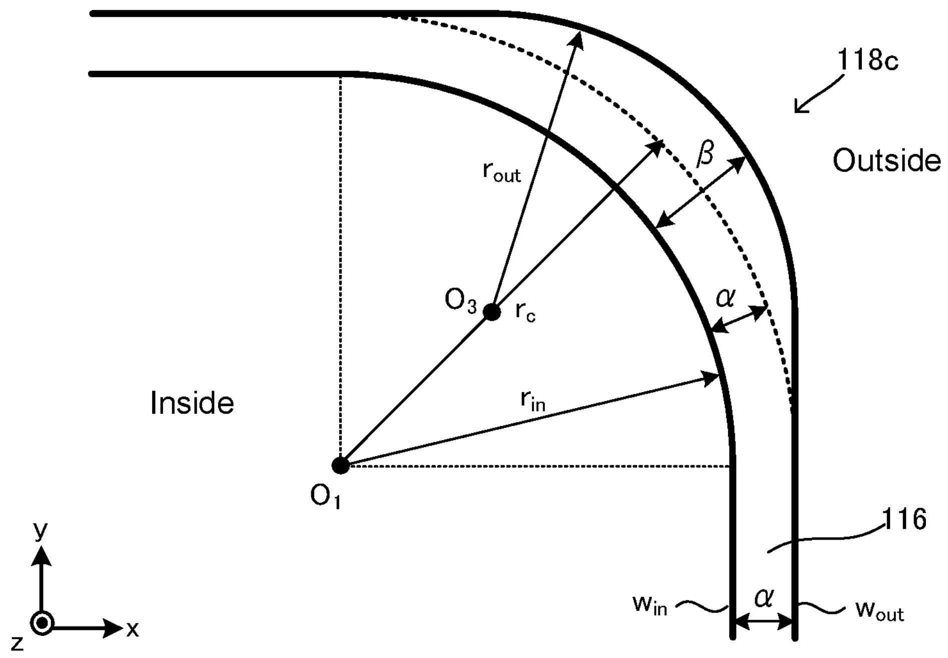
FIG. 39 illustrates an example of the curved part 118*c*.

In the example of FIG. 39, at the curved part 118*c*, the radius of the curve $r_{out}$ of the outer side wall $w_{out}$ of the vapor flow path groove 116 is smaller than the radius of the curve $r_{in}$ and than the radius of the curve $r_c$ ($r_{out} \ll r_c$), and the center $O_3$ thereof shifts toward the vapor flow path groove 116 side more than $O_1$. In this example, it is sufficient that at the curved part 118*c*, both the size of $r_{out}$ and the position of 03 of any of the vapor flow path grooves 116 which is disposed on an inner side lead to a larger width β thereof.

Figure 40:
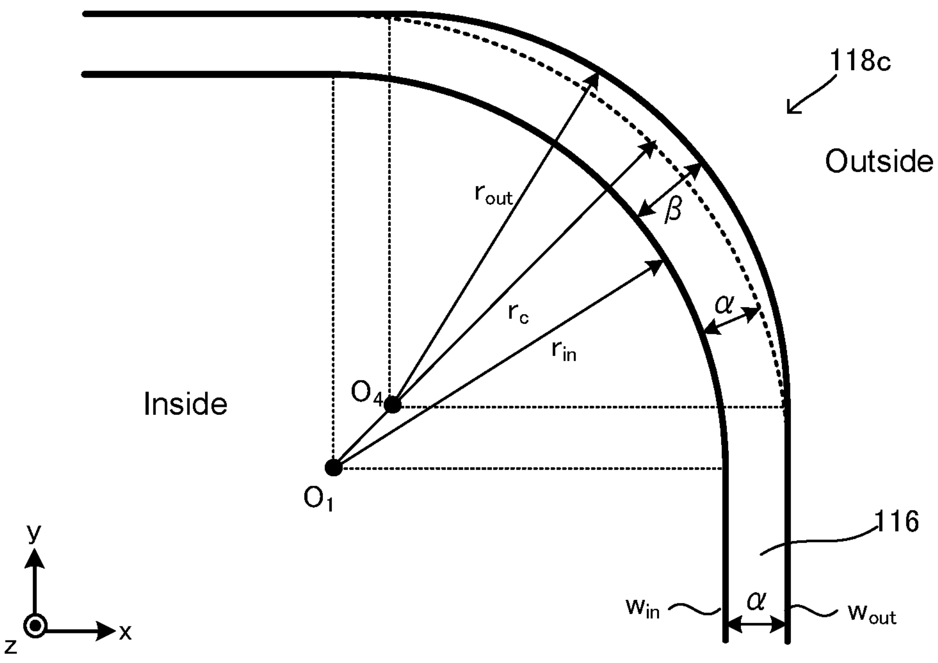
FIG. 40 illustrates an example of the curved part 118*c*.

In the example of FIG. 40, at the curved part 118*c*, the radius of the curve $r_{out}$ of the outer side wall $w_{out}$ of the vapor flow path groove 116 is the same as the radius of the curve $r_{in}$ of the inner side wall $w_{in}$, and the center $O_4$ for $r_{out}$ shifts toward the vapor flow path groove 116 side more than $O_1$. In this example, it is sufficient that at the curved part 118*c*, the position of 04 of any of the vapor flow path grooves 116 which is disposed on an inner side lead to a larger width β thereof.

In the examples of FIGS. 37 and 38, the respective linear portions and the portion of a circular arc are connected by one bending portion at the outer side wall $w_{out}$. The bending portion is not limited to this. The bending portion may be configured to be replaced by many small bending portions or by a curved line, so that the linear portions and the portion of a circular arc are connected so that the direction of the outer side wall $w_{out}$ changes gradually and smoothly.

The degree at which any of the vapor flow path grooves on an inner side has a larger width is not particularly limited. Preferably, one of the vapor flow path grooves has a width approximately 3% to 20% larger than the groove disposed on the outer side thereof adjacent thereto. It is not necessary that this proportion be fixed or regular for a plurality of the grooves. This proportion may be suitably set.

The respective widths of the vapor flow path grooves 116 at the curved part 118*c* to the respective widths of the vapor flow path grooves 116 at the linear part 118*b* are not particularly limited, but may be larger than those at each of the linear part 118*a* and the linear part 118*b* in the range of 10% to 100%. This range causes the balance of the flow resistance between the linear part 118*b* and the curved part 118*c* to be better.

The above description has focused on the width of the vapor flow path groove, and has describes the examples. The depth of each of the vapor flow path grooves 116 at the curved part 118*c* may be changed instead, or in addition to the foregoing. That is, a plurality of the vapor flow path grooves 116 may be configured, so that at the curved part 118*c*, one of a plurality of the vapor flow path grooves 116 which is disposed on the outer side is the shallowest, and any of the vapor flow path grooves 116 which is disposed on an inner side is deeper. In an example where a change is made in the depth direction (z-direction), spreading in the planar direction (xy-direction) is suppressed, which makes it possible to secure a larger area where condensate flow paths are disposed and achieve an improvement in the heat transport capability, and makes it possible to secure the peripheral bonding part of a larger area and achieve an improvement in the reliability of the pressure resistance.

That is, by the formation of the vapor flow path grooves 116 each having a different width from each other at the curved part 118*c* as described above, a vapor flow path disposed on an inner side can have a larger width than that disposed on an outer side has at the curved part when the first sheet 110 and the second sheet 120 are combined. According to this, the flow path cross-sectional area of a vapor flow path disposed on an inner side can be larger than that disposed on an outer side, at the curved part.

By the formation of the vapor flow path grooves 116 each having a different depth from each other at the curved part 118*c*, a vapor flow path disposed on an inner side can have a larger height than that disposed on an outer side has at the curved part when the first sheet 110 and the second sheet 120 are combined. According to this, the flow path cross-sectional area of a vapor flow path disposed on an inner side can be larger than that disposed on an outer side, at the curved part.

The respective pitches for the communicating opening parts 114*c* and the communicating opening parts 115*c* provided in the walls 114*b* and the walls 115*b* partitioning the fluid flow path grooves 114*a*, the fluid flow path grooves 115*a* and the vapor flow path grooves 116 (see FIGS. 34 and 36), at the curved part 118*c* may be formed to be different from those at the other parts (linear part 118*a* and 118*b*). This means that the pitch for the communicating opening parts at the curved part may be either larger or smaller than that for the communicating opening parts in the respective linear parts. In these examples, the example that can lead to a lower flow resistance may be employed in view of the entire shape of the vapor chamber, and the influence of, for example, the location of a heat source, based on the comprehensive determination. At this curved part 118*c*, no communicating opening part 114*c* or communicating opening parts 115*c* may be provided in the walls 114*b* and the walls 115*b* partitioning the fluid flow path grooves 114*a*, the fluid flow path grooves 115*a* and the vapor flow path grooves 116.

In the example of a larger pitch for the communicating opening parts at the curved part than that in the linear part, it can be suppressed that a working fluid flowing in the vapor flow path grooves 116 (vapor flow paths 104) enters the communicating opening parts 114*c* and the communicating opening parts 115*c* at the curved part 118*c*. At the curved part 118*c*, force by which a working fluid moving in the vapor flow path grooves 116 (vapor flow paths 104) is about to directly flow into the communicating opening parts 114*c* and the communicating opening parts 115*c* due to its flow direction is exerted at the curved part 118*c*, which leads to increasing tendencies for a vapor to enter the condensate flow paths 103, and for the flow resistance to increase due to the depressions and the protrusions of the communicating opening parts 114*c* and the communicating opening parts 115*c*. Against them, at the curved part 118*c*, larger pitches for the communicating opening parts 114*c* and the communicating opening part 115*c*, part of which are in contact with the vapor flow path grooves 116; or no communicating opening part 114*c* or communicating opening part 115*c* in contact with the vapor flow path grooves 116 may make it possible to suppress such an increase in the flow resistance, to further reduce the difference between the vapor flow path grooves 116 (vapor flow paths 104) in flow resistance, to improve the balance of the movement of a working fluid, and to improve the heat transport capability.

In the example of a smaller pitch for the communicating opening parts at the curved part than that in the linear part, the occasion when a vapor flowing in the vapor flow path grooves (vapor flow paths) strongly hits at the wall faces increases at the curved part, which easily leads to condensation of the vapor. At this time, in the example of a smaller pitch for the communicating opening parts at the curved part than that in the linear part, it is possible to increase the number of the communicating opening parts, to smoothly introduce a condensate to the fluid flow path grooves (condensate flow paths), and to prevent the vapor flow paths from closing with the condensate. This may make it possible to suppress an increase in the flow resistance, to further reduce the difference between the vapor flow path grooves (vapor flow paths) in flow resistance, to improve the balance of the movement of a working fluid, and to improve the heat transport capability.

Instead of the size of the pitch, the length of each wall between adjacent communicating opening parts (size in a direction along the flow paths) at the curved part may be configured to be either larger or smaller than that in the linear part. At this time, at the curved part, it is not necessary that the length of each wall be the same, but this length may be different between the walls. In this case, the relationship of the magnitude between the length of each wall at the curved part and that in the linear part shall be based on the relationship between the average values of the lengths of the walls at the respective parts.

Figure 41:
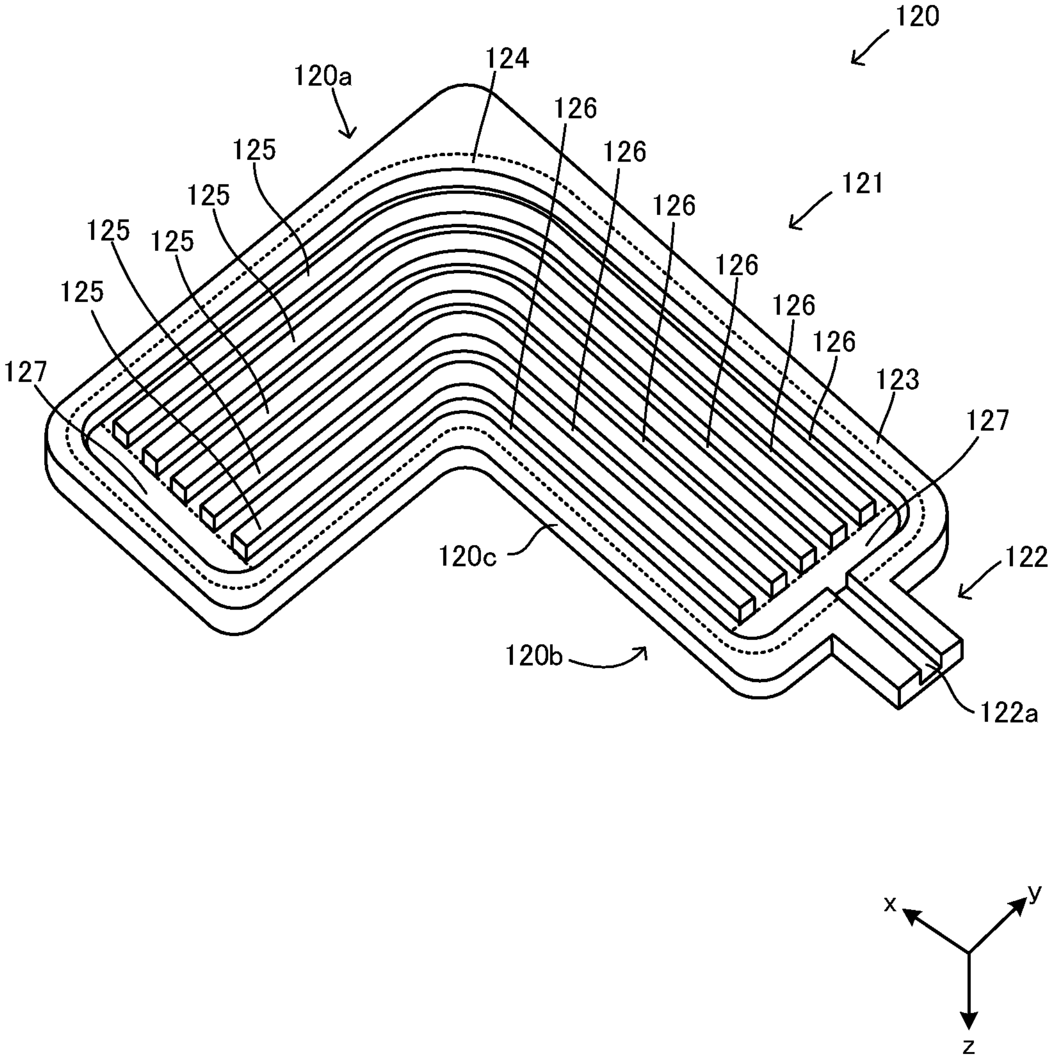
FIG. 41 is a perspective view of a second sheet 120.
Figure 42:
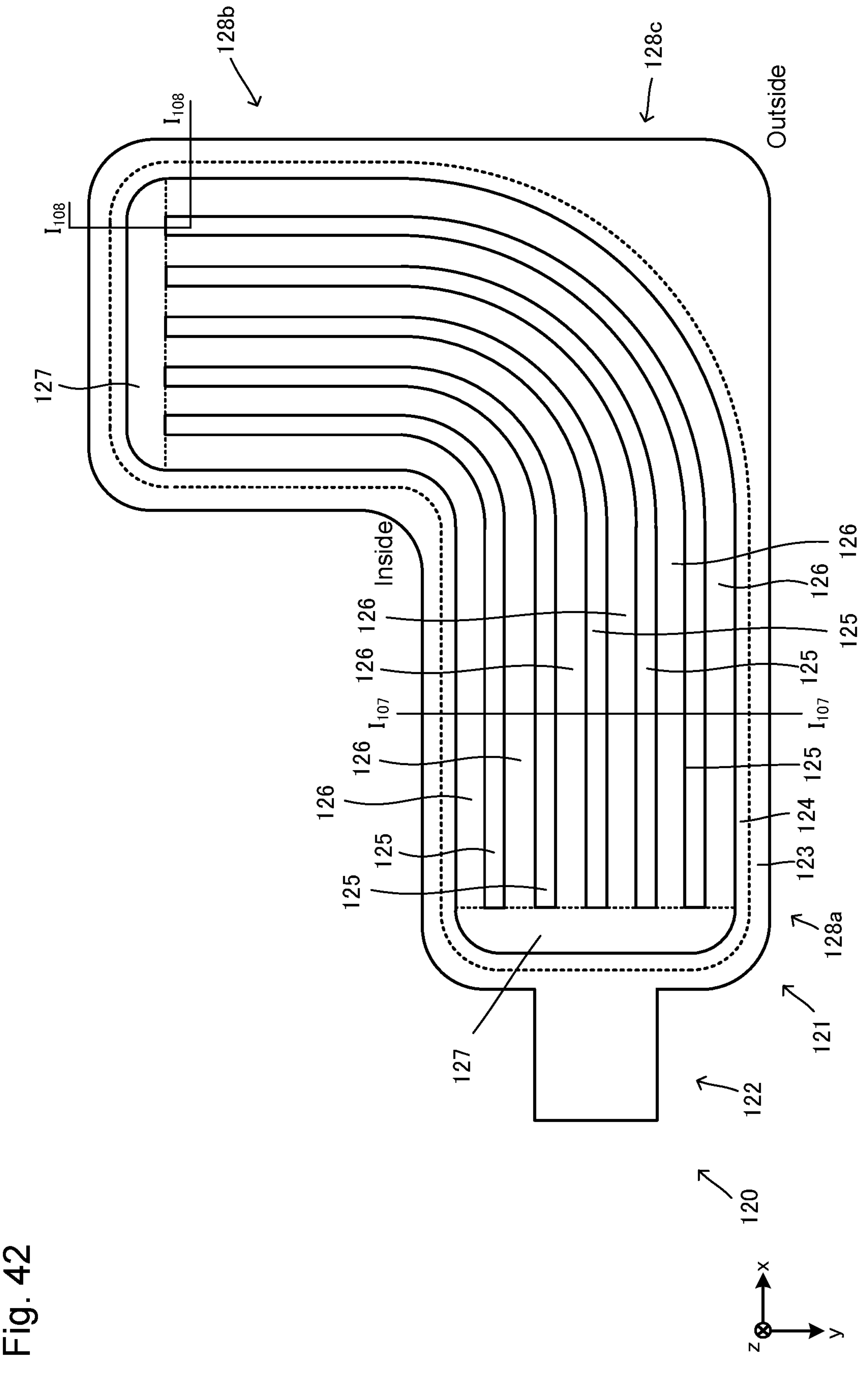
FIG. 42 is a plan view of the second sheet 120.
Figure 43:
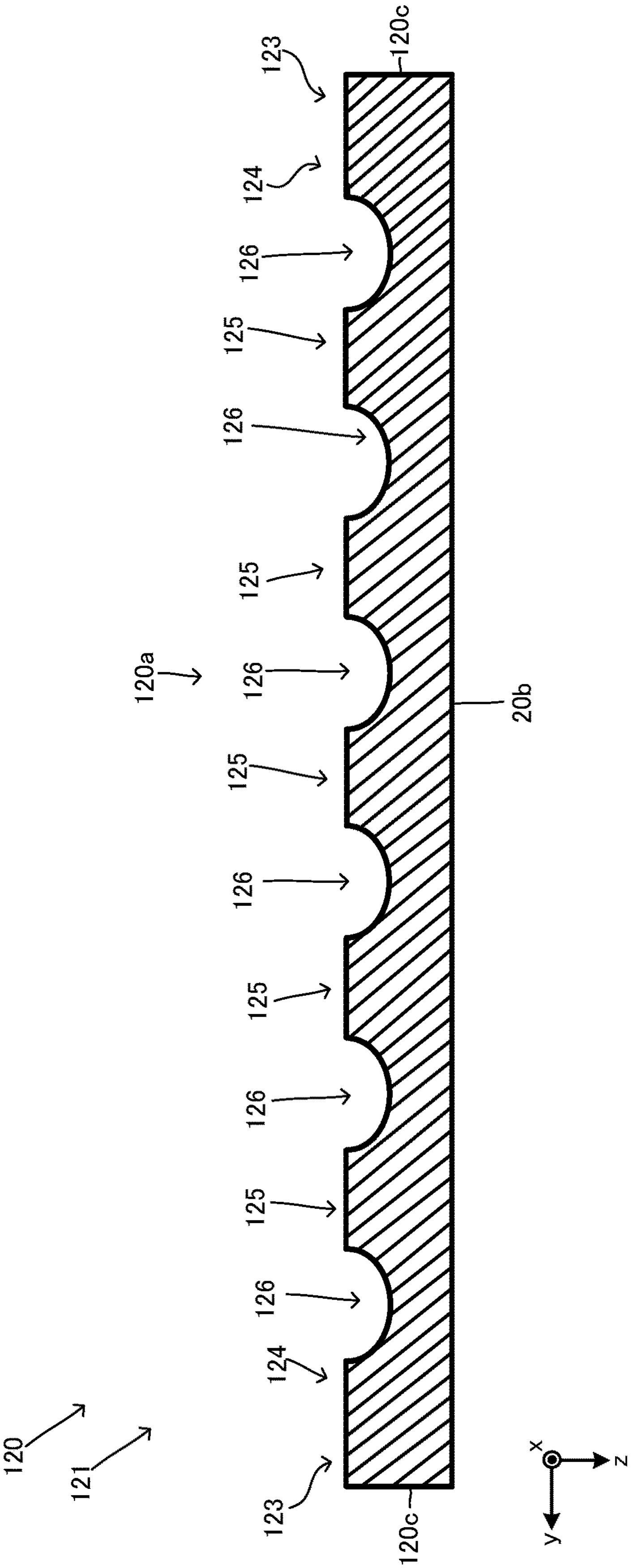
FIG. 43 shows a cross section of the second sheet 120.
Figure 44:
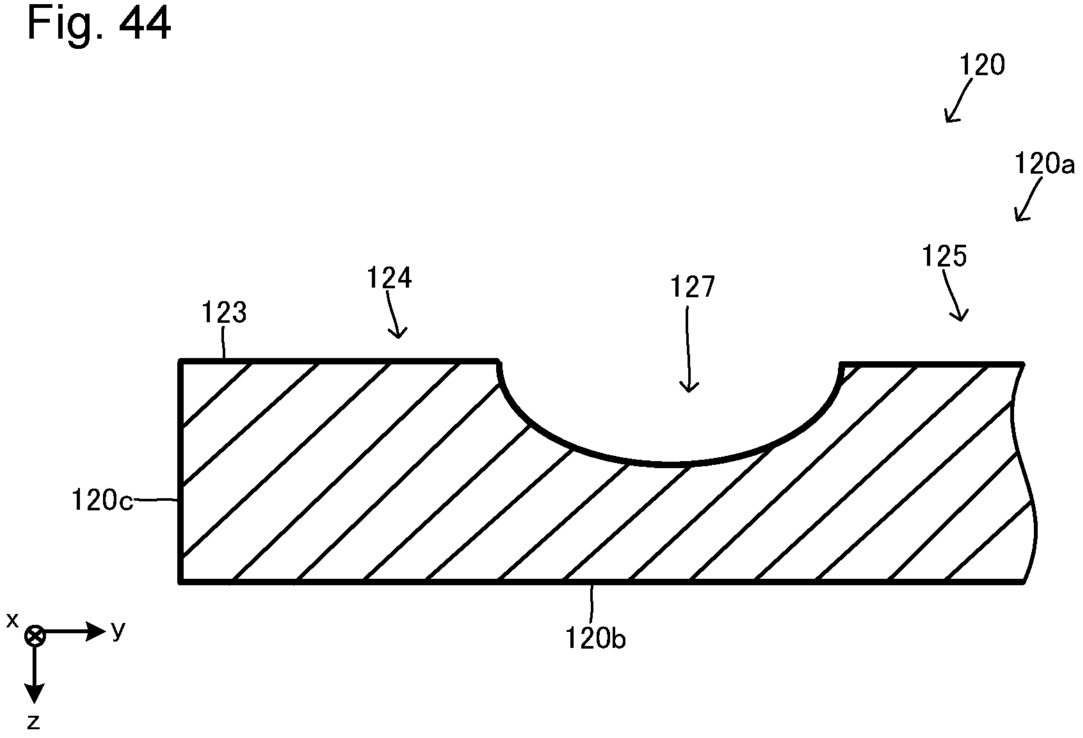
FIG. 44 shows another cross section of the second sheet 120.

Next, the second sheet 120 will be described. In this example, the second sheet 120 is also a sheet-like member as a whole, and curves in the form of L from a plan view. FIG. 41 is a perspective view of the second sheet 120 from the inner face 120*a* side. FIG. 42 is a plan view of the second sheet 120 from the inner face 120*a* side. FIG. 43 shows a cross section of the second sheet 120 taken along the line $I_{107}$-$I_{107}$ of FIG. 42. FIG. 44 shows a cross section of the second sheet 120 taken along the line $I_{108}$-$I_{108}$ of FIG. 42.

The second sheet 120 includes the inner face 120*a*, an outer face 120*b* on the opposite side of the inner face 120*a*, and a side face 120*c* that stretches between the inner face 120*a* and the outer face 120*b* to form the thickness. A pattern where a working fluid moves is formed on the inner face 120*a* side. As described later, the inner face 120*a* of this second sheet 120 and the inner face 110*a* of the first sheet 110 are superposed so as to face each other, so that the hollow part is formed. This hollow part is the sealed space 102 when a working fluid is enclosed therein.

The thickness of the second sheet 120 is not particularly limited, but may be considered the same as the second sheet 20.

The second sheet 120 includes a main body 121 and an inlet part 122. The main body 121 is in the form a sheet and forms a portion where a working fluid moves, and in the present embodiment, is in the form of L with a curved portion from a plan view.

The inlet part 122 is a portion via which a working fluid is poured into the hollow part formed by the first sheet 110 and the second sheet 120. In the present embodiment, an inlet groove 122*a* is formed in the inlet part 122 of the second sheet 120 on the inner face 120*a* side, so that the side face 120*c* of the second sheet 120 and the inside (the hollow part, or the portion to be the sealed space 102) of the main body 121 communicate with each other.

A structure for moving a working fluid is formed in the main body 121 on the inner face 120*a* side. Specifically, the main body 121 includes a peripheral bonding part 123, a peripheral fluid flow path part 124, inner side fluid flow path parts 125, vapor flow path grooves 126, and vapor flow path communicating grooves 127, on the inner face 120*a* side.

The peripheral bonding part 123 is a face formed on the inner face 120*a* side of the main body 121 along the periphery of the main body 121. This peripheral bonding part 123 is superposed on, and bonded (diffusion bonding, brazing, or the like) to the peripheral bonding part 113 of the first sheet 110, so that the hollow part is formed between the first sheet 110 and the second sheet 120. This hollow part is the sealed space 102 when a working fluid is enclosed therein.

The width of the peripheral bonding part 123 is preferably the same as that of the peripheral bonding part 113 of the main body 111 of the first sheet 110.

The peripheral fluid flow path part 124 functions as a fluid flow path part, and is a portion that forms a part of the condensate flow paths 103 (see, for example, FIG. 46), which are flow paths where a condensed and liquified working fluid passes.

The peripheral fluid flow path part 124 is formed on the inner face 120*a* of the main body 121 along the inside of the peripheral bonding part 123 so as to form a ring along the periphery of the sealed space 102. In the present embodiment, the peripheral fluid flow path part 124 of the second sheet 120 has a flat face and is flush with the peripheral bonding part 123, before the bonding to the first sheet 110, as can be seen in FIGS. 43 and 44. This results in closed openings of at least a part of a plurality of the fluid flow path grooves 114*a* of the first sheet 110 to form the condensate flow paths 3. A specific mode on combining the first sheet 110 and the second sheet 120 will be described later.

Since the peripheral bonding part 123 and the peripheral fluid flow path part 124 are flush with each other on the second sheet 120 as described above, there is no border to structurally distinguish them. For clarity, FIGS. 41 and 42 each show the border between them in the dotted line.

The width of the peripheral fluid flow path part 124 is not particularly limited. This width may be the same as, and may be different from the width of the peripheral fluid flow path part 114 of the first sheet 110.

When the width of the peripheral fluid flow path part 124 is smaller than that of the peripheral fluid flow path part 113, the opening(s) of the fluid flow path groove(s) 114*a* in at least part of the peripheral fluid flow path part 114 is/are not closed with the peripheral fluid flow path part 124 but are kept open. Via the opening(s), a condensate is easy to enter and a vapor is easy to go out, which can result in a smoother movement of a working fluid.

In the present embodiment, the peripheral fluid flow path part 124 of the second sheet 120 is formed of a flat face. The peripheral fluid flow path part 124 is not limited to this, but may include fluid flow path grooves similarly to the peripheral fluid flow path part 114. At this time, the fluid flow path grooves of the first sheet and the fluid flow path grooves of the second sheet are superposed so that the condensate flow paths 103 can be formed.

In the present embodiment, as described concerning the first sheet, the peripheral fluid flow path part 124 is not always necessary to be provided. No peripheral fluid flow path part 124 may be provided.

Next, the inner side fluid flow path parts 125 will be described. The inner side fluid flow path parts 125 are also fluid flow path parts, and each of them is one part that forms the condensate flow paths 103.

As can be seen from FIGS. 41 to 44, the inner side fluid flow path parts 125 are formed on the inner face 120*a* of the main body 121 inside the annular ring of the peripheral fluid flow path part 124. The inner side fluid flow path parts 125 according to the present embodiment are extending protrusions with curved portions. The plural (five in the present embodiment) inner side fluid flow path parts 125 are aligned at intervals in a direction different from the extending direction thereof, and disposed among the vapor flow path grooves 126.

In the present embodiment, the surface of each of the inner side fluid flow path parts 125 on the inner face 120*a* side is formed to be a flat face before the bonding to the first sheet 110. This results in closed openings of at least a part of a plurality of the fluid flow path grooves 115*a* of the first sheet 110 to form the condensate flow paths 103.

When no groove for forming the condensate flow paths 103 is formed in the inner side fluid flow path parts 125 as in the present embodiment, the thickness of the second sheet 120 is preferably equal to or larger than the thickness obtained by subtracting the depth of the fluid flow path grooves 115*a* from the thickness of the first sheet 110. This makes it possible to prevent the vapor chamber from fracturing (breaking) on the second sheet side.

In the present embodiment, the inner side fluid flow path parts 125 of the second sheet 120 are formed of flat faces. The inner side fluid flow path parts 125 are not limited to this, but may include fluid flow path grooves similarly to the inner side peripheral fluid flow path parts 115. At this time, the fluid flow path grooves of the first sheet and the fluid flow path grooves of the second sheet are superposed so that the condensate flow paths 103 can be formed.

The width of each of the inner side fluid flow path parts 125 is not particularly limited. This width may be the same as, and may be different from the width of each of the inner side fluid flow path parts 115 of the first sheet 110. In the present embodiment, the width of each of the inner side fluid flow path parts 125 is the same as that of each of the inner side fluid flow path parts 115.

Different widths between each of the inner side fluid flow path parts 125 and each of the inner side fluid flow path parts 115 can result in a reduced influence of a positional deviation at the bonding. When the width of each of the inner side fluid flow path parts 125 is smaller than that of each of the inner side fluid flow path parts 115, the openings of the fluid flow path grooves 115*a* in at least a part of the inner side fluid flow path parts 115 are not closed with the inner side fluid flow path parts 125 but are kept open. Via the openings, a condensate is easy to enter and a vapor is easy to go out, which can result in a smoother movement of a working fluid.

Next, the vapor flow path grooves 126 will be described. The vapor flow path grooves 126 are portions where a working fluid in the form of a vapor or a condensate moves, and form a part of the vapor flow paths 104. FIG. 42 shows a shape of the vapor flow path grooves 126 from a plan view. FIG. 43 shows a cross-sectional shape of the vapor flow path grooves 126.

As can be seen from these drawings, the vapor flow path grooves 126 are formed of grooves with curved portions which are formed on the inner face 120*a* of the main body 121 inside the ring of the annular peripheral fluid flow path part 124. Specifically, the vapor flow path grooves 126 according to the present embodiment are grooves formed between adjacent ones of the inner side fluid flow path parts 125, and between the peripheral fluid flow path part 124 and the inner side fluid flow path parts 125. The plural (six in the present embodiment) vapor flow path grooves 126 are aligned in a direction different from the extending direction thereof. Thus, as can be seen in FIG. 43, the second sheet 120 has a shape of repeated depressions and protrusions: the protrusions are formed of the inner side fluid flow path parts 125 as protrusions; and the depressions are the vapor flow path grooves 126 as depressions.

Here, since being grooves, the vapor flow path grooves 126 each have a bottom portion, and an opening that is present in a portion on the opposite side of the bottom portion and faces the bottom portion, in a cross-sectional shape thereof.

The vapor flow path grooves 126 are preferably arranged at places superposed on the vapor flow path grooves 116 of the first sheet 110 in the thickness direction when combined with the first sheet 110. This can lead to the formation of the vapor flow paths 104 by the vapor flow path grooves 116 and the vapor flow path grooves 126.

The width of each of the vapor flow path grooves 126 is not particularly limited. This width may be the same as, and may be different from the width of each of the vapor flow path grooves 116 of the first sheet 110. In the present embodiment, the width of each of the vapor flow path grooves 116 is the same as that of each of those vapor flow path grooves.

Different widths between each of the vapor flow path grooves 126 and each of the vapor flow path grooves 116 can result in a reduced influence of a positional deviation at the bonding. When the width of each of the vapor flow path grooves 126 is larger than that of each of the vapor flow path grooves 116, the openings of the fluid flow path grooves 115*a* in at least a part of the inner side fluid flow path parts 115 are not closed with the inner side fluid flow path parts 125 and are kept open. Via the openings, a condensate is easy to enter and a vapor is easy to go out, which can result in a smoother movement of a working fluid.

The depth of each of the vapor flow path grooves 126 may be considered the same as that of the vapor flow path grooves 26 of the second sheet 20.

Here, the vapor flow path grooves 126 are preferably configured so that the width of each of the vapor flow paths 104 is larger than the height thereof (size in the thickness direction), that is, each of the vapor flow paths 104 has a flat shape when combined with the second sheet 110 to form the vapor flow paths 104 as described later. Therefore, the aspect ratio represented by a value obtained by dividing the depth of each of the vapor flow path grooves 126 by the width thereof is preferably at least 4.0, and more preferably at least 8.0.

In the present embodiment, the cross-sectional shape of each of the vapor flow path grooves 126 is a semi-ellipse. This cross-sectional shape may be a quadrangle such as a square, a rectangle and a trapezoid, a triangle, a semicircle, a semicircle at the bottom, a semi-ellipse at the bottom, or the like.

The vapor flow path communicating grooves 127 are grooves forming flow paths that allow a plurality of the vapor flow paths 104 formed by the vapor flow path grooves 126 to communicate with each other at the ends thereof when combined with the vapor flow path communicating grooves 117 of the first sheet 110. The vapor flow path communicating grooves 127 may be considered the same as the vapor flow path communicating grooves 27 of the second sheet 20.

In the present embodiment, the second sheet 120 includes a curved part 128*c* that is a portion at which the extending directions of the peripheral fluid flow path part 124, the inner side fluid flow path parts 125, and the vapor flow path grooves 126 change. That is, as can be seen in FIG. 42, the second sheet 120 includes: a linear part 128*a* where the peripheral fluid flow path part 124, the inner side fluid flow path parts 125, and the vapor flow path grooves 126 linearly extend in the x-direction; a linear part 128*b* where the peripheral fluid flow path part 124, the inner side fluid flow path parts 125, and the vapor flow path grooves 126 linearly extend in the y-direction; and the curved part 128*c* where part of the peripheral fluid flow path part 124, the inner side fluid flow path parts 125, and the vapor flow path grooves 126 in the linear part 128*a* and part of those in the linear part 128*b* are linked. Therefore, one end of the curved part 128*c* is connected to the linear part 128*a*, and the other end thereof is connected to the linear part 128*b*. At the curved part 128*c*, the peripheral fluid flow path part 124, the inner side fluid flow path parts 125, and the vapor flow path grooves 126 curve, so that the directions of the flows therein change from the x-direction to the y-direction and from the y-direction to the x-direction.

The modes of the peripheral fluid flow path part 124, the inner side fluid flow path parts 125, and the vapor flow path grooves 126 at the curved part 128*c* according to the present embodiment may be considered the same as those at the curved part 118*c* of the first sheet 110.

Next, the structure of the vapor chamber 101 formed by combining the first sheet 110 and the second sheet 120 will be described. This description will help further understand the arrangement, the size, the shape, etc. of each component of the first sheet 110 and the second sheet 120.

Figure 45:
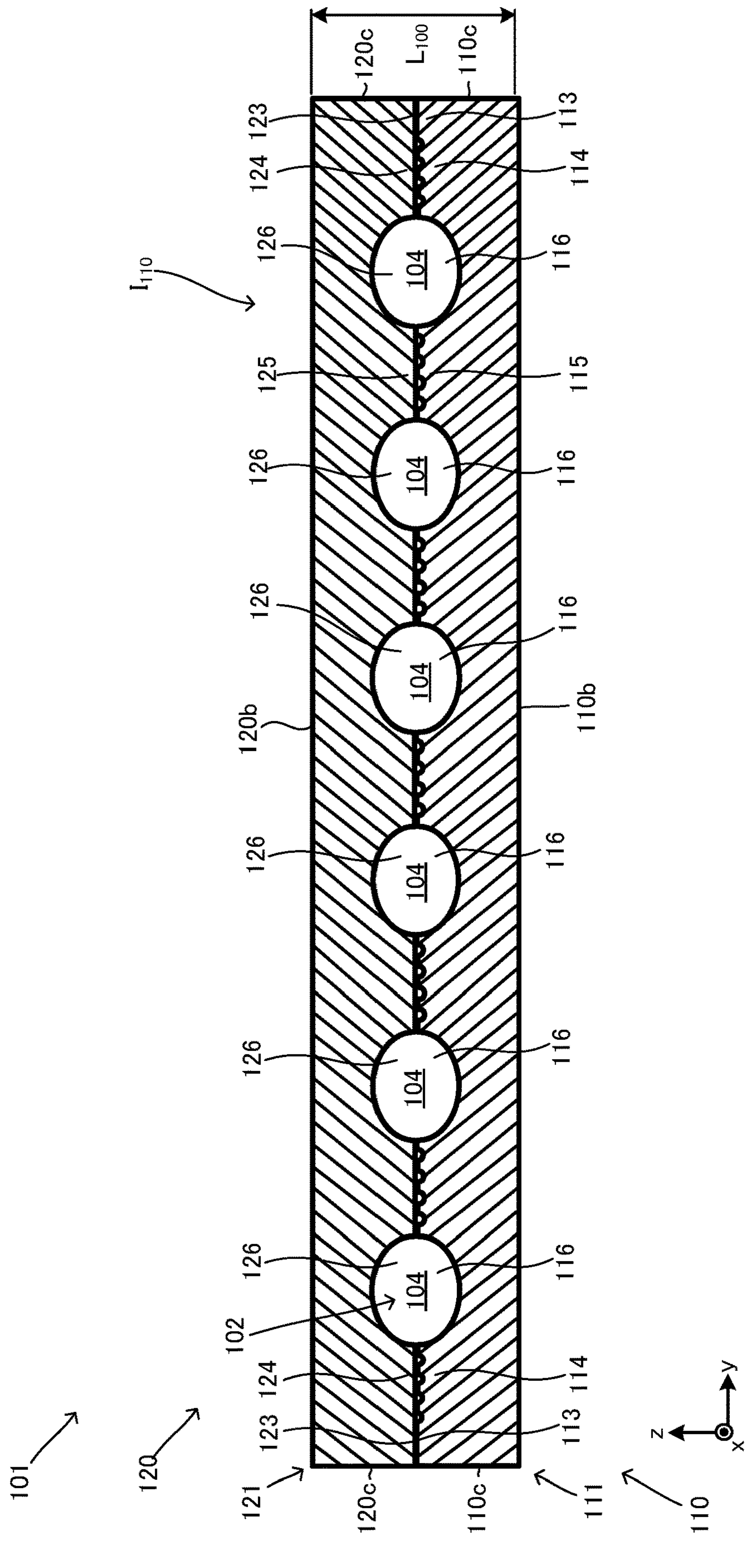
FIG. 45 shows a cross section of the vapor chamber 101.

FIG. 45 shows a cross section of the vapor chamber 101 taken along the y-direction indicated by $I_{109}$-$I_{109}$ in FIG. 27 in the thickness direction. This drawing is the combination of the drawing of the first sheet 110 shown in FIG. 31 and the drawing of the second sheet 120 shown in FIG. 43 so as to show a cross section of the vapor chamber 101 at this portion.

Figure 46:
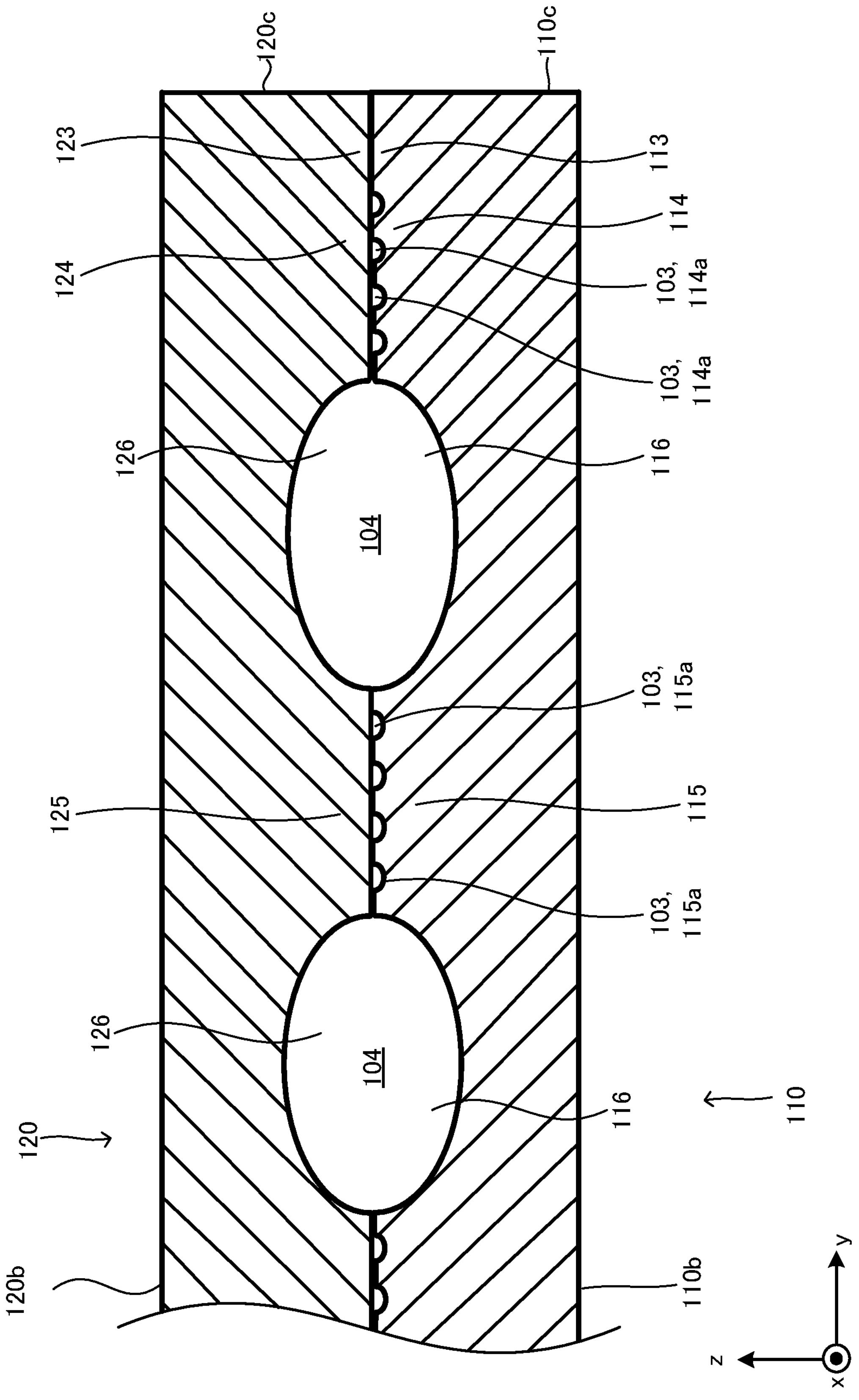
FIG. 46 is a partially enlarged view of FIG. 45.

FIG. 46 is an enlarged view of the portion indicated by $I_{110}$ in FIG. 45.

Figure 47:
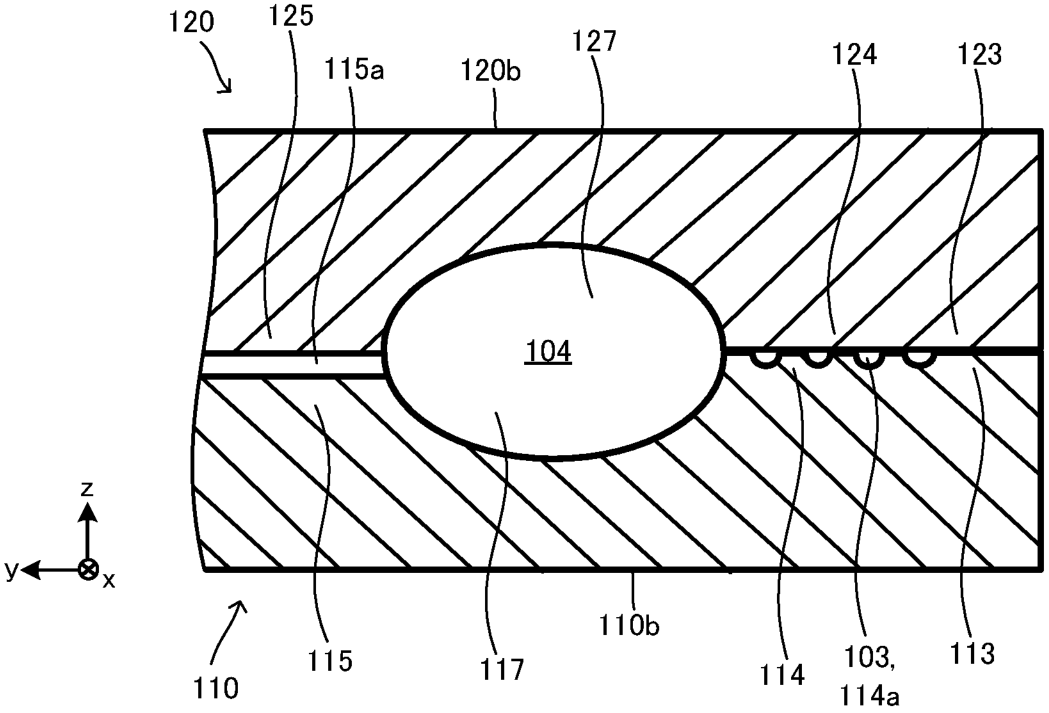
FIG. 47 shows another cross section of the vapor chamber 101.

FIG. 47 shows a cross section of the vapor chamber 101 taken along the x-direction indicated by of FIG. 27 in the thickness direction. This drawing is a combination of the drawing of the first sheet 110 shown in FIG. 33 and the drawing of the second sheet 120 shown in FIG. 44 so as to show a cross section of the vapor chamber 101 at this portion.

As can be seen from FIGS. 27, 28 and 45 to 47, the first sheet 110 and the second sheet 120 are arranged so as to be superposed, and are bonded to each other, thereby forming the vapor chamber 101. At this time, the inner face 110*a* of the first sheet 110 and the inner face 120*a* of the second sheet 120 are disposed so as to face each other, so that the main body 111 of the first sheet 110 and the main body 121 of the second sheet 120 are superposed and the inlet part 112 of the first sheet 110 and the inlet part 122 of the second sheet 120 are superposed.

Such a laminate of the first sheet 110 and the second sheet 120 allows each component included in the main body 111 and the main body 121 to be arranged as shown in FIGS. 45 to 47. This is specifically as follows.

The effect of the vapor chamber 101 according to the present embodiment is large especially when the vapor chamber 101 is slim. In such a view, the thickness of the vapor chamber 101 which is indicated by $L_{100}$ in FIGS. 27 and 45 is at most 1 mm, more preferably at most 0.4 mm, and further preferably at most 0.2 mm. This thickness of 0.4 mm or less makes it possible to install the vapor chamber inside an electronic device without any processing (such as groove formation) on the electronic device for forming a space where the vapor chamber is arranged in more situations. According to the present embodiment, even such a slim vapor chamber has high strength and is deformation-resistant, offering maintained thermal performance.

The peripheral bonding part 113 of the first sheet 110 and the peripheral bonding part 123 of the second sheet 120 are arranged so as to be superposed, and are bonded to each other by a bonding way such as diffusion bonding and brazing, so that a working fluid is enclosed. This leads to the formation of the sealed space 102 between the first sheet 110 and the second sheet 120.

The peripheral fluid flow path part 114 of the first sheet 110 and the peripheral fluid flow path part 124 of the second sheet 120 are arranged so as to be superposed. This leads to the formation of the condensate flow paths 103, where a condensate that is a condensed and liquefied working fluid flows, by the fluid flow path grooves 114*a* of the peripheral fluid flow path part 114, and the peripheral fluid flow path part 124.

Likewise, the inner side fluid flow path parts 115 of the first sheet 110, which are protrusions, and the inner side fluid flow path parts 125 of the second sheet 120, which are protrusions, are arranged so as to be superposed. This leads to the formation of the condensate flow paths 103, where a condensate flows, by the fluid flow path grooves 115*a* of the inner side fluid flow path parts 115, and the inner side fluid flow path parts 125.

Here, following the slimming of the vapor chamber 101, each of the condensate flow paths 103 preferably has a flat cross-sectional shape. This makes it possible to increase the capillary force and to lead to a further smooth movement of a condensate, which make it possible to keep the heat transport capability at a high level. More specifically, the aspect ratio represented by a value obtained by dividing the width of each of the condensate flow paths 103 by the height thereof is preferably more than 1.0 and at most 4.0.

At this time, the width of each of the condensate flow paths 103 is based on the width of each of the fluid flow path grooves 115*a* in the present embodiment, and is preferably 10 1 μm to 300 μm. This width smaller than 10 μm may cause the flow path resistance to be higher and the transport capability to deteriorate. This width larger than 300 μm causes the capillary force to be weaker, which may deteriorate the transport capability.

The height of the condensate flow paths 103 is based on the depth of each of the fluid flow path grooves 115*a* in the present embodiment, and is preferably 5 μm to 200 μm. This makes it possible to sufficiently bring about the capillary force of the condensate flow paths which is necessary for the movement. This height is preferably equal to or smaller than the thickness of the first sheet 110 and equal to or smaller than the thickness of the second sheet 120 in the thickness direction (z-direction) at any portion where the condensate flow paths 103 are sandwiched between the first sheet 110 on one side thereof and the second sheet 120 on the other side thereof. This makes it possible to further prevent the vapor chamber from fracturing (breaking) due to the condensate flow paths 3.

The cross-sectional shape of each of the condensate flow paths 103 is a semi-ellipse according to the cross-sectional shapes of each of the fluid flow path grooves 114*a* and each of the fluid flow path grooves 115*a*. This cross-sectional shape is not limited to this, but may be a quadrangle such as a square, a rectangle and a trapezoid, a triangle, a semicircle, a semicircle at the bottom, a semi-ellipse at the bottom, or any combination thereof, or the like. This cross-sectional shape may be in the form of a crescent.

In the present embodiment, the fluid flow path grooves 114*a* and the fluid flow path grooves 115*a* are provided only in the first sheet 110. Thus, the height of each of the condensate flow paths is based on the respective depths of the fluid flow path grooves 114*a* and the fluid flow path grooves 115*a*. The vapor chamber 101 is not limited to this, but a fluid flow path groove may be also provided in the second sheet 120. In this case, the fluid flow path grooves of the first sheet and the fluid flow path grooves of the second sheet are superposed, so that the condensate flow paths are formed. The height of the condensate flow paths is based on the total depth of the fluid flow path grooves in both the sheets.

Figure 48:
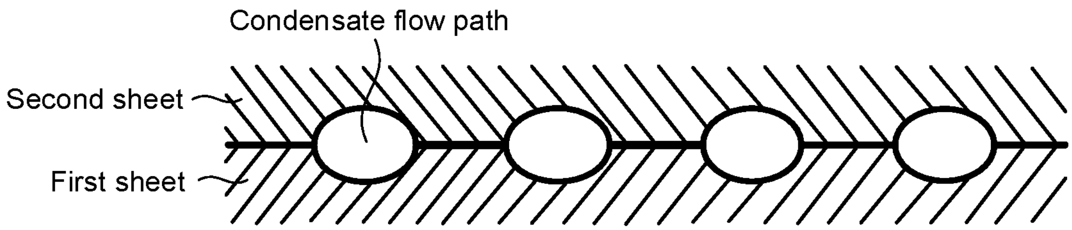
FIG. 48 illustrates an example of condensate flow paths.
Figure 49:
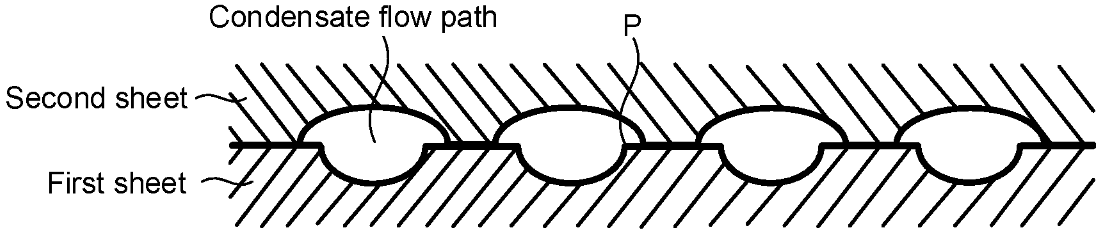
FIG. 49 illustrates an example of the condensate flow paths.
Figure 50:
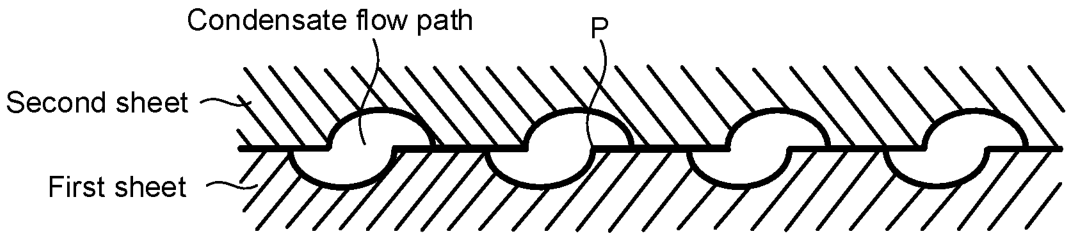
FIG. 50 illustrates an example of the condensate flow paths.

When the fluid flow path grooves are provided in the first sheet and the second sheet and are superposed, so that the condensate flow paths are formed as described above, the condensate flow paths can be configured as in FIGS. 48 to 50.

FIG. 48 shows an example of the fluid flow path grooves of respective first sheet having the same width and arranged at the same position as respective fluid flow path grooves of the second sheet.

FIG. 49 shows an example of respective fluid flow path grooves of the second sheet having a larger width than and arranged at the same position as respective fluid flow path grooves of the first sheet. In this example, protrusions are formed in the condensate flow paths as indicated by P, which makes it possible to increase the capillary force, and to increase force by which a condensate moves (the supply capability for the condensate).

Figure 51:
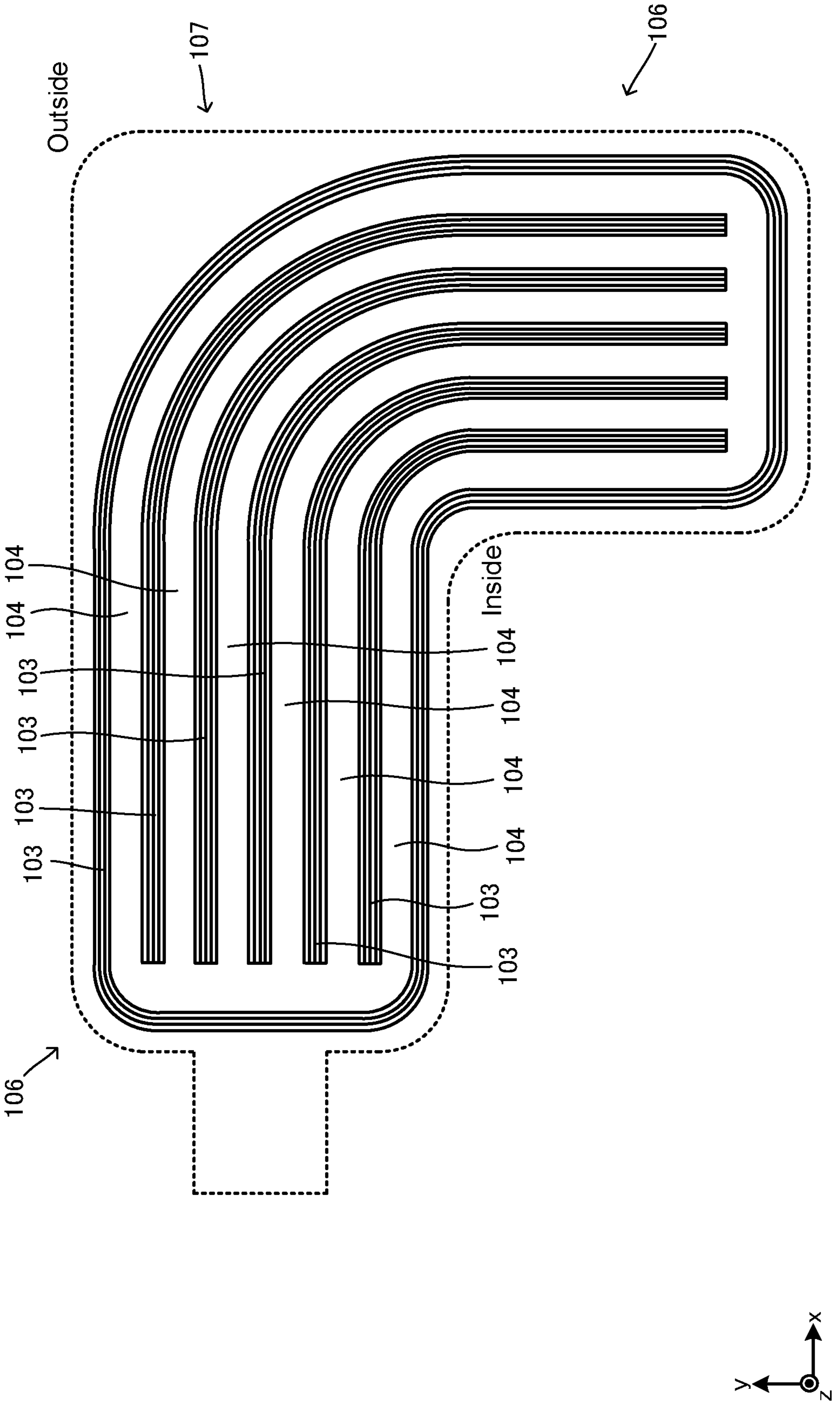
FIG. 51 illustrates condensate flow paths 103 and vapor flow paths 104.

FIG. 51 shows an example of respective fluid flow path grooves of the first sheet having the same width as and arranged at different positions from respective fluid flow path grooves of the second sheet. In this example, protrusions are also formed in the condensate flow paths as indicated by P, which makes it possible to increase the capillary force, and to increase force by which a condensate moves (the supply capability for the condensate).

As described above, the communicating opening parts 114*c* and the communicating opening parts 115*c* are formed in the condensate flow paths 103. This allows a plurality of the condensate flow paths 103 to communicate with each other, which leads to an achievement of the equality of a condensate, and an efficient movement of the condensate. the communicating opening parts 114*c* and the communicating opening parts 115*c*, which are adjacent to the vapor flow paths 104 and allow the vapor flow paths 104 and the condensate flow paths 103 to communicate with each other make it possible for a condensate generated in the vapor flow paths 104 to smoothly move to the condensate flow paths 103, for a vapor generated in the condensate flow paths 103 to smoothly move to the vapor flow paths 104, and for a working fluid to rapidly move.

Preferably, a part of the condensate flow paths 103 which is formed by the peripheral fluid flow path part 114 and the peripheral fluid flow path part 124 is continuously formed along the edge inside the sealed space 102 in the form of a ring. That is, preferably, the part of the condensate flow paths 103 which is formed by the peripheral fluid flow path part 114 and the peripheral fluid flow path part 124 annularly extends so as to make a circuit without being cut by any other components. This results in reduction of factors that inhibit the movement of a condensate, which can lead to a smooth movement of the condensate.

In the present embodiment, as described so far, the condensate flow path grooves are provided in the sheets, so that the flow paths are formed to be used as the condensate flow paths. Instead, any tool for generating the capillary force may be separately disposed here, and used as the condensate flow paths. For this, for example, a so-called wick such as mesh (net) materials, nonwoven fabrics, strands, and sintered bodies of metal powders may be also disposed.

The openings of the vapor flow path grooves 116 of the first sheet 110, and the openings of the vapor flow path grooves 126 of the second sheet 120 are superposed so as to face each other, so that the flow paths are formed. These flow paths are the vapor flow paths 104.

Here, following the slimming of the vapor chamber 101, each of the vapor flow paths 104 preferably has a flat cross-sectional shape. This makes it possible to secure the surface areas inside the flow paths even the vapor chamber 101 is slimmed, which makes it possible to keep the heat transport capability at a high level. More specifically, the aspect ratio represented by a value obtained by dividing the width of each of the vapor flow paths 104 by the height thereof is preferably at least 2.0. In view of securing a further high heat transport capability, this ratio is further preferably at least 4.0.

As can be seen from FIG. 47, the openings of the vapor flow path communicating grooves 117 of the first sheet 110, and the openings of the vapor flow path communicating grooves 127 of the second sheet 120 are superposed so as to face each other, so that the flow paths are formed, which allows the end parts of a plurality of the vapor flow paths 104 formed by the vapor flow path grooves 116 and the vapor flow path grooves 126 to communicate with each other, so that flow paths for a working fluid moving in a well-balanced way are formed.

As described above, the condensate flow paths 103 and the vapor flow paths 104 are formed in the sealed space 102 of the vapor chamber 101 according to the shapes of the first sheet 110 and the second sheet 120. FIG. 51 focuses on the condensate flow paths 103 and the vapor flow paths formed in the sealed space 102.

As can be seen from, for example, FIGS. 46 and 51, the vapor chamber 101 has a shape formed by a plurality of the condensate flow paths 103 each arranged between every two vapor flow paths 104. According to this, the condensate flow paths 103, where a condensate should mainly flow, and the vapor flow path 104, where a vapor and a condensate move, are separated and alternately aligned, which helps a working fluid smoothly move.

Owing to the vapor flow paths 104 and the condensate flow paths 103, a working fluid in a vapor or condensate state moves in the vapor flow paths 104, so that heat is efficiently transferred and diffused. Owing to the condensate flow paths 103 provided separately from the vapor flow paths 104, a condensate efficiently moves by a capillary force, which makes it possible to suppress dryout.

In the vapor chamber 101, two linear parts 106 between which the extending direction of the condensate flow paths 103 and the vapor flow paths 104 is different are linked by a curved part 107. The formation of such flow paths with the curved part 107 makes it possible to efficiently transfer heat generated from a heat source to separated places even when the vapor chamber is disposed on an electronic device with restrictions on the arrangement thereof so that no flow path of one straight line only can be formed.

This curved part 107 is formed of the curved part 118*c* of the first sheet 110, and the curved part 128*c* of the second sheet 120. Therefore, one end of the curved part 107 is connected to one of the linear parts 106, and the other end thereof is connected to the other linear part 106. At the curved part 107, the condensate flow paths 103 and the vapor flow paths 104 curve, so that the directions of the flows change from the x-direction to the y-direction and from the y-direction to the x-direction.

In the present embodiment, the flow path cross-sectional area of any of the vapor flow paths 104 which is disposed on an inner side is configured to be larger than that of any of the vapor flow paths 104 which is disposed on an outer side, at the curved part 107. This makes it possible to improve the balance of the flow resistance at the curved part, which can result in a smoother movement of a working fluid and an increase of the heat transport capability. Specifically, the flow path cross-sectional area of the vapor flow path can be adjusted by adjusting the magnitude of at least one of the width and the height of the flow path.

Here, "flow path cross-sectional area" is a cross-sectional area of a flow path on a plane orthogonal to the extending direction of the flow path.

The tool or way for increasing the flow path cross-sectional areas (widths in this embodiment) of the vapor flow paths 104 at the curved part 107 as described above, how large it is, and the approach to it are the same as described concerning the curved part 118*c* of the first sheet 110.

At the curved part 107, the respective pitches for a part of the communicating opening parts 114*c* and a part of the communicating opening parts 115*c* provided in a part of the walls 114*b* and a part of the walls 115*b* partitioning the condensate flow path 103 and the vapor flow path 104 (see FIGS. 34 and 36) may be formed to be different from those in the linear parts 106. This means that the pitch for the communicating opening parts at the curved part may be either larger or smaller than that for the curved part in the respective linear parts. In these examples, the example that can lead to a lower flow resistance may be employed in view of the entire shape of the vapor chamber, and the influence of, for example, the location of a heat source, based on the comprehensive determination. At this curved part 107, no communicating opening part 114*c* or communicating opening part 115*c* may be provided in the part of the walls 114*b* and the part of the walls 115*b* partitioning the condensate flow path 103 and the vapor flow path 104.

In the example of a larger pitch for the communicating opening parts at the curved part than that in the linear parts, it can be suppressed that a working fluid flowing in the vapor flow paths 104 enters the communicating opening parts 114*c* and the communicating opening parts 115*c* at the curved part 107. At the curved part 107, force by which a working fluid moving in the vapor flow paths 104 is about to directly flow into the communicating opening parts 114*c* and the communicating opening parts 115*c* due to its flow direction is exerted at the curved part 107, which leads to increasing tendencies for a vapor to enter the condensate flow paths 103, and for the flow resistance to increase due to the depressions and the protrusions of the communicating opening parts 114*c* and the communicating opening parts 115*c*. Against them, at the curved part 107, larger pitches for the communicating opening parts 114*c* and the communicating opening part 115*c*, part of which are in contact with the vapor flow paths 104; or no communicating opening part 114*c* or communicating opening part 115*c* in contact with the vapor flow paths 104 may make it possible to suppress such an increase in the flow resistance, to further reduce the difference between the vapor flow paths 104 in flow resistance, to improve the balance of the movement of a working fluid, and to improve the heat transport capability.

In the example of a smaller pitch for the communicating opening parts at the curved part than that in the linear part, the occasion when a vapor flowing in the vapor flow path grooves (vapor flow paths) strongly hit at the wall faces increases at the curved part, which easily leads to condensation of the vapor. At this time, in the example of a smaller pitch for the communicating opening parts at the curved part than that in the linear part, it is possible to increase the number of the communicating opening parts, to smoothly introduce a condensate to the fluid flow path grooves (condensate flow paths), and to prevent the vapor flow paths from closing with the condensate. This may make it possible to suppress an increase in the flow resistance, to further reduce the difference between the vapor flow path grooves (vapor flow paths) in flow resistance, to improve the balance of the movement of a working fluid, and to improve the heat transport capability.

Instead of the size of the pitch, the length of each wall between adjacent communicating opening parts (size in a direction along the flow paths) at the curved part may be configured to be either larger or smaller than that in the linear part. At this time, at the curved part, it is not necessary that the length of each wall be the same, but this length may be different between the walls. In this case, the relationship of the magnitude between the length of each wall at the curved part and that in the linear part shall be based on the relationship between the average values of the lengths of the walls at the respective parts.

The inlet part 112 and the inlet part 122 are also superposed, so that the inner face 110*a* and the inner face 120*a* thereof face each other as shown in FIGS. 27 and 28. The opening of the inlet groove 122*a* of the second sheet 120 which is on the opposite side of its bottom is closed by the inner face 110*a* of the inlet part 112 of the first sheet 110, so that an inlet flow path 105 that allows the outside, and the hollow part between the main body 111 and the main body 121 (condensate flow paths 103 and the vapor flow paths 104) to communicate with each other.

Since the inlet flow path 105 is closed after a working fluid is poured via the inlet flow path 105 to the sealed space 102, the outside and the sealed space 102 do not communicate with each other in the vapor chamber 101 in the final form.

A working fluid is enclosed in the sealed space 102 of the vapor chamber 101. The working fluid is not particularly limited. Any working fluid used for a usual vapor chamber, such as pure water, ethanol, methanol, and acetone may be used.

The vapor chamber 101 as described above may be made in the same way as the vapor chamber 1.

Next, the effect of the vapor chamber 101 when the vapor chamber 101 operates will be described. The mode in which the vapor chamber 101 is attached to an electronic device may be considered the same as that described with reference to FIG. 23.

Figure 52:
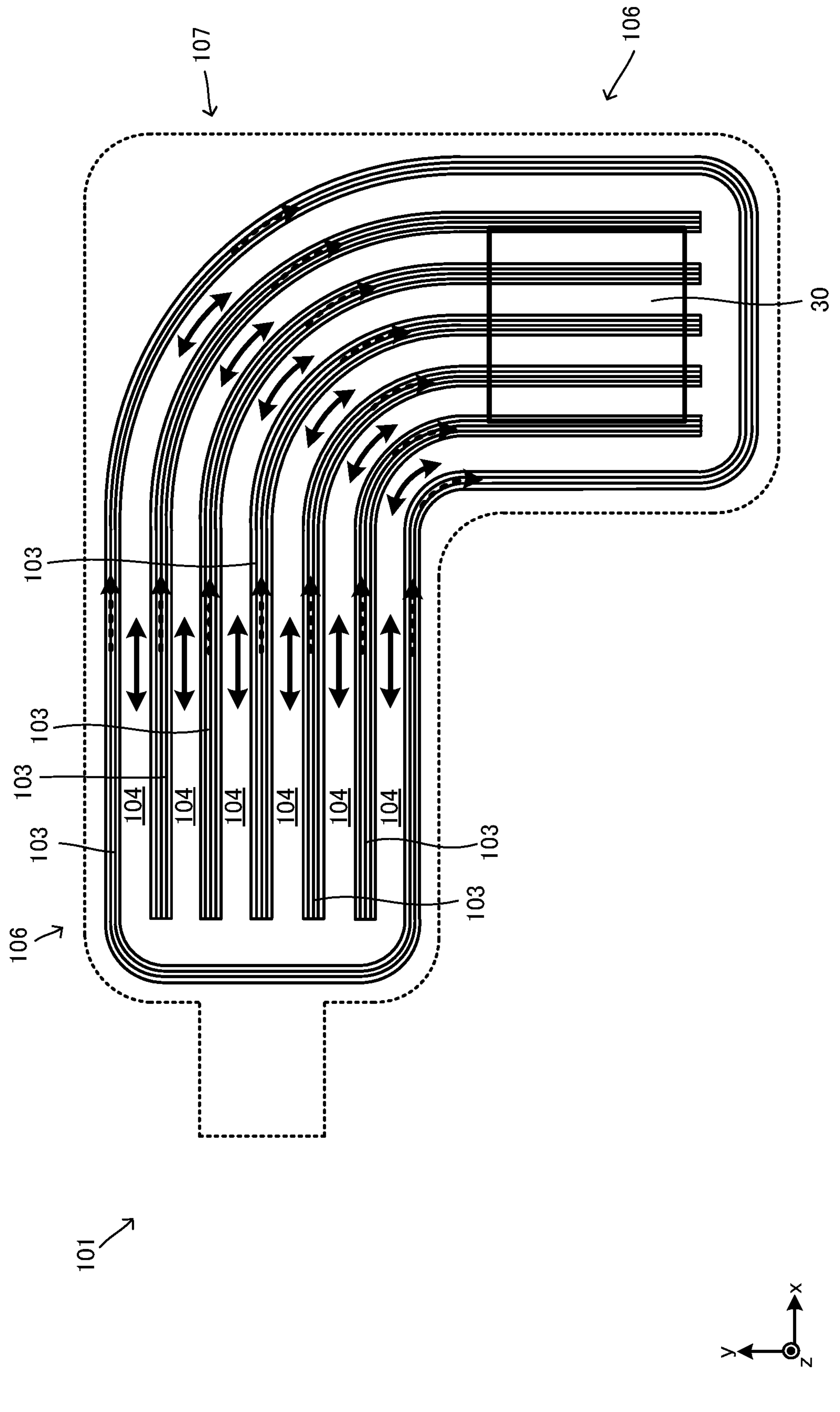
FIG. 52 illustrates operation of the vapor chamber 101.

FIG. 52 illustrates behaviors of the working fluid. For easy description, this drawing focuses on the condensate flow paths 103 and the vapor flow paths 104, which are formed inside the sealed space 102, from the same viewpoint as FIG. 51.

When the electronic component 30 generates heat, the heat is conducted inside the first sheet 110 by heat conduction, and part of a condensate present near the electronic component 30 and in the sealed space 102 receives the heat. The condensate having received this heat absorbs the heat, and vaporizes and gasifies. This causes the electronic component 30 to be cooled.

A vapor that is the gasified working fluid moves in the vapor flow paths 104. The gasified working fluid may move so as to vibrate in the vapor flow paths 104 as shown by the solid straight arrows in FIG. 52, or may move without vibrating but in one direction separating from the electronic component 30, which is a heat source, which is not shown.

At this time, the vapor flow paths 104 include curved portions at the curved part 107. The curved part 107 having the above-described structure leads to a well-balanced flow resistance thereat, which results in a smooth movement of the working fluid in the vapor flow paths 104. This makes it possible to exert a high heat transport capability.

When moving in the foregoing way, the working fluid is cooled as the heat thereof is taken by the first sheet 110 and the second sheet 120 successively. The first sheet 110 and the second sheet 120, which have taken the heat from the vapor, transfer the heat to, for example, a housing of a portable terminal device in contact with the outer face 110*b* or the outer face 120*b* thereof. Finally, the heat is released to the outside. The working fluid, from which the heat has been taken as the working fluid has moving in the vapor flow paths 104, condenses and liquifies.

Part of the condensate generated in the vapor flow paths 104 moves to the condensate flow paths 103 from the communicating opening parts, etc. Because the condensate flow paths 103 according to the present embodiment include the communicating opening parts 114*c* and 115*c*, the condensate passes through these communicating opening parts 114*c* and 115*c* and are distributed into a plurality of the condensate flow paths 103.

The condensate having entered the condensate flow paths 103 moves so as to approach the electronic component 30, which is a heat source, as shown by the dotted straight arrows in FIG. 52 by the capillary force by the condensate flow paths. The condensate then gasifies again by the heat of the electronic component 30, which is a heat source, and the above process is repeated.

As the above, the vapor chamber 101 makes it possible for the working fluid to smoothly move well and makes it possible to improve the heat transport capability by the movement of the working fluid in the vapor flow paths and a strong capillary force in the condensate flow paths.

In the vapor chamber 101, the formation of the flow paths with the curved part 107 makes it possible to efficiently move heat generated from a heat source to separated places even when the vapor chamber is disposed on an electronic device with restrictions on the arrangement thereof so that no flow path of one straight line only cannot be formed.

At the curved part 107, the difference between a plurality of the vapor flow paths 104 in flow resistance is small as described above, which makes it possible for the working fluid to move in a well-balanced manner to improve the heat transport capability.

Figure 53:
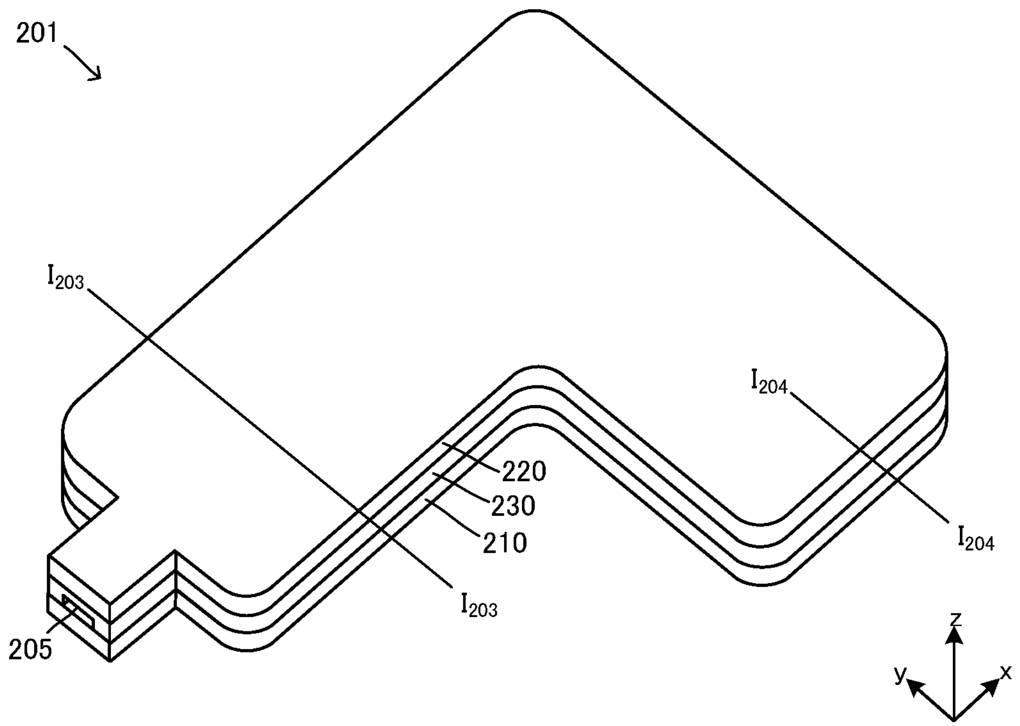
FIG. 53 is an external perspective view of a vapor chamber 201.
Figure 54:
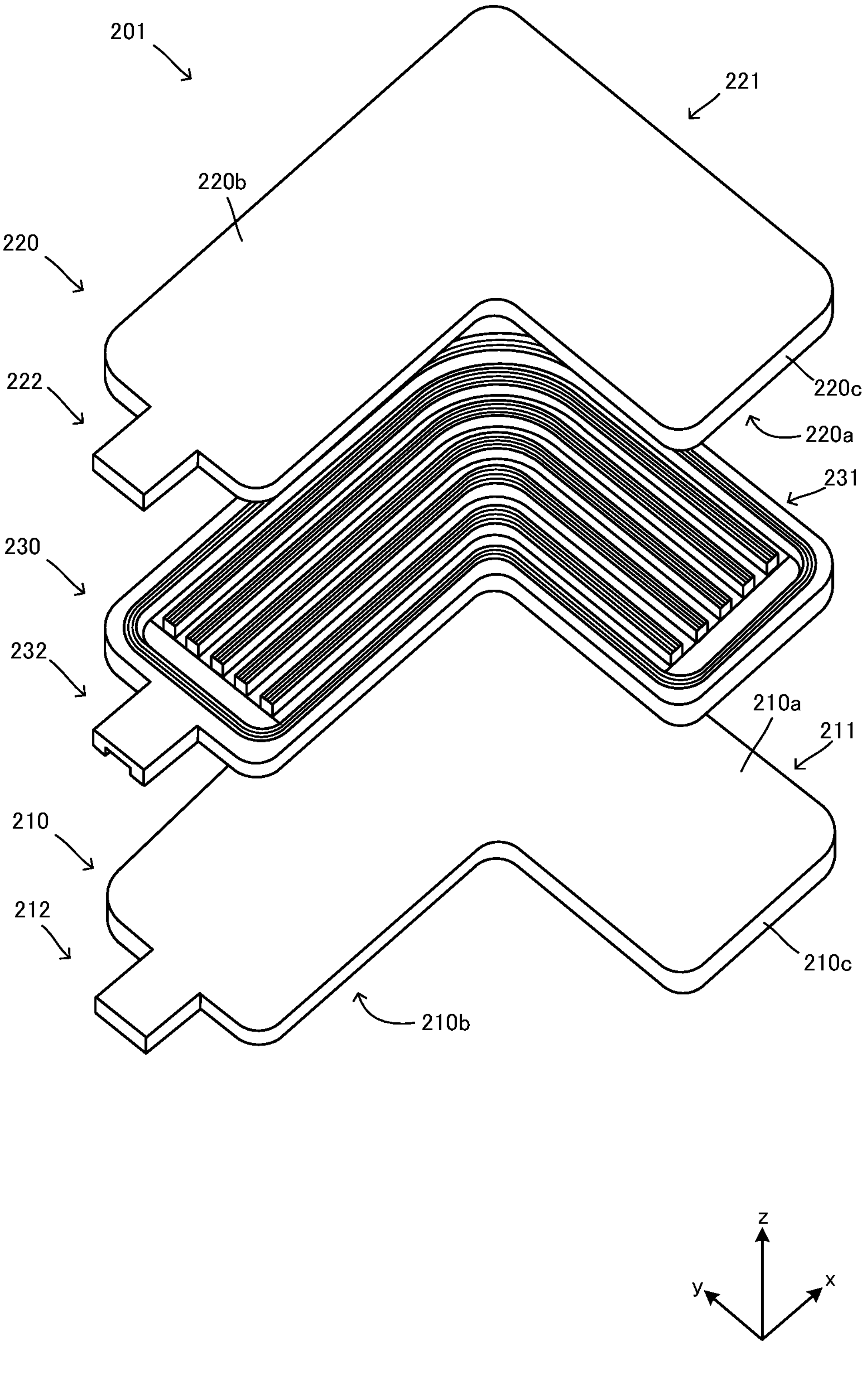
FIG. 54 is an exploded perspective view of the vapor chamber 201.

FIGS. 53 to 61 illustrate a vapor chamber 201 according to a modification. FIG. 53 is an external perspective view of the vapor chamber 201. FIG. 54 is an exploded perspective view of the vapor chamber 201.

The vapor chamber 201 has, as can be seen from FIGS. 53 and 54, a first sheet 210, a second sheet 220 and a third sheet 230. These first sheet 210, second sheet 220 and third sheet 230 are superposed and bonded (diffusion bonding, brazing, or the like), so that a hollow part surrounded by the first sheet 210, the second sheet 220 and the third sheet 230 is formed. This hollow part is a sealed space 202 when a working fluid is enclosed therein.

In the present embodiment, the first sheet 210 is a sheetlike member as a whole. The first sheet 210 is formed of flat faces on the front and back sides. The first sheet 210 includes an inner face 210*a*, an outer face 210*b* on the opposite side of the inner face 210*a*, and a side face 210*c* that stretches between the inner face 210*a* and the outer face 210*b* to form the thickness.

The first sheet 210 includes a main body 211 and an inlet part 212. The main body 211 is a sheetlike portion to form the sealed space, where a working fluid moves, and in the present embodiment, is a rectangle having circular arcs (what is called R) at the corners from a plan view.

The inlet part 212 is a portion via which a working fluid is poured into the sealed space formed by the first sheet 210, the second sheet 220, and the third sheet 230. In the present embodiment, the inlet part 212 is in the form of a sheet of a quadrangle from a plan view which sticks out of the L-shape of the main body 211 from a plan view. In the present embodiment, the inlet part 212 of the first sheet 210 is formed to have flat faces on both the inner face 210*a* side and the outer face 210*b* side.

In the present embodiment, the second sheet 220 is a sheetlike member as a whole. The second sheet 220 is formed of flat faces on the front and back sides. The second sheet 220 includes an inner face 220*a*, an outer face 220*b* on the opposite side of the inner face 220*a*, and a side face 220*c* that stretches between the inner face 220*a* and the outer face 220*b* to form the thickness.

The second sheet 220 also has a main body 221 and an inlet part 222.

Figure 55:
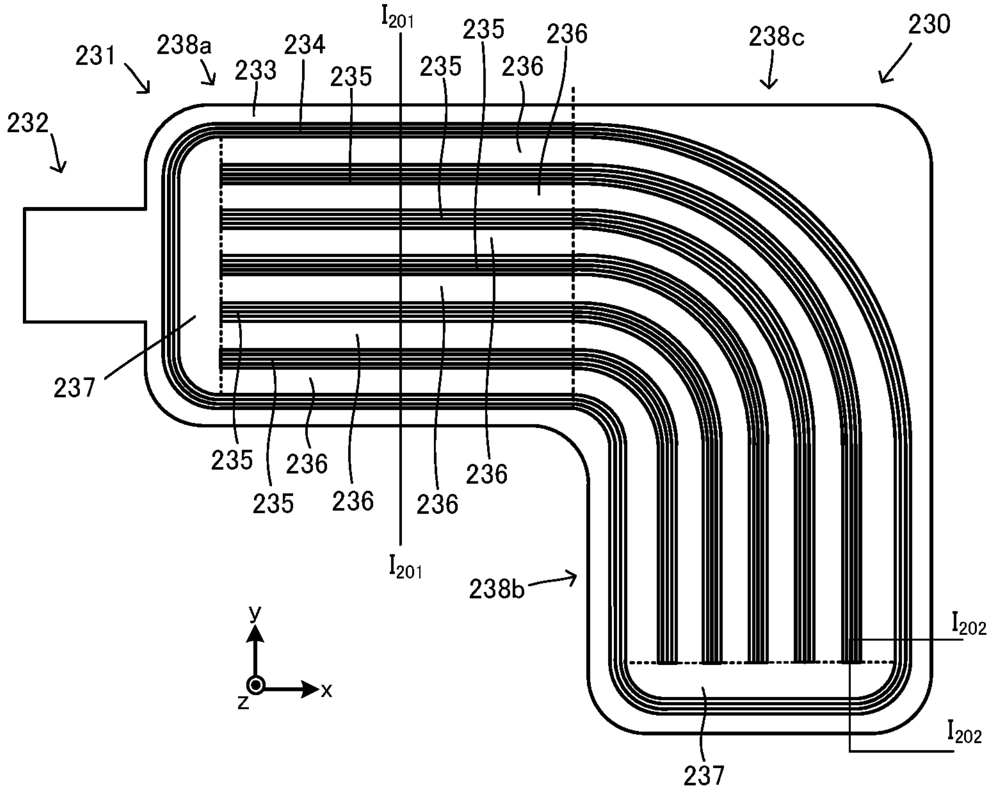
FIG. 55 shows a third sheet 230 on one face side.
Figure 56:
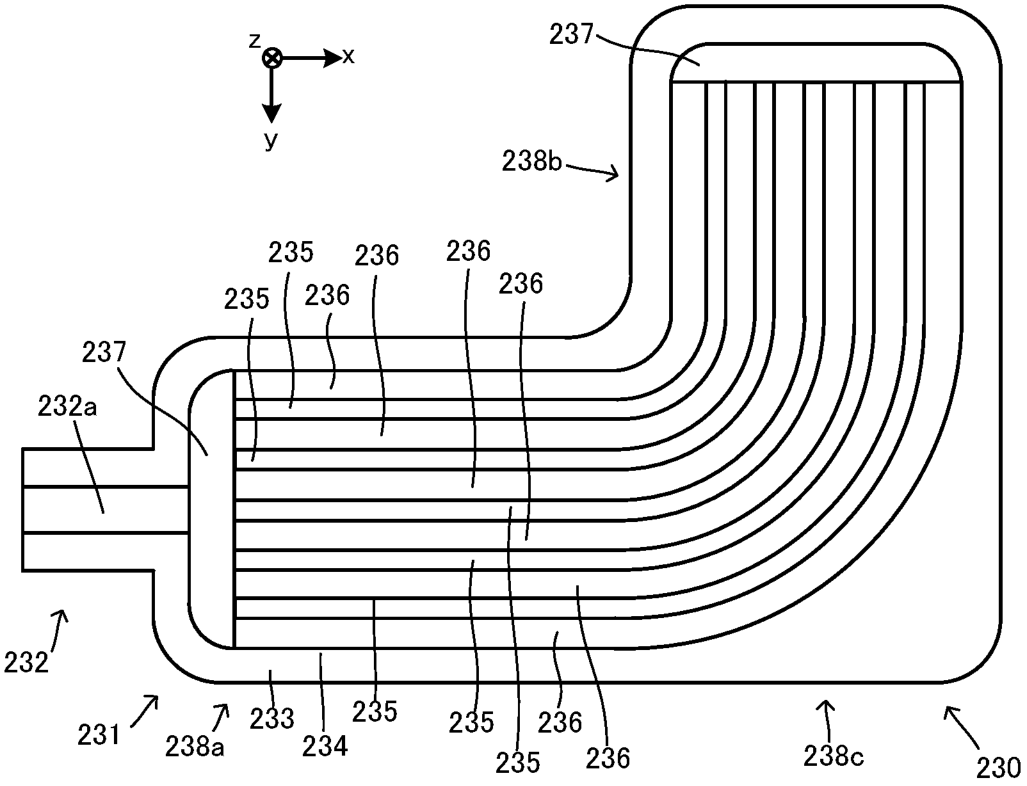
FIG. 56 shows the third sheet 230 on the other face side.
Figure 57:
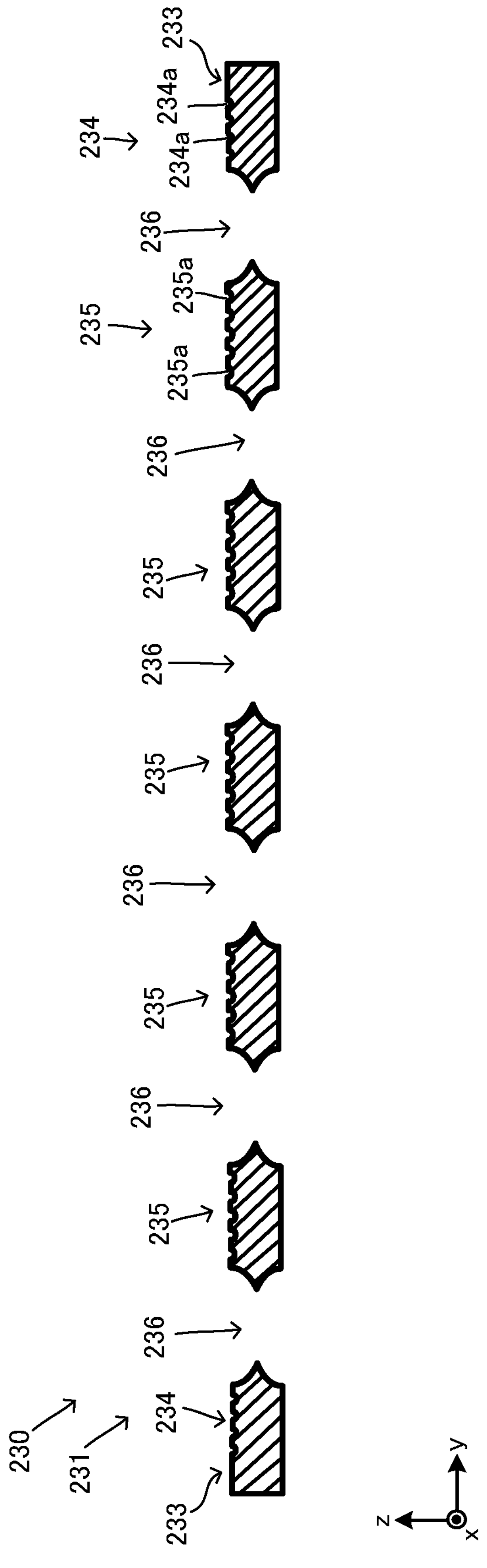
FIG. 57 shows a cross section of the third sheet 230.
Figure 58:
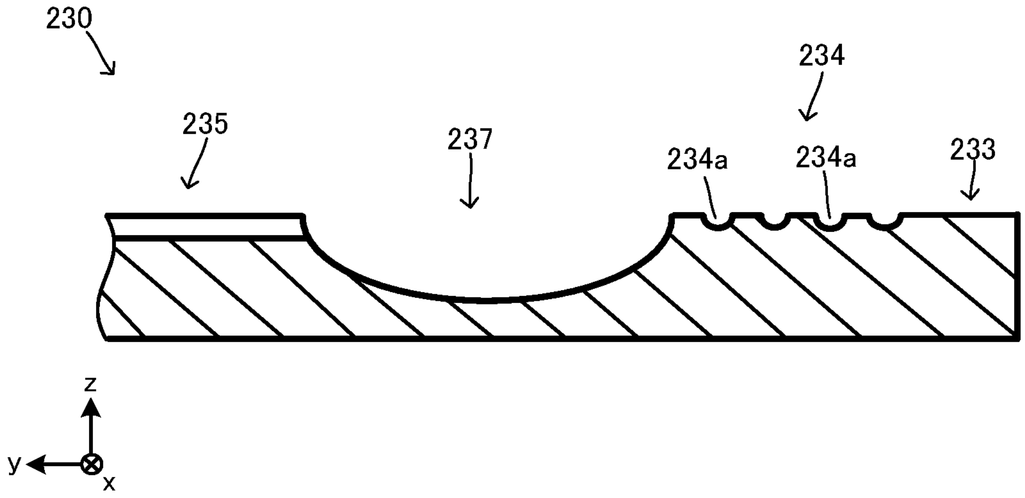
FIG. 58 shows another cross section of the third sheet 230.

In the present embodiment, the third sheet 230 is a sheet sandwiched between and superposed on the inner face 210*a* of the first sheet 210 and the inner face 220*a* of the second sheet 220. A structure for a working fluid to move is formed in a main body 231 of the third sheet 230. FIGS. 55 and 56 are plan views of the third sheet 230: FIG. 55 shows a face to be superposed on the second sheet 220; and FIG. 56 shows a face to be superposed on the first sheet 210. FIG. 57 shows a cross section taken along the line $I_{201}$-$I_{201}$ in FIG. 55. FIG. 58 shows a cross section taken along the line $I_{202}$-$I_{202}$ in FIG. 55.

The third sheet 230 includes the main body 231 and an inlet part 232. The main body 231 is a sheetlike portion to form the sealed space, where a working fluid moves. In the present embodiment, the main body 231 is in the form of L with a curved portion from a plan view.

The inlet part 232 is a portion via which a working fluid is poured into the sealed space formed by the first sheet 210, the second sheet 220, and the third sheet 230. In the present embodiment, the inlet part 232 is in the form of a sheet of a quadrangle from a plan view which sticks out of the L-shape of the main body 231 from a plan view. An inlet groove 232*a* is formed in a face of the inlet part 232 which is to be superposed on the first sheet 210. The inlet groove 232*a* may be considered the same as the inlet groove 122*a*.

The main body 231 includes a peripheral bonding part 233, a peripheral fluid flow path part 234, inner side fluid flow path parts 235, vapor flow path slits 236, and vapor flow path communicating grooves 237.

The peripheral bonding part 233 is a portion formed along the periphery of the main body 231. One face of the peripheral bonding part 233 is superposed on and bonded (diffusion bonding, brazing, or the like) to a face of the first sheet 210, and the other face thereof is superposed on and bonded (diffusion bonding, brazing, or the like) to a face of the second sheet 220. This results in the formation of the hollow part surrounded by the first sheet 210, the second sheet 220, and the third sheet 230. This hollow part is the sealed space when a working fluid is enclosed therein.

The peripheral bonding part 233 may be considered the same as the peripheral bonding part 113.

The peripheral fluid flow path part 234 functions as a fluid flow path part, and is a portion that forms a part of the condensate flow paths 103, which are flow paths where a condensed and liquified working fluid passes. The peripheral fluid flow path part 234 is formed on the main body 231 along the inside of the peripheral bonding part 223, and is provided along the periphery of the sealed space 202 so as to be annular. Fluid flow path grooves 234*a* are formed in a face of the peripheral fluid flow path part 234 which is on the side facing the second sheet 220. In the present embodiment, the fluid flow path grooves 234*a* are provided only in the face facing the second sheet 220. In addition to them, the fluid flow path grooves may be also provided in the face facing the first sheet 210.

The peripheral fluid flow path part 234, and the fluid flow path grooves 234*a* included therein may be considered the same as the peripheral fluid flow path part 114, and the fluid flow path grooves 114*a*.

The inner side fluid flow path parts 235 also function as fluid flow path parts, and are portions that form a part of the condensate flow paths 103, where a condensed and liquified working fluid passes. The inner side fluid flow path parts 235 are formed on the main body 231 inside the ring of the annular peripheral fluid flow path part 234 so as to extend with curved portions. The plural (five in the present embodiment) inner side fluid flow path parts 235 are aligned in a direction different from the extending direction thereof, and disposed among the vapor flow path slits 236.

In faces of the inner side fluid flow path parts 235 which are on the side facing the second sheet 220, fluid flow path grooves 235*a* that are grooves parallel to the extending direction of the inner side fluid flow path parts 235 are formed. The inner side fluid flow path parts 235 and the fluid flow path grooves 235*a* may be considered the same as the inner side fluid flow path parts 115 and the fluid flow path grooves 115*a*.

In the present embodiment, the fluid flow path grooves 235*a* are provided only in the face facing the second sheet 220. In addition to them, the fluid flow path grooves may be also provided in the face facing the first sheet 210.

The vapor flow path slits 236 are portions where a working fluid in a vapor or condensate state moves, and are slits to form the vapor flow paths 104. The vapor flow path slits 236 are formed of slits with curved portions which are formed in the main body 231 inside the ring of the annular peripheral fluid flow path part 234. Specifically, the vapor flow path slits 236 according to the present embodiment are slits formed between adjacent ones of the inner side fluid flow path parts 235, and between the peripheral fluid flow path part 234 and the inner side fluid flow path parts 235. Therefore, the vapor flow path slits 236 penetrate through the third sheet 230 in the thickness direction (z-direction).

The plural (six in the present embodiment) vapor flow path slits 236 are aligned in a direction different from the extending direction thereof. Thus, as can be seen from FIG. 60, the third sheet 230 has a shape formed of the peripheral fluid flow path part 234, and the inner side fluid flow path parts 235 and the vapor flow path slits 236, which are alternately repeated.

The vapor flow path slits 236 as the foregoing may be considered the same as the mode of the vapor flow paths 104, which are formed by combining the vapor flow path grooves 116 and the vapor flow path grooves 126.

In the present embodiment, the cross-sectional shape of each of the vapor flow path slits 236 is formed in such a way that elliptic arcs are partially superposed on each other and the centers thereof in the thickness direction protrude. This cross-sectional shape is not limited to this, but may be another shape such as a quadrangle including a square, a rectangle and a trapezoid, a triangle, a semicircle, a crescent, and any combination thereof.

The vapor flow path communicating grooves 237 are grooves to form flow paths allowing a plurality of the vapor flow path slits 236 to communicate with each other. This makes it possible to balance the movement of a working fluid generated in the vapor flow paths in the extending direction of the inner side fluid flow path parts 235.

This also makes it possible to achieve the equality of a working fluid in the vapor flow paths, and to convey a vapor into a wider area and efficiently use much part of the condensate flow paths formed by the fluid flow path grooves 234*a* and the fluid flow path grooves 235*a*.

The vapor flow path communicating grooves 237 according to the present embodiment are formed between the peripheral fluid flow path part 234 and both ends of the inner side fluid flow path parts 235 and the vapor flow path slits 236 in their extending direction. The shape of each of the vapor flow path communicating grooves 237 is not particularly limited as long as the vapor flow path communicating grooves 237 allow adjacent ones of the vapor flow path slits 236 to communicate with each other. This shape may be considered the same as that of each of the flow paths formed by superposing the vapor flow path communicating grooves 117 and the vapor flow path communicating grooves 127.

The third sheet 230 also includes a linear part 238*a*, a linear part 238*b*, and a curved part 238*c*, so that the vapor chamber 201 has the condensate flow paths 103 and the vapor flow paths 104 with linear portions and curved portions in the sealed space. The concept of these linear portions and curved portions is the same as described above.

The third sheet 230 as the foregoing may be made by etching both the faces individually, etching both the faces at once, pressing, cutting, or the like.

Figure 59:
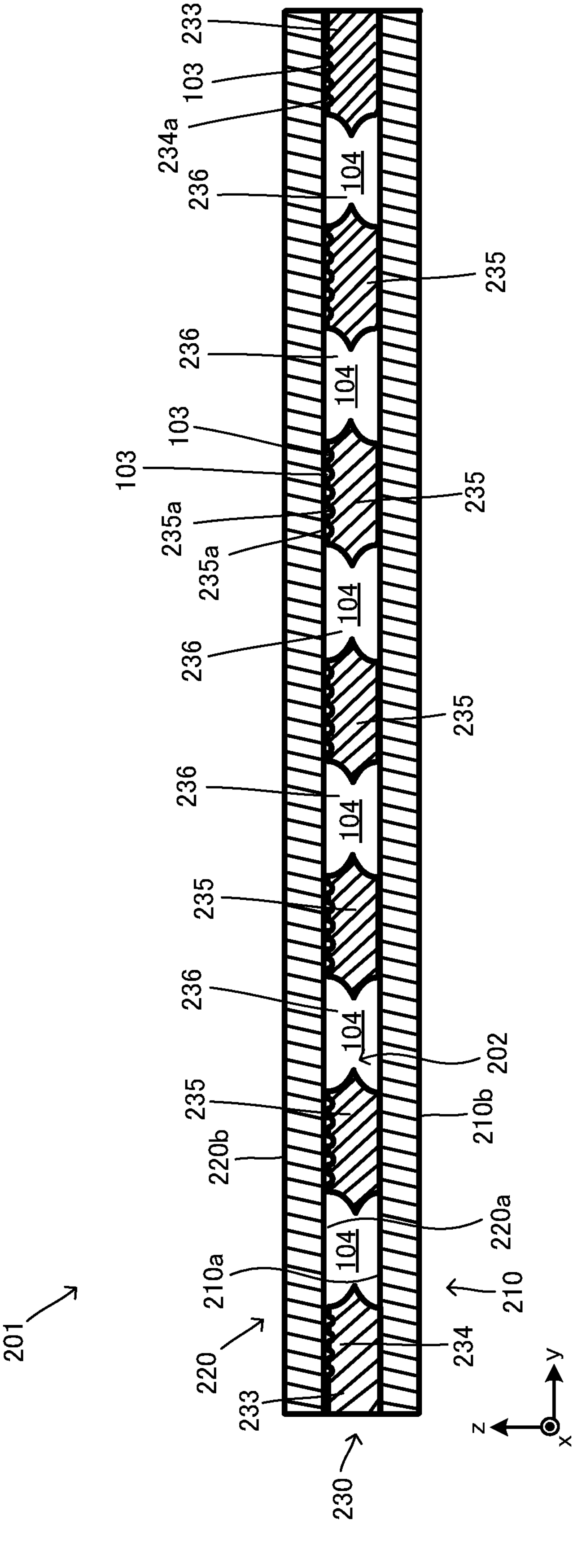
FIG. 59 shows a cross section of the vapor chamber 201.
Figure 60:
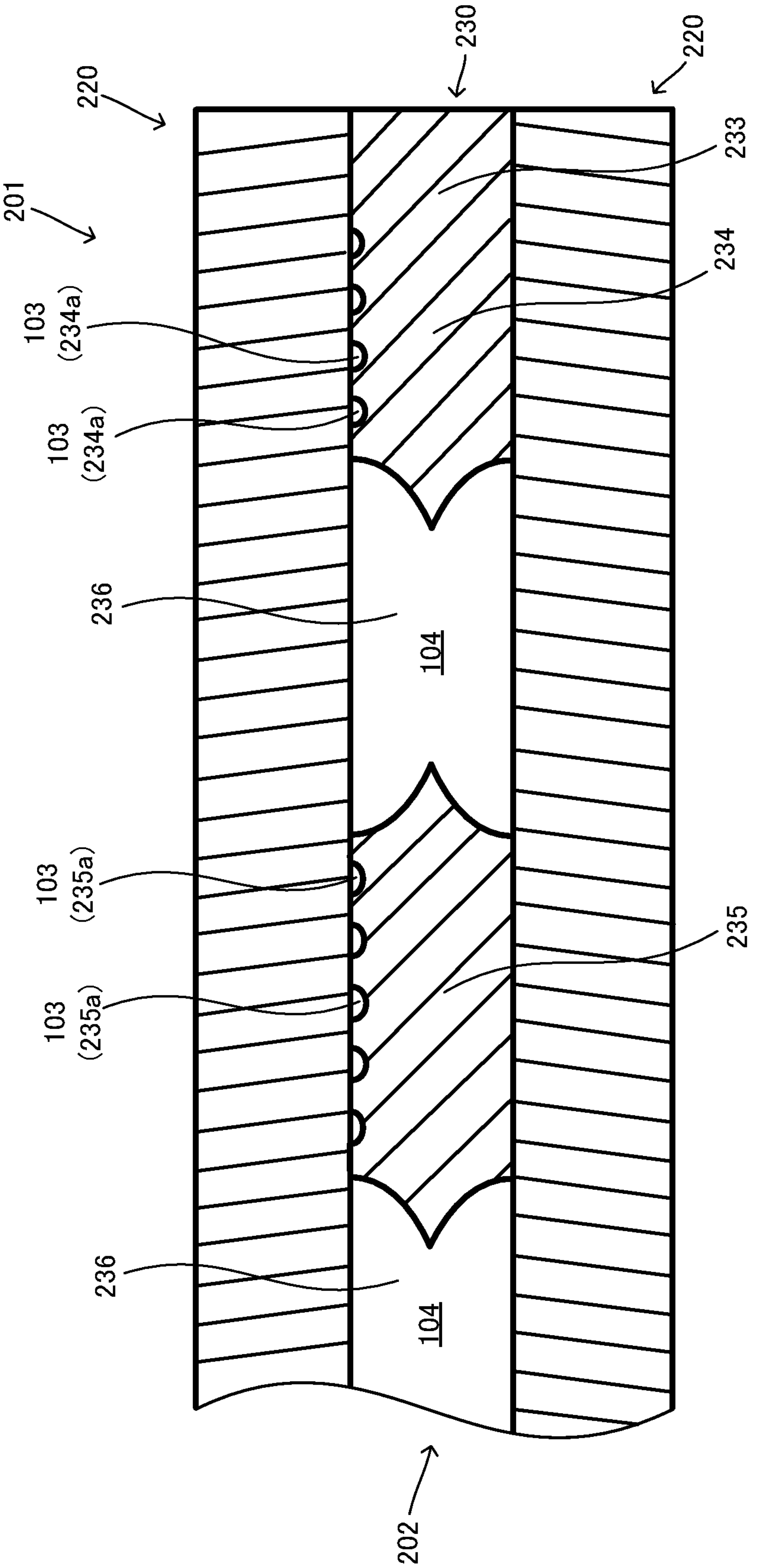
FIG. 60 is a partially enlarged view of FIG. 59.
Figure 61:
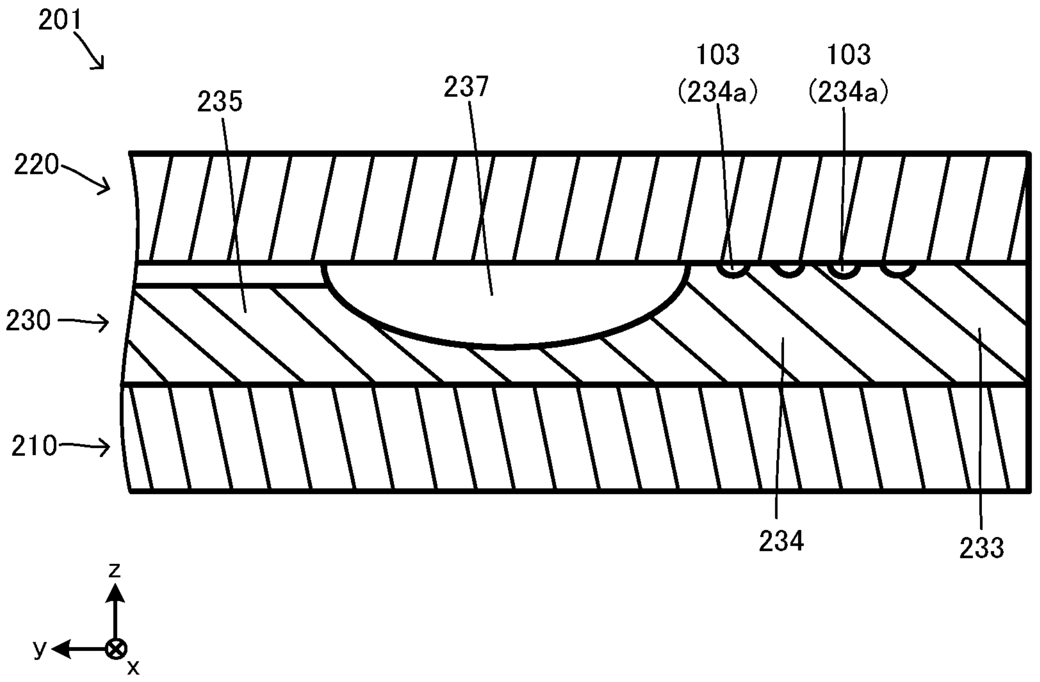
FIG. 61 shows another cross section of the vapor chamber 201.

FIGS. 59 to 61 illustrate the structure of the vapor chamber 201 formed by combining the first sheet 210, the second sheet 220, and the third sheet 230. FIG. 59 shows a cross-sectional face taken along the line indicated by $I_{203}$-$I_{203}$ in FIG. 53. FIG. 60 is a partially enlarged view of FIG. 59. FIG. 61 shows a cross-sectional face taken along the line indicated by $I_{204}$-$I_{204}$ in FIG. 53.

As can be seen from FIGS. 53 and 59 to 61, the first sheet 210, the second sheet 220, and the third sheet 230 are arranged so as to be superposed, and are bonded to each other, thereby forming the vapor chamber 201. At this time, the inner face 210*a* of the first sheet 210 and one face of the third sheet 230 (face on the side where no fluid flow path grooves 234*a* or fluid flow path grooves 235*a* are disposed) are disposed so as to face each other, and the inner face 220*a* of the second sheet 220 and the other face of the third sheet 230 (face on the side where the fluid flow path grooves 234*a* and the fluid flow path grooves 235*a* are disposed) are disposed so as to face each other. Similarly, the inlet part parts 212, 222 and 232 of the respective sheets are superposed.

This results in the formation of the sealed space surrounded by the first sheet 210, the second sheet 220, and the third sheet 230, between the first sheet 210 and the second sheet 220. The condensate flow paths 103 and the vapor flow paths 104 are formed here. To these condensate flow paths 103 and vapor flow paths 104 in the sealed space, the same concept as the condensate flow paths 103 and the vapor flow paths 104 of the vapor chamber 101 may be applied.

The above-described embodiment has described the vapor chamber with the curved part at a crossed portion assuming that the two linear parts extend so as to cross each other at an angle of 90 degrees and form an L-shape. The curvature is not limited to this. The above-described curved part may be also applied to any other curvatures. For example, the above-described curved part may be applied to: a crossed portion assuming that two linear parts extend in directions so as to cross each other in the form of T; a crossed portion assuming that two linear parts extend in directions so as to cross each other in a cross; a crossed portion assuming that two straight lines extend so as to cross each other at an acute angle (angle smaller than 90 degrees) and form a V-shape; and a crossed portion assuming that two straight lines extend so as to cross each other at an obtuse angle (angle larger than 90 degrees) and form a V-shape.

Third Embodiment

The third embodiment will describe an intermediate that is an object obtained in the middle of manufacturing a vapor chamber that is a final product, a sheet where multiple intermediates are imposed, and a roll obtained by winding this sheet. Thus, for convenience, the third embodiment will show a production method followed by a description, thereby describing an intermediate, a sheet where multiple intermediates are imposed, and a roll where multiple intermediates are imposed which are obtained by the method.

<<Method of Manufacturing Vapor Chamber S1>>

Figure 62:
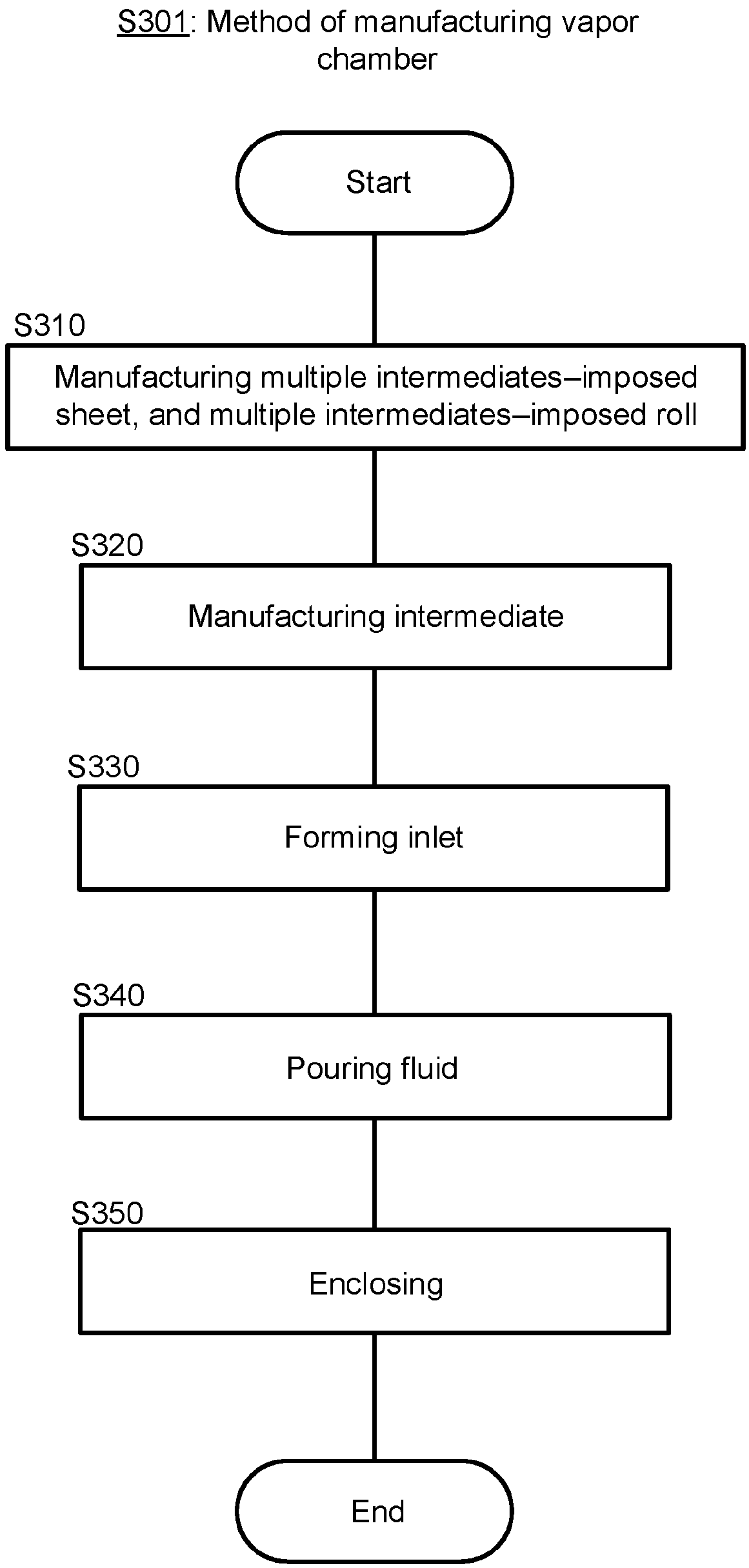
FIG. 62 shows a flow of a method of manufacturing a vapor chamber S301.

FIG. 62 shows a flow of a method of manufacturing a vapor chamber according to one embodiment S301 (hereinafter may be referred to as "manufacturing method S301"). As can be seen from FIG. 62, the manufacturing method S301 includes the steps of manufacturing a multiple intermediates—imposed sheet, and a multiple intermediates—imposed roll S310, manufacturing an intermediate S320, forming an inlet S330, pouring a fluid S340, and enclosing S350.

For convenience, hereinafter "a sheet where multiple intermediates for a vapor chamber are imposed" may be referred to as "a multiple intermediates—imposed sheet", and "a roll of a wound sheet where multiple intermediates for a vapor chamber are imposed" may be referred to as "a multiple intermediates—imposed roll".

Hereinafter the respective steps will be described in detail.

<Material>

Material is prepared in advance to the manufacturing method S301. In the present embodiment, two material sheets are prepared because a vapor chamber is manufactured by bonding two sheets.

As described as follows, in the present embodiment, a vapor chamber is not made by cutting two material sheets, but via the step of making a multiple intermediates—imposed sheet and a multiple intermediates—imposed roll where a plurality of intermediates are aligned by superposing two long belt-shaped material sheets, and thereafter, for example, individually punching out the intermediates, which is so-called "multiple imposition". Therefore, the material sheets prepared in the present embodiment are two long belt-shaped sheets that are generally provided as a roll formed by winding these belt-shaped sheets.

It is noted that the present disclosure except the steps particular to multiple imposition may be also applied to a method of manufacturing an intermediate by cutting sheets, and a method of manufacturing a vapor chamber by cutting sheets.

The material constituting the material sheets is not particularly limited, but may be a metal. Among metals, a metal of high thermal conductivity is preferable. Examples of such a metal include copper, copper alloys, and aluminum. The material does not have to be a metallic material, but may be, for example, a ceramic such as AlN, $Si_3N_4$ and $Al_2O_3$, and a resin such as polyimide and epoxy.

A laminate of at least two materials in one sheet (a so-called clad material, or the first sheet 10 and the second sheet 20 described concerning the vapor chamber 1) may be used. A material having different characteristics between portions may be used.

The thickness of each of the material sheets may be considered the same as, for example, that of the first sheet 10 and the second sheet 20 of the vapor chamber 1, and the first sheet 110 and the second sheet 120 of the vapor chamber 101.

<Manufacturing Multiple Intermediates—Imposed Sheet and Multiple Intermediates-Imposed Roll S310>

Figure 63:
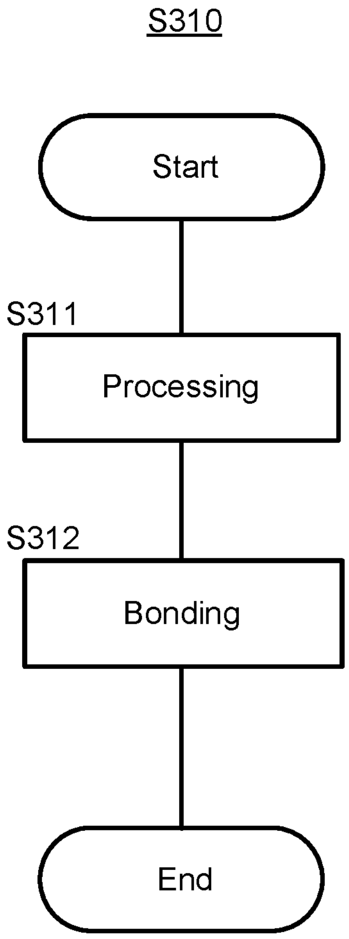
FIG. 63 shows a flow of a step S310.

In the manufacturing a multiple intermediates—imposed sheet and a multiple intermediates—imposed roll S310 (hereinafter may be referred to as "step S310"), a multiple intermediates—imposed sheet and/or a multiple intermediates—imposed roll is/are manufactured from the above-described material. FIG. 63 shows a flow of the step S310. As can be seen from FIG. 63, the step S310 includes the steps of processing S311 and bonding S312.

(Processing S311)

Figure 64:
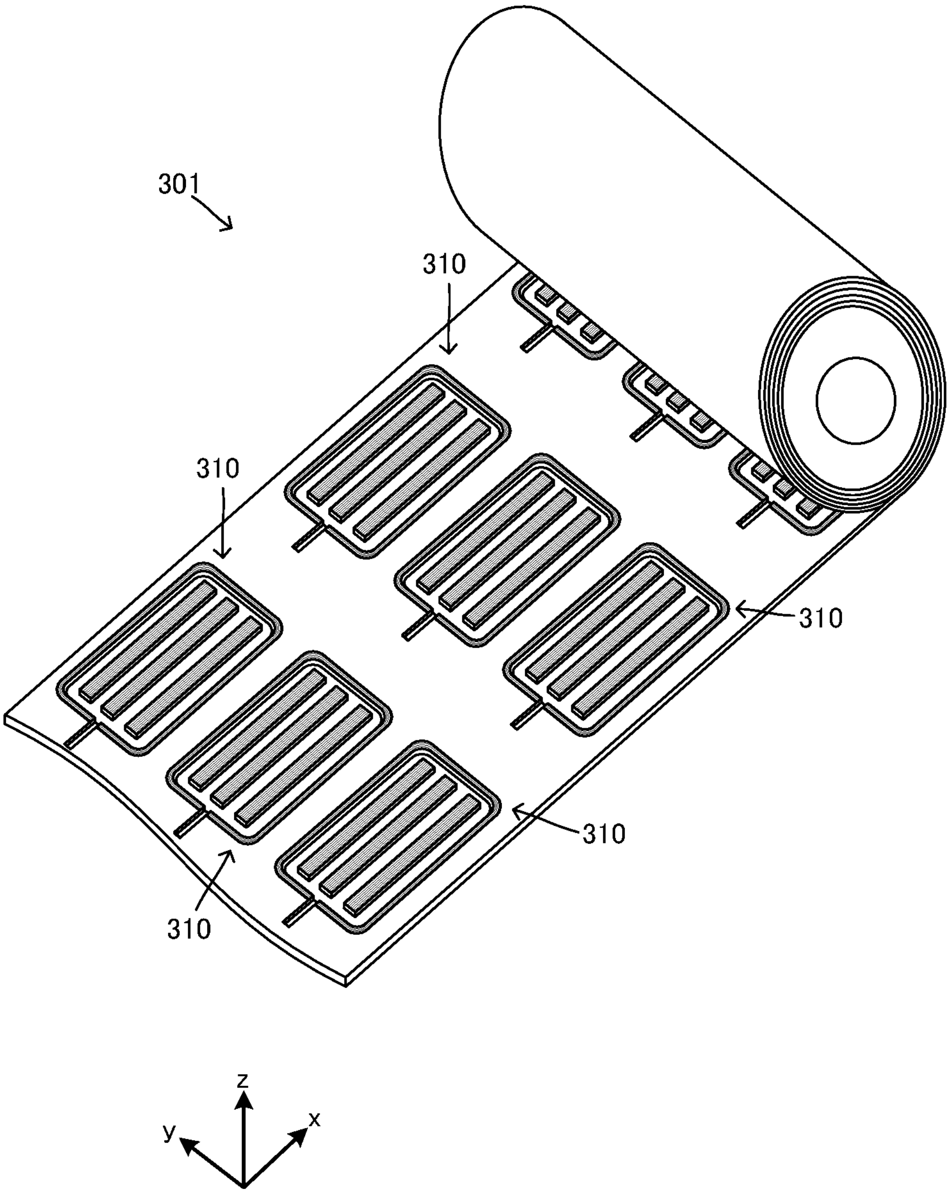
FIG. 64 is a perspective view of a first sheet with multiple imposition 301.

The processing S311 is a step of forming a shape for flow paths of a vapor chamber. In the present embodiment, such a shape is formed on a first sheet with multiple imposition 301 that is one of the two material sheets A second sheet with multiple imposition 302 that is the other material sheet is used without processing for flow paths. FIG. 64 illustrates the processed first sheet with multiple imposition 301, on which shapes 310 are given. As can be seen from this drawing, a plurality of the shapes 310 for flow paths of a vapor chamber are aligned on the first sheet with multiple imposition 301, so that the sheet 301 becomes a sheet where the multiple shapes 310 are imposed. This sheet 301 is wound and forms a roll.

The way of forming the shapes 310 is not particularly limited. Examples of this way include etching, cutting, and pressing. Among them, the formation of the shapes by etching is more efficient and mass-productive than other ways. In this case, so-called half etching may be applied: half etching here is to etch the material sheets in the middle without penetrating in the thickness direction.

Figure 65:
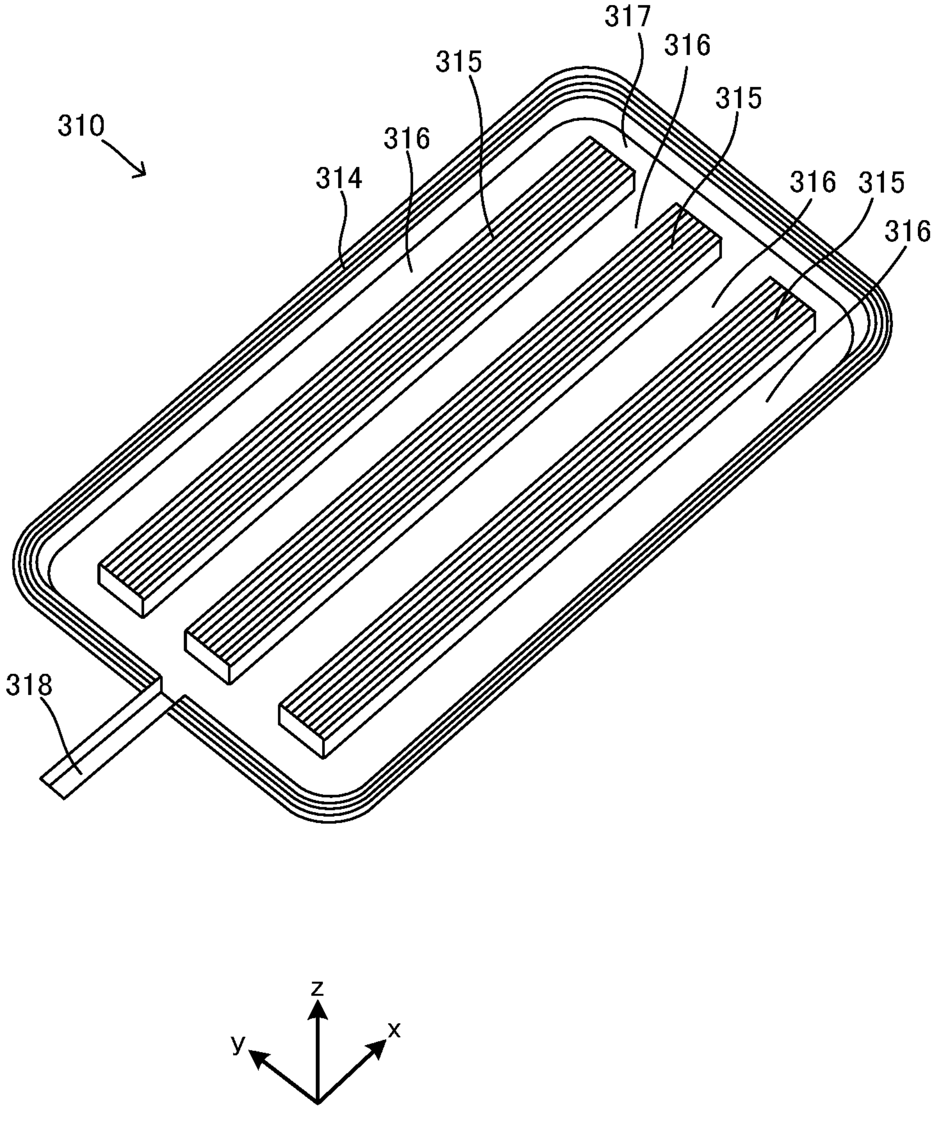
FIG. 65 is a perspective view showing one of shapes 310 that are formed on the first sheet with multiple imposition 301.
Figure 66:
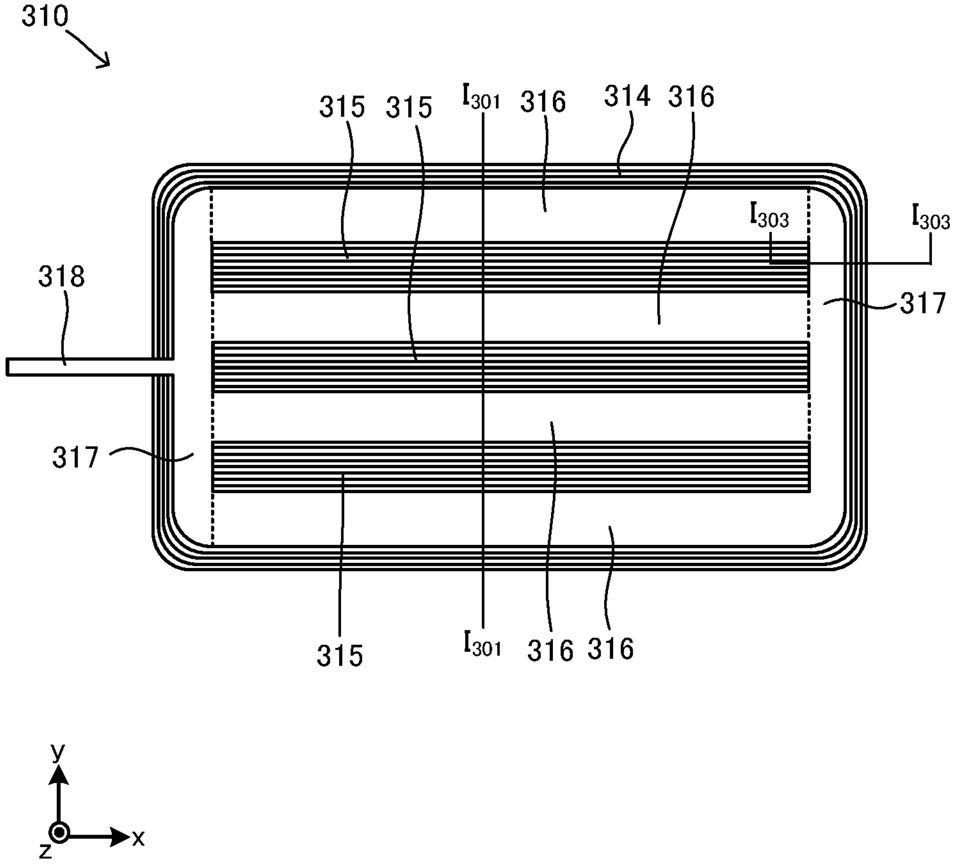
FIG. 66 is a plan view showing one of the shapes 310, which are formed on the first sheet with multiple imposition 301.
Figure 67:
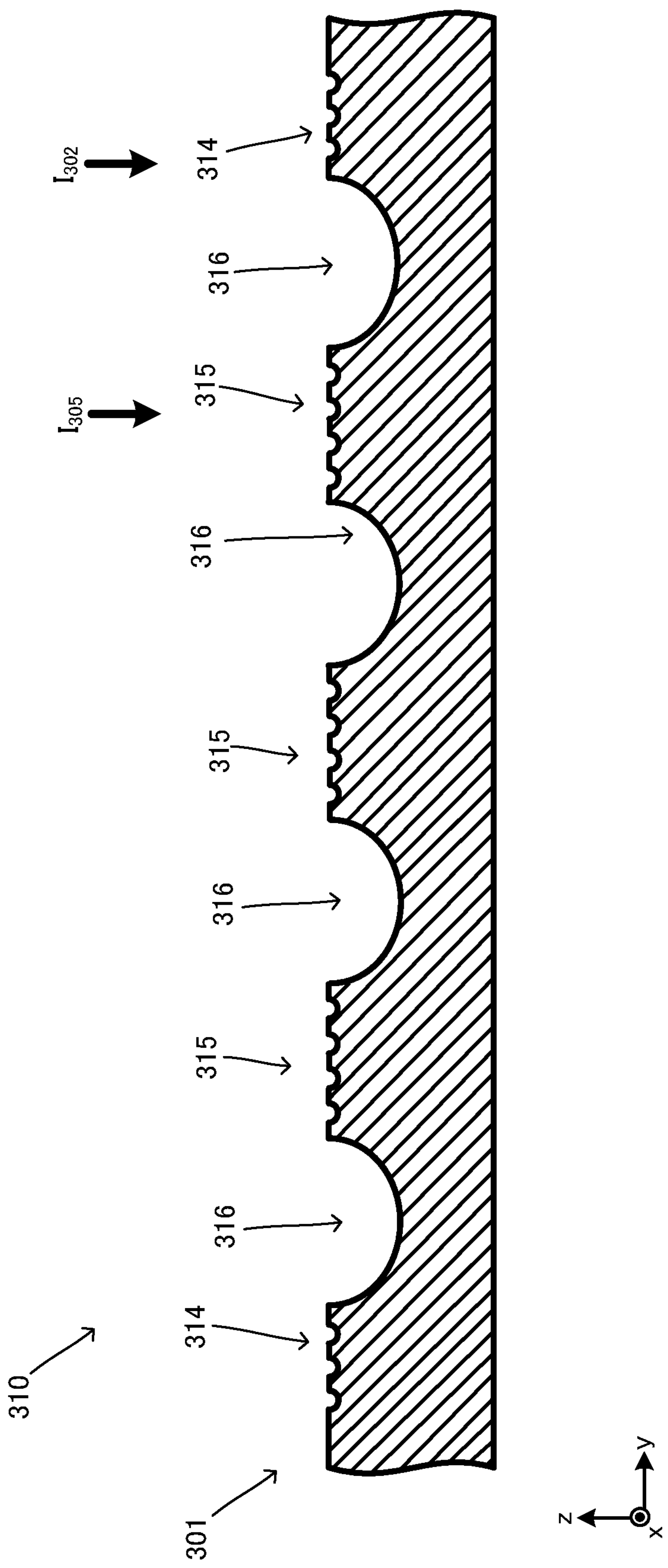
FIG. 67 is a cross-sectional view showing one of the shapes 310, which are formed on the first sheet with multiple imposition 301.

Here, any specific mode of the shapes 310 is not particularly limited, but for example, may be the following. FIGS. 65 to 67 illustrate one example. FIG. 65 is an external perspective view focusing on one of the multiple shapes 310, which are imposed, in FIG. 64. FIG. 66 shows FIG. 65 in the z-direction (from a plan view). FIG. 67 is a cross-sectional view taken along the line $I_{301}$-$I_{301}$ of FIG. 66.

The shape to be given includes grooves to be flow paths for a working fluid to reflux, and a groove to be a flow path via which the working fluid is poured into the foregoing grooves. Specifically, in this embodiment, a peripheral fluid flow path part 314, inner side fluid flow path parts 315, vapor flow path grooves 316, vapor flow path communicating grooves 317, and an inlet groove 318 are provided.

Figure 68:
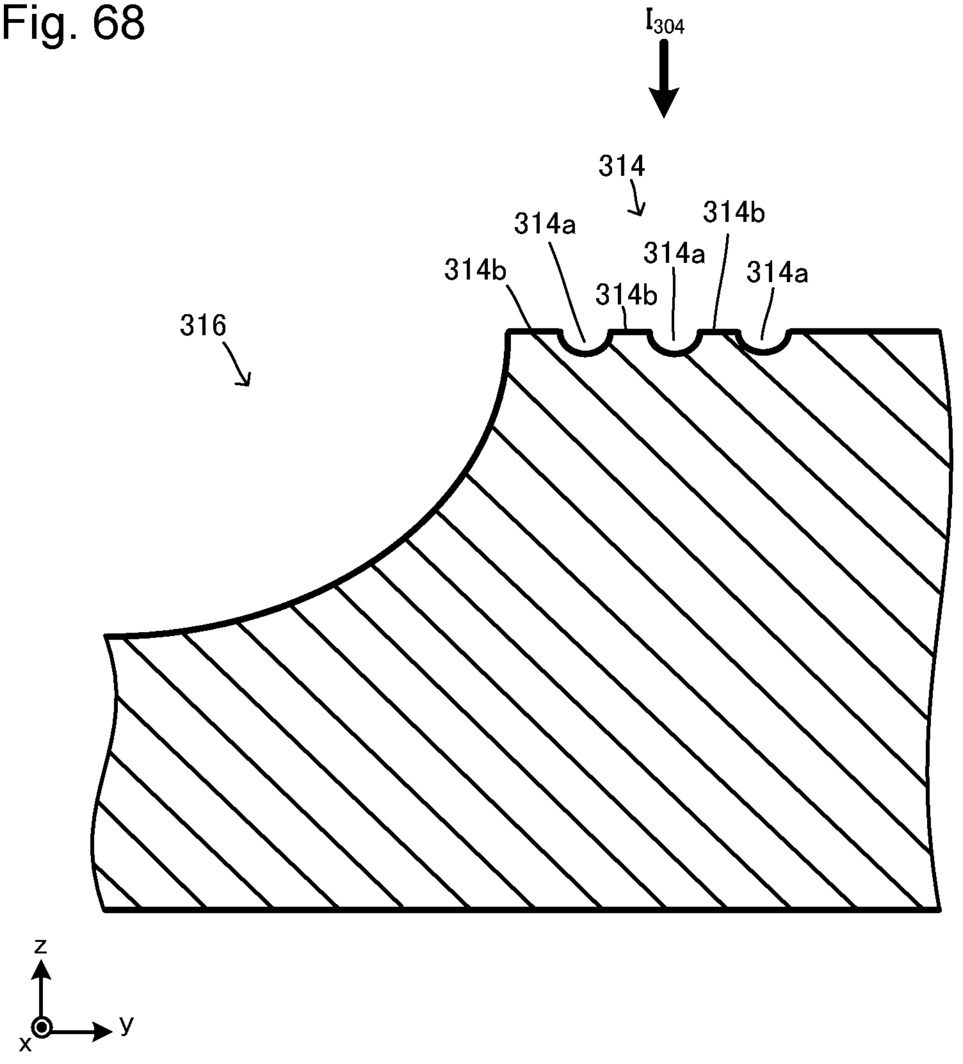
FIG. 68 is a partially enlarged view of FIG. 67.
Figure 69:
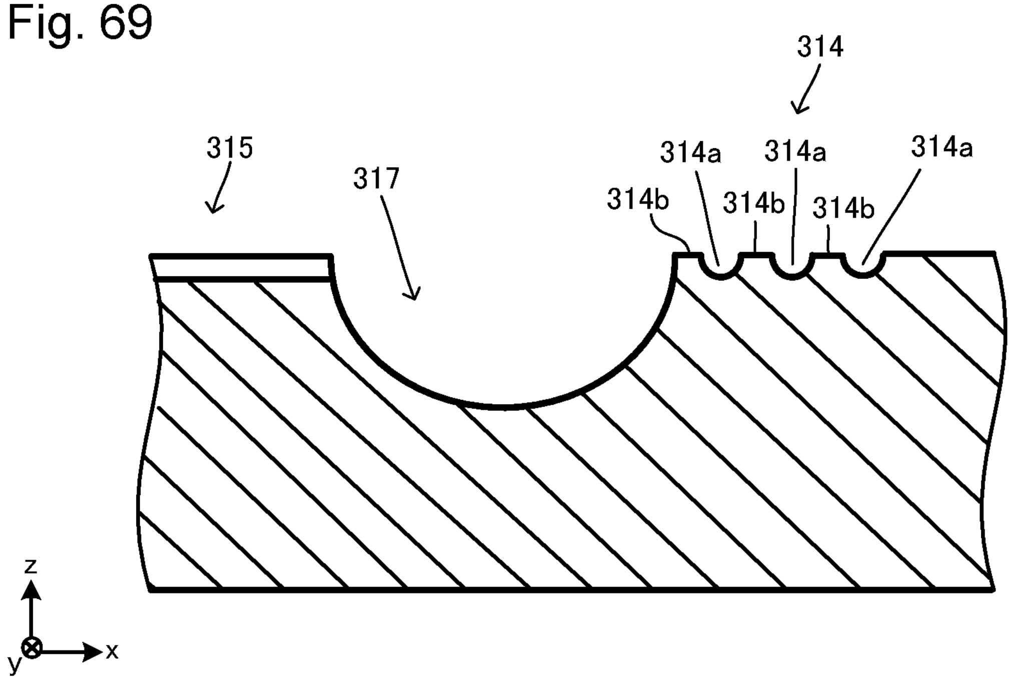
FIG. 69 is another cross-sectional view showing one of the shapes 310, which are formed on the first sheet with multiple imposition 301.

The peripheral fluid flow path part 314 functions as a fluid flow path part, and is a portion that forms a part of condensate flow paths 354 (see, for example, FIG. 84) that are the second flow paths where a condensed and liquified working fluid passes. FIG. 68 shows a cross section of a portion indicated by the arrow $I_{1302}$ in FIG. 67. FIG. 69 shows a cross section of a portion taken along the line $I_{303}$-$I_{303}$ in FIG. 66. Both the drawings show cross-sectional shapes of the peripheral fluid flow path part 314. FIG. 90 is a partially enlarged view of the peripheral fluid flow path part 314 in the direction indicated by the arrow $I_{1304}$ in FIG. 7 (z-direction, or from a plan view).

Figure 70:
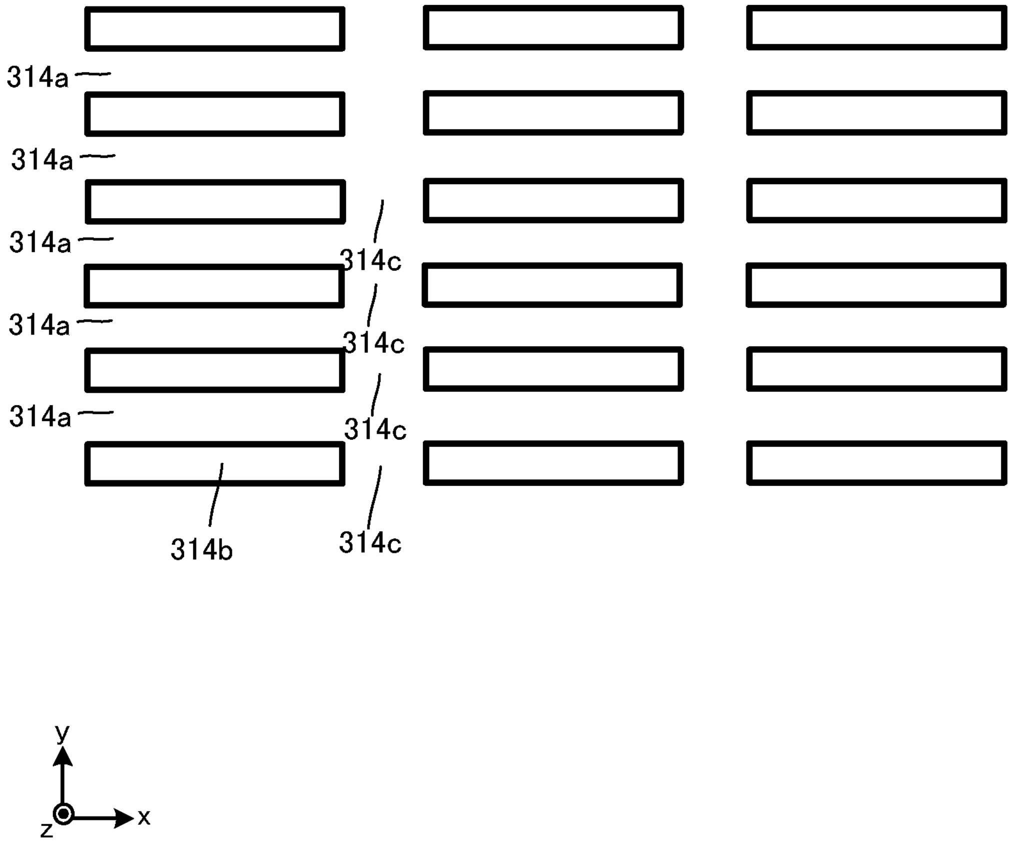
FIG. 70 is a partially enlarged plan view of a peripheral fluid flow path part 314.

As can be seen from these drawings, the peripheral fluid flow path part 314 is a portion in the form of a ring. The peripheral fluid flow path part 314 is provided with fluid flow path grooves 314*a* that are a plurality of grooves extending in this annular direction. A plurality of the fluid flow path grooves 314*a* are arranged at predetermined intervals in a direction different from the extending direction thereof. Thus, as can be seen from FIGS. 68 and 69, the fluid flow path grooves 314*a*, which are depressions, and protrusion 314*b* among the fluid flow path grooves 314*a* are formed on the peripheral fluid flow path part 314 as the depressions and the protrusions are repeated in a cross section of the peripheral fluid flow path part 314. In the present embodiment, on the peripheral fluid flow path part 314, as can be seen from FIG. 70, any adjacent ones of the fluid flow path grooves 314*a* at predetermined intervals communicate with each other via communicating opening parts 314*c*.

The mode of the peripheral fluid flow path part 314 as described above may be considered the same as the peripheral fluid flow path part of the vapor chamber according to each of the above-described embodiments.

Figure 71:
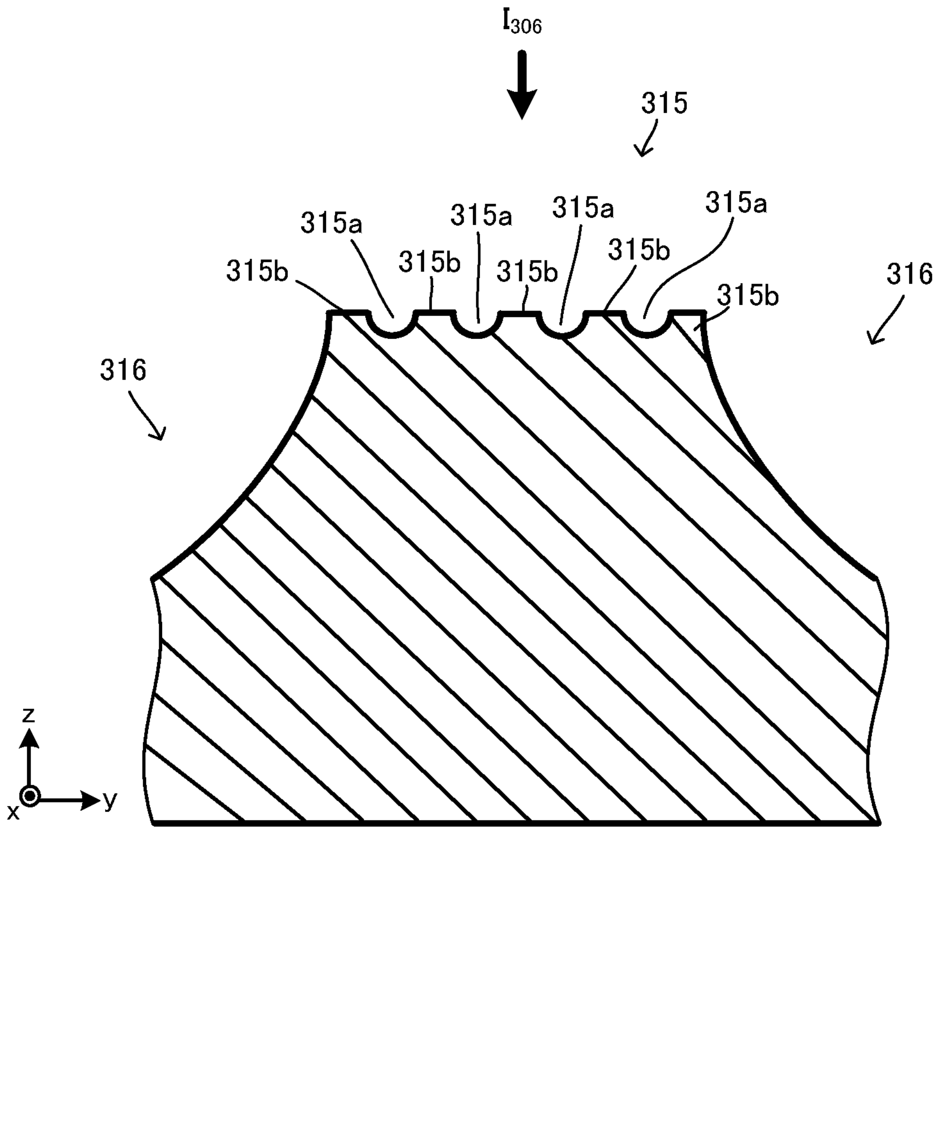
FIG. 71 shows a cross section focusing on one inner side fluid flow path part 315.
Figure 72:
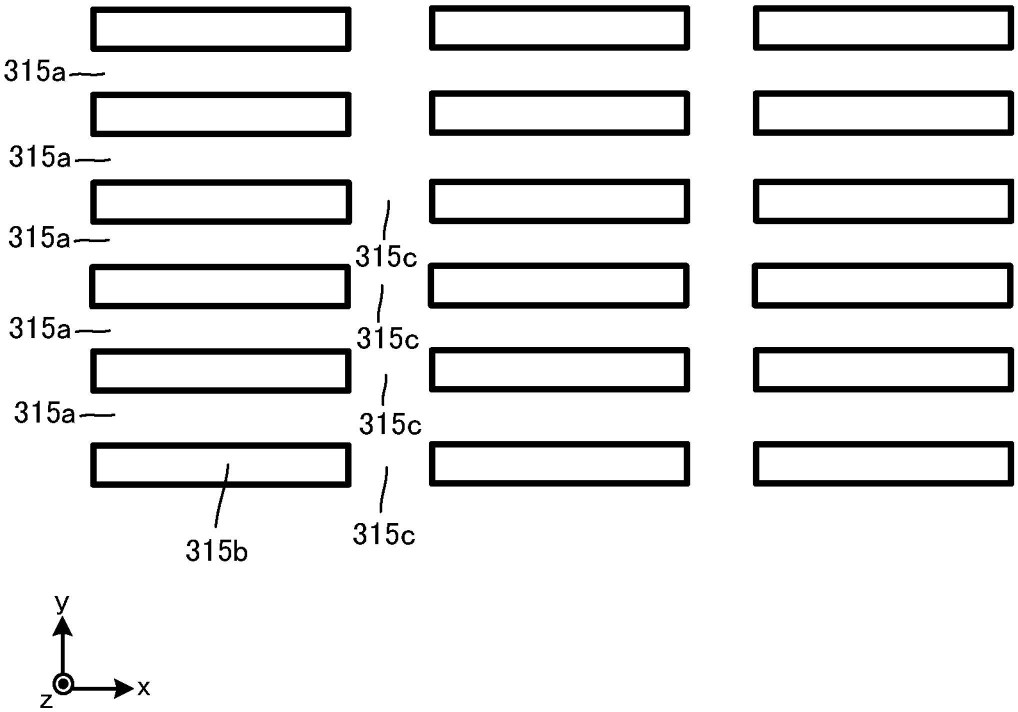
FIG. 72 is a partially enlarged plan view of the inner side fluid flow path part 315.

The inner side fluid flow path parts 315 also function as fluid flow path parts, and are portions that form a part of the condensate flow paths 354, which are the second flow paths where a condensed and liquified working fluid passes. FIG. 71 shows a portion indicated by the arrow $I_{1305}$ in FIG. 67. This drawing also shows a cross-sectional shape of the inner side fluid flow path parts 315. FIG. 72 is a partially enlarged view of the inner side fluid flow path parts 315 in the direction indicated by the arrow $I_{306}$ in FIG. 71 (z-direction, or from a plan view).

As can be seen from these drawings, the inner side fluid flow path parts 315 are formed inside the annular ring of the peripheral fluid flow path part 314. As can be seen from FIGS. 65 and 66, the inner side fluid flow path parts 315 according to the present embodiment are walls extending in the x-direction. The plural (three in this embodiment) inner side fluid flow path parts are aligned at predetermined intervals in a direction orthogonal to the extending direction thereof (y-direction).

Fluid flow path grooves 315*a* that are grooves parallel to the extending direction of the inner side fluid flow path parts 315 are formed in each of the inner side fluid flow path parts 315. A plurality of the fluid flow path grooves 315*a* are arranged at predetermined intervals in a direction different from the extending direction thereof. Thus, as can be seen from FIGS. 67 and 71, the fluid flow path grooves 315*a*, which are depressions, and protrusions by protrusions 315*b* among the fluid flow path grooves 315*a* are formed on the inner side fluid flow path parts 315 as the depressions and the protrusions are repeated in a cross section of the inner side fluid flow path parts 315. As can be seen from FIG. 72, any adjacent ones of the fluid flow path grooves 315*a* at predetermined intervals communicate with each other via communicating opening parts 315*c*.

The mode of the inner side fluid flow path parts 315 as described above may be considered the same as the inner side fluid flow path parts of the vapor chamber according to each of the above-described embodiments.

The vapor flow path grooves 316 are portions where a vapor that is a vaporized and gasified working fluid passes, and form a part of vapor flow paths 355 (see, for example, FIG. 84) that are the first flow paths. FIG. 66 shows a shape of the vapor flow path grooves 316 in the z-direction. FIG. 67 shows a cross-sectional shape of each of the vapor flow path grooves 316.

As can be seen in these drawings, the vapor flow path grooves 316 are formed of grooves that are formed inside the annular ring of the peripheral fluid flow path part 314. Specifically, the vapor flow path grooves 316 according to the present embodiment are grooves formed between adjacent ones of the inner side fluid flow path parts 315 and between the peripheral fluid flow path part 314 and the inner side fluid flow path parts 315, and extending in the extending direction of the inner side fluid flow path parts 315 (x-direction). The plural (four in the present embodiment) vapor flow path grooves 316 are aligned in a direction orthogonal to this extending direction (y-direction). Thus, as can be seen in FIG. 67, a shape of repeated depressions and protrusions in the y-direction is included: the protrusions are the peripheral fluid flow path part 314 and the inner side fluid flow path parts 315; and the depressions are the vapor flow path grooves 316.

The mode of the vapor flow path grooves 316 as described above may be considered the same as the vapor flow path grooves of the vapor chamber according to each of the above-described embodiments.

The vapor flow path communicating grooves 317 are grooves allowing a plurality of the vapor flow path grooves 316 to communicate. This makes it possible to achieve the equality of a vapor in a plurality of the vapor flow paths 355, and to convey a vapor into a wider area and efficiently use much part of the condensate flow paths 354, which make it possible to more smoothly reflux a working fluid.

The mode of the vapor flow path communicating grooves 317 may be considered the same as the vapor flow path communicating grooves of the vapor chamber according to each of the above-described embodiments.

The inlet groove 318 is a groove via which a working fluid is poured into the vapor flow path grooves 316. As can be seen from FIGS. 65 and 66, in the present embodiment, the inlet groove 318 is a groove linked to one of the vapor flow path communicating grooves 317 so as to traverse the peripheral fluid flow path part 314.

(Bonding S312)

In the bonding S312 shown in FIG. 63, the first sheet with multiple imposition 301 and the second sheet with multiple imposition 302, which are prepared in the processing S311 as described above, are superposed on and bonded to each other, so that a multiple intermediates—imposed sheet 350, and a multiple intermediates—imposed roll 351 formed by winding this are manufactured.

Figure 73:
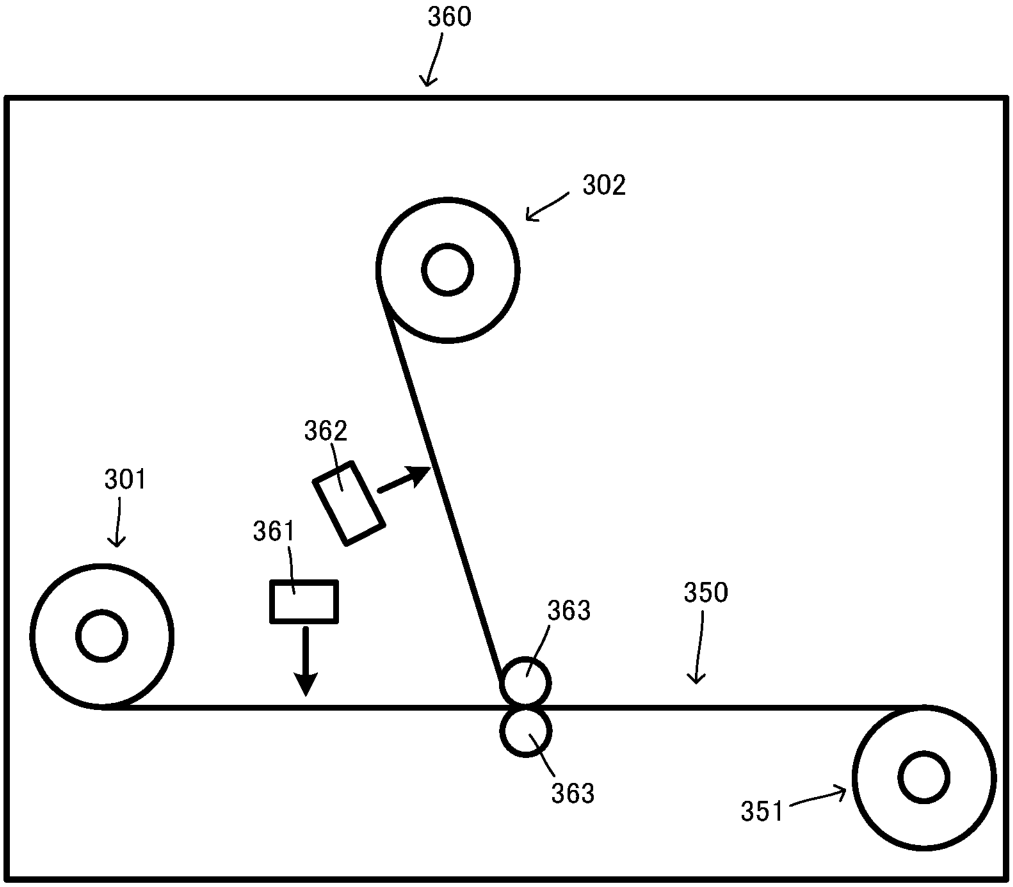
FIG. 73 illustrates bonding.

The way of the bonding is not particularly limited. Specific examples of this way include diffusion bonding, brazing, and irradiation. Here, bonding by irradiation will be described as one example. FIG. 73 shows an illustration. In this embodiment, bonding in any way is performed in a vacuum chamber 360 connected to a vacuum pump (not shown).

The first sheet with multiple imposition 301 and the second sheet with multiple imposition 302 are unwound from rolls respectively.

Next, a face of the unwound first sheet with multiple imposition 301 on the side where the shapes 310 are formed is irradiated with at least one of an atomic beam, an ion beam, and plasma from an irradiation device 361.

Here, an atomic beam with which the face is irradiated is a beam of a unit of neutral atoms running as a small flux in a certain traveling direction, an ion beam with which the face is irradiated is a beam of ions accelerated in an electric field, and plasma with which the face is irradiated is in a condition in which molecules constituting a gas move, being ionized and separated into positive ions and electrons.

This results in the removal of any oxide film on the face of the first sheet with multiple imposition 301, where the irradiation is performed.

Similarly, a face of the unwound second sheet with multiple imposition 302 on the side where the first sheet with multiple imposition 301 is to be superposed is irradiated with at least one of the atomic beam, the ion beam, and the plasma from an irradiation device 362.

This results in the removal of any oxide film on the face of the second sheet with multiple imposition 302, where the irradiation is performed.

The face of the first sheet with multiple imposition 301 and the face of the second sheet with multiple imposition 302, where the irradiation is performed as described above, are superposed on each other, and pressed with press rolls 363. This leads to the bonded first sheet with multiple imposition 301 and second sheet with multiple imposition 302, so that the multiple intermediates—imposed sheet 350 is formed. This multiple intermediates—imposed sheet 350 is wound, so that the multiple intermediates—imposed roll 351 is formed.

As the foregoing, irradiating bonding faces of sheets to be bonded as described above and thereafter bonding the sheets results in removal of an oxide film. Thus, no bonding at a high temperature is necessary. Therefore, deterioration in material can be suppressed. Particularly, a problem such as a failure in enclosing a working fluid can be suppressed because the deterioration in material causes such a problem more easily following slimming of a vapor chamber.

In addition, not only the oxide film on the bonding faces but also any oxide film inside the fluid flow path grooves 314*a*, the fluid flow path grooves 315*a*, the vapor flow path grooves 316, and the vapor flow path communicating grooves 317 can be removed. Thus, the wettability of the inner surfaces of the foregoing improves, and the heat transport performance of a vapor chamber can be improved.

Such an oxide film removal effect, and the improvement in heat transport performance by this effect can be also recognized by diffusion bonding or brazing.

Figure 74:
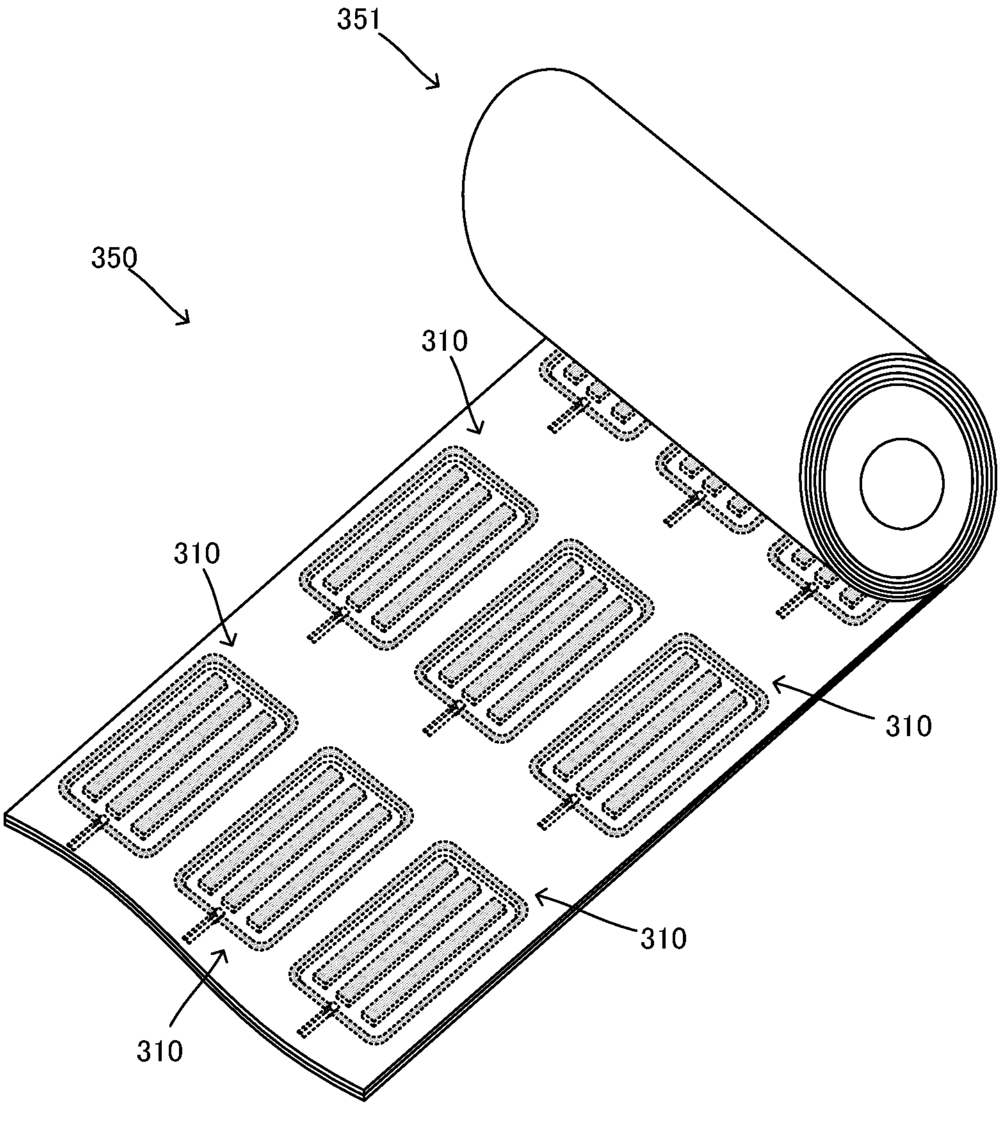
FIG. 74 illustrates a sheet 350 where multiple intermediates are imposed, and a roll 351 of the sheet 350, which is wound and where multiple intermediates are imposed.

FIG. 74 shows an external appearance of the multiple intermediates—imposed sheet 350 and the multiple intermediates—imposed roll 351. FIG. 74 shows the shapes 310 arranged between the first sheet with multiple imposition 301 and the second sheet with multiple imposition 302 in the dotted line, which are invisible to the outside.

Figure 75:
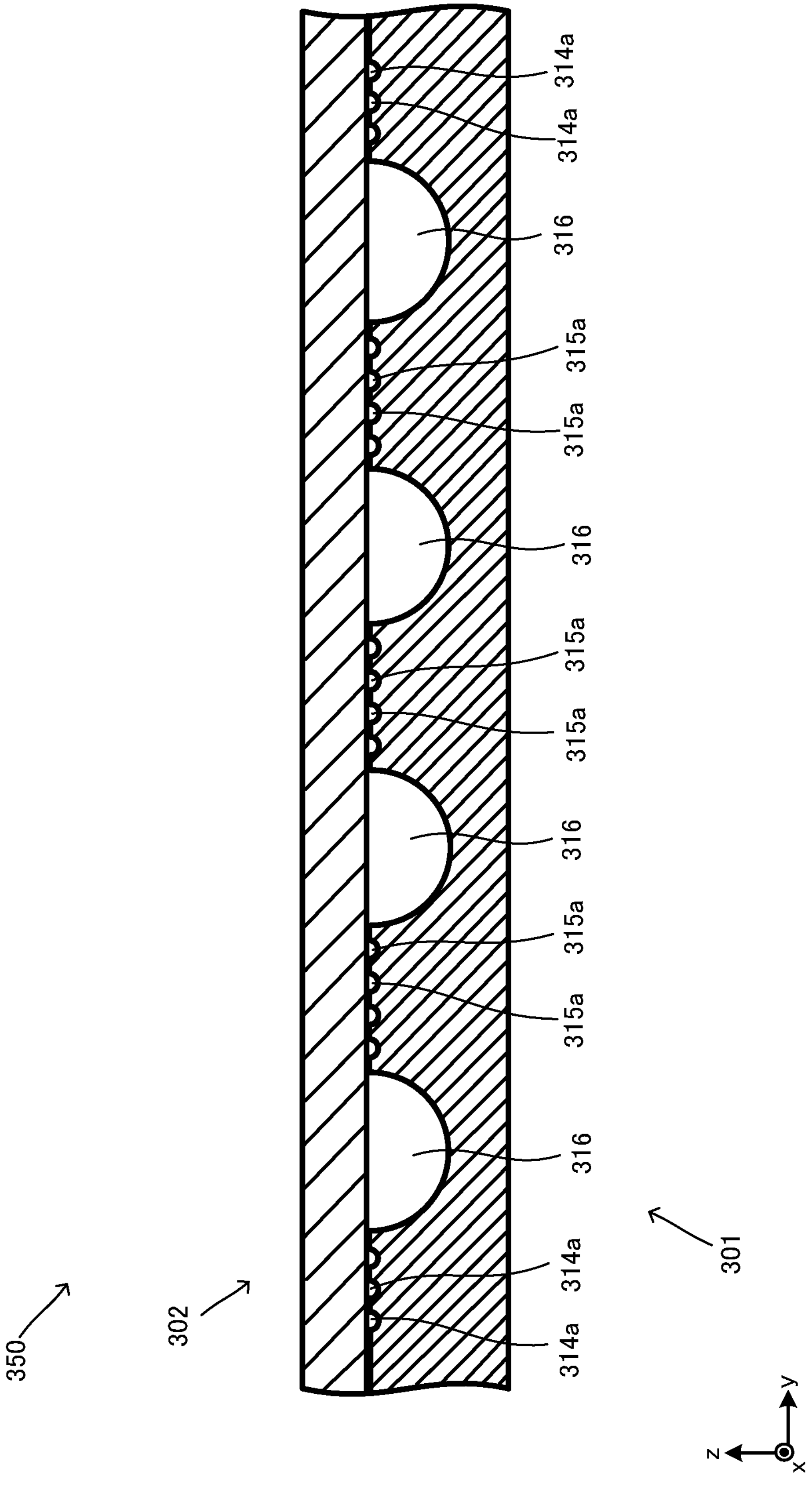
FIG. 75 shows part of a cross section of the sheet 350, where multiple intermediates are imposed.

FIG. 75 shows a cross section of a portion of one of the multiple shapes 310 imposed on the multiple intermediates—imposed sheet 350. This cross section is viewed from the same viewpoint as FIG. 67.

As can be seen from these drawings, in the multiple intermediates—imposed sheet 350 and the multiple intermediates—imposed roll 351, the openings of the fluid flow path grooves 314*a*, the fluid flow path grooves 315*a*, the vapor flow path grooves 316, and the vapor flow path communicating grooves 317 are closed by the second sheet with multiple imposition 302, so that a hollow part is formed.

In the present embodiment, the inside of the hollow part is configured to have an oxygen concentration of 1% or lower, preferably 0.1% or lower, and more preferably 500 ppm or lower. This hollow part is shut off from the outside, and does not communicate with the outside of the multiple intermediates—imposed sheet 350 or the multiple intermediates—imposed roll 351, so that this oxygen concentration is maintained.

This makes it possible to keep the inside of the hollow part at a low oxygen concentration even when the multiple intermediates—imposed sheet 350 or the multiple intermediates—imposed roll 351 is not immediately processed to be a vapor chamber, for example, the sheet 350 or the roll 351 is stored or conveyed. Thus, the generation of the oxide film on the inner surface of the hollow part can be suppressed. Therefore, even if a vapor chamber is made using this multiple intermediates—imposed sheet 350 thereafter, the vapor chamber of excellent heat transport performance which includes flow paths (the condensate flow paths 354 and the vapor flow paths 355) having inner surfaces of a small amount of an oxide film can be made.

As one measure for this, a vacuum can be formed in the hollow part. Here, the meaning of “vacuum” is not limited to a complete vacuum. For example, the pressure may be at most 134 Pa (at most 1 Torr).

The way of forming a vacuum in the hollow part is not particularly limited. For example, as described above, one may consider that the first sheet with multiple imposition 301 and the second sheet with multiple imposition 302 are bonded in a vacuum atmosphere. Not only the above-described bonding by irradiation, but also bonding by diffusion bonding or brazing may be performed in a vacuum atmosphere.

The present embodiment has described the example of the hollow part in the multiple intermediates—imposed sheet 350 or the multiple intermediates—imposed roll 351, where a vacuum is formed. An inert gas such as nitrogen or argon may be included in the hollow part instead of the formation of a vacuum as long as the oxygen concentration is suppressed so that the generation of an oxide film on the inner surface of the hollow part can be suppressed. This also makes it possible to suppress the oxygen concentration in the hollow part, and to suppress the generation of an oxide film.

In this case, such an inert gas can be included in the hollow part by performing the bonding in a way which can be performed in an inert gas atmosphere.

Moisture may be contained in the hollow part.

Even when air is included in the hollow part, so that the oxygen concentration of the hollow part is more than 1%, the generation of an oxide film is suppressed more than the case where the hollow part communicates with the outside, since the hollow part is shut off from the outside as described above, so that there is no replacement of air. Thus, even when the hollow part includes air, the above effect is more or less brought about.

<Manufacturing Intermediate S320>

In the manufacturing an intermediate S320 shown in FIG. 62, an intermediate 352 is manufactured from the multiple intermediates—imposed sheet 350 or the multiple intermediates—imposed roll 351. Specifically, the intermediates 352 are individually taken out from the multiple intermediates—imposed sheet 350, where multiple objects to be the intermediates 352 are imposed, by a known method such as punching.

Figure 76:
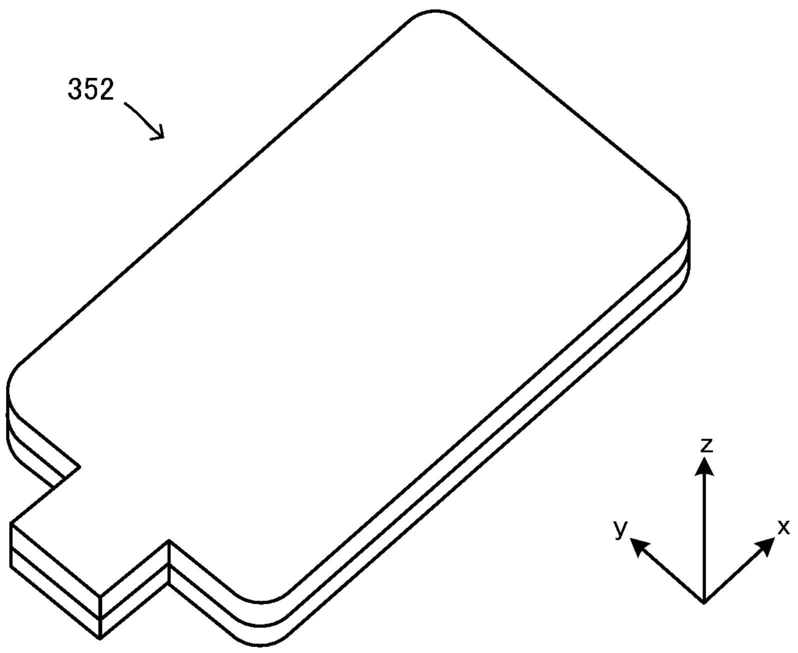
FIG. 76 is a perspective view of an intermediate 352.
Figure 77:
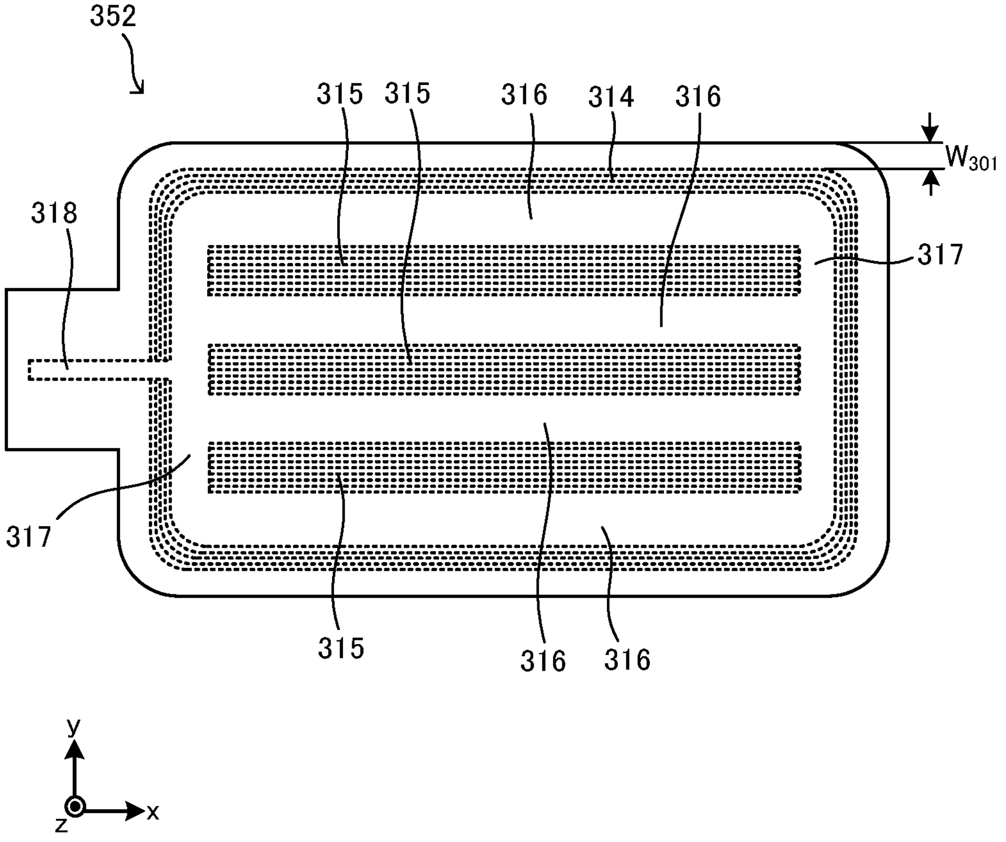
FIG. 77 is a plan view of the intermediate 352.

FIG. 76 is an external perspective view of the intermediate 352. FIG. 77 shows the intermediate 352 in the z-direction (from a plan view). FIG. 77 shows the mode of the hollow part formed inside the intermediate 352 in the dotted line.

As can be seen from FIGS. 76 and 77, in the intermediate 352, the hollow part is also shut off from the outside. This results in the suppression of the generation of any oxide film on the inner surface of the hollow part even in the state of the intermediate 352. Thus, in the present embodiment, the intermediate 352 may be stored or transported.

The width of the bonding part indicated by $W_{301}$ in FIG. 77 may be suitably set as necessary. This width $W_{301}$ is preferably at most 3.0 mm, and may be at most 2.5 mm, and may be at most 2.0 mm. The width $W_{301}$ larger than 3.0 mm leads to a smaller internal volume of a space for flow paths where a working fluid flows, which may make it impossible to sufficiently secure vapor flow paths and condensate flow paths. The width $W_{301}$ is preferably at least 0.2 mm, and may be at least 0.6 mm, and may be at least 0.8 mm. The width $W_{301}$ smaller than 0.2 mm may lead to lack of the bonding area when there is a positional deviation in the bonding of the first sheet and the second sheet. The range of the width $W_{301}$ may be defined by a combination of any one of the foregoing plural candidate values for the upper limit, and any one of the foregoing plural candidate values for the lower limit. The range of the width $W_{301}$ may be also defined by a combination of any two of the plural candidate values for the upper limit, or a combination of any two of the plural candidate values for the lower limit.

<Forming Inlet S330>

Figure 78:
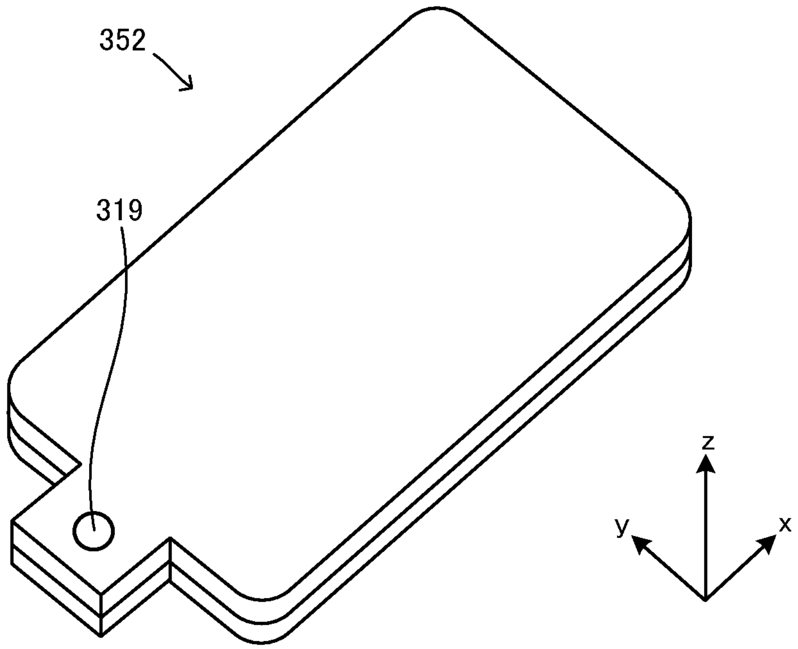
FIG. 78 illustrates formation of an inlet 319.
Figure 79:
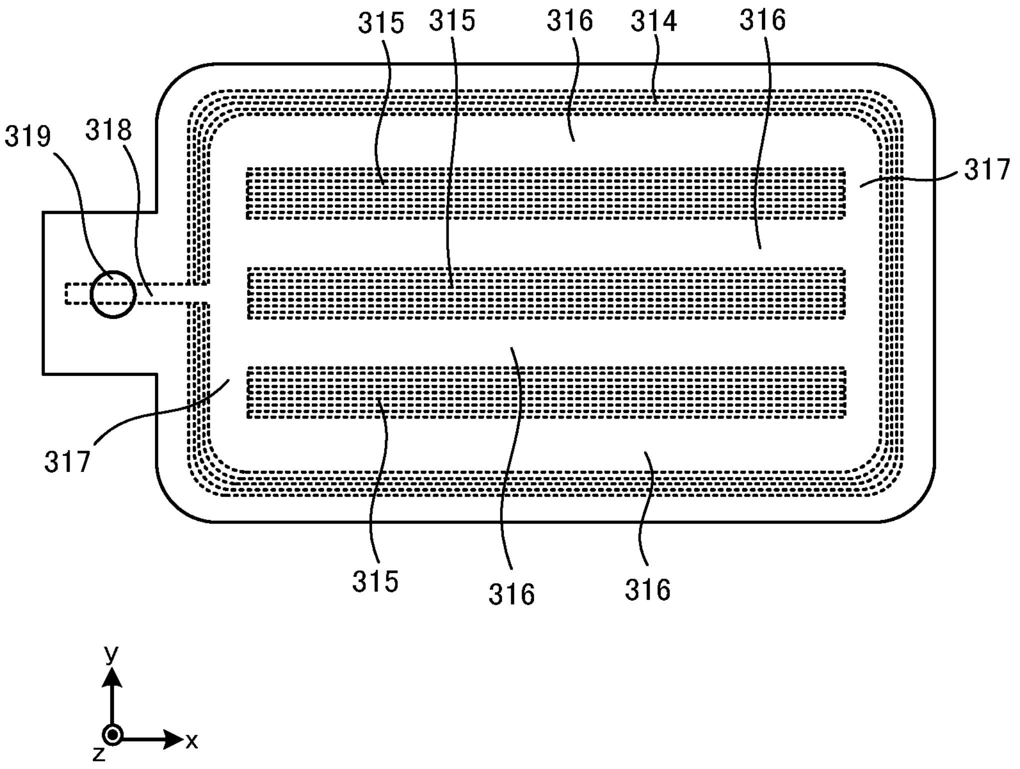
FIG. 79 illustrates the formation of the inlet 319.
Figure 80:
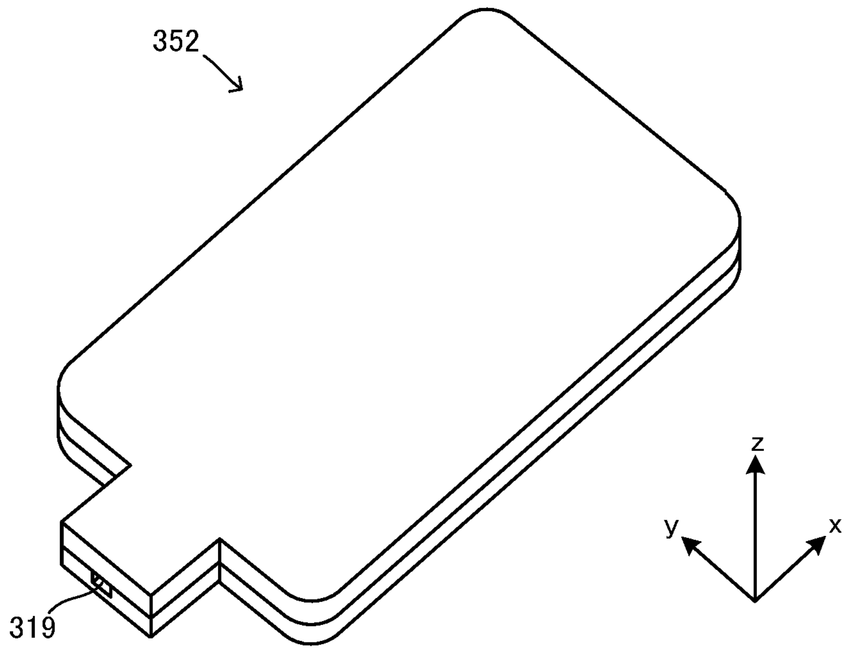
FIG. 80 illustrates another formation of the inlet 319.
Figure 81:
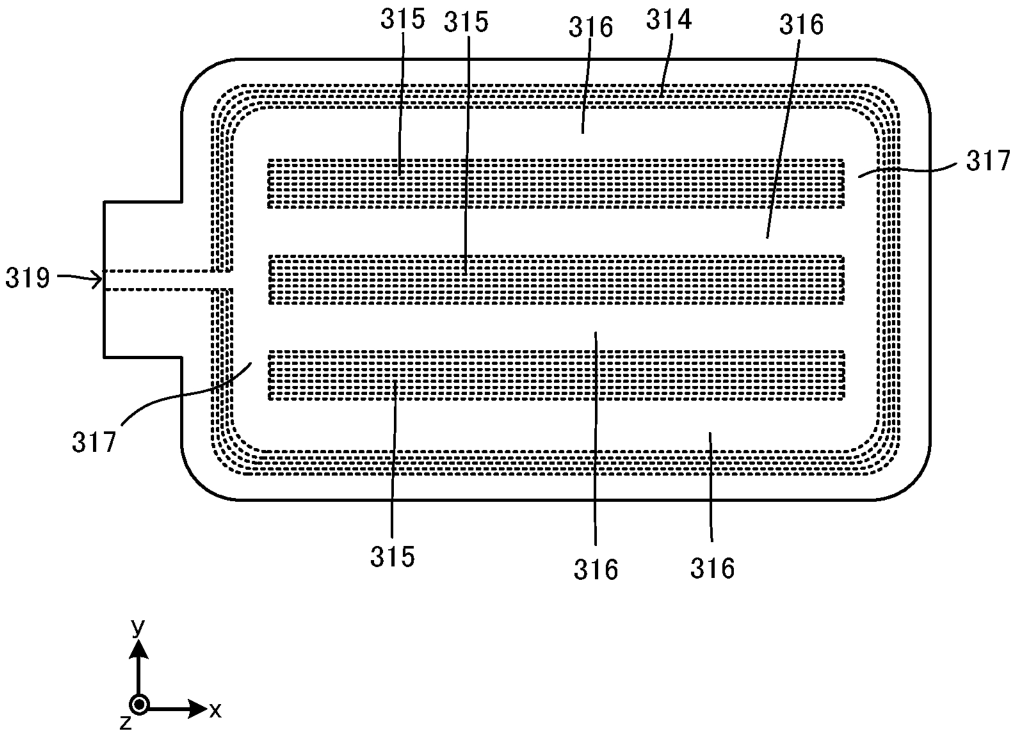
FIG. 81 illustrates the other formation of the inlet 319.

In the forming an inlet S330 shown in FIG. 62, an opening for pouring a working fluid into the hollow part is formed. Thus, in the present embodiment, an opening via which the outside and the inlet groove 318 communicate is formed in the intermediate 352. FIGS. 78 and 79 show an inlet 319 according to one example. FIGS. 80 and 81 show the inlet 319 according to another example.

In the example shown in FIGS. 78 and 79, the inlet 319 is formed by making a hole in the intermediate 352 in the z-direction (thickness direction), so that the inlet groove 318 and the outside communicate with each other.

In the example shown in FIGS. 80 and 81, the inlet 319 is formed by removing an end face of the intermediate 352, so that the inlet groove 318 and the outside communicate with each other.

The present embodiment has shown the examples of opening an inlet in the intermediate 352. Other than this, when the multiple intermediates—imposed sheet 350 or the multiple intermediates—imposed roll 351 is stored or transported, and a vapor chamber is made right after the intermediate 352 is taken out, the inlet 319 may be formed in the multiple intermediates—imposed sheet 350 at the stage before the intermediate 352 is manufactured.

Therefore, in this case, the inlet 319 is formed before or at the same time when the intermediate 352 is taken out.

<Pouring Fluid S340>

In the pouring a fluid shown in FIG. 62, a working fluid is poured into the hollow part, using the formed inlet 319. The way of pouring is not particularly limited, but a known way may be applied.

The working fluid is not particularly limited. Any working fluid used for a usual vapor chamber, such as pure water, ethanol, methanol, acetone, and any mixture thereof may be used.

<Enclosing S350>

In the enclosing S350, the inlet groove 318 is closed in a state where the working fluid has been poured. The way for the closing is not particularly limited, but examples thereof include caulking and welding.

[Vapor Chamber]

Figure 82:
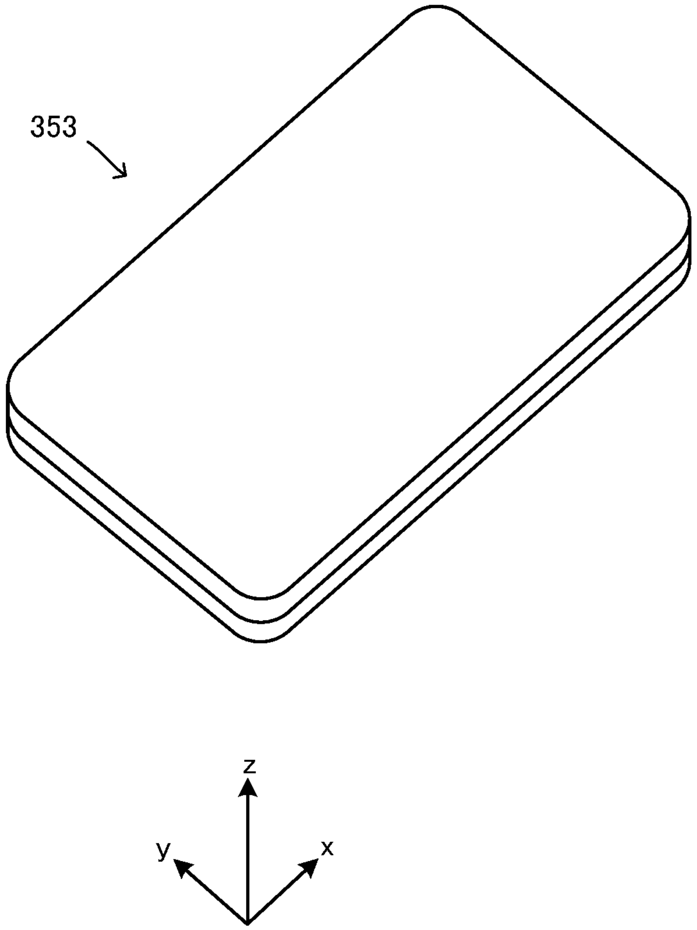
FIG. 82 is a perspective view of a vapor chamber 353.
Figure 83:
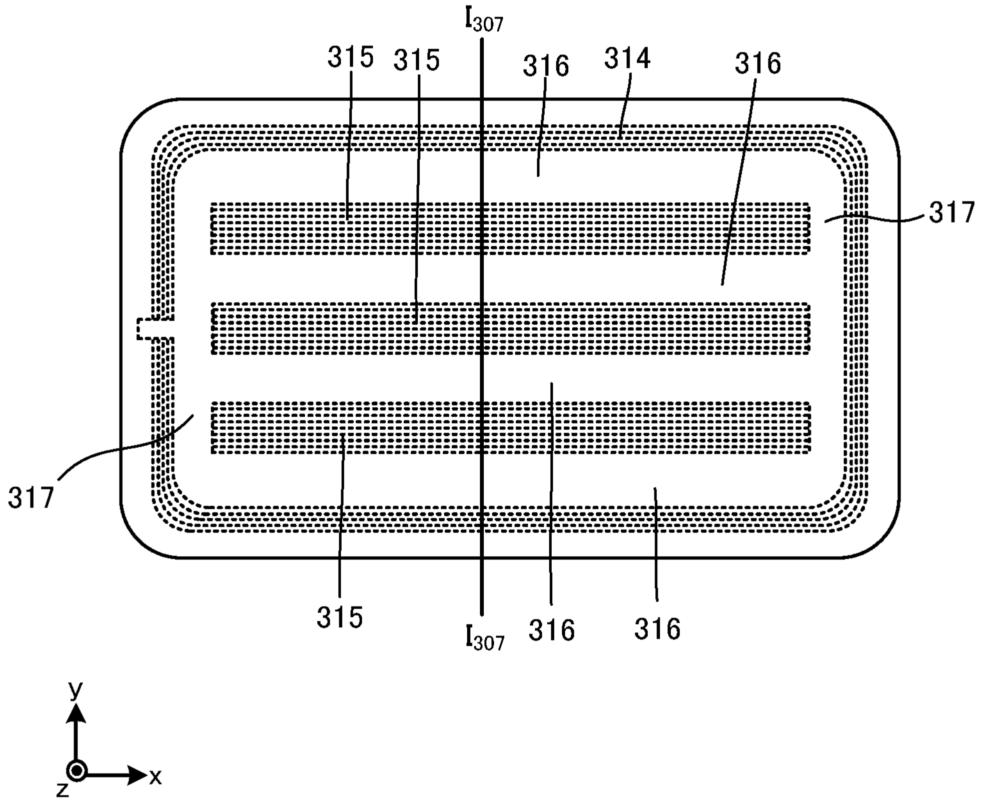
FIG. 83 is a plan view of the vapor chamber 353.
Figure 84:
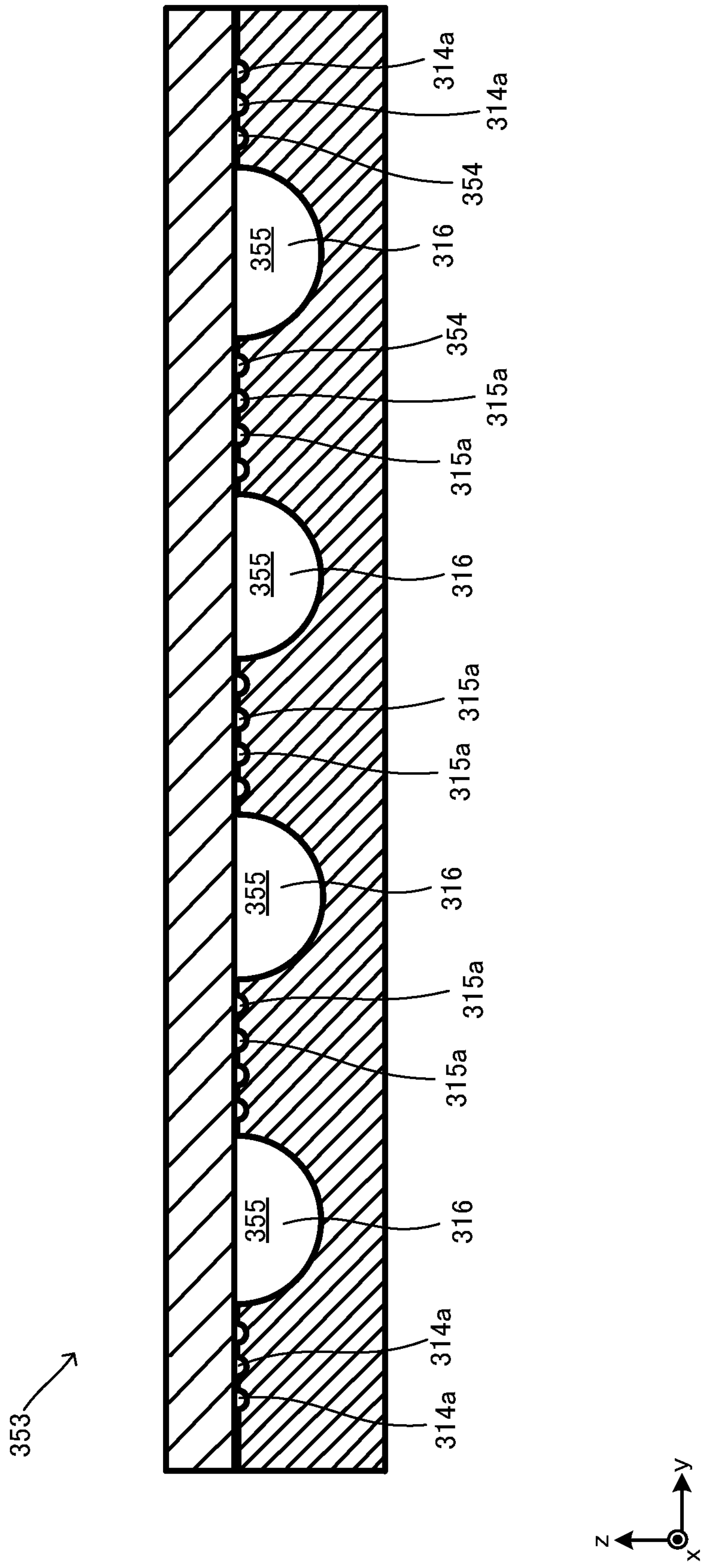
FIG. 84 is a cross-sectional view of the vapor chamber 353.

A vapor chamber 353 manufactured as the foregoing has the following structure. FIGS. 82 to 84 show illustrations. FIG. 82 is an external perspective view of the vapor chamber 353. FIG. 83 shows the vapor chamber 353 in the z-direction. FIG. 84 is a cross-sectional view taken along the line $I_{307}$-$I_{307}$ of FIG. 83. FIG. 83 shows the inside structure in the dotted line.

The inside of the vapor chamber 353 is a sealed space when the working fluid is enclosed in the hollow part of the intermediate 352.

Specifically, this sealed space includes the condensate flow paths 354 by the fluid flow path grooves 314*a* and the fluid flow path grooves 315*a*, which are the second flow paths where a condensate that is the condensed and liquefied working fluid flows, and the vapor flow paths 355 by the vapor flow path grooves 316, which are the first flow paths where a vapor that is the condensed and gasified working fluid flows. Further, this sealed space also includes flow paths by the vapor flow path communicating grooves 317 which allow the vapor flow paths 355 to communicate.

In this way, the condensate flow paths 354, which are the second flow paths, are formed separately from the vapor flow paths 355, which are the first flow paths. This can lead to a smooth circulation of the working fluid. In addition, the formation of slim flow paths by the condensate flow paths 354 all surrounded by walls in a cross section makes it possible to move the condensate by a great capillary force, and to lead to a smooth circulation.

Here, the flow path cross-sectional area of each of the condensate flow paths 354, which are the second flow paths, are formed so as to be smaller than that of each of the vapor flow paths 355, which are the first flow paths. More specifically, when the average flow path cross-sectional area of any two adjacent ones of the vapor flow paths 355 (each formed by one of the vapor flow path grooves 316 in the present embodiment) is defined as $A_g$, and the average flow path cross-sectional area of groups of the condensate flow paths 354 which are each arranged between two adjacent ones of the vapor flow paths 355 (in the present embodiment, a plurality of the condensate flow paths 354 formed by one of the inner side fluid flow path parts 315) is defined as $A_l$: in the relationship between the condensate flow paths 354 and the vapor flow paths 355, $A_l$ is at most 0.5 times, preferably at most 0.25 times, as large as $A_g$. This results in the working fluid selectively passing through the first flow paths and the second flow paths more easily according to the mode of a phase (gas or liquid phase) thereof.

This relationship may be established in at least part of the entire vapor chamber. It is further preferrable to establish this relationship in the entire vapor chamber.

The vapor chamber 353 as described above may be also attached to an electronic device and operate as well as the above-described vapor chambers according to the other embodiments.

In the present embodiment, as described above, in the manufacturing process, the state where an oxide film is difficult to be generated on the inner surface of the hollow part (the condensate flow paths 354 and the vapor flow paths 355) is kept in the multiple intermediates—imposed sheet 350, the multiple intermediates—imposed roll 351, and the intermediate 352, which leads to good wettability of the inner surfaces of the condensate flow paths 354 and the vapor flow paths 355, which makes it possible to improve a smooth flow of the working fluid, and heat transfer.

Particularly, when a heat transport capability at a high level is attempted to be obtained by increasing the surface areas inside flow paths so as to increase heat transfer areas while slimming a vapor chamber as the present embodiment, the influence of an oxide film is relatively large. Thus, the present disclosure can lead to a remarkable effect of exerting a heat transport capability.

Figure 85:
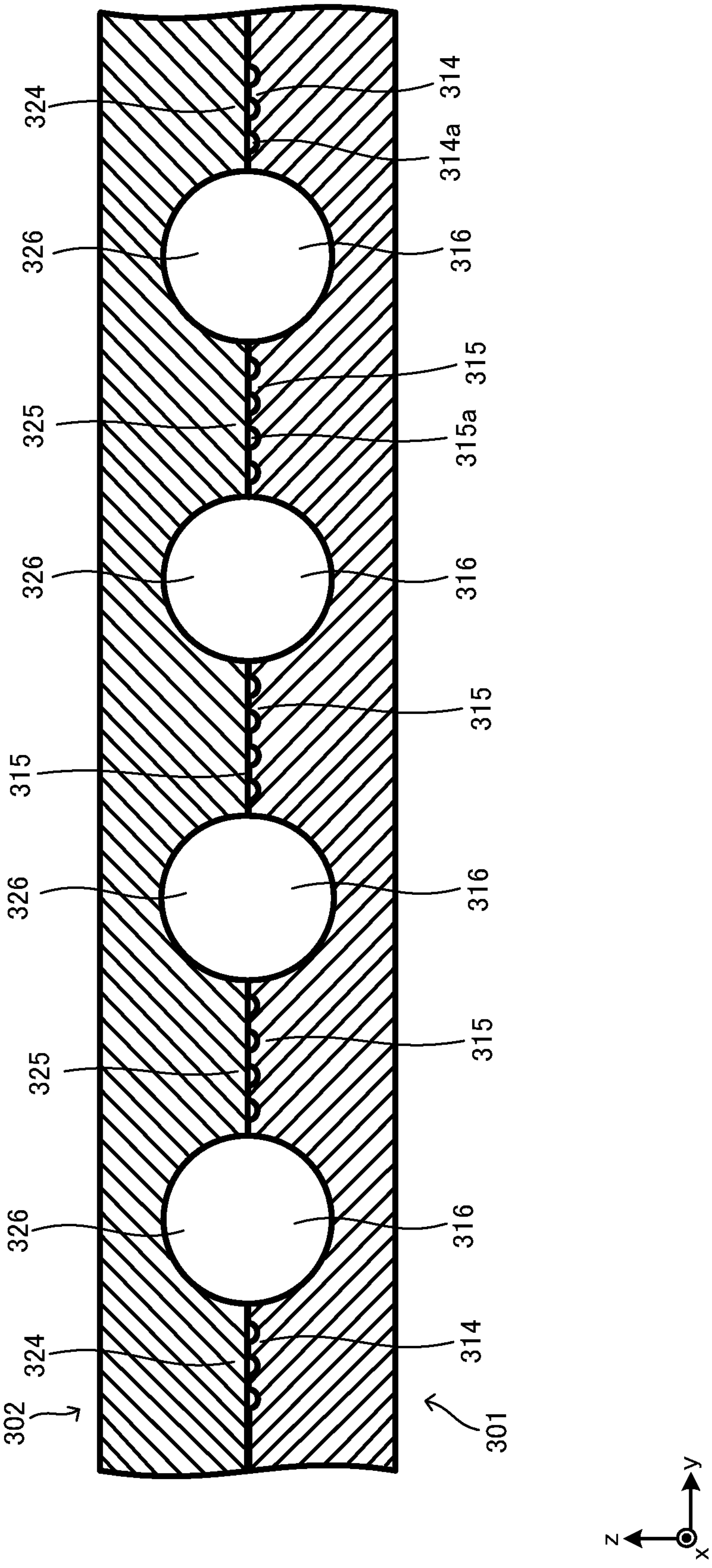
FIG. 85 illustrates the vapor chamber 353 according to another example.
Figure 86:
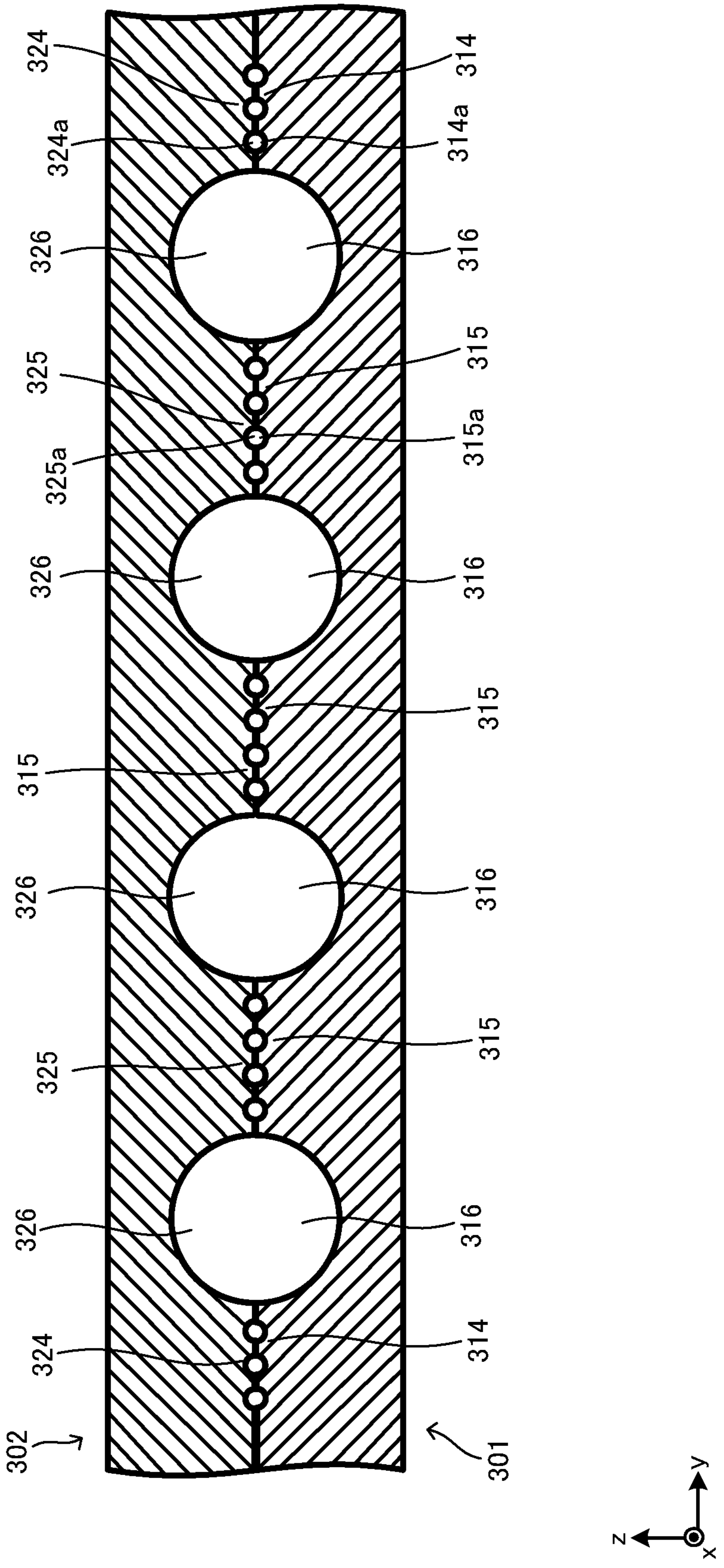
FIG. 86 illustrates the vapor chamber 353 according to another example.

The present embodiment has shown the example of only the first sheet with multiple imposition 301 including the fluid flow path grooves 314*a*, the fluid flow path grooves 315*a*, and the vapor flow path grooves 316. As shown in FIG. 85, the second sheet with multiple imposition 302 may also include vapor flow path grooves 326. As shown in FIG. 86, the second sheet with multiple imposition 302 may also include fluid flow path grooves 324*a*, fluid flow path grooves 325*a*, and the vapor flow path grooves 326.

In these examples, the multiple intermediates—imposed sheet, the multiple intermediates—imposed roll, the intermediate, and the vapor chamber according to the present disclosure can be also formed.

Figure 87:
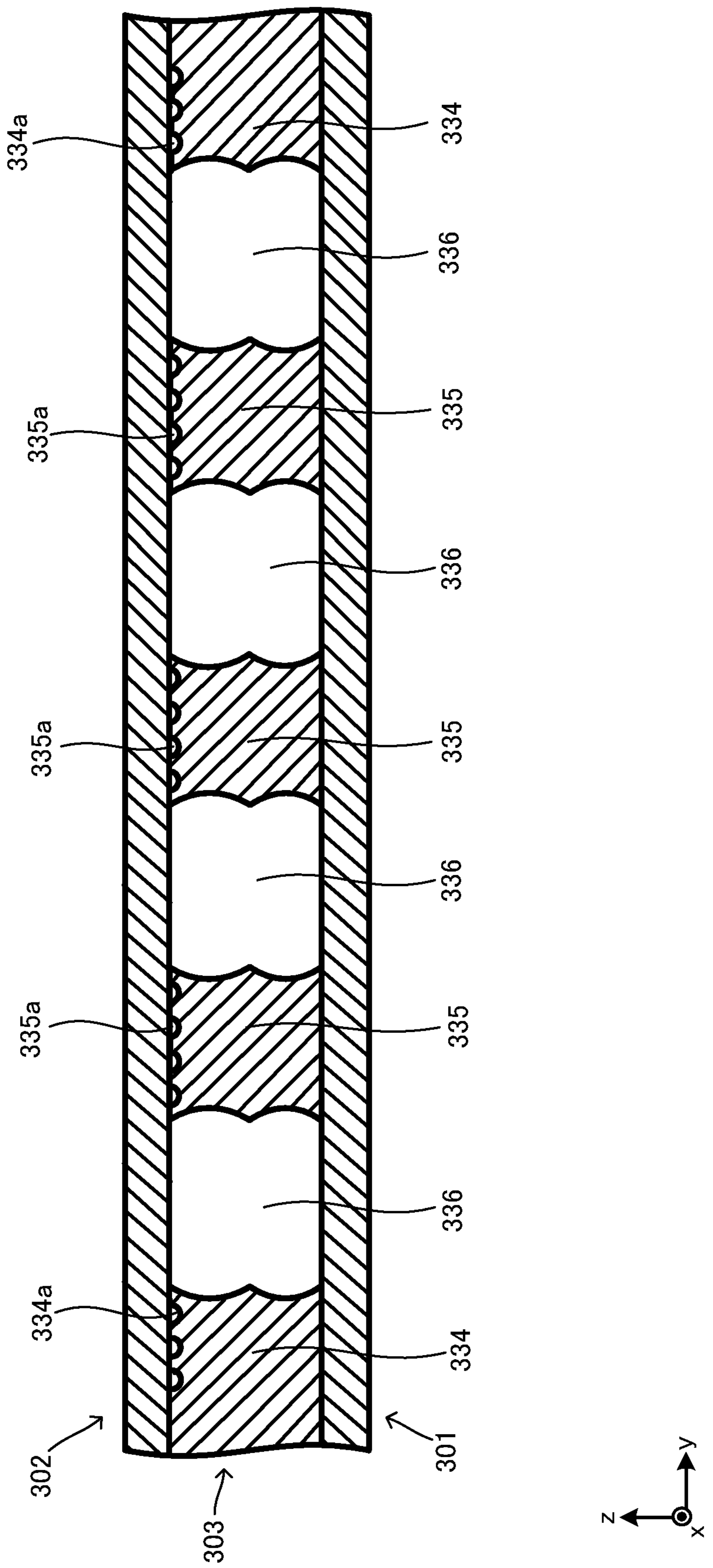
FIG. 87 illustrates the vapor chamber 353 according to another example.

The number of the sheets with multiple imposition is not limited to two. As shown in FIG. 87, the multiple intermediates—imposed sheet or the multiple intermediates—imposed roll may be formed of three sheets with multiple imposition; and the intermediate or the vapor chamber may be manufactured therefrom.

The multiple intermediates—imposed sheet shown in FIG. 87 is a laminate of the first sheet with multiple imposition 301, the second sheet with multiple imposition 302, and a middle sheet with multiple imposition 303 (third sheet with multiple imposition 303).

The middle sheet with multiple imposition 303 is arranged so as to be sandwiched between the first sheet with multiple imposition 301 and the second sheet with multiple imposition 302. These sheets are bonded to each other according to any of the above-described examples.

In this example, both the faces of the first sheet with multiple imposition 301, and both the faces of the second sheet with multiple imposition 302 are flat.

The thickness of each of the first sheet with multiple imposition 301 and the second sheet with multiple imposition 302 at this time is preferably at most 1.0 mm, and may be at most 0.5 mm, and may be at most 0.1 mm. This thickness is preferably at least 0.005 mm, and may be at least 0.015 mm, and may be at least 0.030 mm. The ranges of these thicknesses may be each defined by a combination of any one of the foregoing plural candidate values for the upper limit and any one of the foregoing plural candidate values for the lower limit. The ranges of these thicknesses may be also each defined by a combination of any two of the plural candidate values for the upper limit or a combination of any two of the plural candidate values for the lower limit.

The middle sheet with multiple imposition 303 includes vapor flow path grooves 336, a peripheral fluid flow path part 334, inner side fluid flow path parts 335, fluid flow path grooves 334*a*, and fluid flow path parts 335*a*.

The vapor flow path grooves 336 are grooves penetrating through the middle sheet with multiple imposition 303 in the thickness direction, are grooves as those constituting the vapor flow paths 355 by the vapor flow path grooves 316, which are the first flow paths, and are arranged in the manner corresponding to them.

The peripheral fluid flow path part 334 and the fluid flow path grooves 334*a* may be considered the same as the peripheral fluid flow path part 314 and the fluid flow path grooves 314*a*. The peripheral fluid flow path part 335 and the fluid flow path grooves 335*a* may be considered the same as the peripheral fluid flow path part 315 and the fluid flow path grooves 315*a*.

The examples in the above-described embodiments of the present disclosure are not limited as they are, but components therein may be modified and specified as long as the modification does not deviate from the gist thereof. A plurality of the components disclosed in the embodiments may be suitably combined so that various forms are made. Some components may be deleted from all the components shown in each of the embodiments.

REFERENCE SIGNS LIST

1, 101 vapor chamber
2, 102 sealed space
3, 103 condensate flow path
4, 104 vapor flow path
10, 110 first sheet
10*a* inner face
10*b* outer face
10*c* side face
10*d* inner layer
10*e* outer layer
11, 111 main body
12, 112 inlet part
13, 113 peripheral bonding part
14, 114 peripheral fluid flow path part
14*a*, 114*a* fluid flow path groove
14*c*, 114*c* communicating opening part
15, 115 inner side fluid flow path part
15*a*, 115*a* fluid flow path groove
15*c*, 115*c* communicating opening part
16, 116 vapor flow path groove
17, 117 vapor flow path communicating groove
20, 120 second sheet
20*a* inner face
20*b* outer face
20*c* side face
20*d* inner layer
20*e* outer layer
21, 121 main body
22, 122 inlet part
23, 123 peripheral bonding part
24, 124 peripheral fluid flow path part
25, 125 inner side fluid flow path part
26, 126 vapor flow path groove
27, 127 vapor flow path communicating groove
30 electronic component
40 electronic device (portable terminal)
41 housing
50, 230 third sheet
236 vapor flow path slit
301 first sheet with multiple imposition
302 second sheet with multiple imposition
350 multiple intermediates—imposed sheet
351 multiple intermediates—imposed roll
352 intermediate
353 vapor chamber

The invention claimed is:

1. A vapor chamber having a sealed space in which a working fluid is enclosed, the vapor chamber comprising:

a plurality of condensate flow paths in the sealed space of the vapor chamber, the condensate flow paths are flow paths through which the working fluid in a condensate state moves along the condensate flow paths;

a plurality of vapor flow paths in the sealed space of the vapor chamber, the vapor flow paths are flow paths through which the working fluid in a vapor state and the condensate state moves along the vapor flow paths;

a flow path cross-sectional area throughout the entirety of each of the vapor flow paths is larger than a flow path cross-sectional area throughout the entirety of each of the condensate flow paths;

a first linear part where each of the plurality of condensate flow paths and each of the plurality of vapor flow paths linearly extend in a first direction, a second linear part where each of the plurality of condensate flow paths and each of the plurality of vapor flow paths linearly extend in a second direction intersecting with the first direction, and a curved part continuous to the first linear part on one end and continuous to the second linear part on the other end, where at the curved part each of the condensate flow paths and each of the vapor flow paths change gradually from the first direction to the second direction, wherein each of the plurality of condensate flow paths is continuous through the first linear part, the curved part and the second linear part, wherein each of the plurality of vapor flow paths is continuous through the first linear part, the curved part and the second linear part, wherein:

the flow path cross-sectional area of a respective one of at least one of the vapor flow paths at the curved part is larger than the flow path cross-sectional area of the respective one of the at least one of the vapor flow paths in at least one of the first or second linear parts, at the curved part, the flow path cross-sectional area of at least one of the vapor flow paths disposed on an inner side of the curved part is larger than the flow path cross-sectional area of at least another of the vapor flow paths disposed on an outer side of the curved part, and wherein the respective one of at least one of the vapor flow paths is one of the at least one of the vapor flow paths or the at least another of the vapor flow paths.

2. The vapor chamber according to claim 1, wherein at the curved part, a width of the flow path cross-sectional area of the at least one of the vapor flow paths disposed on the inner side of the curved part is larger than a width of the flow path cross-sectional area of the at least another of the vapor flow paths disposed on the outer side of the curved part, the width being a measurement from side-to-side of the flow path cross-sectional area.

3. The vapor chamber according to claim 1, wherein at the curved part, a height of the flow path cross-sectional area of the at least one of the vapor flow paths disposed on the inner side of the curved part is larger than a height of the flow path cross-sectional area of the at least another of the vapor flow path disposed on the outer side of the curved part, the height being a measurement from a base to a top of the flow path cross-sectional area.

4. The vapor chamber according to claim 1, wherein the plurality of the vapor flow paths are linked.

5. The vapor chamber according to claim 1, wherein each of the vapor flow paths is positioned between a pair of the condensate flow paths.

6. The vapor chamber according to claim 1, wherein the condensate flow paths have a plurality of communicating opening parts, and a pitch of the communicating opening parts at the curved part is different from a pitch of the communicating opening parts in the first and second linear parts.

7. The vapor chamber according to claim 1, wherein the condensate flow paths have a plurality of communicating opening parts in the first and second linear parts and not in the curved part.

8. An electronic device comprising:

a housing;

an electronic component disposed inside the housing; and the vapor chamber according to claim 1, the vapor chamber being disposed in direct contact with the electronic component or in contact with the electronic component via another member.

* * * * *